(12) United States Patent
Zhang et al.

(10) Patent No.: US 12,421,261 B2
(45) Date of Patent: Sep. 23, 2025

(54) ORGANIC LIGHT EMITTING MATERIAL

(71) Applicant: BEIJING SUMMER SPROUT TECHNOLOGY CO., LTD., Beijing (CN)

(72) Inventors: Qi Zhang, Beijing (CN); Xueyu Lu, Beijing (CN); Xinfang Hao, Beijing (CN); Chi Yuen Raymond Kwong, Beijing (CN); Chuanjun Xia, Beijing (CN)

(73) Assignee: BEIJING SUMMER SPROUT TECHNOLOGY CO., LTD., Beijing (CN)

( * ) Notice: Subject to any disclaimer, the term of this patent is extended or adjusted under 35 U.S.C. 154(b) by 850 days.

(21) Appl. No.: 17/323,274

(22) Filed: May 18, 2021

(65) Prior Publication Data

US 2021/0380618 A1     Dec. 9, 2021

(30) Foreign Application Priority Data

May 19, 2020   (CN) .......................... 202010423833.4
Dec. 17, 2020  (CN) .......................... 202011492493.7

(51) Int. Cl.
*H10K 85/30*     (2023.01)
*C07F 7/08*      (2006.01)
(Continued)

(52) U.S. Cl.
CPC ........ *C07F 15/0033* (2013.01); *C07F 7/0812* (2013.01); *C09K 11/06* (2013.01);
(Continued)

(58) Field of Classification Search
CPC . C07F 15/0033; C07F 7/0812; H10K 85/342; H10K 85/6572; H10K 50/11; C09K 11/06; C09K 2211/1029; C09K 2211/1088
(Continued)

(56) References Cited

U.S. PATENT DOCUMENTS 5,703,436 A   12/1997   Forrest et al.
5,707,745 A   1/1998    Forrest et al.
(Continued)

FOREIGN PATENT DOCUMENTS

CN   1847248 A       10/2006
CN   104335377 A     2/2015
(Continued)

OTHER PUBLICATIONS

Japanese Notice of Reasons for Refusal for Japanese Application No. 2021-084101, dated Sep. 8, 2022, 5 pages with English translation.
(Continued)

*Primary Examiner* — Ruiyun Zhang
(74) *Attorney, Agent, or Firm* — Workman Nydegger

(57) ABSTRACT

Provided is an organic light-emitting material. The organic light-emitting material is a metal complex having a ligand with a structure of Formula 1 or Formula 1'. The metal complex can be used as a light-emitting material in an electroluminescent device. These novel metal complexes can effectively adjust a light-emitting color to deep red, can improve external quantum efficiency of devices while maintaining a relatively narrow FWHM, and can provide better device performance. Further provided are an electroluminescent device and a compound formulation.

32 Claims, 2 Drawing Sheets

(51) Int. Cl.
  *C07F 15/00* (2006.01)
  *C09K 11/06* (2006.01)
  *H10K 50/11* (2023.01)
  *H10K 85/60* (2023.01)
(52) U.S. Cl.
  CPC .... *H10K 85/342* (2023.02); *C09K 2211/1029* (2013.01); *C09K 2211/1088* (2013.01); *H10K 50/11* (2023.02); *H10K 85/6572* (2023.02)
(58) Field of Classification Search
  USPC .......................................................... 257/40
  See application file for complete search history.

(56) References Cited

U.S. PATENT DOCUMENTS

| | | | |
|---|---|---|---|
| 5,844,363 | A | 12/1998 | Gu et al. |
| 6,097,147 | A | 8/2000 | Baldo et al. |
| 6,303,238 | B1 | 10/2001 | Thompson et al. |
| 7,279,704 | B2 | 10/2007 | Walters et al. |
| 7,968,146 | B2 | 6/2011 | Wagner et al. |
| 2003/0230980 | A1 | 12/2003 | Forrest et al. |
| 2004/0174116 | A1 | 9/2004 | Lu et al. |
| 2006/0228582 | A1 | 10/2006 | Ragini et al. |
| 2012/0181511 | A1 | 7/2012 | Ma et al. |
| 2015/0105843 | A1 | 4/2015 | Heun et al. |
| 2015/0287933 | A1 | 10/2015 | Kottas et al. |
| 2015/0315222 | A1 | 11/2015 | Boudreault et al. |
| 2015/0349273 | A1 | 12/2015 | Hung et al. |
| 2016/0093808 | A1 | 3/2016 | Adamovich et al. |
| 2016/0104848 | A1 | 4/2016 | Boudreault et al. |
| 2016/0359122 | A1 | 12/2016 | Boudreault et al. |
| 2017/0200907 | A1 | 7/2017 | Masahiro et al. |
| 2017/0229663 | A1 | 8/2017 | Tsai et al. |
| 2018/0097185 | A1 | 4/2018 | Su et al. |
| 2018/0190914 | A1 | 7/2018 | Tsai et al. |
| 2018/0273563 | A1 | 9/2018 | Choi et al. |
| 2018/0287070 | A1 | 10/2018 | Ji et al. |
| 2019/0326526 | A1 | 10/2019 | Kwak et al. |
| 2020/0251666 | A1 | 8/2020 | Cai et al. |
| 2020/0358011 | A1 | 11/2020 | Lu et al. |
| 2021/0115077 | A1 | 4/2021 | Hwang et al. |

FOREIGN PATENT DOCUMENTS

| | | | |
|---|---|---|---|
| CN | 105503960 | A | 4/2016 |
| CN | 106459114 | A | 2/2017 |
| CN | 107973823 | A | 5/2018 |
| CN | 111909212 | A | 11/2020 |
| EP | 2940098 | A1 | 11/2015 |
| JP | 2006-290891 | A | 10/2006 |
| JP | 2014-510712 | A | 5/2014 |
| JP | 2015-520166 | A | 7/2015 |
| JP | 2016-076696 | A | 5/2016 |
| KR | 10-2014-0060974 | A | 5/2014 |
| KR | 10-2016-0041771 | A | 4/2016 |
| KR | 20180107942 | A | 10/2018 |
| WO | 2015/190464 | A1 | 12/2015 |

OTHER PUBLICATIONS

Japanese Search Report from Japanese Application No. 2021-084101, dated Aug. 17, 2022, 36 Pages with English Translation.
Shang. X. et al., "DFT/TDDFT study on the electronic structures and optoelectronic properties of a series of iridium(III) complexes based on quinoline derivatives in OLEDs," Journal of physical chemistry, vol. 26, Issue 10, 2013, pp. 784-790.
Tang. C.W. et al., "Organic electroluminescent diodes," Appl. Phys. Lett. vol. 51, 1987, pp. 913-915.
Uoyama. H. et al., "Highly efficient organic light-emitting diodes from delayed fluorescence," Nature, vol. 492, Dec. 2012, pp. 234-238.
CN Office Action, including Search Report Mailed on Jul. 17, 2023 for CN Application No. 202011492493, 13 page(s).
DE Office Action Mailed on Sep. 27, 2023 for DE Application No. 102021112841, 6 page(s).
JP Office Action Mailed on Mar. 20, 2023 for JP Application No. 2021084101, 6 page(s).
KR Office Action Mailed on Jul. 13, 2023 for KR Application No. 10-2021-0064912, 16 page(s).
Chines Notification to Grant for Chinese Application No. 202011492493.7, dated Jul. 16, 2024, 2 pages with translation.
Chinese Second Office Action for Chinese Application No. 202011492493.7, dated Apr. 27, 2024, 12 pages with translation.
Chinese Search Report for Chinese Application No. 2020114924937, dated Dec. 17, 2020, 2 pages.
Japanese Notice of Reasons for Refusal for Japanese Application No. 2021-084101, dated Oct. 24, 2023, 6 pages with translation.
Japanese Decision to Grant for Japanese Application No. 2021-084101, dated Jun. 13, 2024, 6 pages with translation.
Korean Written Decision on Registration for Korean Application No. 10-2021-0064912, dated Jan. 30, 2024, 6 pages with translation.

ORGANIC LIGHT EMITTING MATERIAL

TECHNICAL FIELD

The present disclosure relates to compounds used in organic electronic devices such as organic light-emitting devices. More particularly, the present disclosure relates to a metal complex having a ligand with a structure of Formula 1 or Formula 1' and an organic electroluminescent device and a compound formulation including the metal complex.

BACKGROUND

Organic electronic devices include, but are not limited to, the following types: organic light-emitting diodes (OLEDs), organic field-effect transistors (O-FETs), organic light-emitting transistors (OLETs), organic photovoltaic devices (OPVs), dye-sensitized solar cells (DSSCs), organic optical detectors, organic photoreceptors, organic field-quench devices (OFQDs), light-emitting electrochemical cells (LECs), organic laser diodes and organic plasmon emitting devices.

In 1987, Tang and Van Slyke of Eastman Kodak reported a bilayer organic electroluminescent device, which comprises an arylamine hole transporting layer and a tris-8-hydroxyquinolato-aluminum layer as the electron and emitting layer (Applied Physics Letters, 1987, 51 (12): 913-915). Once a bias is applied to the device, green light was emitted from the device. This device laid the foundation for the development of modern organic light-emitting diodes (OLEDs). State-of-the-art OLEDs may comprise multiple layers such as charge injection and transporting layers, charge and exciton blocking layers, and one or multiple emissive layers between the cathode and anode. Since the OLED is a self-emitting solid state device, it offers tremendous potential for display and lighting applications. In addition, the inherent properties of organic materials, such as their flexibility, may make them well suited for particular applications such as fabrication on flexible substrates.

The OLED can be categorized as three different types according to its emitting mechanism. The OLED invented by Tang and van Slyke is a fluorescent OLED. It only utilizes singlet emission. The triplets generated in the device are wasted through nonradiative decay channels. Therefore, the internal quantum efficiency (IQE) of the fluorescent OLED is only 25%. This limitation hindered the commercialization of OLED. In 1997, Forrest and Thompson reported phosphorescent OLED, which uses triplet emission from heavy metal containing complexes as the emitter. As a result, both singlet and triplets can be harvested, achieving 100% IQE. The discovery and development of phosphorescent OLED contributed directly to the commercialization of active-matrix OLED (AMOLED) due to its high efficiency. Recently, Adachi achieved high efficiency through thermally activated delayed fluorescence (TADF) of organic compounds. These emitters have small singlet-triplet gap that makes the transition from triplet back to singlet possible. In the TADF device, the triplet excitons can go through reverse intersystem crossing to generate singlet excitons, resulting in high IQE.

OLEDs can also be classified as small molecule and polymer OLEDs according to the forms of the materials used. A small molecule refers to any organic or organometallic material that is not a polymer. The molecular weight of the small molecule can be large as long as it has well defined structure. Dendrimers with well-defined structures are considered as small molecules. Polymer OLEDs include conjugated polymers and non-conjugated polymers with pendant emitting groups. Small molecule OLED can become the polymer OLED if post polymerization occurred during the fabrication process.

There are various methods for OLED fabrication. Small molecule OLEDs are generally fabricated by vacuum thermal evaporation. Polymer OLEDs are fabricated by solution process such as spin-coating, inkjet printing, and slit printing. If the material can be dissolved or dispersed in a solvent, the small molecule OLED can also be produced by solution process.

The emitting color of the OLED can be achieved by emitter structural design. An OLED may comprise one emitting layer or a plurality of emitting layers to achieve desired spectrum. In the case of green, yellow, and red OLEDs, phosphorescent emitters have successfully reached commercialization. Blue phosphorescent device still suffers from non-saturated blue color, short device lifetime, and high operating voltage. Commercial full-color OLED displays normally adopt a hybrid strategy, using fluorescent blue and phosphorescent yellow, or red and green. At present, efficiency roll-off of phosphorescent OLEDs at high brightness remains a problem. In addition, it is desirable to have more saturated emitting color, higher efficiency, and longer device lifetime.

Phosphorescent metal complexes can be used as phosphorescent doping materials of light-emitting layers and applied to the field of organic electroluminescence lighting or display. To meet needs in different cases, the color of a material can be adjusted on a certain basis by adjusting different substituents on a ligand of the material so that phosphorescent metal complexes with different emission wavelengths are obtained.

Patent application CN104335377A has disclosed a compound with the following structure:

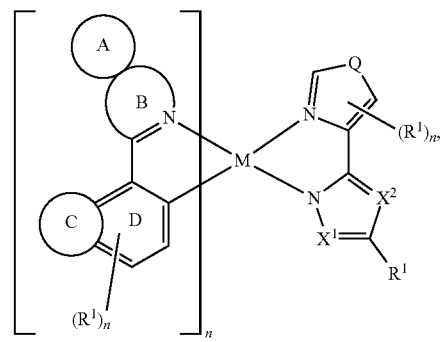

which includes a series of structures

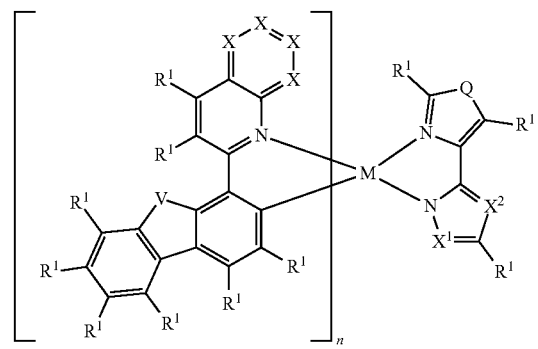

and similar structures. The applicant of that invention pointed out that materials with such structures have high EL efficiency and good lifetimes. However, they focused on researches on the application of diazole/triazole-containing dinitrogen ligands to metal complexes and paid no attention to the advantages of a group $R^1$ substituted on a particular ring being a silyl group.

Patent application CN107973823A has disclosed a compound

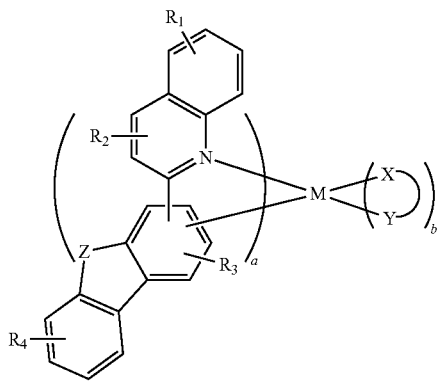

with a quinolyl dibenzo substituent as a ligand, where $R_1$ to $R_4$ can be selected from hydrogen, alkyl, heteroalkyl, aryl or heteroaryl. The applicant of that invention pointed out that materials with such structures have relatively good stability, lifetimes and color saturation. However, the substituents $R_1$ to $R_4$ in the disclosed structures are all hydrogen or alkyl, and the advantages of a silyl substituent on a particular ring are not disclosed or taught.

Though there are some metal complexes including ligands with quinoline structures, these metal complexes still have deficiencies in related properties such as a light-emitting color, device efficiency and a device lifetime. The research and development of related materials still need to be deepened.

SUMMARY

The present disclosure aims to provide a series of metal complexes having a ligand with a structure of Formula 1 or Formula 1' to solve at least part of the preceding problems. The metal complexes can be used as light-emitting materials in organic electroluminescent devices. These novel metal complexes can effectively adjust the light-emitting color to deep red, can improve external quantum efficiency of the devices while maintaining a relatively narrow full width at half maximum (FWHM), and can provide better device performance.

According to an embodiment of the present disclosure, disclosed is a metal complex which has a maximum emission wavelength greater than or equal to 612 nm, preferably greater than or equal to 615 nm in a photoluminescence (PL) spectrum and comprises a metal selected from a metal with a relative atomic mass greater than 40 and a ligand $L_a$ which has a structure represented by Formula 1:

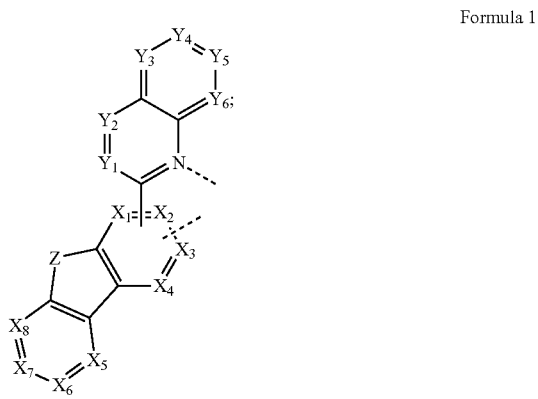

Formula 1 wherein,
Z is selected from O;
$X_1$ to $X_8$ are, at each occurrence identically or differently, selected from C, $CR_x$ or N;
$Y_1$ to $Y_6$ are, at each occurrence identically or differently, selected from $CR_y$ or N;
$R_x$ and $R_y$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof;
adjacent substituents $R_x$ can be optionally joined to form a ring.

According to an embodiment of the present disclosure, disclosed is a metal complex which comprises a metal selected from a metal with a relative atomic mass greater than 40 and a ligand $L_a$ which has a structure represented by Formula 1':

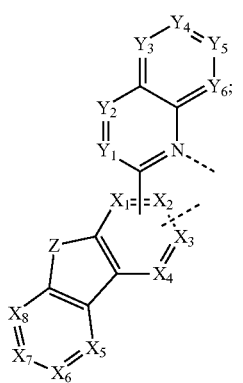

Formula 1' wherein,

Z is selected from O, S or Se;

$X_1$ to $X_8$ are, at each occurrence identically or differently, selected from C, $CR_x$ or N;

$Y_1$ to $Y_6$ are, at each occurrence identically or differently, selected from $CR_{y1}$, $CR_{y2}$ or N; wherein at least one of $Y_1$ to $Y_6$ is selected from $CR_{y2}$, and the $R_{y2}$ has a structure of $-L-SiR_{s1}R_{s2}R_{s3}$;

$R_x$, $R_{y1}$, $R_{s1}$, $R_{s2}$ and $R_{s3}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof;

L is selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or a combination thereof;

adjacent substituents $R_x$, $R_{s1}$, $R_{s2}$, $R_{s3}$ can be optionally joined to form a ring.

According to another embodiment of the present disclosure, further disclosed is an electroluminescent device which comprises an anode, a cathode and an organic layer disposed between the anode and the cathode, wherein the organic layer comprises a metal complex whose specific structure is as shown in any one of the preceding embodiments.

According to another embodiment of the present disclosure, further disclosed is a compound formulation which comprises the metal complex described above.

The novel metal complexes each having a ligand with a structure of Formula 1 or Formula 1', disclosed by the present disclosure, can be used as the light-emitting materials in the electroluminescent devices. These novel metal complexes can effectively adjust the light-emitting color to deep red, can improve the external quantum efficiency of the devices while maintaining a relatively narrow FWHM, and can provide the better device performance.

DETAILED DESCRIPTION

Figure 1:
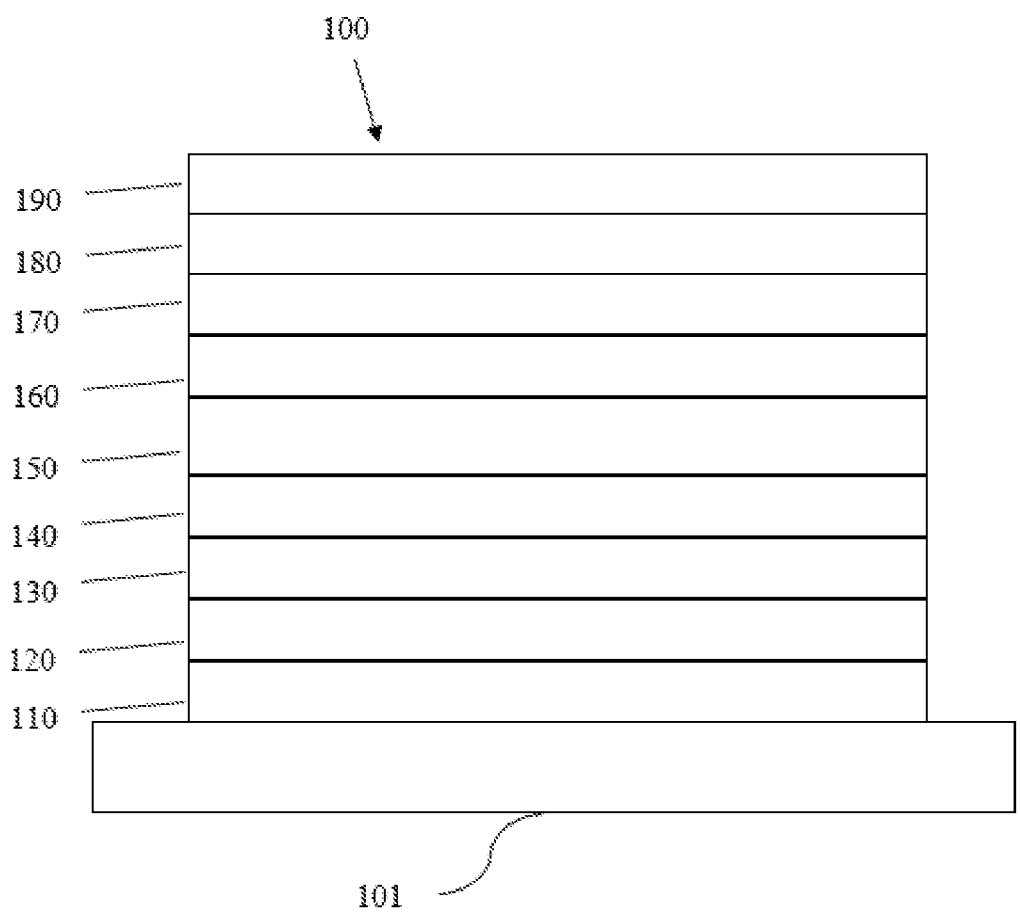
FIG. 1 is a schematic diagram of an organic light-emitting apparatus that may include a metal complex and a compound formulation disclosed by the present disclosure.

OLEDs can be fabricated on various types of substrates such as glass, plastic, and metal foil. FIG. 1 schematically shows an organic light emitting device 100 without limitation. The figures are not necessarily drawn to scale. Some of the layers in the figures can also be omitted as needed. Device 100 may include a substrate 101, an anode 110, a hole injection layer 120, a hole transport layer 130, an electron blocking layer 140, an emissive layer 150, a hole blocking layer 160, an electron transport layer 170, an electron injection layer 180 and a cathode 190. Device 100 may be fabricated by depositing the layers described in order. The properties and functions of these various layers, as well as example materials, are described in more detail in U.S. Pat. No. 7,279,704 at cols. 6-10, the contents of which are incorporated by reference herein in its entirety.

More examples for each of these layers are available. For example, a flexible and transparent substrate-anode combination is disclosed in U.S. Pat. No. 5,844,363, which is incorporated by reference herein in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference herein in its entirety. Examples of host materials are disclosed in U.S. Pat. No. 6,303,238 to Thompson et al., which is incorporated by reference herein in its entirety. An example of an n-doped electron transport layer is BPhen doped with Li at a molar ratio of 1:1, as disclosed in U.S. Patent Application Publication No. 2003/0230980, which is incorporated by reference herein in its entirety. U.S. Pat. Nos. 5,703,436 and 5,707,745, which are incorporated by reference herein in their entireties, disclose examples of cathodes including composite cathodes having a thin layer of metal such as Mg:Ag with an overlying transparent, electrically-conductive, sputter-deposited ITO layer. The theory and use of blocking layers are described in more detail in U.S. Pat. No. 6,097,147 and U.S. Patent Application Publication No. 2003/0230980, which are incorporated by reference herein in their entireties. Examples of injection layers are provided in U.S. Patent Application Publication No. 2004/0174116, which is incorporated by reference herein in its entirety. A description of protective layers may be found in U.S. Patent Application Publication No. 2004/0174116, which is incorporated by reference herein in its entirety.

The layered structure described above is provided by way of non-limiting examples. Functional OLEDs may be achieved by combining the various layers described in different ways, or layers may be omitted entirely. It may also include other layers not specifically described. Within each layer, a single material or a mixture of multiple materials can be used to achieve optimum performance. Any functional layer may include several sublayers. For example, the emissive layer may have two layers of different emitting materials to achieve desired emission spectrum.

In one embodiment, an OLED may be described as having an "organic layer" disposed between a cathode and an anode. This organic layer may comprise a single layer or multiple layers.

Figure 2:
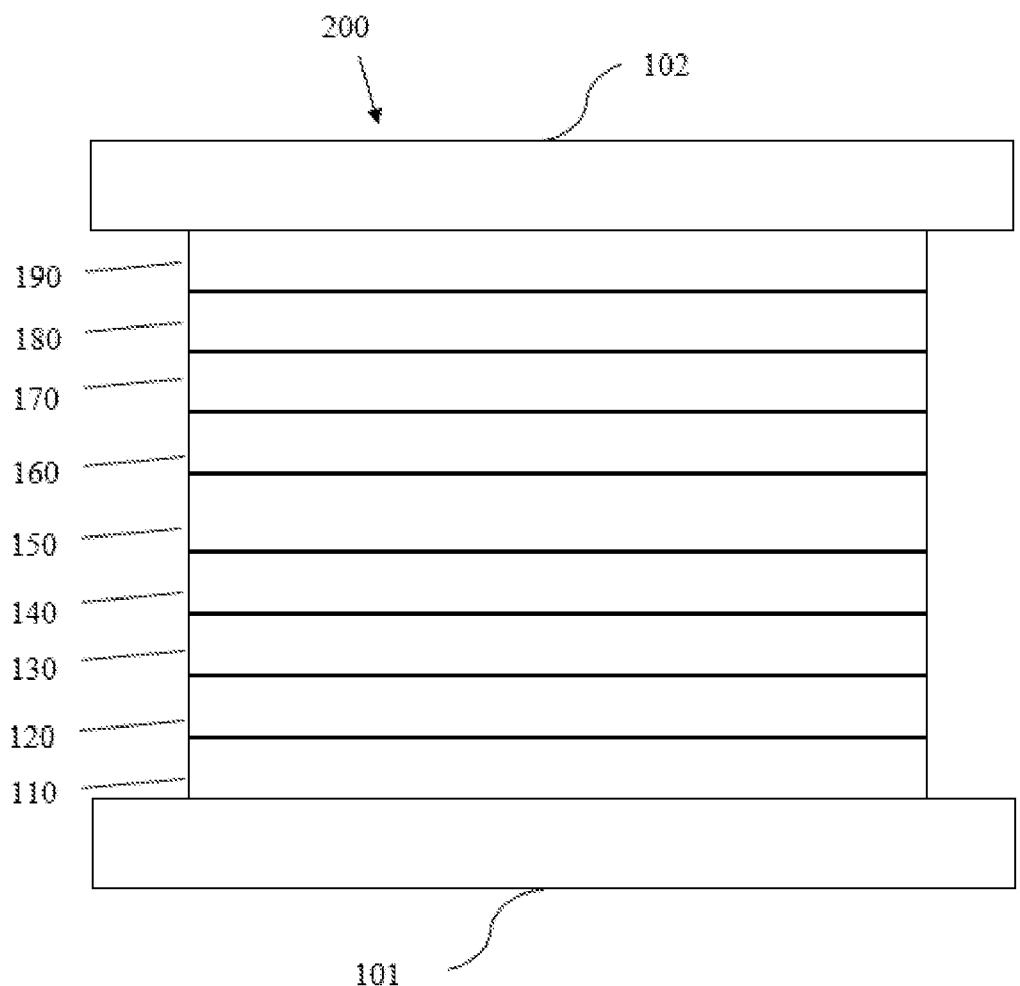
FIG. 2 is a schematic diagram of another organic light-emitting apparatus that may include a metal complex and a compound formulation disclosed by the present disclosure.

An OLED can be encapsulated by a barrier layer. FIG. 2 schematically shows an organic light emitting device 200 without limitation. FIG. 2 differs from FIG. 1 in that the organic light emitting device include a barrier layer 102, which is above the cathode 190, to protect it from harmful species from the environment such as moisture and oxygen. Any material that can provide the barrier function can be used as the barrier layer such as glass or organic-inorganic hybrid layers. The barrier layer should be placed directly or indirectly outside of the OLED device. Multilayer thin film encapsulation was described in U.S. Pat. No. 7,968,146, which is incorporated by reference herein in its entirety.

Devices fabricated in accordance with embodiments of the present disclosure can be incorporated into a wide variety of consumer products that have one or more of the electronic component modules (or units) incorporated therein. Some examples of such consumer products include flat panel displays, monitors, medical monitors, televisions, billboards, lights for interior or exterior illumination and/or signaling, heads-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

The materials and structures described herein may be used in other organic electronic devices listed above.

As used herein, "top" means furthest away from the substrate, while "bottom" means closest to the substrate. Where a first layer is described as "disposed over" a second layer, the first layer is disposed further away from the substrate. There may be other layers between the first and second layers, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the transition between the triplet states and the singlet excited states. Compounds that are capable of generating E-type delayed fluorescence are required to have very small singlet-triplet gaps to convert between energy states. Thermal energy can activate the transition from the triplet state back to the singlet state. This type of delayed fluorescence is also known as thermally activated delayed fluorescence (TADF). A distinctive feature of TADF is that the delayed component increases as temperature rises. If the reverse intersystem crossing rate is fast enough to minimize the non-radiative decay from the triplet state, the fraction of back populated singlet excited states can potentially reach 75%. The total singlet fraction can be 100%, far exceeding 25% of the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap ($\Delta E_{S-T}$). Organic, non-metal containing, donor-acceptor luminescent materials may be able to achieve this. The emission in these materials is generally characterized as a donor-acceptor charge-transfer (CT) type emission. The spatial separation of the HOMO and LUMO in these donor-acceptor type compounds generally results in small $\Delta E_{S-T}$. These states may involve CT states. Generally, donor-acceptor luminescent materials are constructed by connecting an electron donor moiety such as amino- or carbazole-derivatives and an electron acceptor moiety such as N-containing six-membered aromatic rings.

Definition of Terms of Substituents

Halogen or halide—as used herein includes fluorine, chlorine, bromine, and iodine.

Alkyl—as used herein includes both straight and branched chain alkyl groups. Alkyl may be alkyl having 1 to 20 carbon atoms, preferably alkyl having 1 to 12 carbon atoms, and more preferably alkyl having 1 to 6 carbon atoms. Examples of alkyl groups include a methyl group, an ethyl group, a propyl group, an isopropyl group, a n-butyl group, an s-butyl group, an isobutyl group, a t-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, a neopentyl group, a 1-methylpentyl group, a 2-methylpentyl group, a 1-pentylhexyl group, a 1-butylpentyl group, a 1-heptyloctyl group, and a 3-methylpentyl group. Additionally, the alkyl may be optionally substituted. Of the above, preferred are a methyl group, an ethyl group, a propyl group, an isopropyl group, a n-butyl group, an s-butyl group, an isobutyl group, a t-butyl group, an n-pentyl group, a neopentyl group, and an n-hexyl group. Additionally, the alkyl group may be optionally substituted.

Cycloalkyl—as used herein includes cyclic alkyl groups. The cycloalkyl groups may be those having 3 to 20 ring carbon atoms, preferably those having 4 to 10 carbon atoms. Examples of cycloalkyl include cyclobutyl, cyclopentyl, cyclohexyl, 4-methylcyclohexyl, 4,4-dimethylcylcohexyl, 1-adamantyl, 2-adamantyl, 1-norbornyl, 2-norbornyl, and the like. Of the above, preferred are cyclopentyl, cyclohexyl, 4-methylcyclohexyl, and 4,4-dimethylcylcohexyl. Additionally, the cycloalkyl group may be optionally substituted.

Heteroalkyl—as used herein, includes a group formed by replacing one or more carbons in an alkyl chain with a hetero-atom(s) selected from the group consisting of a nitrogen atom, an oxygen atom, a sulfur atom, a selenium atom, a phosphorus atom, a silicon atom, a germanium atom, and a boron atom. Heteroalkyl may be those having 1 to 20 carbon atoms, preferably those having 1 to 10 carbon atoms, and more preferably those having 1 to 6 carbon atoms. Examples of heteroalkyl include methoxymethyl, ethoxymethyl, ethoxyethyl, methylthiomethyl, ethylthiomethyl, ethylthioethyl, methoxymethoxymethyl, ethoxymethoxymethyl, ethoxyethoxyethyl, hydroxymethyl, hydroxyethyl, hydroxypropyl, mercaptomethyl, mercaptoethyl, mercaptopropyl, aminomethyl, aminoethyl, aminopropyl, dimethylaminomethyl, trimethylsilyl, dimethylethylsilyl, dimethylisopropylsilyl, t-butyldimethylsilyl, triethylsilyl, triisopropylsilyl, trimethylsilylmethyl, trimethylsilylethyl, and trimethylsilylisopropyl. Additionally, the heteroalkyl group may be optionally substituted.

Alkenyl—as used herein includes straight chain, branched chain, and cyclic alkene groups. Alkenyl may be those having 2 to 20 carbon atoms, preferably those having 2 to 10 carbon atoms. Examples of alkenyl include vinyl, propenyl, 1-butenyl, 2-butenyl, 3-butenyl, 1,3-butandienyl, 1-methylvinyl, styryl, 2,2-diphenylvinyl, 1,2-diphenylvinyl, 1-methylallyl, 1,1-dimethylallyl, 2-methylallyl, 1-phenylallyl, 2-phenylallyl, 3-phenylallyl, 3,3-diphenylallyl, 1,2-dimethylallyl, 1-phenyl-1-butenyl, 3-phenyl-1-butenyl, cyclopentenyl, cyclopentadienyl, cyclohexenyl, cycloheptenyl, cycloheptatrienyl, cyclooctenyl, cyclooctatetraenyl, and norbornenyl. Additionally, the alkenyl group may be optionally substituted.

Alkynyl—as used herein includes straight chain alkynyl groups. Alkynyl may be those having 2 to 20 carbon atoms, preferably those having 2 to 10 carbon atoms. Examples of alkynyl groups include ethynyl, propynyl, propargyl, 1-butynyl, 2-butynyl, 3-butynyl, 1-pentynyl, 2-pentynyl, 3,3-dimethyl-1-butynyl, 3-ethyl-3-methyl-1-pentynyl, 3,3-diisopropyl-1-pentynyl, phenylethynyl, phenylpropynyl, etc. Of the above, preferred are ethynyl, propynyl, propargyl, 1-butynyl, 2-butynyl, 3-butynyl, 1-pentynyl, and phenylethynyl. Additionally, the alkynyl group may be optionally substituted.

Aryl or an aromatic group—as used herein includes non-condensed and condensed systems. Aryl may be those having 6 to 30 carbon atoms, preferably those having 6 to 20 carbon atoms, and more preferably those having 6 to 12 carbon atoms. Examples of aryl groups include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Additionally, the aryl may be optionally substituted. Examples of non-condensed aryl groups include phenyl, biphenyl-2-yl, biphenyl-3-yl, biphenyl-4-yl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-(2-phenylpropyl)phenyl, 4'-methylbiphenylyl, 4"-t-butyl-p-terphenyl-4-yl, o-cumenyl, m-cumenyl, p-cumenyl, 2,3-xylyl, 3,4-xylyl, 2,5-xylyl, mesityl, and m-quarterphenyl. Additionally, the aryl group may be optionally substituted.

Heteroaryl—as used herein, includes non-condensed and condensed hetero-aromatic groups having 1 to 5 heteroatoms, wherein at least one hetero-atom is selected from the group consisting of a nitrogen atom, an oxygen atom, a sulfur atom, a selenium atom, a silicon atom, a phosphorus atom, a germanium atom, and a boron atom. A heteroaromatic group is also referred to as heteroaryl. Heteroaryl may be those having 3 to 30 carbon atoms, preferably those having 3 to 20 carbon atoms, and more preferably those having 3 to 12 carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridoindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indenoazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—as used herein, is represented by —O-alkyl, —O-cycloalkyl, or —O-heteroalkyl. Examples and preferred examples of alkyl, cycloalkyl, and heteroalkyl are the same as those described above. Alkoxy groups may be those having 1 to 20 carbon atoms, preferably those having 1 to 6 carbon atoms. Examples of alkoxy groups include methoxy, ethoxy, propoxy, butoxy, pentyloxy, hexyloxy, cyclopropyloxy, cyclobutyloxy, cyclopentyloxy, cyclohexyloxy, methoxypropyloxy, ethoxyethyloxy, methoxymethyloxy, and ethoxymethyloxy. Additionally, the alkoxy group may be optionally substituted.

Aryloxy—as used herein, is represented by —O-aryl or —O-heteroaryl. Examples and preferred examples of aryl and heteroaryl are the same as those described above. Aryloxy groups may be those having 6 to 30 carbon atoms, preferably those having 6 to 20 carbon atoms. Examples of aryloxy groups include phenoxy and biphenyloxy. Additionally, the aryloxy group may be optionally substituted.

Arylalkyl—as used herein, contemplates alkyl substituted with an aryl group. Arylalkyl may be those having 7 to 30 carbon atoms, preferably those having 7 to 20 carbon atoms, and more preferably those having 7 to 13 carbon atoms. Examples of arylalkyl groups include benzyl, 1-phenylethyl, 2-phenylethyl, 1-phenylisopropyl, 2-phenylisopropyl, phenyl-t-butyl, alpha-naphthylmethyl, 1-alpha-naphthylethyl, 2-alpha-naphthylethyl, 1-alpha-naphthylisopropyl, 2-alpha-naphthylisopropyl, beta-naphthylmethyl, 1-beta-naphthylethyl, 2-beta-naphthylethyl, 1-beta-naphthylisopropyl, 2-beta-naphthylisopropyl, p-methylbenzyl, m-methylbenzyl, o-methylbenzyl, p-chlorobenzyl, m-chlorobenzyl, o-chlorobenzyl, p-bromobenzyl, m-bromobenzyl, o-bromobenzyl, p-iodobenzyl, m-iodobenzyl, o-iodobenzyl, p-hydroxybenzyl, m-hydroxybenzyl, o-hydroxybenzyl, p-aminobenzyl, m-aminobenzyl, o-aminobenzyl, p-nitrobenzyl, m-nitrobenzyl, o-nitrobenzyl, p-cyanobenzyl, m-cyanobenzyl, o-cyanobenzyl, 1-hydroxy-2-phenylisopropyl, and 1-chloro-2-phenylisopropyl. Of the above, preferred are benzyl, p-cyanobenzyl, m-cyanobenzyl, o-cyanobenzyl, 1-phenylethyl, 2-phenyl ethyl, 1-phenylisopropyl, and 2-phenylisopropyl. Additionally, the arylalkyl group may be optionally substituted.

Alkylsilyl—as used herein, contemplates a silyl group substituted with an alkyl group. Alkylsilyl groups may be those having 3 to 20 carbon atoms, preferably those having 3 to 10 carbon atoms. Examples of alkylsilyl groups include trimethylsilyl, triethylsilyl, methyldiethylsilyl, ethyldimethylsilyl, tripropylsilyl, tributylsilyl, triisopropylsilyl, methyldiisopropylsilyl, dimethylisopropylsilyl, tri-t-butylsilyl, triisobutylsilyl, dimethyl t-butylsilyl, and methyl di-t-butylsilyl. Additionally, the alkylsilyl group may be optionally substituted.

Arylsilyl—as used herein, contemplates a silyl group substituted with at least one aryl group. Arylsilyl groups may be those having 6 to 30 carbon atoms, preferably those having 8 to 20 carbon atoms. Examples of arylsilyl groups include triphenylsilyl, phenyldibiphenylylsilyl, diphenylbiphenylsilyl, phenyldiethylsilyl, diphenylethylsilyl, phenyldimethylsilyl, diphenylmethylsilyl, phenyldiisopropylsilyl, diphenylisopropylsilyl, diphenylbutylsilyl, diphenylisobutylsilyl, diphenyl t-butylsilyl, tri-t-butylsilyl, dimethyl t-butylsilyl, methyl di-t-butylsilyl. Additionally, the arylsilyl group may be optionally substituted.

The term "aza" in azadibenzofuran, aza-dibenzothiophene, etc. means that one or more of the C—H groups in the respective aromatic fragment are replaced by a nitrogen atom. For example, azatriphenylene encompasses dibenzo[f,h]quinoxaline, dibenzo[f,h]quinoline and other analogues with two or more nitrogens in the ring system. One of ordinary skill in the art can readily envision other nitrogen analogs of the aza-derivatives described above, and all such analogs are intended to be encompassed by the terms as set forth herein.

In the present disclosure, unless otherwise defined, when any term of the group consisting of substituted alkyl, substituted cycloalkyl, substituted heteroalkyl, substituted arylalkyl, substituted alkoxy, substituted aryloxy, substituted alkenyl, substituted alkynyl, substituted aryl, substituted heteroaryl, substituted alkylsilyl, substituted arylsilyl, substituted amine, substituted acyl, substituted carbonyl, substituted carboxylic acid group, substituted ester group, substituted sulfinyl, substituted sulfonyl and substituted phosphino is used, it means that any group of alkyl, cycloalkyl, heteroalkyl, arylalkyl, alkoxy, aryloxy, alkenyl, alkynyl, aryl, heteroaryl, alkylsilyl, arylsilyl, amine, acyl, carbonyl, carboxylic acid group, ester group, sulfinyl, sulfonyl and phosphino may be substituted with one or more groups selected from the group consisting of deuterium, a halogen, an unsubstituted alkyl group having 1 to 20 carbon atoms, an unsubstituted cycloalkyl group having 3 to 20 ring carbon atoms, an unsubstituted heteroalkyl group having 1 to 20 carbon atoms, an unsubstituted arylalkyl group having 7 to 30 carbon atoms, an unsubstituted alkoxy group having 1 to 20 carbon atoms, an unsubstituted aryloxy group having 6 to 30 carbon atoms, an unsubstituted alkenyl group having 2 to 20 carbon atoms, an unsubstituted alkynyl group having 2 to 20 carbon atoms, an unsubstituted aryl group having 6 to 30 carbon atoms, an unsubstituted heteroaryl group having 3 to 30 carbon atoms, an unsubstituted alkylsilyl group having 3 to 20 carbon atoms, an unsubstituted arylsilyl group having 6 to 20 carbon atoms, an unsubstituted amino group having 0 to 20 carbon atoms, an acyl group, a carbonyl group, a carboxylic acid group, an ester group, a cyano group, an isocyano group, a sulfanyl group, a sulfinyl group, a sulfonyl group and a phosphino group, and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In the compounds mentioned in the present disclosure, the hydrogen atoms can be partially or fully replaced by deuterium. Other atoms such as carbon and nitrogen can also be replaced by their other stable isotopes. The replacement by other stable isotopes in the compounds may be preferred due to its enhancements of device efficiency and stability.

In the compounds mentioned in the present disclosure, multiple substitutions refer to a range that includes a double substitution, up to the maximum available substitutions. When a substitution in the compounds mentioned in the present disclosure represents multiple substitutions (including di, tri, tetra substitutions etc.), that means the substituent may exist at a plurality of available substitution positions on its linking structure, the substituents present at a plurality of available substitution positions may be the same structure or different structures.

In the compounds mentioned in the present disclosure, adjacent substituents in the compounds cannot connect to form a ring unless otherwise explicitly defined, for example, adjacent substituents can be optionally joined to form a ring. In the compounds mentioned in the present disclosure, adjacent substituents can be optionally joined to form a ring, including both the case where adjacent substituents can be joined to form a ring, and the case where adjacent substituents are not joined to form a ring. When adjacent substituents can be optionally joined to form a ring, the ring formed may be monocyclic or polycyclic, as well as alicyclic, heteroalicyclic, aromatic or heteroaromatic. In such expression, adjacent substituents may refer to substituents bonded to the same atom, substituents bonded to carbon atoms which are directly bonded to each other, or substituents bonded to carbon atoms which are more distant from each other. Preferably, adjacent substituents refer to substituents bonded to the same carbon atom and substituents bonded to carbon atoms which are directly bonded to each other.

The expression that adjacent substituents can be optionally joined to form a ring is also intended to mean that two substituents bonded to the same carbon atom are joined to each other via a chemical bond to form a ring, which can be exemplified by the following formula:

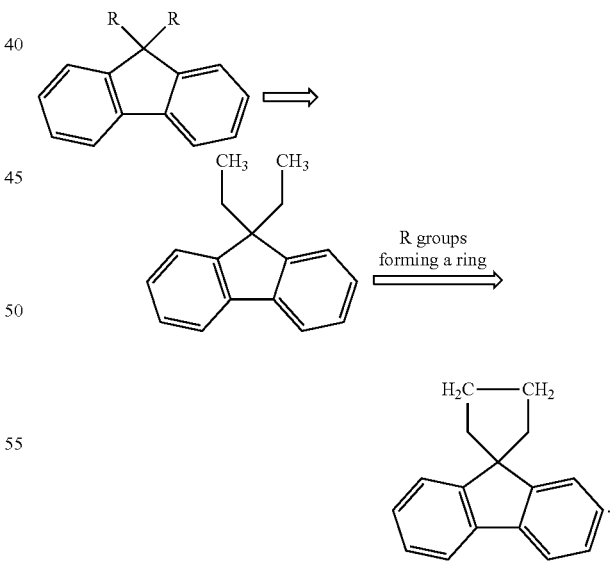

The expression that adjacent substituents can be optionally joined to form a ring is also intended to mean that two substituents bonded to carbon atoms which are directly bonded to each other are joined to each other via a chemical bond to form a ring, which can be exemplified by the following formula:

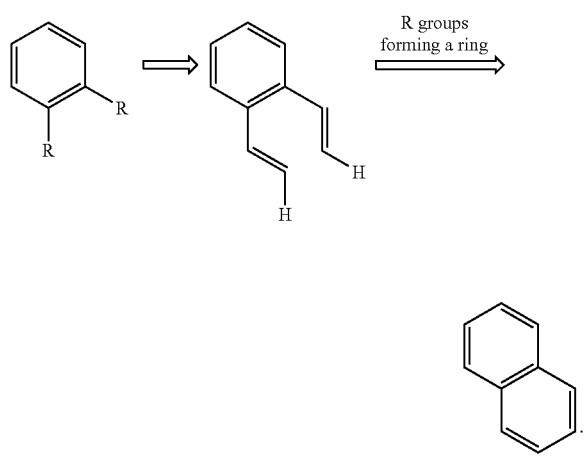

Furthermore, the expression that adjacent substituents can be optionally joined to form a ring is also intended to mean that, in the case where one of the two substituents bonded to carbon atoms which are directly bonded to each other represents hydrogen, the second substituent is bonded at a position at which the hydrogen atom is bonded, thereby forming a ring. This is exemplified by the following formula:

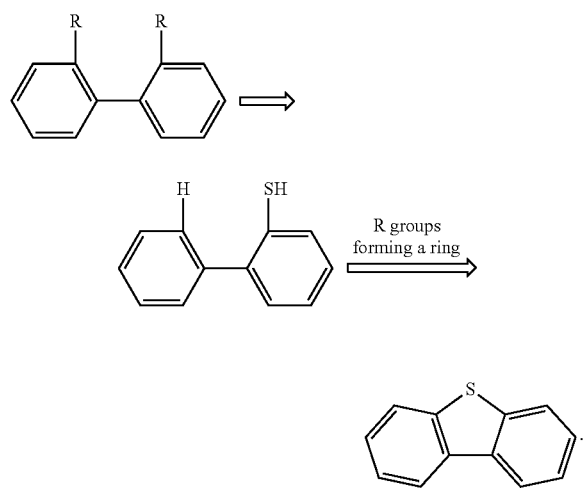

According to an embodiment of the present disclosure, disclosed is a metal complex which has a maximum emission wavelength greater than or equal to 612 nm, preferably greater than or equal to 615 nm in a photoluminescence (PL) spectrum and comprises a metal selected from a metal with a relative atomic mass greater than 40 and a ligand $L_a$ which has a structure represented by Formula 1:

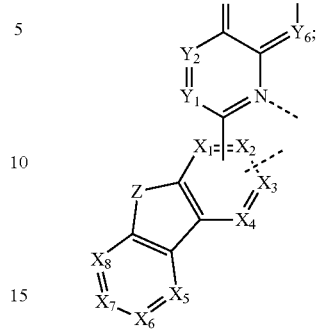

Formula 1 wherein,

Z is selected from O;

$X_1$ to $X_8$ are, at each occurrence identically or differently, selected from C, $CR_x$ or N;

$Y_1$ to $Y_6$ are, at each occurrence identically or differently, selected from $CR_y$ or N;

$R_x$ and $R_y$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof;

adjacent substituents $R_x$ can be optionally joined to form a ring.

In the present disclosure, the expression that adjacent substituents $R_x$ can be optionally joined to form a ring is intended to mean that in the presence of multiple substituents $R_x$, any adjacent substituents $R_x$ can be joined to form a ring. Obviously, in the presence of multiple substituents $R_x$, any adjacent substituents $R_x$ may not be joined to form a ring. Any adjacent substituents $R_y$ are not joined to form a ring.

In this embodiment, the expression that the metal complex has a maximum emission wavelength greater than or equal to 612 nm in the photoluminescence spectrum (PL) means that when the metal complex is dissolved in anhydrous dichloromethane and formulated into a solution with a concentration of $3\times10^{-5}$ mol/L and then measured for the photoluminescence spectrum (PL) using a fluorescence spectrophotometer at room temperature (298 K), the maximum emission wavelength of the metal complex in the photoluminescence spectrum is greater than or equal to 612 nm. Preferably, the metal complex has a maximum emission wavelength greater than or equal to 615 nm in the photoluminescence spectrum. More preferably, the metal complex has a maximum emission wavelength greater than or equal to 618 nm in the photoluminescence spectrum.

According to an embodiment of the present disclosure, wherein in Formula 1, at least one of $X_1$ to $X_8$ and $Y_1$ to $Y_6$ is selected from $CR_x$ or $CR_y$; and the $R_x$ and $R_y$ are, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof.

In this embodiment, the expression that at least one of $X_1$ to $X_8$ and $Y_1$ to $Y_6$ is selected from $CR_x$ or $CR_y$ means that at least one of $X_1$ to $X_8$ is selected from $CR_x$ or at least one of $Y_1$ to $Y_6$ is selected from $CR_y$, and $R_x$ and $R_y$ are, at each occurrence identically or differently, selected from the group of substituents except hydrogen.

According to an embodiment of the present disclosure, wherein in Formula 1, at least two or three of $X_1$ to $X_8$ and $Y_1$ to $Y_6$ are selected from $CR_x$ and/or $CR_y$; and the $R_x$ and $R_y$ are, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof.

In this embodiment, the expression that at least two or three of $X_1$ to $X_8$ and $Y_1$ to $Y_6$ are selected from $CR_x$ and/or $CR_y$ means that $X_1$ to $X_8$ and $Y_1$ to $Y_6$ include at least any one or more of the following cases: (1) at least two of $X_1$ to $X_8$ are selected from $CR_x$; (2) at least two of $Y_1$ to $Y_6$ are selected from $CR_y$; (3) at least two of $X_1$ to $X_8$ are selected from $CR_x$ and at least one of $Y_1$ to $Y_6$ is selected from $CR_y$; (4) at least one of $X_1$ to $X_8$ is selected from $CR_x$ and at least two of $Y_1$ to $Y_6$ are selected from $CR_y$; (5) at least three of $X_1$ to $X_8$ are selected from $CR_x$; (6) at least three of $Y_1$ to $Y_6$ are selected from $CR_y$; (7) at least one of $X_1$ to $X_8$ is selected from $CR_x$ and at least one of $Y_1$ to $Y_6$ is selected from $CR_y$.

In any one of the above cases, $R_x$ and $R_y$ are, at each occurrence identically or differently, selected from the group of substituents except hydrogen.

According to an embodiment of the present disclosure, wherein the metal complex further comprises a ligand $L_b$ which has a structure represented by the following formula:

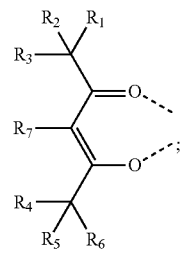

wherein $R_1$ to $R_7$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

preferably, wherein at least one or two of $R_1$ to $R_3$ are selected from substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or a combination thereof; and/or at least one of $R_4$ to $R_6$ is substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or a combination thereof;

more preferably, wherein at least two of $R_1$ to $R_3$ are selected from substituted or unsubstituted alkyl having 2 to 20 carbon atoms, substituted or unsubstituted cycloalkyl having 3 to 20 ring carbon atoms, substituted or unsubstituted heteroalkyl having 2 to 20 carbon atoms or a combination thereof; and/or at least two of $R_4$ to $R_6$ are selected from substituted or unsubstituted alkyl having 2 to 20 carbon atoms, substituted or unsubstituted cycloalkyl having 3 to 20 ring carbon atoms, substituted or unsubstituted heteroalkyl having 2 to 20 carbon atoms or a combination thereof.

According to an embodiment of the present disclosure, wherein in Formula 1, $Y_1$ to $Y_6$ are, at each occurrence identically or differently, selected from $CR_{y1}$, $CR_{y2}$ or N; and at least one of $Y_1$ to $Y_6$ is selected from $CR_{y2}$, wherein the $R_{y2}$ has a structure of $-L-SiR_{s1}R_{s2}R_{s3}$;

$R_{y1}$, $R_{s1}$, $R_{s2}$ and $R_{s3}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof;

L is selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or a combination thereof;

adjacent substituents $R_{s1}$, $R_{s2}$, $R_{s3}$ can be optionally joined to form a ring.

In this embodiment, the expression that adjacent substituents $R_{s1}$, $R_{s2}$, $R_{s3}$ can be optionally joined to form a ring is intended to mean that for groups of adjacent substituents, such as substituents $R_{s1}$ and $R_{s2}$, substituents $R_{s1}$ and $R_{s3}$, and substituents $R_{s2}$ and $R_{s3}$, any one or more of these groups of adjacent substituents can be joined to form a ring. Obviously, any of these groups of substituents may not be joined to form a ring.

According to an embodiment of the present disclosure, wherein in Formula 1, $Y_1$ to $Y_6$ are, at each occurrence identically or differently, selected from $CR_{y1}$, $CR_{y2}$ or N; and at least one of $Y_1$ to $Y_6$ is selected from $CR_{y1}$, wherein the $R_{y1}$ is fluorine.

According to an embodiment of the present disclosure, wherein in Formula 1, at least one of $Y_2$ to $Y_6$ is selected from $CR_{y1}$, wherein the $R_{y1}$ is fluorine.

According to an embodiment of the present disclosure, disclosed is a metal complex which comprises a metal selected from a metal with a relative atomic mass greater than 40 and a ligand $L_a$ which has a structure represented by Formula 1':

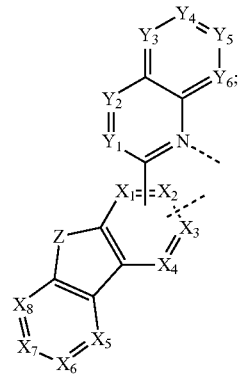

Formula 1' wherein,

Z is selected from O, S or Se;

$X_1$ to $X_8$ are, at each occurrence identically or differently, selected from C, $CR_x$ or N;

$Y_1$ to $Y_6$ are, at each occurrence identically or differently, selected from $CR_{y1}$, $CR_{y2}$ or N; wherein at least one of $Y_1$ to $Y_6$ is selected from $CR_{y2}$, and the $R_{y2}$ has a structure of $-L-SiR_{s1}R_{s2}R_{s3}$;

$R_x$, $R_{y1}$, $R_{s1}$, $R_{s2}$ and $R_{s3}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof;

L is selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or a combination thereof;

adjacent substituents $R_x$, $R_{s1}$, $R_{s2}$, $R_{s3}$ can be optionally joined to form a ring.

In the present disclosure, the expression that adjacent substituents $R_x$, $R_{s1}$, $R_{s2}$, $R_{s3}$ can be optionally joined to form a ring is intended to mean that for groups of adjacent substituents, such as two substituents $R_x$, substituents $R_{s1}$ and $R_{s2}$, substituents $R_{s1}$ and $R_{s3}$, and substituents $R_{s2}$ and $R_{s3}$, any one or more of these groups of adjacent substituents can be joined to form a ring. Obviously, any of these groups of substituents may not be joined to form a ring. Any adjacent substituents $R_{y1}$ are not joined to form a ring.

According to an embodiment of the present disclosure, wherein in Formula 1 or Formula 1', wherein two adjacent ones of $X_1$ to $X_4$ are C, and one of the two C is linked to the metal by a carbon-metal bond, one of $X_1$ to $X_4$ at an ortho position of the carbon-metal bond is selected from $CR_x$, and the $R_x$ is selected from deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group or a combination thereof.

In this embodiment, two adjacent ones of $X_1$ to $X_4$ are C, and one of the two C is linked to the metal by the carbon-metal bond, in this case, one of $X_1$ to $X_4$ at the ortho position of the carbon-metal bond is selected from $CR_x$, and the $R_x$ is selected from the group of substituents. For example, if the $X_1$ is C, and $X_2$ is also C and forms a carbon-metal bond with the metal, then $L_a$ has a structure of

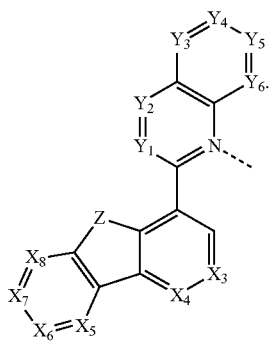

In this case, the one of $X_1$ to $X_4$ at the ortho position of the carbon-metal bond refers to $X_3$, $X_3$ is selected from $CR_x$, and the $R_x$ is selected from the group of substituents. In another case, for example, in Formula 1, if $X_2$ is C, and $X_1$ is also C and forms a carbon-metal bond with the metal, then $L_a$ has a structure of

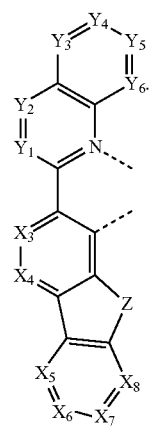

In this case, none of $X_1$ to $X_4$ is at the ortho position of the carbon-metal bond and can be substituted, which is obviously not a case included in this embodiment.

According to an embodiment of the present disclosure, wherein in Formula 1 or Formula 1', at least one of $X_1$ to $X_8$ and $Y_1$ to $Y_6$ is selected from $CR_x$ or $CR_{y1}$; and the $R_x$ and $R_{y1}$ are, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof.

In this embodiment, the expression that at least one of $X_1$ to $X_8$ and $Y_1$ to $Y_6$ is selected from $CR_x$ or $CR_{y1}$ means that at least one of $X_1$ to $X_8$ is selected from $CR_x$ or at least one of $Y_1$ to $Y_6$ is selected from $CR_{y1}$, and the $R_x$ and $R_{y1}$ are, at each occurrence identically or differently, selected from the group of substituents except hydrogen.

According to an embodiment of the present disclosure, wherein in Formula 1 or Formula 1', at least two or three of $X_1$ to $X_8$ and $Y_1$ to $Y_6$ are selected from $CR_x$ and/or $CR_{y1}$; and the $R_x$ and $R_{y1}$ are, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof.

In this embodiment, the expression that at least two or three of $X_1$ to $X_8$ and $Y_1$ to $Y_6$ are selected from $CR_x$ and/or $CR_{y1}$ means that $X_1$ to $X_8$ and $Y_1$ to $Y_6$ include at least one or more of the following cases: (1) at least two of $X_1$ to $X_8$ are selected from $CR_x$; (2) at least two of $Y_1$ to $Y_6$ are selected from $CR_{y1}$; (3) at least two of $X_1$ to $X_8$ are selected from $CR_x$ and at least one of $Y_1$ to $Y_6$ is selected from $CR_{y1}$; (4) at least one of $X_1$ to $X_8$ is selected from $CR_x$ and at least two of $Y_1$ to $Y_6$ are selected from $CR_{y1}$; (5) at least three of $X_1$ to $X_8$ are selected from $CR_x$; (6) at least three of $Y_1$ to $Y_6$ are selected from $CR_{y1}$; (7) at least one of $X_1$ to $X_8$ is selected from $CR_x$ and at least one of $Y_1$ to $Y_6$ is selected from $CR_{y1}$. In any one of the above cases, $R_x$ and $R_{y1}$ are, at each occurrence identically or differently, selected from the group of substituents except hydrogen.

According to an embodiment of the present disclosure, wherein in Formula 1 or Formula 1', $X_7$ is selected from $CR_x$ or N, wherein $R_x$ is selected from the group consisting of: hydrogen, deuterium, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof.

According to an embodiment of the present disclosure, wherein $L_a$ has a structure represented by Formula 2:

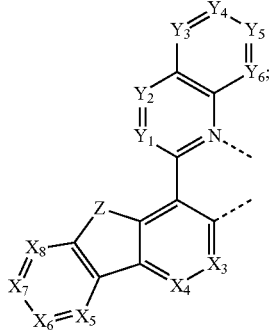

Formula 2 wherein,

Z is selected from O, S or Se;

$X_3$ to $X_8$ are, at each occurrence identically or differently, selected from $CR_x$ or N;

$Y_1$ to $Y_6$ are, at each occurrence identically or differently, selected from $CR_{y1}$, $CR_{y2}$ or N; wherein at least one of $Y_1$ to $Y_6$ is selected from $CR_{y2}$, and the $R_{y2}$ has a structure of $-L-SiR_{s1}R_{s2}R_{s3}$;

$R_x$, $R_{y1}$, $R_{s1}$, $R_{s2}$ and $R_3$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof;

L is selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or a combination thereof;

adjacent substituents $R_x$, $R_{s1}$, $R_{s2}$, $R_{s3}$ can be optionally joined to form a ring.

According to an embodiment of the present disclosure, wherein $Y_1$ and $Y_2$ are, at each occurrence identically or differently, selected from $CR_{y1}$ or N; $Y_3$ to $Y_6$ are, at each occurrence identically or differently, selected from $CR_{y1}$, $CR_{y2}$ or N, and at least one of $Y_3$ to $Y_6$ is selected from $CR_{y2}$, and the $R_{y2}$ has a structure of $-L-SiR_{s1}R_{s2}R_{s3}$;

$R_{y1}$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof;

$R_{s1}$, $R_{s2}$ and $R_{s3}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof;

L is selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or a combination thereof;

adjacent substituents $R_{s1}$, $R_{s2}$, $R_{s3}$ can be optionally joined to form a ring.

In the present disclosure, the expression that adjacent substituents $R_{s1}$, $R_{s2}$, $R_{s3}$ can be optionally joined to form a ring is intended to mean that for groups of adjacent substituents, such as substituents $R_{s1}$ and $R_{s2}$, substituents $R_{s1}$ and $R_{s3}$, and substituents $R_{s2}$ and $R_{s3}$, any one or more of these groups of adjacent substituents can be joined to form a ring. Obviously, any of these groups of substituents may not be joined to form a ring. Any adjacent substituents $R_{y1}$ are not joined to form a ring.

According to an embodiment of the present disclosure, wherein $Y_1$ and $Y_2$ are, at each occurrence identically or differently, selected from $CR_{y1}$ or N; and $R_{y1}$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof; and when the $R_{y1}$ is selected from substituted alkyl, substituted cycloalkyl, substituted heteroalkyl, substituted arylalkyl, substituted alkoxy, substituted aryloxy, substituted alkenyl, substituted aryl, substituted heteroaryl, substituted amino, substituted acyl, substituted carbonyl, a substituted carboxylic acid group, a substituted ester group, substituted sulfinyl, substituted sulfonyl, substituted phosphino, it refers to that any one group among alkyl, cycloalkyl, heteroalkyl, arylalkyl, alkoxy, aryloxy, alkenyl, aryl, heteroaryl, amino, acyl, carbonyl, a carboxylic acid group, an ester group, sulfinyl, sulfonyl and phosphino may be substituted by one or more selected from the group consisting of: deuterium, halogen, unsubstituted alkyl having 1 to 20 carbon atoms, unsubstituted cycloalkyl having 3 to 20 ring carbon atoms, unsubstituted heteroalkyl having 1 to 20 carbon atoms, unsubstituted arylalkyl having 7 to 30 carbon atoms, unsubstituted alkoxy having 1 to 20 carbon atoms, unsubstituted aryloxy having 6 to 30 carbon atoms, unsubstituted alkenyl having 2 to 20 carbon atoms, unsubstituted alkynyl having 2 to 20 carbon atoms, unsubstituted aryl having 6 to 30 carbon atoms, unsubstituted heteroaryl having 3 to 30 carbon atoms, unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group and combinations thereof.

According to an embodiment of the present disclosure, wherein $R_{s1}$, $R_{s2}$ and $R_{s3}$ are, at each occurrence identically or differently, selected from the group consisting of:

hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof;

adjacent substituents $R_{s1}$, $R_{s2}$, $R_{s3}$ can be optionally joined to form a ring.

According to an embodiment of the present disclosure, wherein $Y_1$ and $Y_2$ are, at each occurrence identically or differently, selected from $CR_{y1}$ or N; $Y_3$ to $Y_6$ are, at each occurrence identically or differently, selected from $CR_{y1}$, $CR_{y2}$ or N, and at least one of $Y_3$ to $Y_6$ is selected from $CR_{y2}$, and the $R_{y2}$ has a structure of -L-SiR$_{s1}$R$_{s2}$R$_{s3}$;

$R_{y1}$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof;

$R_{s1}$, $R_{s2}$ and $R_{s3}$ are, at each occurrence identically or differently, selected from the group consisting of: substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms and combinations thereof;

L is selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or a combination thereof;

adjacent substituents $R_{s1}$, $R_{s2}$, $R_{s3}$ can be optionally joined to form a ring.

According to an embodiment of the present disclosure, wherein the metal complex has a structure of $M(L_a)_m(L_b)_n(L_c)_q$;

wherein,
the metal M is selected from Ir, Rh, Re, Os, Pt, Au or Cu; preferably, the metal M is selected from Ir, Pt or Os;

$L_a$, $L_b$ and $L_c$ are the first ligand, the second ligand and the third ligand of the metal complex, respectively; m is selected from 1, 2 or 3, n is selected from 0, 1 or 2, q is selected from 0, 1 or 2, and m+n+q is equal to the oxidation state of the metal M; when m is greater than 1, the multiple $L_a$ are the same or different; when n is 2, the two $L_b$ are the same or different; when q is 2, the two $L_c$ are the same or different;

$L_a$, $L_b$ and $L_c$ can be optionally joined to form a multidentate ligand; for example, any two of $L_a$, $L_b$ and $L_c$ may be joined to form a tetradentate ligand; in another example, $L_a$, $L_b$ and $L_c$ may be joined to each other to form a hexadentate ligand;

$L_b$ and $L_c$ are, at each occurrence identically or differently, selected from the group consisting of the following structures:

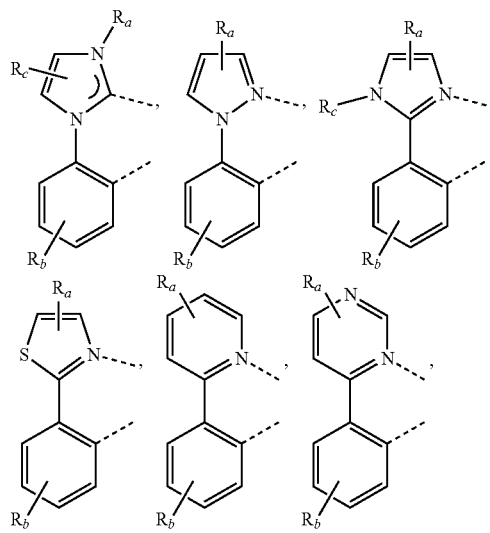

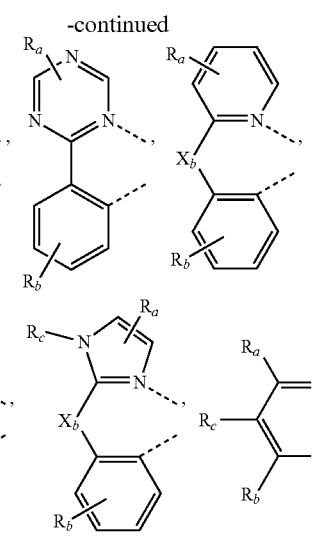

wherein,
$R_a$, $R_b$ and $R_c$ represent, at each occurrence identically or differently, mono-substitution, multiple substitutions or non-substitution;

$X_b$ is, at each occurrence identically or differently, selected from the group consisting of: O, S, Se, $NR_{N1}$ and $CR_{C1}R_{C2}$;

$X_c$ and $X_d$ are, at each occurrence identically or differently, selected from the group consisting of: O, S, Se and $NR_{N2}$;

$R_a$, $R_b$, $R_{N1}$, $R_{N2}$, $R_{C1}$ and $R_{C2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

wherein adjacent substituents $R_a$, $R_b$, $R_c$, $R_{N1}$, $R_{N2}$, $R_{C1}$ and $R_{C2}$ can be optionally joined to form a ring.

In this embodiment, the expression that adjacent substituents $R_a$, $R_b$, $R_c$, $R_{N1}$, $R_{N2}$, $R_{C1}$ and $R_{C2}$ can be optionally joined to form a ring is intended to mean that for groups of adjacent substituents, such as two substituents $R_a$, two substituents $R_b$, two substituents substituents $R_a$ and $R_b$, substituents $R_a$ and $R_c$, substituents $R_b$ and $R_c$, substituents $R_a$ and $R_{N1}$, substituents $R_b$ and $R_{N1}$, substituents $R_a$ and $R_{C1}$, substituents $R_a$ and $R_{C2}$, substituents $R_b$ and $R_{C1}$, substituents $R_b$ and $R_{C2}$, substituents $R_a$ and $R_{N2}$, substituents $R_b$ and $R_{N2}$, and substituents $R_{C1}$ and $R_{C2}$, any one or more of these groups of substituents may be joined to form a ring. Obviously, these substituents may not be joined to form a ring.

According to an embodiment of the present disclosure, wherein the metal complex has a structure of $M(L_a)_m(L_b)_n(L_c)_q$;

wherein the metal M is selected from Ir, Rh, Re, Os, Pt, Au or Cu;

$L_a$, $L_b$ and $L_c$ are the first ligand, the second ligand and the third ligand of the metal complex, respectively; m is selected from 1, 2 or 3, n is selected from 0, 1 or 2, q is selected from 0, 1 or 2, and m+n+q is equal to an oxidation state of the metal M; when m is greater than 1, the multiple $L_a$ may be the same or different; when n is 2, the two $L_b$ may be the same or different; when q is 2, the two $L_c$ may be the same or different; $L_a$, $L_b$ and $L_c$ can be optionally joined to form a multi-dentate ligand;

$L_b$ is, at each occurrence identically or differently, selected from the following structure:

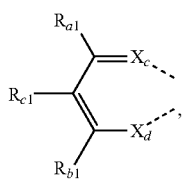

wherein $X_c$ and $X_d$ are, at each occurrence identically or differently, selected from the group consisting of: O, S, Se and $NR_{N2}$;

$R_{a1}$, $R_{b1}$, $R_{c1}$ and $R_{N2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents $R_{a1}$, $R_{b1}$, $R_{c1}$ can be optionally joined to form a ring;

$L_c$ is, at each occurrence identically or differently, selected from the group consisting of the following structures:

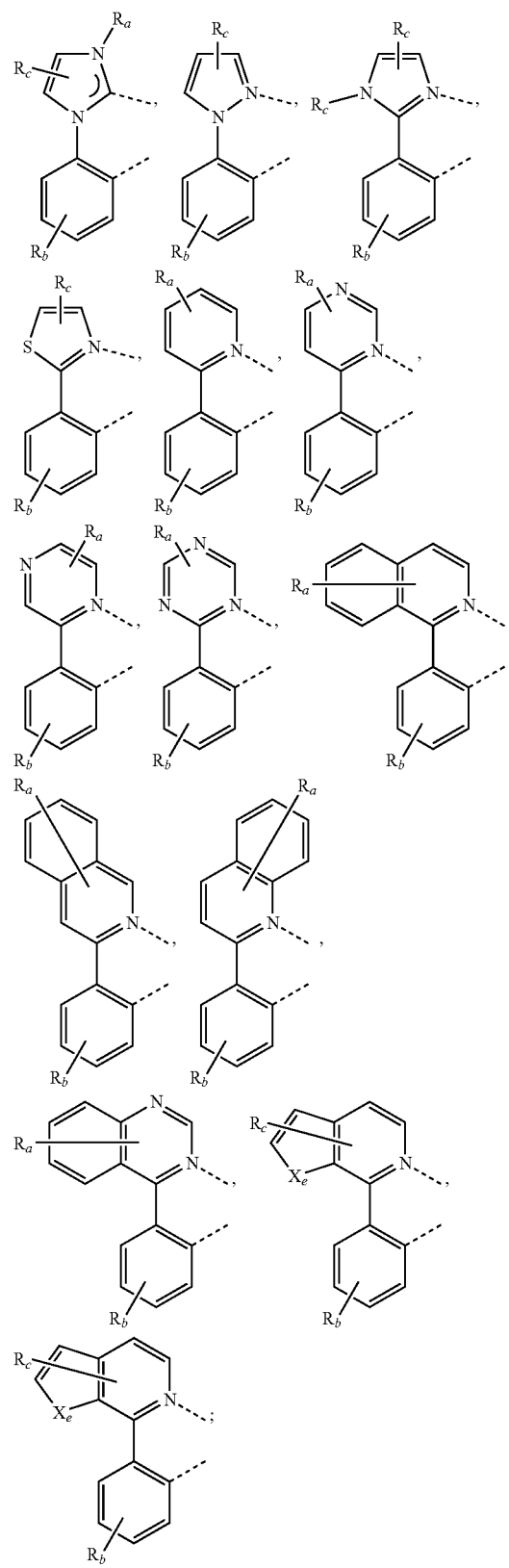

wherein $R_a$, $R_b$ and $R_c$ represent, at each occurrence identically or differently, mono-substitution, multiple substitutions or non-substitution;

$X_e$ is, at each occurrence identically or differently, selected from the group consisting of: O, S, Se and $NR_{N3}$;

$R_a$, $R_b$, $R_c$ and $R_{N3}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

wherein adjacent substituents $R_b$, $R_c$ can be optionally joined to form a ring.

In this embodiment, the expression that adjacent substituents $R_{a1}$, $R_{b1}$, $R_{c1}$ can be optionally joined to form a ring is intended to mean that substituents $R_{a1}$ and $R_{c1}$ or substituents $R_{b1}$ and $R_{c1}$ can be joined to form a ring. Obviously, the substituents $R_{a1}$ and $R_{c1}$ or the substituents $R_{b1}$ and $R_{c1}$ may not be joined to form a ring.

In this embodiment, the expression that adjacent substituents $R_b$, $R_c$ can be optionally joined to form a ring is intended to mean that in the presence of multiple substituents $R_b$, multiple substituents $R_c$, adjacent substituents $R_b$ or adjacent substituents $R_c$ can be joined to form a ring. Obviously, in the presence of multiple substituents $R_b$, multiple substituents adjacent substituents $R_b$ or adjacent substituents $R_c$ may not be joined to form a ring.

According to an embodiment of the present disclosure, wherein the metal M is selected from Ir, Pt or Os.

According to an embodiment of the present disclosure, wherein the metal M is Ir.

According to an embodiment of the present disclosure, wherein the metal complex has a structure represented by Formula 3:

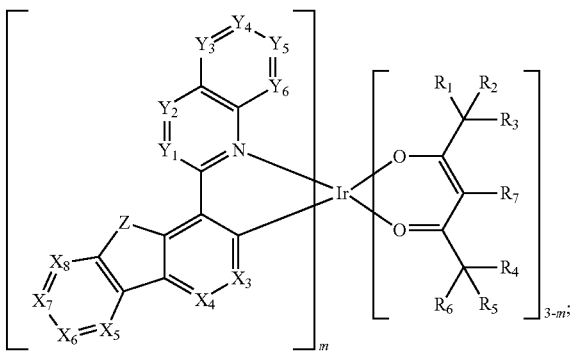

Formula 3 wherein, m is 1 or 2;

Z is, at each occurrence identically or differently, selected from O or S;

$X_3$ to $X_8$ are, at each occurrence identically or differently, selected from $CR_x$ or N;

$Y_1$ to $Y_6$ are, at each occurrence identically or differently, selected from $CR_{y1}$, $CR_{y2}$ or N; wherein at least one of $Y_1$ to $Y_6$ is selected from $CR_{y2}$, and the $R_{y2}$ has a structure of $-L-SiR_{s1}R_{s2}R_{s3}$;

$R_x$, $R_{y1}$, $R_{s1}$, $R_{s2}$, $R_{s3}$, $R_1$, $R_2$, $R_3$, $R_4$, $R_5$, $R_6$ and $R_7$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof;

L is selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or a combination thereof;

adjacent substituents $R_x$, $R_{s1}$, $R_{s2}$, $R_{s3}$ can be optionally joined to form a ring;

adjacent substituents $R_1$, $R_2$, $R_3$, $R_4$, $R_5$, $R_6$, $R_7$ can be optionally joined to form a ring.

In this embodiment, the expression that adjacent substituents $R_x$, $R_{s1}$, $R_{s2}$, $R_{s3}$ can be optionally joined to form a ring is intended to mean that for groups of adjacent substituents, such as two substituents $R_x$, substituents $R_{s1}$ and $R_{s2}$, substituents $R_{s1}$ and $R_{s3}$, and substituents $R_{s2}$ and $R_{s3}$, any one or more of these groups of substituents can be joined to form a ring. Obviously, any of these groups of substituents may not be joined to form a ring.

In this embodiment, the expression that adjacent substituents $R_1$, $R_2$, $R_3$, $R_4$, $R_5$, $R_6$, $R_7$ can be optionally joined to form a ring is intended to mean that for groups of adjacent substituents, such as substituents $R_1$ and $R_2$, substituents $R_1$ and $R_3$, substituents $R_2$ and $R_3$, substituents $R_4$ and $R_5$, substituents $R_5$ and $R_6$, substituents $R_4$ and $R_6$, substituents $R_1$ and $R_7$, substituents $R_2$ and $R_7$, substituents $R_3$ and $R_7$, substituents $R_4$ and $R_7$, substituents $R_5$ and $R_7$, and substituents $R_6$ and $R_7$, any one or more of these groups of substituents can be joined to form a ring. Obviously, any of these groups of substituents may not be joined to form a ring.

According to an embodiment of the present disclosure, wherein the metal complex has a structure represented by Formula 3:

Formula 3

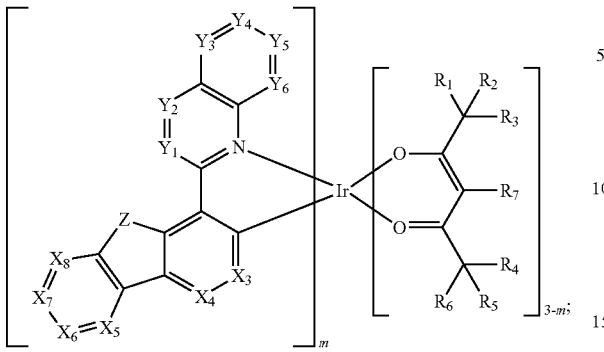

wherein, m is 1 or 2;

Z is, at each occurrence identically or differently, selected from O or S;

wherein $R_1$ to $R_7$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof.

According to an embodiment of the present disclosure, wherein the metal complex has a structure represented by Formula 3:

Formula 3

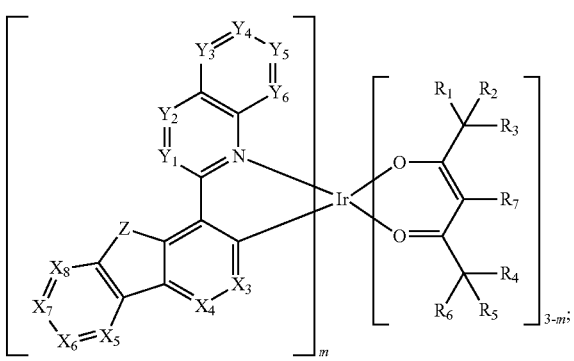

wherein, m is 1 or 2;

Z is, at each occurrence identically or differently, selected from O or S;

wherein at least one of $R_1$ to $R_3$ is selected from substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or a combination thereof; and/or at least one of $R_4$ to $R_6$ is substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or a combination thereof.

According to an embodiment of the present disclosure, wherein the metal complex has a structure represented by Formula 3:

Formula 3

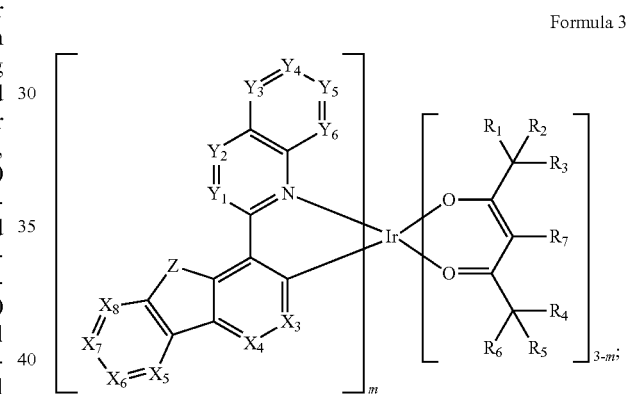

wherein, m is 1 or 2;

Z is, at each occurrence identically or differently, selected from O or S;

wherein at least two of $R_1$ to $R_3$ are selected from substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or a combination thereof; and/or at least one of $R_4$ to $R_6$ is substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or a combination thereof.

According to an embodiment of the present disclosure, wherein the metal complex has a structure represented by Formula 3:

Formula 3

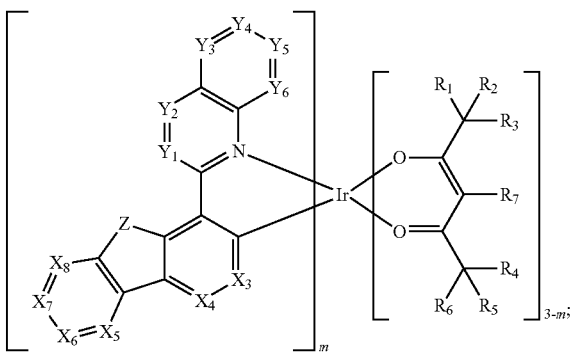

wherein, m is 1 or 2;

Z is, at each occurrence identically or differently, selected from O or S;

wherein at least two of $R_1$ to $R_3$ are selected from substituted or unsubstituted alkyl having 2 to 20 carbon atoms, substituted or unsubstituted cycloalkyl having 3 to 20 ring carbon atoms, substituted or unsubstituted heteroalkyl having 2 to 20 carbon atoms or a combination thereof; and/or at least two of $R_4$ to $R_6$ are selected from substituted or unsubstituted alkyl having 2 to 20 carbon atoms, substituted or unsubstituted cycloalkyl having 3 to 20 ring carbon atoms, substituted or unsubstituted heteroalkyl having 2 to 20 carbon atoms or a combination thereof.

According to an embodiment of the present disclosure, wherein in Formula 2 and/or Formula 3, $Y_1$ to $Y_6$ are each independently selected from $CR_{y1}$ or $CR_{y2}$.

According to an embodiment of the present disclosure, wherein in Formula 2 and/or Formula 3, at least one of $Y_1$ to $Y_6$ is selected from N.

According to an embodiment of the present disclosure, wherein in Formula 2 and/or Formula 3, Z is selected from O.

According to an embodiment of the present disclosure, wherein in Formula 2 and/or Formula 3, at least one of $X_3$ to $X_8$ is selected from N.

According to an embodiment of the present disclosure, wherein in Formula 2 and/or Formula 3, one of $X_3$ to $X_8$ is selected from N.

According to an embodiment of the present disclosure, wherein in Formula 2 and/or Formula 3, $X_8$ is N.

According to an embodiment of the present disclosure, wherein in Formula 2 and/or Formula 3, $X_3$ to $X_8$ are each independently selected from $CR_x$.

According to an embodiment of the present disclosure, wherein in Formula 2 and/or Formula 3, $X_3$ to $X_8$ are each independently selected from $CR_x$, and the $R_x$ is selected from hydrogen, deuterium, halogen, substituted or unsubstituted alkyl having 1 to 20 carbon atoms, substituted or unsubstituted cycloalkyl having 3 to 20 ring carbon atoms, substituted or unsubstituted alkylsilyl having 3 to 20 carbon atoms, substituted or unsubstituted arylsilyl having 6 to 20 carbon atoms or a combination thereof.

According to an embodiment of the present disclosure, wherein in Formula 2 and/or Formula 3, $X_3$ to $X_8$ are each independently selected from $CR_x$, and the $R_x$ is selected from the group consisting of: hydrogen, deuterium, fluorine, methyl, ethyl, isopropyl, isobutyl, t-butyl, neopentyl, cyclopentyl, cyclopentylmethyl, cyclohexyl, norbornyl, adamantyl, trimethylsilyl, isopropyldimethylsilyl, phenyldimethylsilyl, trifluoromethyl and combinations thereof.

According to an embodiment of the present disclosure, wherein in Formula 2 and/or Formula 3, $X_3$ is selected from $CR_x$, and the $R_x$ is selected from hydrogen, deuterium, halogen, substituted or unsubstituted alkyl having 1 to 20 carbon atoms, substituted or unsubstituted cycloalkyl having 3 to 20 ring carbon atoms, substituted or unsubstituted alkylsilyl having 3 to 20 carbon atoms, substituted or unsubstituted arylsilyl having 6 to 20 carbon atoms, or a combination thereof.

According to an embodiment of the present disclosure, wherein in Formula 2 and/or Formula 3, $X_3$ is selected from $CR_x$, and the $R_x$ is selected from deuterium, halogen, substituted or unsubstituted alkyl having 1 to 20 carbon atoms, substituted or unsubstituted cycloalkyl having 3 to 20 ring carbon atoms or a combination thereof.

According to an embodiment of the present disclosure, wherein in Formula 2 and/or Formula 3, $X_3$ is selected from $CR_x$, and the $R_x$ is selected from methyl or deuterated methyl.

According to an embodiment of the present disclosure, wherein $Y_2$ is selected from $CR_{y1}$ or $CR_{y2}$; the $R_{y1}$ is selected from the group consisting of: substituted or unsubstituted alkyl having 1 to 20 carbon atoms, substituted or unsubstituted cycloalkyl having 3 to 20 ring carbon atoms and combination thereof; the $R_{y2}$ has a structure of -L-$SiR_{s1}R_{s2}R_{s3}$; $R_{s1}$, $R_{s2}$ and $R_{s3}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof; L is selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or a combination thereof;

adjacent substituents $R_{s1}$, $R_{s2}$, $R_{s3}$ can be optionally joined to form a ring.

According to an embodiment of the present disclosure, wherein in Formula 2 and/or Formula 3, at least one of $Y_1$ to $Y_6$ is selected from $CR_{y2}$, and $R_{y2}$ has a structure of -L-$SiR_{s1}R_{s2}R_{s3}$, wherein L is selected from a single bond, and $R_{s1}$, $R_{s2}$ and $R_{s3}$ are each independently selected from the group consisting of: substituted or unsubstituted alkyl having 1 to 20 carbon atoms, substituted or unsubstituted cycloalkyl having 3 to 20 ring carbon atoms, substituted or unsubstituted aryl having 6 to 20 carbon atoms and combinations thereof.

According to an embodiment of the present disclosure, wherein in Formula 2 and/or Formula 3, $Y_2$ and/or $Y_4$ are selected from $CR_{y2}$; $R_{y2}$ has a structure of -L-$SiR_{s1}R_{s2}R_{s3}$, wherein L is selected from a single bond, and $R_{s1}$, $R_{s2}$ and $R_{s3}$ are each independently selected from the group consisting of: substituted or unsubstituted alkyl having 1 to 20 carbon atoms, substituted or unsubstituted cycloalkyl having 3 to 20 ring carbon atoms, substituted or unsubstituted aryl having 6 to 20 carbon atoms and combinations thereof; and at least one, two or three of $R_{s1}$, $R_{s2}$ and $R_{s3}$ are each independently selected from substituted or unsubstituted alkyl having 1 to 20 carbon atoms, substituted or unsubstituted cycloalkyl having 3 to 20 ring carbon atoms or a combination thereof.

According to an embodiment of the present disclosure, wherein in Formula 2 and/or Formula 3, at least one of $Y_1$ to $Y_6$ is selected from $CR_{y2}$, and $R_{y2}$ has a structure of -L-$SiR_{s1}R_{s2}R_{s3}$, wherein L is selected from a single bond, and $R_{s1}$, $R_{s2}$ and $R_{s3}$ are each independently selected from the group consisting of: methyl, ethyl, isopropyl, isobutyl, t-butyl, neopentyl, cyclopentyl, cyclopentylmethyl, cyclohexyl, norbornyl, adamantyl, trifluoromethyl, phenyl and combinations thereof.

According to an embodiment of the present disclosure, wherein in Formula 1 (or 1'), $Y_1$ to $Y_6$ are, at each occurrence identically or differently, selected from $CR_y$ (or $CR_{y1}$) or N; $R_y$ (or $R_{y1}$) is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof and when the $R_y$ (or $R_{y1}$) is selected from substituted alkyl having 1 to 20 carbon atoms, substituted cycloalkyl having 3 to 20 carbon atoms, or substituted heteroalkyl having 1 to 20 carbon atoms, the substitutions are selected from the group consisting of: hydrogen, deuterium, halogen, unsubstituted alkyl having 1 to 20 carbon atoms, unsubstituted cycloalkyl having 3 to 20 ring carbon atoms, unsubstituted heteroalkyl having 1 to 20 carbon atoms, unsubstituted arylalkyl having 7 to 30 carbon atoms, unsubstituted alkoxy having 1 to 20 carbon atoms, unsubstituted aryloxy having 6 to 30 carbon atoms, unsubstituted alkenyl having 2 to 20 carbon atoms, unsubstituted aryl having 6 to 30 carbon atoms, unsubstituted heteroaryl having 3 to 30 carbon atoms, unsubstituted alkylsilyl having 3 to 20 carbon atoms, unsubstituted arylsilyl having 6 to 20 carbon atoms, unsubstituted amino having 0 to 20 carbon atoms, an acyl group, a carbonyl group, a carboxylic acid group, an ester group, a hydroxyl group, a sulfanyl group, a sulfinyl group, a sulfonyl group, a phosphino group and combinations thereof.

According to an embodiment of the present disclosure, wherein in Formula 1 or 1', $X_1$ to $X_8$ are, at each occurrence identically or differently, selected from C, $CR_x$ or N; $R_x$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a hydroxyl group, a sulfanyl group, a sulfinyl group, a sulfonyl group, a phosphino group and combinations thereof.

According to an embodiment of the present disclosure, wherein $L_a$ is, at each occurrence identically or differently, selected from any one of the group consisting of $L_{a1}$ to $L_{a108}$, $L_{a133}$ to $L_{a231}$, $L_{a254}$ to $L_{a297}$, $L_{a320}$ to $L_{a411}$, $L_{a436}$ to $L_{a531}$, $L_{a556}$ to $L_{a603}$, $L_{a628}$ to $L_{a726}$, $L_{a728}$ to $L_{a775}$, $L_{a800}$ to $L_{a883}$, $L_{a908}$ to $L_{a955}$, $L_{a980}$ to $L_{a1027}$, $L_{a1052}$ to $L_{a1099}$, $L_{a1124}$ to $L_{a1212}$, $L_{a1214}$ to $L_{a1237}$, $L_{a1250}$ to $L_{a1303}$, $L_{a1328}$ to $L_{a1363}$, $L_{a1376}$ to $L_{a1387}$, $L_{a1394}$ to $L_{a1405}$, $L_{a1412}$ to $L_{a1423}$, $L_{a1430}$ to $L_{a1441}$, $L_{a1448}$ to $L_{a1459}$, $L_{a1466}$ to $L_{a1477}$, $L_{a1484}$ to $L_{a1489}$, $L_{a1496}$ to $L_{a1501}$, $L_{a1508}$ to $L_{a1521}$, $L_{a1523}$ to $L_{a1526}$ and $L_{a1528}$ to $L_{a1539}$, wherein the specific structures of $L_{a1}$ to $L_{a108}$, $L_{a133}$ to $L_{a231}$, $L_{a254}$ to $L_{a297}$, $L_{a320}$ to $L_{a411}$, $L_{a436}$ to $L_{a531}$, $L_{a556}$ to $L_{a603}$, $L_{a628}$ to $L_{a726}$, $L_{a728}$ to $L_{a775}$, $L_{a800}$ to $L_{a883}$, $L_{a908}$ to $L_{a955}$, $L_{a980}$ to $L_{a1027}$, $L_{a1052}$ to $L_{a1099}$, $L_{a1124}$ to $L_{a1212}$, $L_{a1214}$ to $L_{a1237}$, $L_{a1250}$ to $L_{a1303}$, $L_{a1328}$ to $L_{a1363}$, $L_{a1376}$ to $L_{a1387}$, $L_{a1394}$ to $L_{a1405}$, $L_{a1412}$ to $L_{a1423}$, $L_{a1430}$ to $L_{a1441}$, $L_{a1448}$ to $L_{a1459}$, $L_{a1466}$ to $L_{a1477}$, $L_{a1484}$ to $L_{a1489}$, $L_{a1496}$ to $L_{a1501}$, $L_{a1508}$ to $L_{a1521}$, $L_{a1523}$ to $L_{a1526}$ and $L_{a1528}$ to $L_{a1539}$ are referred to claim 20.

In this embodiment, $L_a$ is, at each occurrence identically or differently, selected from any one of the group consisting of $L_{a1}$ to $L_{a108}$, $L_{a133}$ to $L_{a231}$, $L_{a254}$ to $L_{a297}$, $L_{a320}$ to $L_{a411}$, $L_{a436}$ to $L_{a531}$, $L_{a556}$ to $L_{a603}$, $L_{a628}$ to $L_{a726}$, $L_{a728}$ to $L_{a775}$, $L_{a800}$ to $L_{a883}$, $L_{a908}$ to $L_{a955}$, $L_{a980}$ to $L_{a1027}$, $L_{a1052}$ to $L_{a1099}$, $L_{a1124}$ to $L_{a1212}$, $L_{a1214}$ to $L_{a1237}$, $L_{a1250}$ to $L_{a1303}$, $L_{a1328}$ to $L_{a1363}$, $L_{a1376}$ to $L_{a1387}$, $L_{a1394}$ to $L_{a1405}$, $L_{a1412}$ to $L_{a1423}$, $L_{a1430}$ to $L_{a1441}$, $L_{a1448}$ to $L_{a1459}$, $L_{a1466}$ to $L_{a1477}$, $L_{a1484}$ to $L_{a1489}$, $L_{a1496}$ to $L_{a1501}$, $L_{a1508}$ to $L_{a1521}$, $L_{a1523}$ to $L_{a1526}$ and $L_{a1528}$ to $L_{a1539}$. For example,

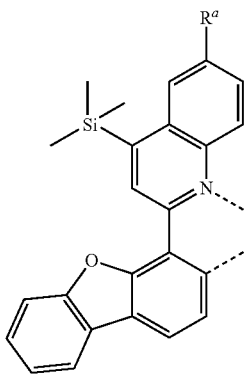

$L_{a1}$: $R^a$=H; $L_{a2}$: $R^a$=CH$_3$;

$L_{a3}$: $R^a$=$R^{a1}$; $L_{a4}$: $R^a$=$R^{a2}$;

$L_{a5}$: $R^a$=$R^{a3}$; $L_{a6}$: $R^a$=$R^{a4}$;

$L_{a7}$: $R^a$=$R^{a5}$; $L_{a8}$: $R^a$=$R^{a6}$;

$L_{a9}$: $R^a$=$R^{a7}$; $L_{a10}$: $R^a$=$R^{a8}$;

$L_{a11}$: $R^a$=$R^{a9}$; $L_{a12}$: $R^a$=F; represents that $L_{a1}$ to $L_{a12}$ are selected from structures listed therein. For $L_{a1}$, the substituent $R^a$ in its structure is H, that is the structure of $L_{a1}$ is

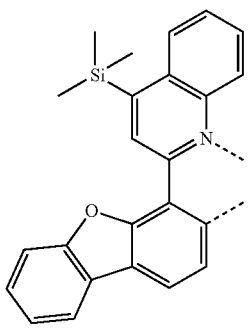

Similarly, for $L_{a2}$, the substituent $R^a$ in its structure is CH$_3$, that is the structure of $L_{a2}$ is

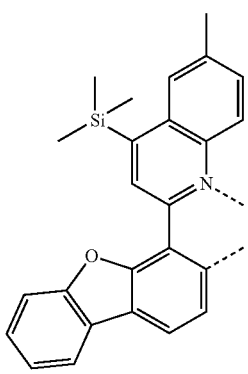

Similarly, for $L_{a3}$, the substituent $R^a$ in its structure is $R^{a1}$ and $R^{a1}$ is

that is the structure of $L_{a3}$ is

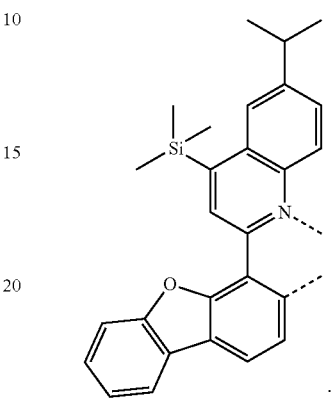

This is also true for $L_{a4}$ to $L_{a1507}$.

According to an embodiment of the present disclosure, wherein $L_a$ is, at each occurrence identically or differently, selected from any one of the group consisting of $L_{a1}$ to $L_{a108}$, $L_{a133}$ to $L_{a231}$, $L_{a254}$ to $L_{a297}$, $L_{a320}$ to $L_{a411}$, $L_{a436}$ to $L_{a531}$, $L_{a556}$ to $L_{a603}$, $L_{a628}$ to $L_{a726}$, $L_{a728}$ to $L_{a775}$, $L_{a800}$ to $L_{a883}$, $L_{a908}$ to $L_{a955}$, $L_{a980}$ to $L_{a1027}$, $L_{a1052}$ to $L_{a1099}$, $L_{a1124}$ to $L_{a1212}$, $L_{a1214}$ to $L_{a1237}$, $L_{a1250}$ to $L_{a1303}$, $L_{a1328}$ to $L_{a1363}$, $L_{a1376}$ to $L_{a1387}$, $L_{a1394}$ to $L_{a1405}$, $L_{a1412}$ to $L_{a1423}$, $L_{a1430}$ to $L_{a1441}$, $L_{a1448}$ to $L_{a1459}$, $L_{a1466}$ to $L_{a1477}$, $L_{a1484}$ to $L_{a1489}$, $L_{a1496}$ to $L_{a1501}$, $L_{a1508}$ to $L_{a1521}$, $L_{a1523}$ to $L_{a1526}$ and $L_{a1528}$ to $L_{a1611}$, wherein the specific structures of $L_{a1}$ to $L_{a108}$, $L_{a133}$ to $L_{a231}$, $L_{a254}$ to $L_{a297}$, $L_{a320}$ to $L_{a411}$, $L_{a436}$ to $L_{a531}$, $L_{a556}$ to $L_{a603}$, $L_{a628}$ to $L_{a726}$, $L_{a728}$ to $L_{a775}$, $L_{a800}$ to $L_{a883}$, $L_{a908}$ to $L_{a955}$, $L_{a980}$ to $L_{a1027}$, $L_{a1052}$ to $L_{a1099}$, $L_{a1124}$ to $L_{a1212}$, $L_{a1214}$ to $L_{a1237}$, $L_{a1250}$ to $L_{a1303}$, $L_{a1328}$ to $L_{a1363}$, $L_{a1376}$ to $L_{a1387}$, $L_{a1394}$ to $L_{a1405}$, $L_{a1412}$ to $L_{a1423}$, $L_{a1430}$ to $L_{a1441}$, $L_{a1448}$ to $L_{a1459}$, $L_{a1466}$ to $L_{a1477}$, $L_{a1484}$ to $L_{a1489}$, $L_{a1496}$ to $L_{a1501}$, $L_{a1508}$ to $L_{a1521}$, $L_{a1523}$ to $L_{a1526}$ and $L_{a1528}$ to $L_{a1611}$ are referred to claim 20.

According to an embodiment of the present disclosure, wherein $L_b$ is, at each occurrence identically or differently, selected from the following structure:

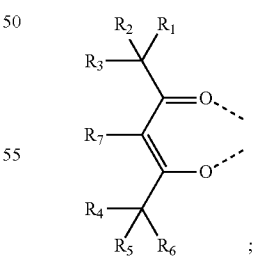

wherein, $R_1$ to $R_7$ are each independently selected from the group consisting of: hydrogen, deuterium, halogen, substituted or unsubstituted alkyl having 1 to 20 carbon atoms, substituted or unsubstituted cycloalkyl having 3 to 20 ring carbon atoms, a cyano group and combinations thereof;

adjacent substituents $R_1$, $R_2$, $R_3$, $R_4$, $R_5$, $R_6$, $R_7$ can be optionally joined to form a ring.

In this embodiment, the expression that adjacent substituents $R_1$, $R_2$, $R_3$, $R_4$, $R_5$, $R_6$, $R_7$ can be optionally joined to form a ring is intended to mean that for groups of adjacent substituents, such as substituents $R_1$ and $R_2$, substituents $R_1$ and $R_3$, substituents $R_2$ and $R_3$, substituents $R_4$ and $R_5$, substituents $R_5$ and $R_6$, substituents $R_4$ and $R_6$, substituents $R_1$ and $R_7$, substituents $R_2$ and $R_7$, substituents $R_3$ and $R_7$, substituents $R_4$ and $R_7$, substituents $R_5$ and $R_7$, and substituents $R_6$ and $R_7$, any one or more of these groups of substituents can be joined to form a ring. Obviously, any of these groups of substituents may not be joined to form a ring.

According to an embodiment of the present disclosure, wherein $R_1$ to $R_7$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a hydroxyl group, a sulfanyl group, a sulfinyl group, a sulfonyl group, a phosphino group and combinations thereof; and when $R_1$ to $R_7$ are each independently selected from substituted alkyl having 1 to 20 carbon atoms, substituted cycloalkyl having 3 to 20 ring carbon atoms, substituted heteroalkyl having 1 to 20 carbon atoms, substituted aryl having 6 to 30 carbon atoms, or substituted heteroaryl having 3 to 30 carbon atoms, the substitutions are selected from the group consisting of: hydrogen, deuterium, halogen, unsubstituted alkyl having 1 to 20 carbon atoms, unsubstituted cycloalkyl having 3 to 20 ring carbon atoms, unsubstituted heteroalkyl having 1 to 20 carbon atoms, unsubstituted arylalkyl having 7 to 30 carbon atoms, unsubstituted alkoxy having 1 to 20 carbon atoms, unsubstituted aryloxy having 6 to 30 carbon atoms, unsubstituted alkenyl having 2 to 20 carbon atoms, unsubstituted aryl having 6 to 30 carbon atoms, unsubstituted heteroaryl having 3 to 30 carbon atoms, unsubstituted alkylsilyl having 3 to 20 carbon atoms, unsubstituted arylsilyl having 6 to 20 carbon atoms, unsubstituted amino having 0 to 20 carbon atoms, an acyl group, a carbonyl group, a carboxylic acid group, an ester group, a hydroxyl group, a sulfanyl group, a sulfinyl group, a sulfonyl group, a phosphino group and combinations thereof.

According to an embodiment of the present disclosure, wherein $L_b$ is, at each occurrence identically or differently, selected from the following structure:

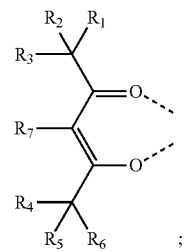

wherein,
$R_1$ to $R_7$ are each independently selected from the group consisting of: hydrogen, deuterium, fluorine, methyl, ethyl, propyl, isopropyl, isobutyl, n-butyl, t-butyl, n-pentyl, isopentyl, neopentyl, cyclobutyl, cyclopentyl, cyclohexyl, cyano and combinations thereof.

According to an embodiment of the present disclosure, wherein $L_b$ is, at each occurrence identically or differently, selected from any one of the group consisting of $L_{b1}$ to $L_{b322}$, wherein the specific structures of $L_{b1}$ to $L_{b322}$ are referred to claim 22.

According to an embodiment of the present disclosure, wherein $L_c$ is, at each occurrence identically or differently, selected from any one of the group consisting of $L_{c1}$ to $L_{c231}$, wherein the specific structures of $L_{c1}$ to $L_{c231}$ are referred to claim 23.

According to an embodiment of the present disclosure, wherein the metal complex has a structure of $Ir(L_a)_2(L_b)$ or $Ir(L_a)_2(L_c)$ or $Ir(L_a)(L_c)_2$;
wherein when the metal complex has a structure of $Ir(L_a)_2(L_b)$, $L_a$ is, at each occurrence identically or differently, selected from any one or any two of the group consisting of $L_{a1}$ to $L_{a108}$, $L_{a133}$ to $L_{a231}$, $L_{a254}$ to $L_{a297}$, $L_{a320}$ to $L_{a411}$, $L_{a436}$ to $L_{a531}$, $L_{a556}$ to $L_{a603}$, $L_{a628}$ to $L_{a726}$, $L_{a728}$ to $L_{a775}$, $L_{a800}$ to $L_{a883}$, $L_{a908}$ to $L_{a955}$, $L_{a980}$ to $L_{a1027}$, $L_{a1052}$ to $L_{a1099}$, $L_{a1124}$ to $L_{a1212}$, $L_{a1214}$ to $L_{a1237}$, $L_{a1250}$ to $L_{a1303}$, $L_{a1328}$ to $L_{a1363}$, $L_{a1376}$ to $L_{a1387}$, $L_{a1394}$ to $L_{a1405}$, $L_{a1412}$ to $L_{a1423}$, $L_{a1430}$ to $L_{a1441}$, $L_{a1448}$ to $L_{a1459}$, $L_{a1466}$ to $L_{a1477}$, $L_{a1484}$ to $L_{a1489}$, $L_{a1496}$ to $L_{a1501}$, $L_{a1508}$ to $L_{a1521}$, $L_{a1523}$ to $L_{a1526}$ and $L_{a1528}$ to $L_{a1539}$, and $L_b$ is selected from any one of the group consisting of $L_{b1}$ to $L_{b322}$; when the metal complex has a structure of $Ir(L_a)_2(L_c)$, $L_a$ is, at each occurrence identically or differently, selected from any one or any two of the group consisting of $L_{a1}$ to $L_{a108}$, $L_{a133}$ to $L_{a231}$, $L_{a254}$ to $L_{a297}$, $L_{a320}$ to $L_{a411}$, $L_{a436}$ to $L_{a531}$, $L_{a556}$ to $L_{a603}$, $L_{a628}$ to $L_{a726}$, $L_{a728}$ to $L_{a775}$, $L_{a800}$ to $L_{a883}$, $L_{a908}$ to $L_{a955}$, $L_{a980}$ to $L_{a1027}$, $L_{a1052}$ to $L_{a1099}$, $L_{a1124}$ to $L_{a1212}$, $L_{a1214}$ to $L_{a1237}$, $L_{a1250}$ to $L_{a1303}$, $L_{a1328}$ to $L_{a1363}$, $L_{a1376}$ to $L_{a1387}$, $L_{a1394}$ to $L_{a1405}$, $L_{a1412}$ to $L_{a1423}$, $L_{a1430}$ to $L_{a1441}$, $L_{a1448}$ to $L_{a1459}$, $L_{a1466}$ to $L_{a1477}$, $L_{a1484}$ to $L_{a1489}$, $L_{a1496}$ to $L_{a1501}$, $L_{a1508}$ to $L_{a1521}$, $L_{a1523}$ to $L_{a1526}$ and $L_{a1528}$ to $L_{a1539}$, and $L_c$ is selected from any one of the group consisting of $L_{c1}$ to $L_{c231}$; and when the metal complex has a structure of $Ir(L_a)(L_c)_2$, $L_a$ is selected from any one of the group consisting of $L_{a1}$ to $L_{a108}$, $L_{a133}$ to $L_{a231}$, $L_{a254}$ to $L_{a297}$, $L_{a320}$ to $L_{a411}$, $L_{a436}$ to $L_{a531}$, $L_{a556}$ to $L_{a603}$, $L_{a628}$ to $L_{a726}$, $L_{a728}$ to $L_{a775}$, $L_{a800}$ to $L_{a883}$, $L_{a908}$ to $L_{a955}$, $L_{a980}$ to $L_{a1027}$, $L_{a1052}$ to $L_{a1099}$, $L_{a1124}$ to $L_{a1212}$, $L_{a1214}$ to $L_{a1237}$, $L_{a1250}$ to $L_{a1303}$, $L_{a1328}$ to $L_{a1363}$, $L_{a1376}$ to $L_{a1387}$, $L_{a1394}$ to $L_{a1405}$, $L_{a1412}$ to $L_{a1423}$, $L_{a1430}$ to $L_{a1441}$, $L_{a1448}$ to $L_{a1459}$, $L_{a1466}$ to $L_{a1477}$, $L_{a1484}$ to $L_{a1489}$, $L_{a1496}$ to $L_{a1501}$, $L_{a1508}$ to $L_{a1521}$, $L_{a1523}$ to $L_{a1526}$ and $L_{a1528}$ to $L_{a1539}$, and $L_c$ is, at each occurrence identically or differently, selected from any one or any two of the group consisting of $L_{c1}$ to $L_{c231}$.

According to an embodiment of the present disclosure, wherein the metal complex has a structure of $Ir(L_a)_2(L_b)$ or $Ir(L_a)_2(L_c)$ or $Ir(L_a)(L_c)_2$;
wherein when the metal complex has a structure of $Ir(L_a)_2(L_b)$, $L_a$ is, at each occurrence identically or differently, selected from any one or any two of the group consisting of $L_{a1}$ to $L_{a108}$, $L_{a133}$ to $L_{a231}$, $L_{a254}$ to $L_{a297}$, $L_{a320}$ to $L_{a411}$, $L_{a436}$ to $L_{a531}$, $L_{a556}$ to $L_{a603}$, $L_{a628}$ to $L_{a726}$, $L_{a728}$ to $L_{a775}$, $L_{a800}$ to $L_{a883}$, $L_{a908}$ to $L_{a955}$, $L_{a980}$ to $L_{a1027}$, $L_{a1052}$ to $L_{a1099}$, $L_{a1124}$ to $L_{a1212}$, $L_{a1214}$ to $L_{a1237}$, $L_{a1250}$ to $L_{a1303}$, $L_{a1328}$ to $L_{a1363}$, $L_{a1376}$ to $L_{a1387}$, $L_{a1394}$ to $L_{a1405}$, $L_{a1412}$ to $L_{a1423}$, $L_{a1430}$ to $L_{a1441}$, $L_{a1448}$ to $L_{a1459}$, $L_{a1466}$ to $L_{a1477}$, $L_{a1484}$ to $L_{a1489}$, $L_{a1496}$ to $L_{a1501}$, $L_{a1508}$ to $L_{a1521}$, $L_{a1523}$ to $L_{a1526}$ and $L_{a1528}$ to $L_{a1611}$, and $L_b$ is selected from any one of the group consisting of $L_{b1}$ to $L_{b322}$; when the metal complex has a structure of $Ir(L_a)_2(L_c)$, $L_a$ is, at each occurrence identically or differently, selected from any one or any two of the group consisting of $L_{a1}$ to $L_{a108}$, $L_{a133}$ to $L_{a231}$, $L_{a254}$ to $L_{a297}$, $L_{a320}$ to $L_{a411}$, $L_{a436}$ to $L_{a531}$, $L_{a556}$ to $L_{a603}$, $L_{a628}$ to $L_{a726}$, $L_{a728}$ to $L_{a775}$, $L_{a800}$ to $L_{a883}$, $L_{a908}$ to $L_{a955}$, $L_{a980}$ to $L_{a1027}$, $L_{a1052}$ to $L_{a1099}$, $L_{a1124}$ to $L_{a1212}$, $L_{a1214}$ to $L_{a1237}$, $L_{a1250}$ to $L_{a1303}$, $L_{a1328}$ to $L_{a1363}$, $L_{a1376}$ to $L_{a1387}$, $L_{a1394}$ to $L_{a1405}$, $L_{a1412}$ to $L_{a1423}$, $L_{a1430}$ to $L_{a1441}$, $L_{a1448}$ to $L_{a1459}$, $L_{a1466}$ to $L_{a1477}$, $L_{a1484}$ to $L_{a1489}$, $L_{a1496}$ to $L_{a1501}$, $L_{a1508}$ to $L_{a1521}$, $L_{a1523}$ to $L_{a1526}$ and $L_{a1528}$ to $L_{a1611}$, and $L_c$ is selected from any one of the group consisting of $L_{c1}$ to $L_{c231}$; and when the metal complex has a structure of $Ir(L_a)(L_c)_2$, $L_a$ is selected from any one of the group consisting of $L_{a1}$ to $L_{a108}$, $L_{a133}$ to $L_{a231}$, $L_{a254}$ to $L_{a297}$, $L_{a320}$ to $L_{a411}$, $L_{a436}$ to $L_{a531}$, $L_{a556}$ to $L_{a603}$, $L_{a628}$ to $L_{a726}$, $L_{a728}$ to $L_{a775}$, $L_{a800}$ to $L_{a883}$, $L_{a908}$ to $L_{a955}$, $L_{a980}$ to $L_{a1027}$, $L_{a1052}$ to $L_{a1099}$, $L_{a1124}$ to $L_{a1212}$, $L_{a1214}$ to $L_{a1237}$, $L_{a1250}$ to $L_{a1303}$, $L_{a1328}$ to $L_{a1363}$, $L_{a1376}$ to $L_{a1387}$, $L_{a1394}$ to $L_{a1405}$, $L_{a1412}$ to $L_{a1423}$, $L_{a1430}$ to $L_{a1441}$, $L_{a1448}$ to $L_{a1459}$, $L_{a1466}$ to $L_{a1477}$, $L_{a1484}$ to $L_{a1489}$, $L_{a1496}$ to $L_{a1501}$, $L_{a1508}$ to $L_{a1521}$, $L_{a1523}$ to $L_{a1526}$ and $L_{a1528}$ to $L_{a1611}$, and $L_c$ is, at each occurrence identically or differently, selected from any one or any two of the group consisting of $L_{c1}$ to $L_{c231}$.

According to an embodiment of the present disclosure, wherein the metal complex is selected from the group of the compounds listed in the following tables;
wherein the compounds listed in the following table have the structure of $Ir(L_a)_2(L_b)$, wherein the two $L_a$ are the same and $L_a$ and $L_b$ are respectively selected from structures listed in the following table:

| Compound No. | $L_a$ | $L_b$ | Compound No. | $L_a$ | $L_b$ |
|---|---|---|---|---|---|
| 1 | $L_{a13}$ | $L_{b31}$ | 2 | $L_{a16}$ | $L_{b31}$ |
| 3 | $L_{a37}$ | $L_{b31}$ | 4 | $L_{a40}$ | $L_{b31}$ |
| 5 | $L_{a61}$ | $L_{b31}$ | 6 | $L_{a64}$ | $L_{b31}$ |
| 7 | $L_{a73}$ | $L_{b31}$ | 8 | $L_{a85}$ | $L_{b31}$ |
| 9 | $L_{a97}$ | $L_{b31}$ | | | |
| | | | 14 | $L_{a146}$ | $L_{b31}$ |
| 15 | $L_{a168}$ | $L_{b31}$ | 16 | $L_{a190}$ | $L_{b31}$ |
| 19 | $L_{a740}$ | $L_{b31}$ | 20 | $L_{a752}$ | $L_{b31}$ |
| 21 | $L_{a764}$ | $L_{b31}$ | | | |
| | | | 24 | $L_{a1268}$ | $L_{b31}$ |
| 25 | $L_{a1280}$ | $L_{b31}$ | | | |
| 27 | $L_{a1376}$ | $L_{b31}$ | 28 | $L_{a1382}$ | $L_{b31}$ |
| | | | 30 | $L_{a1438}$ | $L_{b31}$ |

-continued

| Compound No. | $L_a$ | $L_b$ | Compound No. | $L_a$ | $L_b$ |
|---|---|---|---|---|---|
| 31 | $L_{a1450}$ | $L_{b31}$ | 32 | $L_{a1484}$ | $L_{b31}$ |
| | | | 34 | $L_{a1520}$ | $L_{b31}$ |
| 35 | $L_{a1521}$ | $L_{b31}$ | | | |
| 37 | $L_{a13}$ | $L_{b57}$ | 38 | $L_{a16}$ | $L_{b57}$ |
| 39 | $L_{a37}$ | $L_{b57}$ | 40 | $L_{a40}$ | $L_{b57}$ |
| 41 | $L_{a61}$ | $L_{b57}$ | 42 | $L_{a64}$ | $L_{b57}$ |
| 43 | $L_{a73}$ | $L_{b57}$ | 44 | $L_{a85}$ | $L_{b57}$ |
| 45 | $L_{a97}$ | $L_{b57}$ | | | |
| | | | 50 | $L_{a146}$ | $L_{b57}$ |
| 51 | $L_{a168}$ | $L_{b57}$ | 52 | $L_{a190}$ | $L_{b57}$ |
| 55 | $L_{a740}$ | $L_{b57}$ | 56 | $L_{a752}$ | $L_{b57}$ |
| 57 | $L_{a764}$ | $L_{b57}$ | | | |
| | | | 60 | $L_{a1268}$ | $L_{b57}$ |
| 61 | $L_{a1280}$ | $L_{b57}$ | | | |
| 63 | $L_{a1376}$ | $L_{b57}$ | 64 | $L_{a1382}$ | $L_{b57}$ |
| | | | 66 | $L_{a1438}$ | $L_{b57}$ |
| 67 | $L_{a1450}$ | $L_{b57}$ | 68 | $L_{a1484}$ | $L_{b57}$ |
| | | | 70 | $L_{a1520}$ | $L_{b57}$ |
| 71 | $L_{a1521}$ | $L_{b57}$ | | | |
| 73 | $L_{a13}$ | $L_{b88}$ | 74 | $L_{a16}$ | $L_{b88}$ |
| 75 | $L_{a37}$ | $L_{b88}$ | 76 | $L_{a40}$ | $L_{b88}$ |
| 77 | $L_{a61}$ | $L_{b88}$ | 78 | $L_{a64}$ | $L_{b88}$ |
| 79 | $L_{a73}$ | $L_{b88}$ | 80 | $L_{a85}$ | $L_{b88}$ |
| 81 | $L_{a97}$ | $L_{b88}$ | | | |
| | | | 86 | $L_{a146}$ | $L_{b88}$ |
| 87 | $L_{a168}$ | $L_{b88}$ | 88 | $L_{a190}$ | $L_{b88}$ |
| 91 | $L_{a740}$ | $L_{b88}$ | 92 | $L_{a752}$ | $L_{b88}$ |
| 93 | $L_{a764}$ | $L_{b88}$ | | | |
| | | | 96 | $L_{a1268}$ | $L_{b88}$ |
| 97 | $L_{a1280}$ | $L_{b88}$ | | | |
| 99 | $L_{a1376}$ | $L_{b88}$ | 100 | $L_{a1382}$ | $L_{b88}$ |
| | | | 102 | $L_{a1438}$ | $L_{b88}$ |
| 103 | $L_{a1450}$ | $L_{b88}$ | 104 | $L_{a1484}$ | $L_{b88}$ |
| | | | 106 | $L_{a1520}$ | $L_{b88}$ |
| 107 | $L_{a1521}$ | $L_{b88}$ | | | |
| 109 | $L_{a13}$ | $L_{b122}$ | 110 | $L_{a16}$ | $L_{b122}$ |
| 111 | $L_{a37}$ | $L_{b122}$ | 112 | $L_{a40}$ | $L_{b122}$ |
| 113 | $L_{a61}$ | $L_{b122}$ | 114 | $L_{a64}$ | $L_{b122}$ |
| 115 | $L_{a73}$ | $L_{b122}$ | 116 | $L_{a85}$ | $L_{b122}$ |
| 117 | $L_{a97}$ | $L_{b122}$ | | | |
| | | | 122 | $L_{a146}$ | $L_{b122}$ |
| 123 | $L_{a168}$ | $L_{b122}$ | 124 | $L_{a190}$ | $L_{b122}$ |
| 127 | $L_{a740}$ | $L_{b122}$ | 128 | $L_{a752}$ | $L_{b122}$ |
| 129 | $L_{a764}$ | $L_{b122}$ | | | |
| | | | 132 | $L_{a1268}$ | $L_{b122}$ |
| 133 | $L_{a1280}$ | $L_{b122}$ | | | |
| 135 | $L_{a1376}$ | $L_{b122}$ | 136 | $L_{a1382}$ | $L_{b122}$ |
| | | | 138 | $L_{a1438}$ | $L_{b122}$ |
| 139 | $L_{a1450}$ | $L_{b122}$ | 140 | $L_{a1484}$ | $L_{b122}$ |
| | | | 142 | $L_{a1520}$ | $L_{b122}$ |
| 143 | $L_{a1521}$ | $L_{b122}$ | | | |
| 145 | $L_{a13}$ | $L_{b126}$ | 146 | $L_{a16}$ | $L_{b126}$ |
| 147 | $L_{a37}$ | $L_{b126}$ | 148 | $L_{a40}$ | $L_{b126}$ |
| 149 | $L_{a61}$ | $L_{b126}$ | 150 | $L_{a64}$ | $L_{b126}$ |
| 151 | $L_{a73}$ | $L_{b126}$ | 152 | $L_{a85}$ | $L_{b126}$ |
| 153 | $L_{a97}$ | $L_{b126}$ | | | |
| | | | 158 | $L_{a146}$ | $L_{b126}$ |
| 159 | $L_{a168}$ | $L_{b126}$ | 160 | $L_{a190}$ | $L_{b126}$ |
| 163 | $L_{a740}$ | $L_{b126}$ | 164 | $L_{a752}$ | $L_{b126}$ |
| 165 | $L_{a764}$ | $L_{b126}$ | | | |
| | | | 168 | $L_{a1268}$ | $L_{b126}$ |
| 169 | $L_{a1280}$ | $L_{b126}$ | | | |
| 171 | $L_{a1376}$ | $L_{b126}$ | 172 | $L_{a1382}$ | $L_{b126}$ |
| | | | 174 | $L_{a1438}$ | $L_{b126}$ |
| 175 | $L_{a1450}$ | $L_{b126}$ | 176 | $L_{a1484}$ | $L_{b126}$ |
| | | | 178 | $L_{a1520}$ | $L_{b126}$ |
| 179 | $L_{a1521}$ | $L_{b126}$ | | | |
| 181 | $L_{a13}$ | $L_{b212}$ | 182 | $L_{a16}$ | $L_{b212}$ |
| 183 | $L_{a37}$ | $L_{b212}$ | 184 | $L_{a40}$ | $L_{b212}$ |
| 185 | $L_{a61}$ | $L_{b212}$ | 186 | $L_{a64}$ | $L_{b212}$ |
| 187 | $L_{a73}$ | $L_{b212}$ | 188 | $L_{a85}$ | $L_{b212}$ |
| 189 | $L_{a97}$ | $L_{b212}$ | | | |
| | | | 194 | $L_{a146}$ | $L_{b212}$ |
| 195 | $L_{a168}$ | $L_{b212}$ | 196 | $L_{a190}$ | $L_{b212}$ |
| 199 | $L_{a740}$ | $L_{b212}$ | 200 | $L_{a752}$ | $L_{b212}$ |

-continued

| Compound No. | $L_a$ | $L_b$ | Compound No. | $L_a$ | $L_b$ |
|---|---|---|---|---|---|
| 201 | $L_{a764}$ | $L_{b212}$ | | | |
| | | | 204 | $L_{a1268}$ | $L_{b212}$ |
| 205 | $L_{a1280}$ | $L_{b212}$ | | | |
| 207 | $L_{a1376}$ | $L_{b212}$ | 208 | $L_{a1382}$ | $L_{b212}$ |
| | | | 210 | $L_{a1438}$ | $L_{b212}$ |
| 211 | $L_{a1450}$ | $L_{b212}$ | 212 | $L_{a1484}$ | $L_{b212}$ |
| | | | 214 | $L_{a1520}$ | $L_{b212}$ |
| 215 | $L_{a1521}$ | $L_{b212}$ | | | |
| 301 | $L_{a201}$ | $L_{b31}$ | 302 | $L_{a201}$ | $L_{b57}$ |
| 303 | $L_{a201}$ | $L_{b88}$ | 304 | $L_{a201}$ | $L_{b122}$ |
| 305 | $L_{a201}$ | $L_{b126}$ | 306 | $L_{a201}$ | $L_{b212}$ |
| 307 | $L_{a743}$ | $L_{b156}$ | 308 | $L_{a755}$ | $L_{b156}$ |
| 309 | $L_{a1271}$ | $L_{b156}$ | 310 | $L_{a1283}$ | $L_{b156}$ |
| 311 | $L_{a1542}$ | $L_{b156}$ | 312 | $L_{a1584}$ | $L_{b156}$ |
| 313 | $L_{a1584}$ | $L_{b122}$ | 314 | $L_{a1584}$ | $L_{b126}$ |
| 315 | $L_{a1592}$ | $L_{b122}$ | 316 | $L_{a1592}$ | $L_{b126}$ | wherein the compounds listed in the following table have the structure of $Ir(L_a)_2(L_b)$, wherein the two $L_a$ are different and $L_a$ and $L_b$ are respectively selected from structures listed in the following table:

| Compound No. | $L_a$ | $L_a$ | $L_b$ | Compound No. | $L_a$ | $L_a$ | $L_b$ |
|---|---|---|---|---|---|---|---|
| 217 | $L_{a13}$ | $L_{a16}$ | $L_{b31}$ | 218 | $L_{a13}$ | $L_{a37}$ | $L_{b31}$ |
| | | | | 220 | $L_{a13}$ | $L_{a146}$ | $L_{b31}$ |
| 221 | $L_{a13}$ | $L_{a740}$ | $L_{b31}$ | 222 | $L_{a13}$ | $L_{a752}$ | $L_{b31}$ |
| 223 | $L_{a13}$ | $L_{a1534}$ | $L_{b31}$ | | | | |
| 225 | $L_{a16}$ | $L_{a64}$ | $L_{b31}$ | | | | |
| 227 | $L_{a16}$ | $L_{a146}$ | $L_{b31}$ | | | | |
| 229 | $L_{a146}$ | $L_{a190}$ | $L_{b31}$ | | | | |
| 231 | $L_{a13}$ | $L_{a16}$ | $L_{b57}$ | 232 | $L_{a13}$ | $L_{a37}$ | $L_{b57}$ |
| | | | | 234 | $L_{a13}$ | $L_{a146}$ | $L_{b57}$ |
| 235 | $L_{a13}$ | $L_{a740}$ | $L_{b57}$ | 326 | $L_{a13}$ | $L_{a752}$ | $L_{b57}$ |
| 237 | $L_{a13}$ | $L_{a1534}$ | $L_{b57}$ | | | | |
| 239 | $L_{a16}$ | $L_{a64}$ | $L_{b57}$ | | | | |
| 241 | $L_{a16}$ | $L_{a146}$ | $L_{b57}$ | | | | |
| 243 | $L_{a146}$ | $L_{a190}$ | $L_{b57}$ | | | | |
| 245 | $L_{a13}$ | $L_{a16}$ | $L_{b88}$ | 246 | $L_{a13}$ | $L_{a37}$ | $L_{b88}$ |
| | | | | 248 | $L_{a13}$ | $L_{a146}$ | $L_{b88}$ |
| 249 | $L_{a13}$ | $L_{a740}$ | $L_{b88}$ | 250 | $L_{a13}$ | $L_{a752}$ | $L_{b88}$ |
| 251 | $L_{a13}$ | $L_{a1534}$ | $L_{b88}$ | | | | |
| 253 | $L_{a16}$ | $L_{a64}$ | $L_{b88}$ | | | | |
| 255 | $L_{a16}$ | $L_{a146}$ | $L_{b88}$ | | | | |
| 257 | $L_{a146}$ | $L_{a190}$ | $L_{b88}$ | | | | |
| 259 | $L_{a13}$ | $L_{a16}$ | $L_{b122}$ | 260 | $L_{a13}$ | $L_{a37}$ | $L_{b122}$ |
| | | | | 262 | $L_{a13}$ | $L_{a146}$ | $L_{b122}$ |
| 263 | $L_{a13}$ | $L_{a740}$ | $L_{b122}$ | 264 | $L_{a13}$ | $L_{a752}$ | $L_{b122}$ |
| 265 | $L_{a13}$ | $L_{a1534}$ | $L_{b122}$ | | | | |
| 267 | $L_{a16}$ | $L_{a64}$ | $L_{b122}$ | | | | |
| 269 | $L_{a16}$ | $L_{a146}$ | $L_{b122}$ | | | | |
| 271 | $L_{a146}$ | $L_{a190}$ | $L_{b122}$ | | | | |
| 273 | $L_{a13}$ | $L_{a16}$ | $L_{b126}$ | 274 | $L_{a13}$ | $L_{a37}$ | $L_{b126}$ |
| | | | | 276 | $L_{a13}$ | $L_{a146}$ | $L_{b126}$ |
| 277 | $L_{a13}$ | $L_{a740}$ | $L_{b126}$ | 278 | $L_{a13}$ | $L_{a752}$ | $L_{b126}$ |
| 279 | $L_{a13}$ | $L_{a1534}$ | $L_{b126}$ | | | | |
| 281 | $L_{a16}$ | $L_{a64}$ | $L_{b126}$ | | | | |
| 283 | $L_{a16}$ | $L_{a146}$ | $L_{b126}$ | | | | |
| 285 | $L_{a146}$ | $L_{a190}$ | $L_{b126}$ | | | | |
| 287 | $L_{a13}$ | $L_{a16}$ | $L_{b212}$ | 288 | $L_{a13}$ | $L_{a37}$ | $L_{b212}$ |
| | | | | 290 | $L_{a13}$ | $L_{a146}$ | $L_{b212}$ |
| 291 | $L_{a13}$ | $L_{a740}$ | $L_{b212}$ | 292 | $L_{a13}$ | $L_{a752}$ | $L_{b212}$ |
| 293 | $L_{a13}$ | $L_{a1534}$ | $L_{b212}$ | | | | |
| 295 | $L_{a16}$ | $L_{a64}$ | $L_{b212}$ | | | | |
| 297 | $L_{a16}$ | $L_{a146}$ | $L_{b212}$ | | | | |
| 299 | $L_{a146}$ | $L_{a190}$ | $L_{b212}$ | | | | |

According to an embodiment of the present disclosure, further disclosed is an electroluminescent device, comprising:

an anode, a cathode, and an organic layer disposed between the anode and the cathode, wherein the organic layer comprises a metal complex, wherein the metal complex has a maximum emission wavelength greater than or equal to 612 nm, preferably greater than or equal to 615 nm in a photoluminescence (PL) spectrum and comprises a metal selected from a metal with a relative atomic mass greater than 40 and a ligand $L_a$ which has a structure represented by Formula 1:

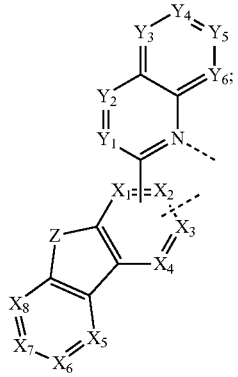

Formula 1 wherein

Z is selected from O;

$X_1$ to $X_8$ are, at each occurrence identically or differently, selected from C, $CR_x$ or N;

$Y_1$ to $Y_6$ are, at each occurrence identically or differently, selected from $CR_y$ or N;

$R_x$ and $R_y$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof;

adjacent substituents $R_x$ can be optionally joined to form a ring.

According to an embodiment of the present disclosure, further disclosed is an electroluminescent device, comprising:
an anode,
a cathode, and
an organic layer disposed between the anode and the cathode, wherein the organic layer comprises a metal complex, wherein the metal complex comprises a metal selected from a metal with a relative atomic mass greater than 40 and a ligand $L_a$ which has a structure represented by Formula 1':

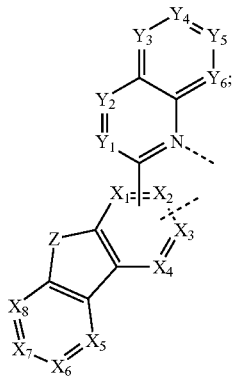

Formula 1' wherein
Z is selected from O, S or Se;
$X_1$ to $X_8$ are, at each occurrence identically or differently, selected from C, $CR_x$ or N;
$Y_1$ to $Y_6$ are, at each occurrence identically or differently, selected from $CR_{y1}$, $CR_{y2}$ or N; wherein at least one of $Y_1$ to $Y_6$ is selected from $CR_{y2}$, and the $R_{y2}$ has a structure of -L-$SiR_{s1}R_{s2}R_{s3}$;
$R_x$, $R_{y1}$, $R_{s1}$, $R_{s2}$ and $R_{s3}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof;
L is selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or a combination thereof;
adjacent substituents $R_x$, $R_{s1}$, $R_{s2}$, $R_{s3}$ can be optionally joined to form a ring.

According to an embodiment of the present disclosure, in the device, the organic layer is a light-emitting layer, and the metal complex is a light-emitting material.

According to an embodiment of the present disclosure, the electroluminescent device emits red light.

According to an embodiment of the present disclosure, the electroluminescent device emits white light.

According to an embodiment of the present disclosure, in the device, the organic layer is a light-emitting layer, wherein the light-emitting layer further comprises at least one host material.

According to an embodiment of the present disclosure, in the device, the at least one host material comprises at least one chemical group selected from the group consisting of: benzene, pyridine, pyrimidine, triazine, carbazole, azacarbazole, indolocarbazole, dibenzothiophene, aza-dibenzothiophene, dibenzofuran, azadibenzofuran, dibenzoselenophene, triphenylene, azatriphenylene, fluorene, silafluorene, naphthalene, quinoline, isoquinoline, quinazoline, quinoxaline, phenanthrene, azaphenanthrene and combinations thereof.

According to another embodiment of the present disclosure, further disclosed is a compound formulation comprising a metal complex. The specific structure of the metal complex is as shown in any one of the embodiments described above.

Combination with Other Materials

The materials described in the present disclosure for a particular layer in an organic light emitting device can be used in combination with various other materials present in the device. The combinations of these materials are described in more detail in U.S. Pat. App. No. 20160359122 at paragraphs 0132-0161, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

The materials described herein as useful for a particular layer in an organic light emitting device may be used in combination with a variety of other materials present in the device. For example, emissive dopants disclosed herein may be used in combination with a wide variety of hosts, transport layers, blocking layers, injection layers, electrodes and other layers that may be present. The combination of these materials is described in detail in paragraphs 0080-0101 of U.S. Pat. App. No. 20150349273, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

In the embodiments of material synthesis, all reactions were performed under nitrogen protection unless otherwise stated. All reaction solvents were anhydrous and used as received from commercial sources. Synthetic products were structurally confirmed and tested for properties using one or more conventional equipment in the art (including, but not limited to, nuclear magnetic resonance instrument produced by BRUKER, liquid chromatograph produced by SHIMADZU, liquid chromatograph-mass spectrometry produced by SHIMADZU, gas chromatograph-mass spectrometry produced by SHIMADZU, differential Scanning calorimeters produced by SHIMADZU, fluorescence spectrophotometer produced by SHANGHAI LENGGUANG TECH., electrochemical workstation produced by WUHAN CORRTEST, and sublimation apparatus produced by ANHUI BEQ, etc.) by methods well known to the persons skilled in the art. In the embodiments of the device, the characteristics of the device were also tested using conventional equipment in the art (including, but not limited to, evaporator produced by ANGSTROM ENGINEERING, optical testing system produced by SUZHOU FATAR, life testing system produced by SUZHOU FATAR, and ellipsometer produced by BEIJING ELLITOP, etc.) by methods well known to the persons skilled in the art. As the persons skilled in the art are aware of the above-mentioned equipment use, test methods and other related contents, the inherent data of the sample can be obtained with certainty and without influence, so the above related contents are not further described in this present disclosure.

MATERIAL SYNTHESIS EXAMPLE

The method for preparing a compound in the present disclosure is not limited herein. Typically, the following compounds are used as examples without limitations, and synthesis routes and preparation methods thereof are described below.

Synthesis Example 1: Synthesis of Compound 77

Step 1: Synthesis of Intermediate 1

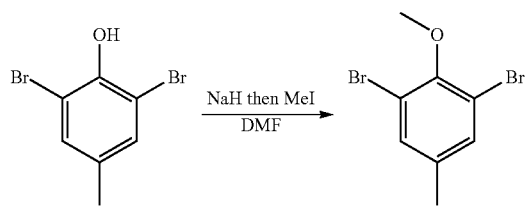

2,6-Dibromo-4-methylphenol (58.2 g, 218.9 mmol) was dissolved in 700 mL of dry DMF, then the reaction solution was cooled to 0° C., and NaH (10.6 g, 281.5 mmol) was added thereto in portions. After addition, the reaction solution was stirred at 0° C. until there was no obvious gas produced from the solution. Then, iodomethane (46.7 g, 328.4 mmol) was added thereto, and then the reaction was warmed to room temperature and stirred overnight. After TLC showed that the reaction was completed, the reaction solution was added with water and ethyl acetate and extracted. The organic phases were combined, washed several times with saturated brine, dried and subjected to rotary evaporation to dryness to obtain a crude product. The crude product was isolated through silica gel column chromatography (eluent: petroleum ether) to obtain target product Intermediate 1 as a colorless oily liquid (57.7 g, 94.3%).

Step 2: Synthesis of Intermediate 2

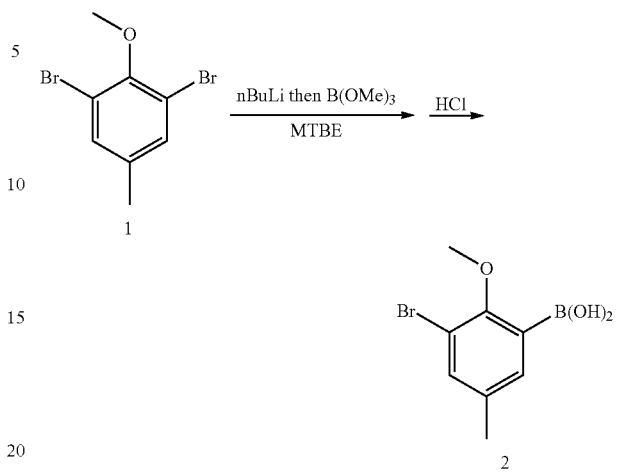

Intermediate 1 (31.7 g, 113.2 mmol) was dissolved in 230 mL of ultra-dry methyl t-butyl ether (MTBE), the reaction solution was cooled to −72° C., and a solution of n-butyl lithium (50 mL, 125 mmol) was added dropwise thereto under nitrogen protection. After dropwise addition, the reaction was maintained at this temperature for 30 min, trimethyl borate (17.6 g, 169.8 mmol) was added thereto, and then the reaction was carried out for 2 h at room temperature. Then, 250 mL of 2 M HCl were added thereto and the reaction solution was stirred at room temperature for 2 h. Next, an appropriate amount of methyl t-butyl ether was added to the reaction, layers were separated, the aqueous phase was extracted with methyl t-butyl ether, and the organic phases were combined, dried and subjected to rotary evaporation to dryness to obtain crude yellow solids. Then, the crude yellow solids were added with 150 mL of n-hexane, heated to reflux for 1 h, cooled to room temperature, and filtered. The solids were collected, washed several times with hexane, and suction-filtered to dryness to obtain Intermediate 2 as a white powder (16.5 g, 59.7%).

Step 3: Synthesis of Intermediate 3

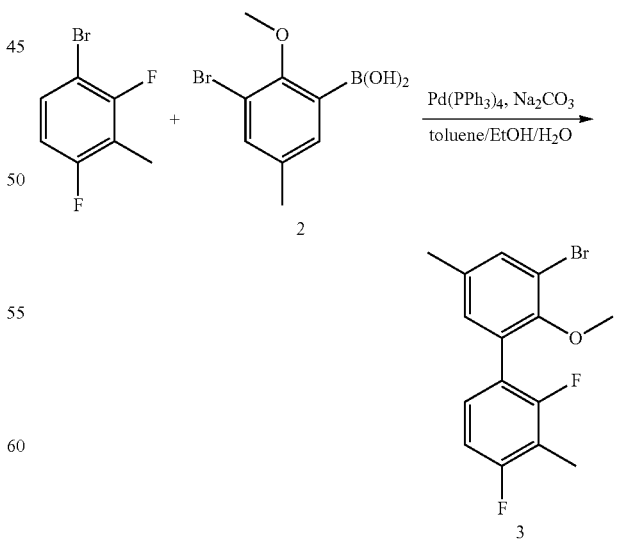

1-Bromo-2,4-difluoro-3-methylbenzene (14.0 g, 67.6 mmol), Intermediate 2 (16.5 g, 67.6 mmol), tetrakis(triphenylphosphine)palladium (3.9 g, 3.4 mmol) and sodium carbonate (14.0 g, 132.1 mmol) were placed in a 1 L reaction flask and added with 210 mL of toluene, 70 mL of ethanol and 70 mL of water. The system was vacuumed, purged with nitrogen, and refluxed overnight. After TLC detected that the reaction was completed, the system was cooled to room temperature, diluted with water and extracted with dichloromethane, and the organic phases were combined, dried, subjected to rotary evaporation, and isolated through silica gel column chromatography (eluents: ethyl acetate:petroleum ether=1:100, v/v) to obtain Intermediate 3 as a colorless oily liquid (12.9 g, 58.3%).

Step 4: Synthesis of Intermediate 4

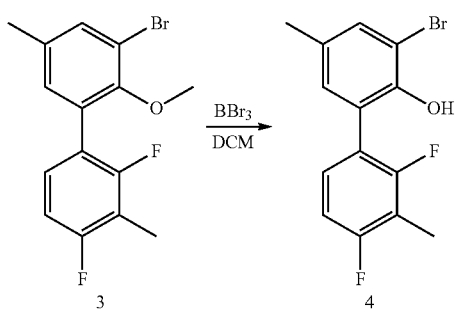

Intermediate 3 (12.9 g, 39.4 mmol) was dissolved in 150 mL of dichloromethane, the reaction solution was then cooled to 0° C., and boron tribromide (15.3 g, 61.1 mmol) was slowly added thereto. Then, the reaction was continued for 2 h at this temperature. After TLC showed that the reaction was completed, the reaction was quenched carefully with water and extracted with dichloromethane, and the organic phases were combined, dried, subjected to rotary evaporation, and isolated through silica gel column chromatography (eluents: ethyl acetate:petroleum ether=1:50, v/v) to obtain Intermediate 4 as a white solid (10.9 g, 88.3%).

Step 5: Synthesis of Intermediate 5

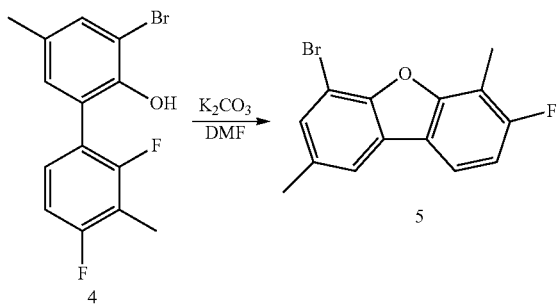

Intermediate 4 (13.9 g, 44.4 mmol), potassium carbonate (12.3 g, 89.0 mmol) and DMF (150 mL) were added to a 250 mL three-necked flask, and then the resulting reaction mixture was heated to 100° C. under nitrogen protection and reacted overnight. After the reaction mixture was cooled to room temperature, the reaction solution was added with water and ethyl acetate and extracted. The organic phases were combined, washed several times with saturated brine, dried and subjected to rotary evaporation to dryness to obtain a crude product. The crude product was isolated through silica gel column chromatography (eluent: petroleum ether) to obtain target product Intermediate 5 as a white solid (10.3 g, 79.1%).

Step 6: Synthesis of Intermediate 6

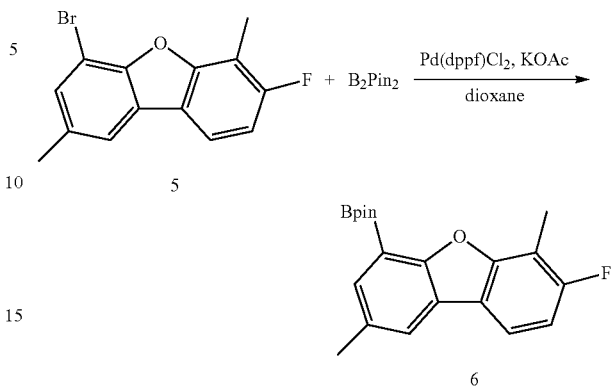

Intermediate 5 (10.3 g, 35.1 mmol), bis(pinacolato)diboron (11.6 g, 45.7 mmol), Pd(dppf)Cl$_2$ (1.3 g, 1.8 mmol), potassium acetate (5.2 g, 53.0 mmol) and 1,4-dioxane (100 mL) were added to a 250 mL three-necked flask, and then the resulting reaction mixture was heated to reflux and reacted overnight under nitrogen protection. After the reaction mixture was cooled to room temperature, the reaction solution was added with water and ethyl acetate and extracted. The organic phases were combined, washed several times with saturated brine, dried and subjected to rotary evaporation to dryness to obtain a crude product. The crude product was isolated through silica gel column chromatography (eluents: ethyl acetate:petroleum ether=1:50, v/v) to obtain target product Intermediate 6 as a white solid (10.2 g, 85.4%).

Step 7: Synthesis of Intermediate 7

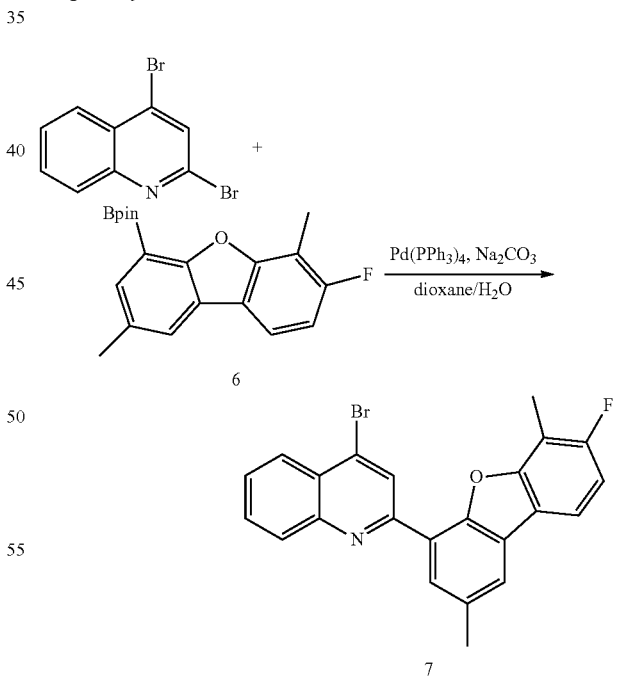

2,4-Dibromoquinoline (6.0 g, 20.9 mmol), Intermediate 6 (7.1 g, 20.9 mmol), tetrakis(triphenylphosphine)palladium (1.2 g, 1.1 mmol), sodium carbonate (3.3 g, 31.1 mmol), 1,4-dioxane (80 mL) and water (20 mL) were added to a 250 mL three-necked flask, and then the resulting reaction mixture was heated to reflux and reacted overnight under nitrogen protection. After the reaction mixture was cooled to room temperature, the reaction solution was filtered and the obtained solids were washed several times with water and petroleum ether and dried to obtain a crude product. The crude product was isolated through silica gel column chromatography (eluents: dichloromethane:petroleum ether=1:3, v/v) to obtain target product Intermediate 7 as a white solid (5.7 g, 65.2%).

Step 8: Synthesis of Intermediate 8

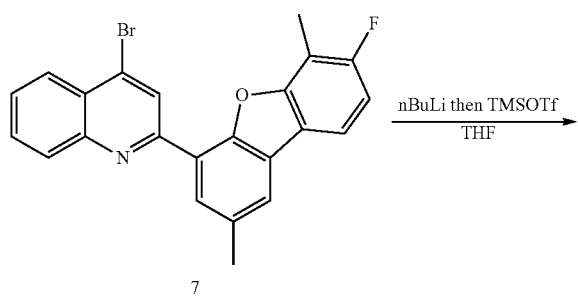

Intermediate 7 (5.2 g, 12.4 mmol) was dissolved in 250 mL of ultra-dry tetrahydrofuran, the reaction solution was cooled to −72° C., and a solution of n-butyl lithium (5.5 mL, 13.6 mmol) was added dropwise thereto under nitrogen protection. After dropwise addition, the reaction was maintained at this temperature for 1 h, trimethylsilyl trifluoromethanesulfonate (TMSOTf) (3.3 g, 14.9 mmol) was added thereto, and the reaction was carried out for 2 h at room temperature. Then, the reaction was quenched with a saturated solution of sodium bicarbonate. Ethyl acetate was added to the reaction, layers were separated, and the aqueous phase was extracted with ethyl acetate. The organic phases were combined, dried, and subjected to rotary evaporation to dryness to obtain a crude product. The crude product was isolated through silica gel column chromatography (eluents: dichloromethane:petroleum ether=1:3, v/v) to obtain target product Intermediate 8 as a white solid (3.2 g, 62.4%).

Step 9: Synthesis of an Iridium Dimer

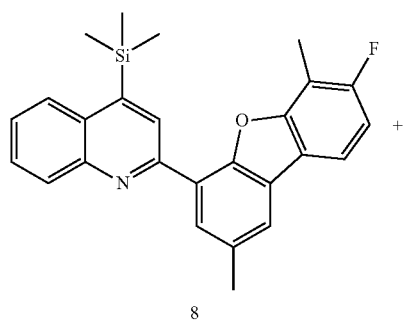

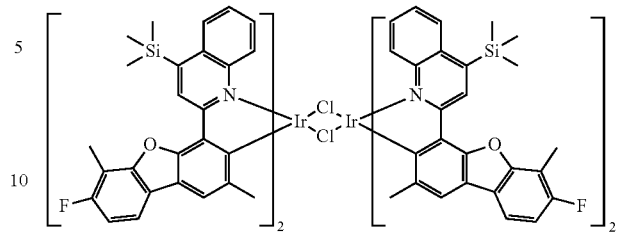

A mixture of Intermediate 8 (2.6 g, 6.3 mmol), iridium trichloride trihydrate (554 mg, 1.6 mmol), 2-ethoxyethanol (21 mL) and water (7 mL) was refluxed under a nitrogen atmosphere for 24 h. The system was cooled to room temperature and subjected to rotary evaporation to carefully remove water in the solution, so that a solution of an iridium dimer in ethoxyethanol was obtained, which was used in the next step without further purification.

Step 10: Synthesis of Compound 77

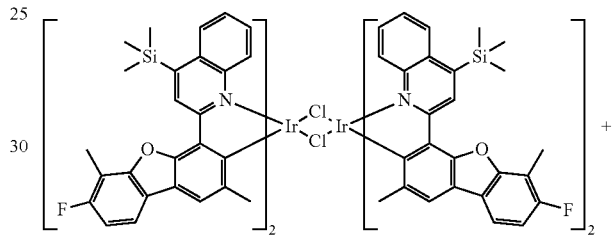

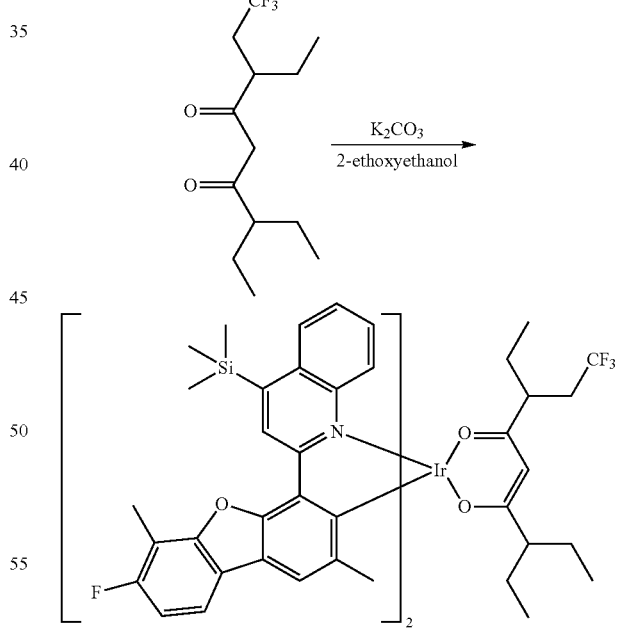

The solution of the iridium dimer in ethoxyethanol obtained in step 9, 3,7-diethyl-1,1,1-trifluoromethylnonane-4,6-dione (511 mg, 2.4 mmol) and potassium carbonate (1.1 g, 8 mmol) were added to a 100 mL round-bottom flask and reacted at room temperature for 24 h under nitrogen protection. Then, the system was poured into a funnel filled with Celite to be filtered and washed with ethanol. The obtained solids were added with dichloromethane and the filtrate was collected. Then ethanol was added and the resulting solution was concentrated not to dryness. The solution was filtered to obtain 0.52 g of Compound 77 (with a yield of 25.3%). The product was further purified through column chromatography. The structure of the compound was confirmed through NMR and LC-MS as the target product with a molecular weight of 1282.4.

Synthesis Example 2: Synthesis of Compound 73

Step 1: Synthesis of Intermediate 9

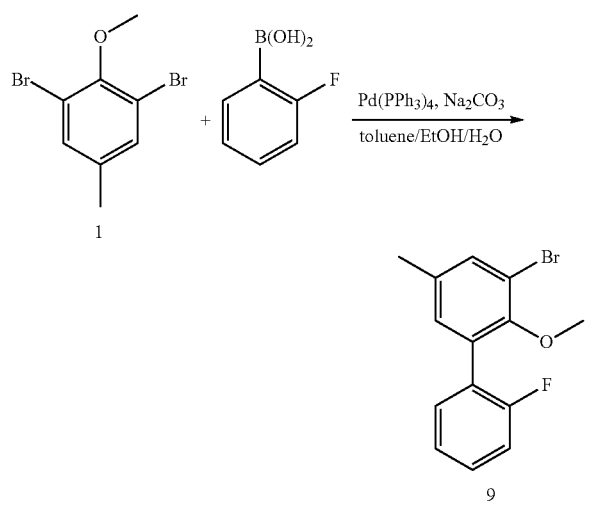

Intermediate 1 (57.7 g, 206 mmol), 2-fluorophenylboronic acid (28.8 g, 206 mmol), tetrakis(triphenylphosphine)palladium (4.76 g, 4.1 mmol) and sodium carbonate (42.7 g, 309 mmol) were placed in a 1 L reaction flask and added with 300 mL of toluene, 100 mL of ethanol and 100 mL of water. The system was vacuumed, purged with nitrogen, and refluxed overnight. After TLC detected that the reaction was completed, the system was cooled to room temperature, diluted with water and extracted with dichloromethane, and the organic phases were combined, dried, subjected to rotary evaporation, and isolated through silica gel column chromatography (eluents: ethyl acetate:petroleum ether=1:100, v/v) to obtain colorless oily liquid, Intermediate 9 (39 g, 64.1%).

Step 2: Synthesis of Intermediate 10

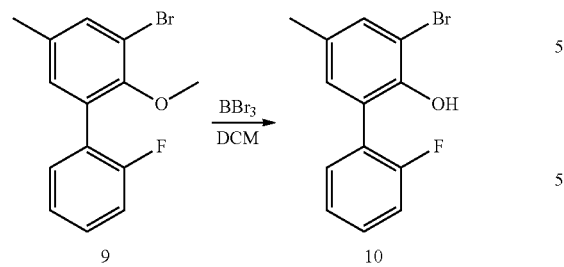

Intermediate 9 (39 g, 132.1 mmol) was dissolved in 500 mL of dichloromethane, the reaction solution was then cooled to 0° C., and boron tribromide (49.7 g, 198.2 mmol) was slowly added thereto. Then, the reaction was continued for 2 h at this temperature. After TLC showed that the reaction was completed, the reaction was quenched carefully with water and extracted with dichloromethane, and the organic phases were combined, dried, subjected to rotary evaporation, and isolated through silica gel column chromatography (eluents: ethyl acetate:petroleum ether=1:50, v/v) to obtain Intermediate 10 as a white solid (31.8 g, 85.5%).

Step 3: Synthesis of Intermediate 11

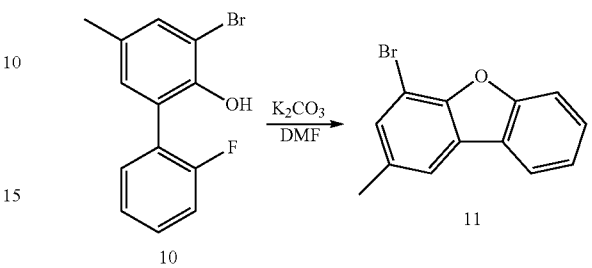

Intermediate 10 (31.8 g, 113 mmol), potassium carbonate (31.3 g, 226 mmol) and DMF (300 mL) were added to a 500 mL three-necked flask, and then the resulting reaction mixture was heated to 100° C. under nitrogen protection and reacted overnight. After the reaction mixture was cooled to room temperature, the reaction solution was added with water and ethyl acetate and extracted. The organic phases were combined, washed several times with saturated brine, dried and subjected to rotary evaporation to dryness to obtain a crude product. The crude product was isolated through silica gel column chromatography (eluent: petroleum ether) to obtain target product Intermediate 11 as a white solid (16.4 g, 55.6%).

Step 4: Synthesis of Intermediate 12

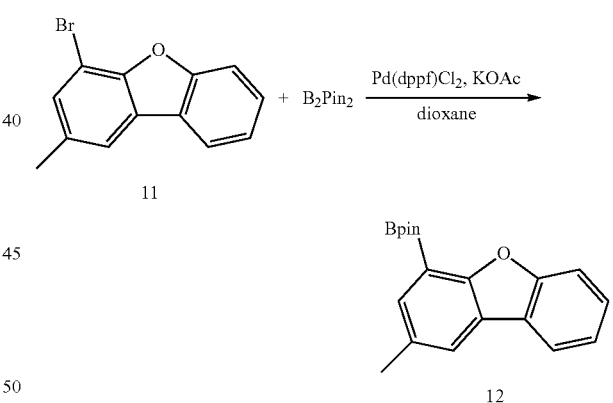

Intermediate 11 (16.4 g, 62.8 mmol), bis(pinacolato)diboron (20.7 g, 81.6 mmol), Pd(dppf)Cl$_2$ (1.4 g, 1.9 mmol), potassium acetate (9.2 g, 94.2 mmol) and 1,4-dioxane (300 mL) were added to a 250 mL three-necked flask, and then the resulting reaction mixture was heated to reflux overnight under nitrogen protection. After the reaction mixture was cooled to room temperature, the reaction solution was added with water and ethyl acetate and extracted. The organic phases were combined, washed several times with saturated brine, dried and subjected to rotary evaporation to dryness to obtain a crude product. The crude product was isolated through silica gel column chromatography (eluents: ethyl acetate:petroleum ether=1:50, v/v) to obtain target product Intermediate 12 as a white solid (13.5 g, 69.8%).

Step 5: Synthesis of Intermediate 13

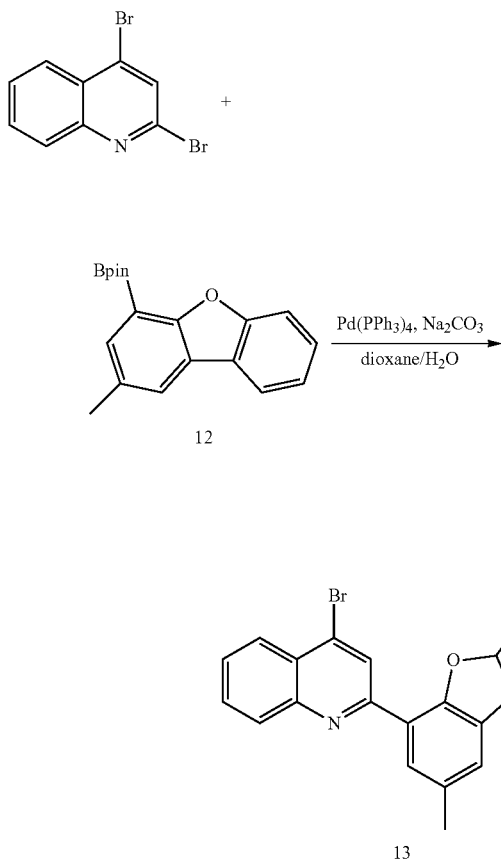

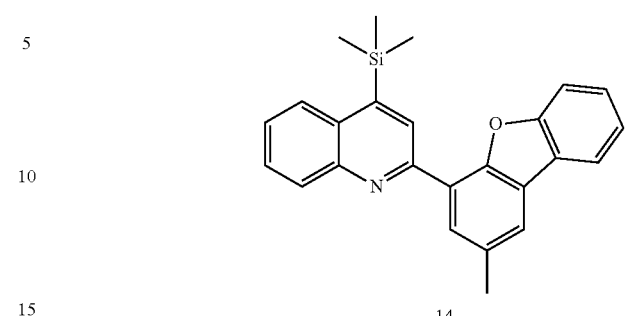

2,4-Dibromoquinoline (6.15 g, 21.4 mmol), Intermediate 12 (6.6 g, 21.4 mmol), tetrakis(triphenylphosphine)palladium (1.2 g, 1.1 mmol), sodium carbonate (3.4 g, 32.1 mmol), 1,4-dioxane (90 mL) and water (20 mL) were added to a 250 mL three-necked flask, and then the resulting reaction mixture was heated to reflux overnight under nitrogen protection. After the reaction mixture was cooled to room temperature, the reaction solution was filtered and the obtained solids were washed several times with water and petroleum ether and dried to obtain a crude product. The crude product was isolated through silica gel column chromatography (eluents: dichloromethane:petroleum ether=1:3, v/v) to obtain target product Intermediate 13 as a white solid (5.2 g, 62.6%).

Step 6: Synthesis of Intermediate 14

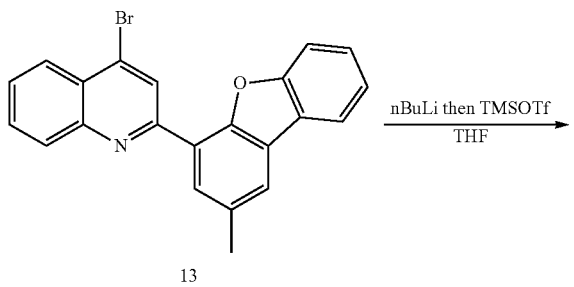

Intermediate 13 (5.2 g, 13.4 mmol) was dissolved in 134 mL of ultra-dry tetrahydrofuran, the reaction solution was cooled to −72° C., and a solution of n-butyl lithium (6.4 mL, 12.0 mmol) was added dropwise thereto under nitrogen protection. After dropwise addition, the reaction was maintained at this temperature for 30 min, trimethylsilyl trifluoromethanesulfonate (TMSOTf) (4.2 g, 18.8 mmol) was added thereto, and the reaction was carried out for 2 h at room temperature. Then, the reaction was quenched with a saturated solution of sodium bicarbonate. Ethyl acetate was added to the reaction, layers were separated, and the aqueous phase was extracted with ethyl acetate. The organic phases were combined, dried, and subjected to rotary evaporation to dryness to obtain a crude product. The crude product was isolated through silica gel column chromatography (eluents: dichloromethane:petroleum ether=1:2, v/v) to obtain target product Intermediate 14 as a white solid (3.2 g, 62.7%).

Step 7: Synthesis of an Iridium Dimer

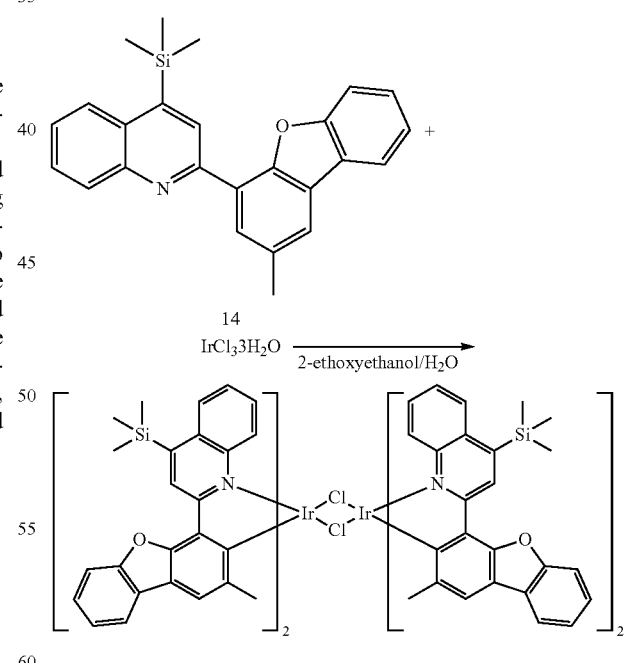

A mixture of Intermediate 14 (3 g, 7.9 mmol), iridium trichloride trihydrate (693 mg, 2.0 mmol), 2-ethoxyethanol (21 mL) and water (7 mL) was refluxed under a nitrogen atmosphere for 24 h. The system was cooled to room temperature and subjected to rotary evaporation to carefully remove water in the solution, so that a solution of an iridium dimer in ethoxyethanol was obtained, which was used in the next step without further purification.

Step 8: Synthesis of Compound 73

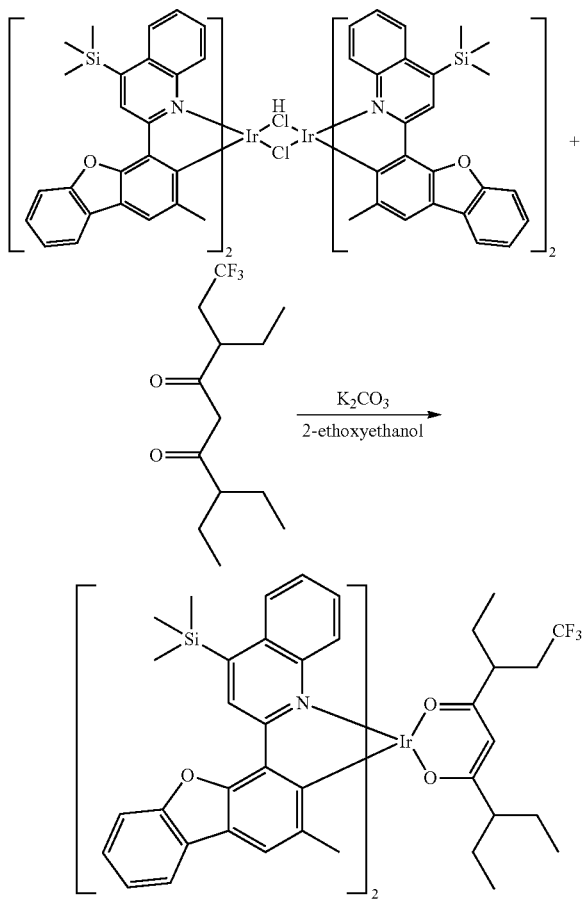

The solution of the iridium dimer in ethoxyethanol obtained in step 7, 3,7-diethyl-1,1,1-trifluoromethylnonane-4,6-dione (798 mg, 3.0 mmol) and potassium carbonate (1.38 g, 10.0 mL) were added to a 100 mL round-bottom flask and reacted at room temperature for 24 h under nitrogen protection. Then, the system was poured into a funnel filled with Celite to be filtered and washed with ethanol. The obtained solids were added with dichloromethane and the filtrate was collected. Then ethanol was added and the resulting solution was concentrated not to dryness. The solution was filtered to obtain 1.2 g of Compound 73 (with a yield of 49.2%). The product was further purified through column chromatography. The structure of the compound was confirmed through NMR and LC-MS as the target product with a molecular weight of 1218.4.

Synthesis Example 3: Synthesis of Compound 128

Step 1: Synthesis of Intermediate 15

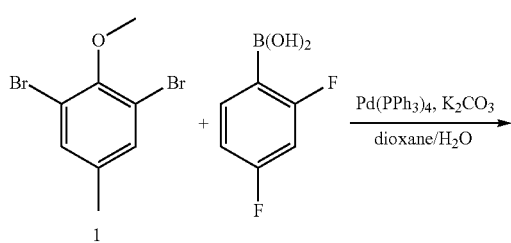

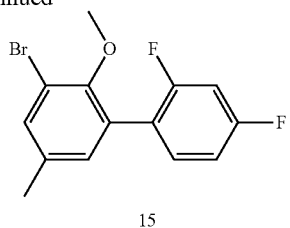

Intermediate 1 (35 g, 125 mmol), 2,4-bifluorophenylboronic acid (19.7 g, 125 mmol), tetrakis(triphenylphosphine)palladium (2.89 g, 2.5 mmol) and potassium carbonate (34.6 g, 250 mmol) were placed in a 1 L reaction flask and added with 375 mL of 1,4-dioxane and 125 mL of water. The system was vacuumed, purged with nitrogen, and refluxed overnight. After TLC detected that the reaction was completed, the system was cooled to room temperature, diluted with water and extracted with dichloromethane, and the organic phases were combined, dried, subjected to rotary evaporation, and isolated through silica gel column chromatography (eluents: ethyl acetate:petroleum ether=1:100, v/v) to obtain colorless oily liquid, Intermediate 15 (15.6 g, 39.8%).

Step 2: Synthesis of Intermediate 16

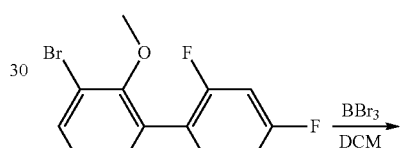

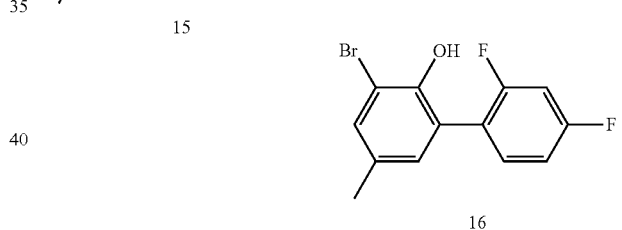

Intermediate 15 (15.6 g, 49.8 mmol) was dissolved in 200 mL of dichloromethane, the reaction solution was then cooled to 0° C., and boron tribromide (18.7 g, 74.7 mmol) was slowly added thereto. Then, the reaction was continued for 2 h at this temperature. After TLC showed that the reaction was completed, the reaction was quenched carefully with water and extracted with dichloromethane, and the organic phases were combined, dried, subjected to rotary evaporation, and isolated through silica gel column chromatography (eluents: ethyl acetate:petroleum ether=1:50, v/v) to obtain Intermediate 16 as a white solid (12.1 g, 81.2%).

Step 3: Synthesis of Intermediate 17

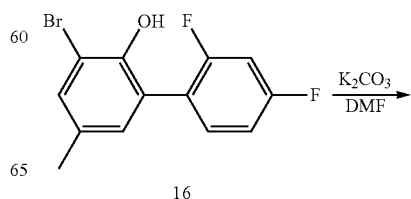

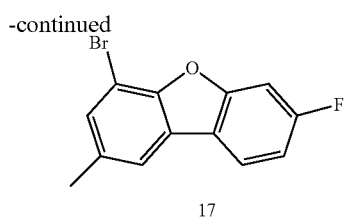

17

Intermediate 16 (12.1 g, 40.5 mmol), potassium carbonate (11.2 g, 80.9 mmol) and DMF (150 mL) were sequentially added to a 500 mL three-necked flask, and then the resulting reaction mixture was heated to 100° C. under nitrogen protection and reacted overnight. After the reaction mixture was cooled to room temperature, the reaction solution was added with water and ethyl acetate and extracted. The organic phases were combined, washed several times with saturated brine, dried and subjected to rotary evaporation to dryness to obtain a crude product. The crude product was isolated through silica gel column chromatography (eluent: petroleum ether) to obtain target product Intermediate 17 as a white solid (9.8 g, 86.7%).

Step 4: Synthesis of Intermediate 18

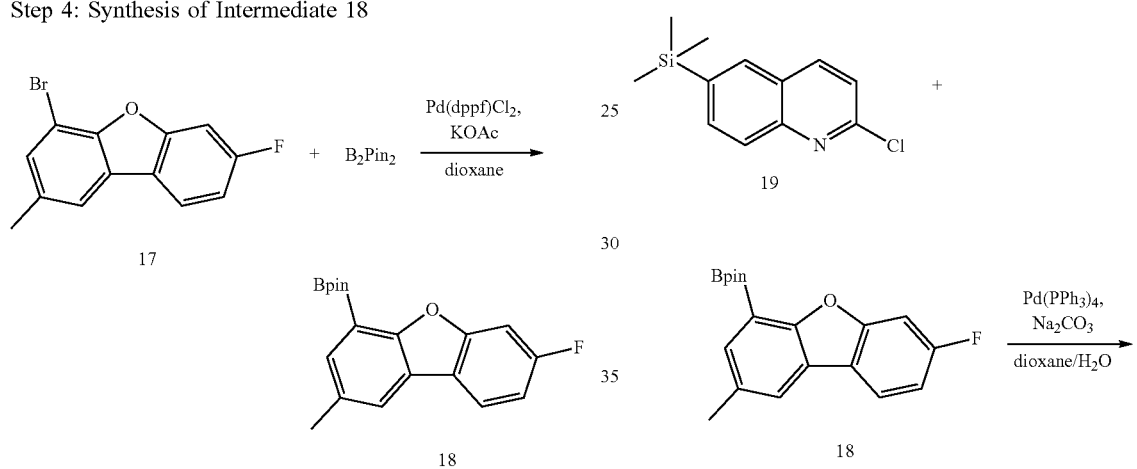

Intermediate 17 (9.8 g, 35.1 mmol), bis(pinacolato)diboron (11.6 g, 45.6 mmol), Pd(dppf)Cl₂ (1.3 g, 1.8 mmol), potassium acetate (5.2 g, 52.7 mmol) and 1,4-dioxane (300 mL) were sequentially added to a 250 mL three-necked flask, and then the resulting reaction mixture was heated to reflux and reacted overnight under nitrogen protection. After the reaction was completed, the reaction mixture was cooled to room temperature, added with water and ethyl acetate, and extracted. Layers were separated. The organic phases were combined, washed several times with saturated brine, dried and subjected to rotary evaporation to dryness to obtain a crude product. The crude product was isolated through silica gel column chromatography (eluents: ethyl acetate:petroleum ether=1:50, v/v) to obtain target product Intermediate 18 as a white solid (9.5 g, 83.0%).

Step 5: Synthesis of Intermediate 19

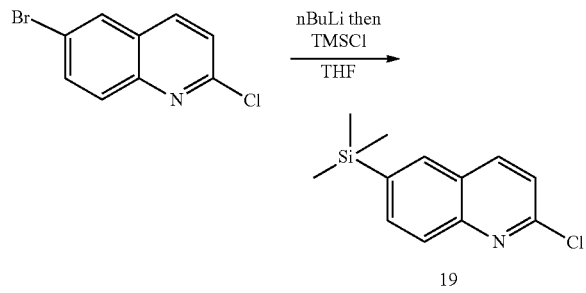

2-Chloro-6-bromoquinoline (5 g, 20.6 mmol) was dissolved in 40 mL of ultra-dry tetrahydrofuran, the reaction solution was cooled to −72° C., and a solution of n-butyl lithium (9 mL, 22.7 mmol) was added dropwise thereto under nitrogen protection. After dropwise addition, the reaction was maintained at this temperature for 30 min, trimethylchlorosilane (TMSCl) (2.7 g, 24.7 mmol) was added thereto, and the reaction was carried out for 2 h at room temperature. Then, the reaction was quenched with a saturated solution of sodium bicarbonate. Ethyl acetate was added to the reaction system, layers were separated, and the aqueous phase was extracted with ethyl acetate. The organic phases were combined, dried, and subjected to rotary evaporation to dryness to obtain a crude product. The crude product was isolated through silica gel column chromatography (eluents: ethyl acetate:petroleum ether=1:100, v/v) to obtain target product Intermediate 19 as a white solid (4.2 g, 86.5%).

Step 6: Synthesis of Intermediate 20

Intermediate 19 (870 mg, 3.7 mmol), Intermediate 18 (1.27 g, 3.89 mmol), tetrakis(triphenylphosphine)palladium (214 mg, 0.2 mmol), sodium carbonate (588 mg, 5.6 mmol), 1,4-dioxane (16 mL) and water (4 mL) were added to a 250 mL three-necked flask, respectively, and then the resulting reaction mixture was heated to reflux overnight under nitrogen protection. After the reaction mixture was cooled to room temperature, the reaction solution was filtered and the obtained solids were washed several times with water and petroleum ether and dried to obtain a crude product. The crude product was isolated through silica gel column chromatography (eluents: ethyl acetate:petroleum ether=1:100, v/v) to obtain target product Intermediate 20 as a white solid (1.28 g, 86.8%).

Step 7: Synthesis of an Iridium Dimer

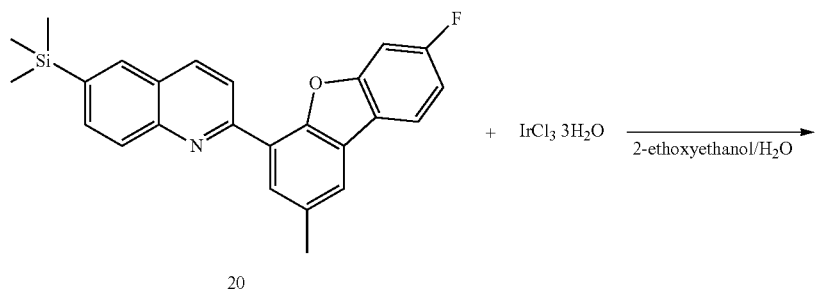

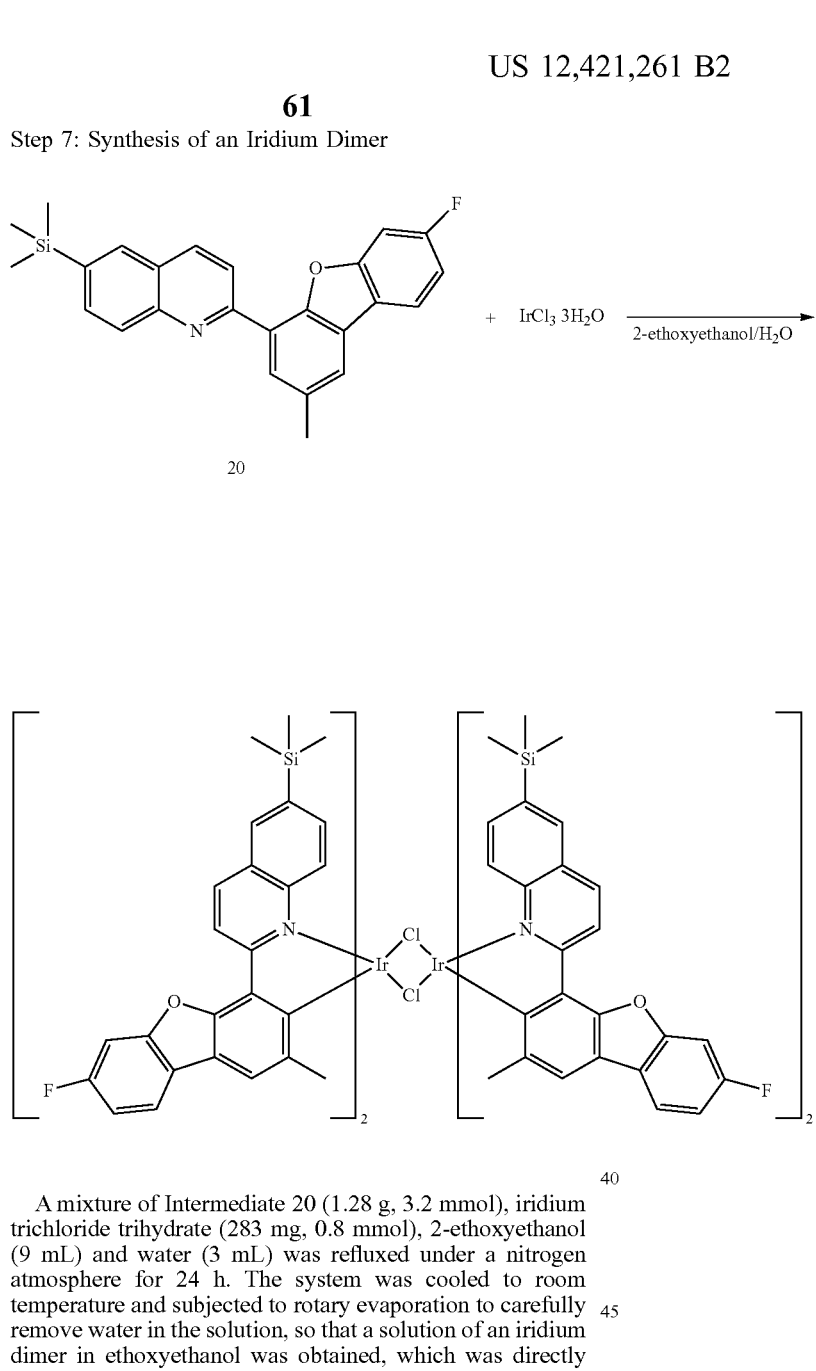

A mixture of Intermediate 20 (1.28 g, 3.2 mmol), iridium trichloride trihydrate (283 mg, 0.8 mmol), 2-ethoxyethanol (9 mL) and water (3 mL) was refluxed under a nitrogen atmosphere for 24 h. The system was cooled to room temperature and subjected to rotary evaporation to carefully remove water in the solution, so that a solution of an iridium dimer in ethoxyethanol was obtained, which was directly used in the next step without further purification.

Step 8: Synthesis of Compound 128

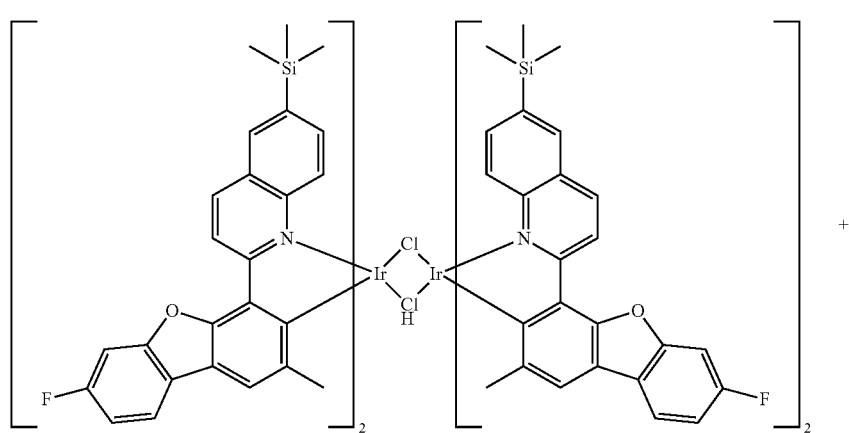

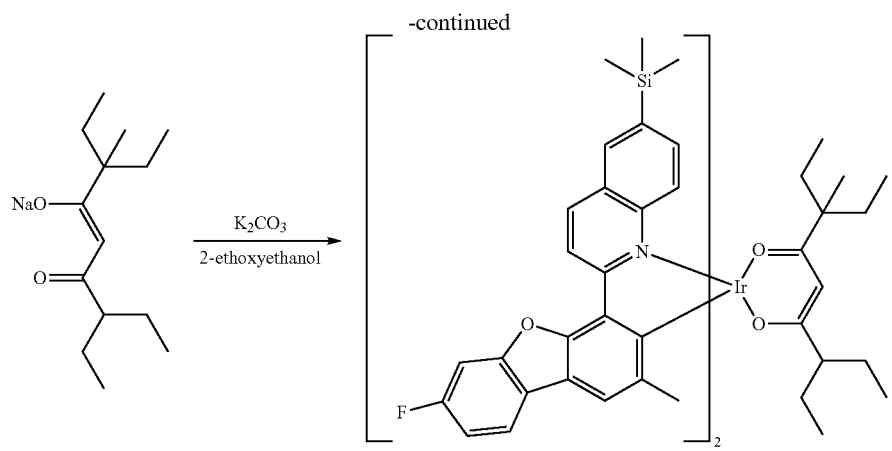

The solution of the iridium dimer in ethoxyethanol obtained in step 7, 3,7-diethyl-3-methylnonane-4,6-dione sodium salt (298 mg, 1.2 mmol) and potassium carbonate (553 mg, 4 mmol) were added to a 50 mL round-bottom flask and reacted at 60° C. for 24 h under nitrogen protection. Then, the system was poured into a funnel filled with Celite to be filtered and washed with ethanol. Dichloromethane was added to the obtained solids and the filtrate was collected. Then ethanol was added and the resulting solution was concentrated not to dryness. The solution was filtered to obtain 400 mg of Compound 128 (with a yield of 41.1%). The product was further purified through column chromatography. The structure of the compound was confirmed through NMR and LC-MS as the target product with a molecular weight of 1214.4.

Synthesis Example 4: Synthesis of Compound 164

Step 1: Synthesis of an Iridium Dimer

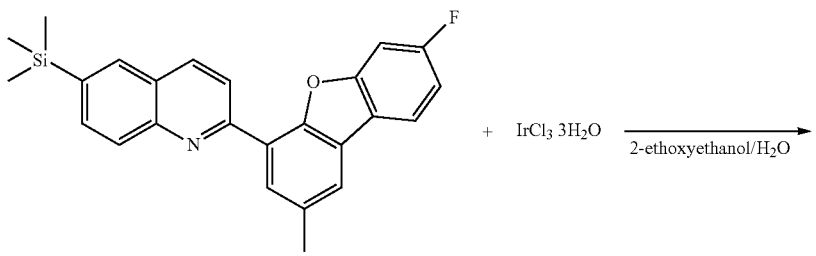

20

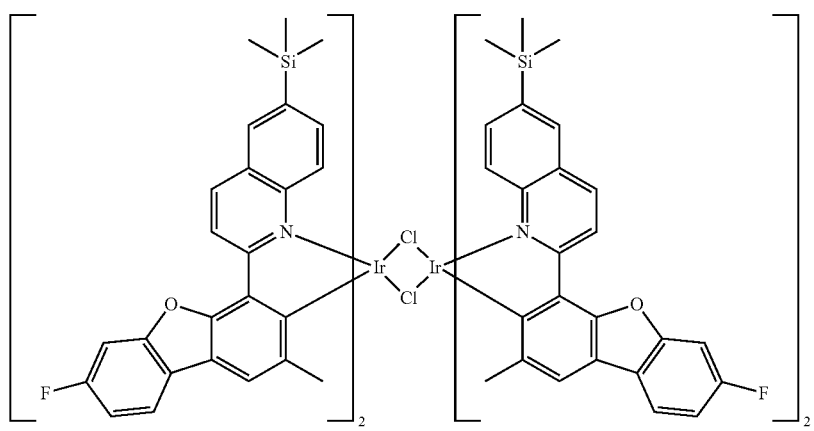

A mixture of Intermediate 20 (2.9 g, 7.2 mmol), iridium trichloride trihydrate (640 mg, 1.8 mmol), 2-ethoxyethanol (21 mL) and water (7 mL) was refluxed under a nitrogen atmosphere for 24 h. The system was cooled to room temperature and subjected to rotary evaporation to carefully remove water in the solution, so that a solution of an iridium dimer in ethoxyethanol was obtained, which was used in the next step without further purification.

Step 2: Synthesis of Compound 164

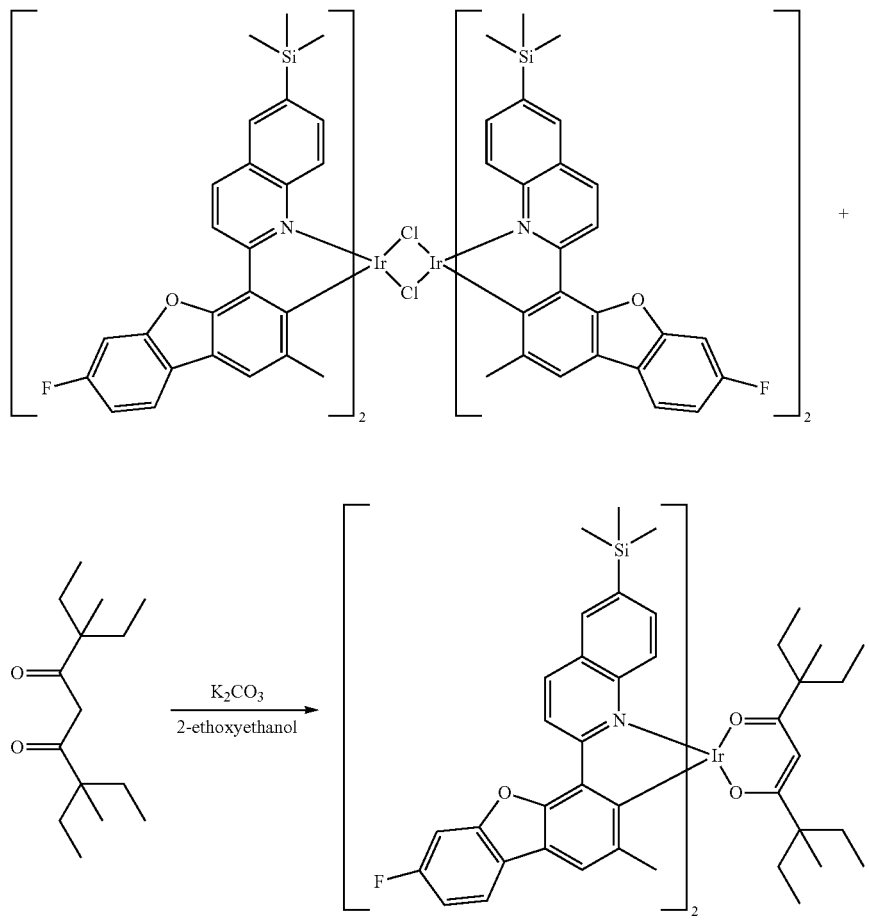

The solution of the iridium dimer in ethoxyethanol obtained in step 1, 3,7-diethyl-3,7-dimethylnonane-4,6-dione (650 mg, 2.7 mmol) and potassium carbonate (1.2 g, 9.1 mmol) were added to a 10 mL round-bottom flask and reacted at 60° C. for 24 h under nitrogen protection. Then, the system was poured into a funnel filled with Celite to be filtered and washed with ethanol. Dichloromethane was added to the obtained solids and the filtrate was collected. Then ethanol was added and the resulting solution was concentrated not to dryness. The solution was filtered to obtain 780 mg of Compound 164 (with a yield of 63.5%). The product was further purified through column chromatography. The structure of the compound was confirmed through NMR and LC-MS as the target product with a molecular weight of 1228.4.

Synthesis Example 5: Synthesis of Compound 74

Step 1: Synthesis of Intermediate 21

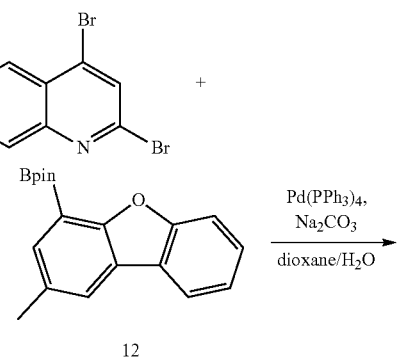

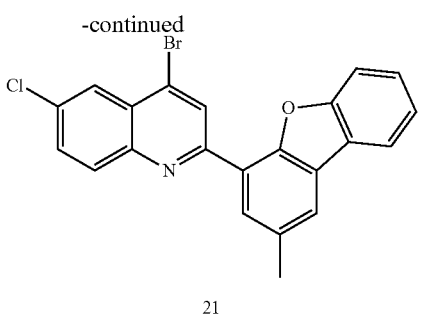

21

2,4-Dibromo-6-chloroquinoline (5.95 g, 18.5 mmol), Intermediate 12 (5.7 g, 21.4 mmol), tetrakis(triphenylphosphine)palladium (1.1 g, 0.93 mmol), sodium carbonate (2.94 g, 27.8 mmol), 1,4-dioxane (80 mL) and water (20 mL) were added to a 250 mL three-necked flask, and then the resulting reaction mixture was heated to reflux overnight under nitrogen protection. After the reaction mixture was cooled to room temperature, the reaction solution was filtered and the obtained solids were washed several times with water and petroleum ether and dried to obtain a crude product. The crude product was isolated through silica gel column chromatography (eluents: dichloromethane:petroleum ether=1:4, v/v) to obtain target product Intermediate 21 as a white solid (4.5 g, 57.3%).

Step 2: Synthesis of Intermediate 22

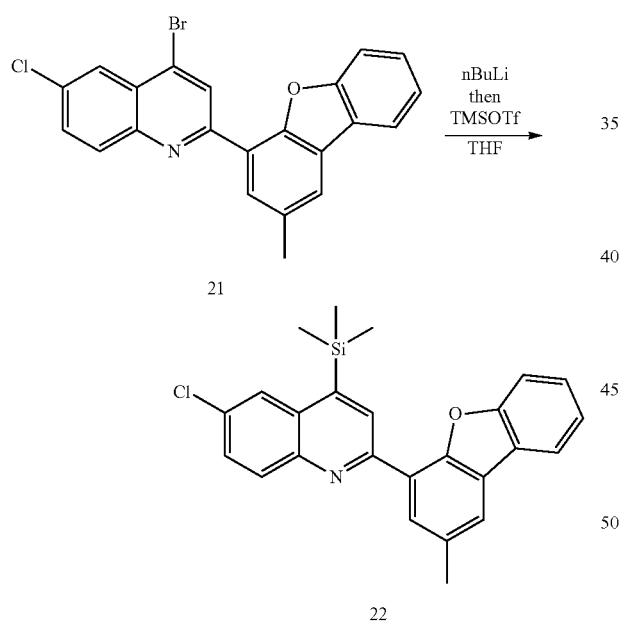

Intermediate 21 (4.5 g, 10.6 mmol) was dissolved in 100 mL of ultra-dry tetrahydrofuran, the reaction solution was cooled to −72° C., and a solution of n-butyl lithium (5.1 mL, 12.8 mmol) was added dropwise thereto under nitrogen protection. After dropwise addition, the reaction was maintained at this temperature for 30 min, trimethylsilyl trifluoromethanesulfonate (TMSOTf) (3.3 g, 14.8 mmol) was added thereto, and the reaction was carried out for 2 h at room temperature. Then, the reaction was quenched with a saturated solution of sodium bicarbonate. Ethyl acetate was added to the reaction, layers were separated, and the aqueous phase was extracted with ethyl acetate. The organic phases were combined, dried, and subjected to rotary evaporation to dryness to obtain a crude product. The crude product was isolated through silica gel column chromatography (eluents: dichloromethane:petroleum ether=1:3, v/v) to obtain target product Intermediate 22 as a white solid (3.37 g, 76.4%).

Step 3: Synthesis of Intermediate 23

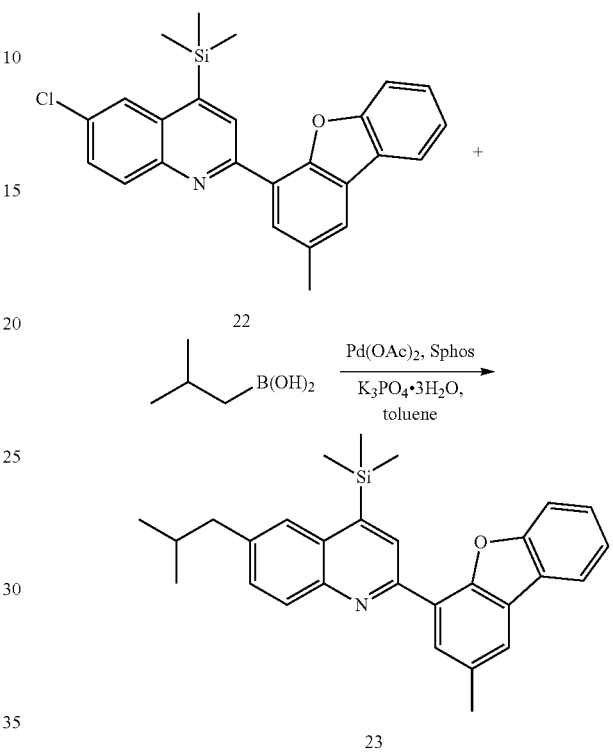

Intermediate 22 (3.37 g, 8.1 mmol), isobutylboronic acid (1.65 g, 16.2 mmol), palladium acetate (91 mg, 0.4 mmol), Sphos (333 mg, 0.8 mmol), potassium phosphate trihydrate (6.47 g, 24.3 mmol) and toluene (60 mL) were added to a 250 mL three-necked flask, and then the resulting reaction mixture was heated to reflux overnight under nitrogen protection. After the reaction mixture was cooled to room temperature, the reaction mixture was poured into a funnel filled with Celite and filtered. The filtrate was collected and subjected to rotary evaporation to dryness to obtain a crude product. The crude product was isolated through silica gel column chromatography (eluents: dichloromethane:petroleum ether=1:3, v/v) to obtain target product Intermediate 23 as a white solid (3.1 g, 87.4%).

Step 4: Synthesis of an Iridium Dimer

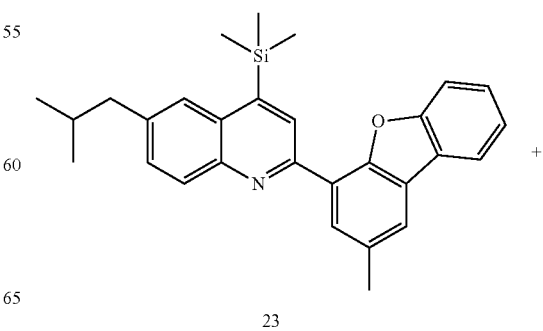

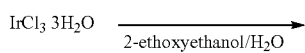

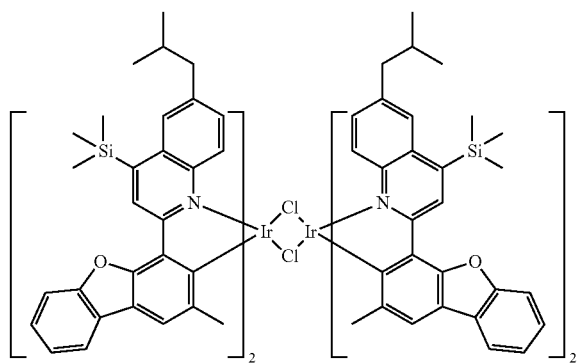

A mixture of Intermediate 23 (2 g, 4.56 mmol), iridium trichloride trihydrate (404 mg, 1.16 mmol), 2-ethoxyethanol (36 mL), and water (12 mL) was refluxed under a nitrogen atmosphere for 24 h. The system was cooled to room temperature and subjected to rotary evaporation to carefully remove water in the solution, so that a solution of an iridium dimer in ethoxyethanol was obtained, which was used in the next step without further purification.

Step 5: Synthesis of Compound 74

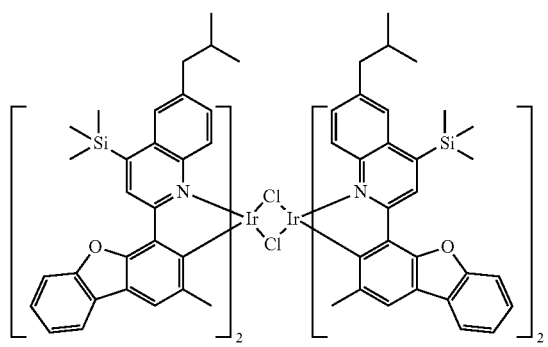

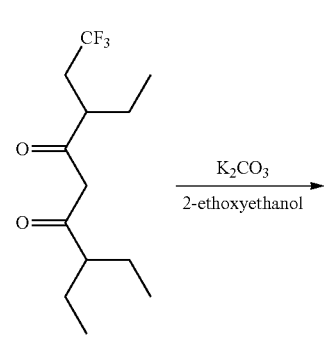

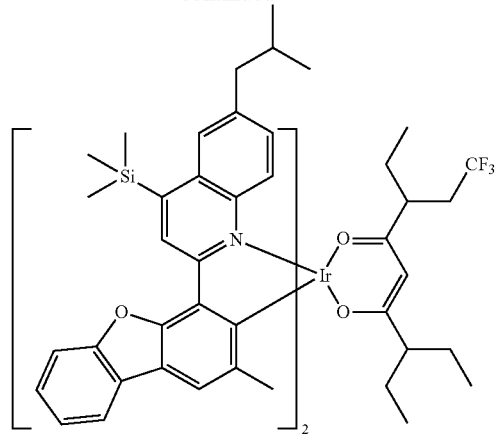

The solution of the iridium dimer in ethoxyethanol obtained in step 4, 3,7-diethyl-1,1,1-trifluorononane-4,6-dione (464 mg, 1.76 mmol) and potassium carbonate (0.8 g, 5.8 mL) were added to a 100 mL round-bottom flask and reacted at room temperature for 24 h under nitrogen protection. Then, the system was poured into a funnel filled with Celite to be filtered and washed with ethanol. The obtained solids were added with dichloromethane and the filtrate was collected. Then ethanol was added and the resulting solution was concentrated not to dryness. The solution was filtered to obtain 0.85 g of Compound 74 (with a yield of 55.1%). The product was further purified through column chromatography. The structure of the compound was confirmed through NMR and LC-MS as the target product with a molecular weight of 1330.5.

Synthesis Example 6: Synthesis of Compound 122

Step 1: Synthesis of Intermediate 24

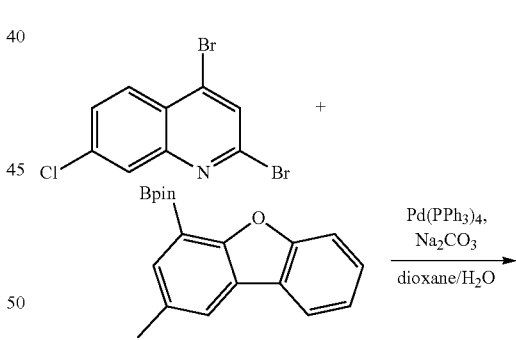

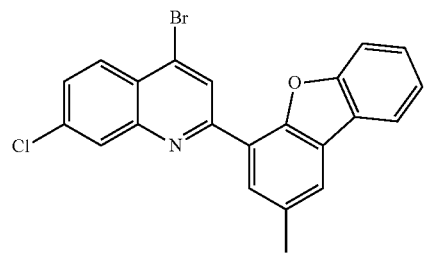

2,4-Dibromo-7-chloroquinoline (6 g, 18.7 mmol), Intermediate 12 (5.75 g, 18.7 mmol), tetrakis(triphenylphosphine)palladium (1.1 g, 0.93 mmol), sodium carbonate (2.97 g, 28.1 mmol), 1,4-dioxane (80 mL) and water (20 mL) were added to a 250 mL three-necked flask, and then the resulting reaction mixture was heated to reflux overnight under nitrogen protection. After the reaction mixture was cooled to room temperature, the reaction solution was filtered and the obtained solids were washed several times with water and petroleum ether and dried to obtain a crude product. The crude product was isolated through silica gel column chromatography (eluents: dichloromethane:petroleum ether=1:5, v/v) to obtain target product Intermediate 24 as a white solid (3.6 g, 45.6%).

Step 2: Synthesis of Intermediate 25

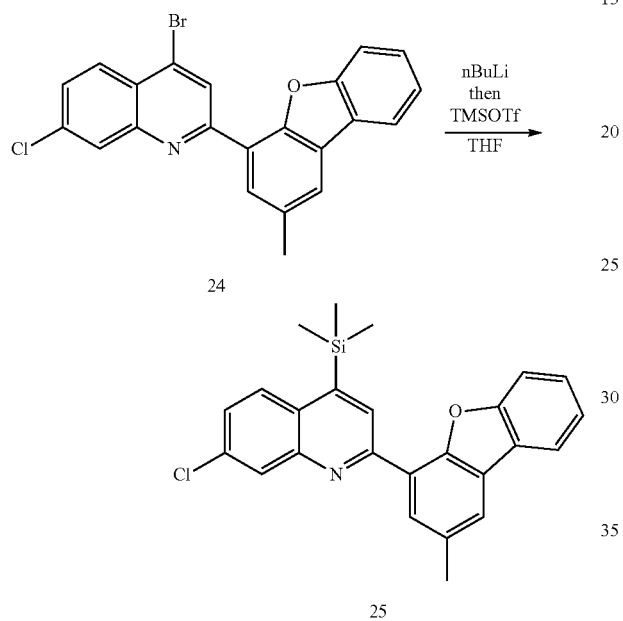

Intermediate 24 (3.6 g, 8.52 mmol) was dissolved in 85 mL of ultra-dry tetrahydrofuran, the reaction solution was cooled to −72° C., and a solution of n-butyl lithium (4.1 mL, 10.2 mmol) was added dropwise thereto under nitrogen protection. After dropwise addition, the reaction was maintained at this temperature for 30 min, trimethylsilyl trifluoromethanesulfonate (TMSOTf) (2.64 g, 11.9 mmol) was added thereto, and the reaction was carried out for 2 h at room temperature. Then, the reaction was quenched with a saturated solution of sodium bicarbonate. Ethyl acetate was added to the reaction, layers were separated, and the aqueous phase was extracted with ethyl acetate. The organic phases were combined, dried, and subjected to rotary evaporation to dryness to obtain a crude product. The crude product was isolated through silica gel column chromatography (eluents: dichloromethane:petroleum ether=1:4, v/v) to obtain target product Intermediate 25 as a white solid (1.8 g, 50.8%).

Step 3: Synthesis of Intermediate 26

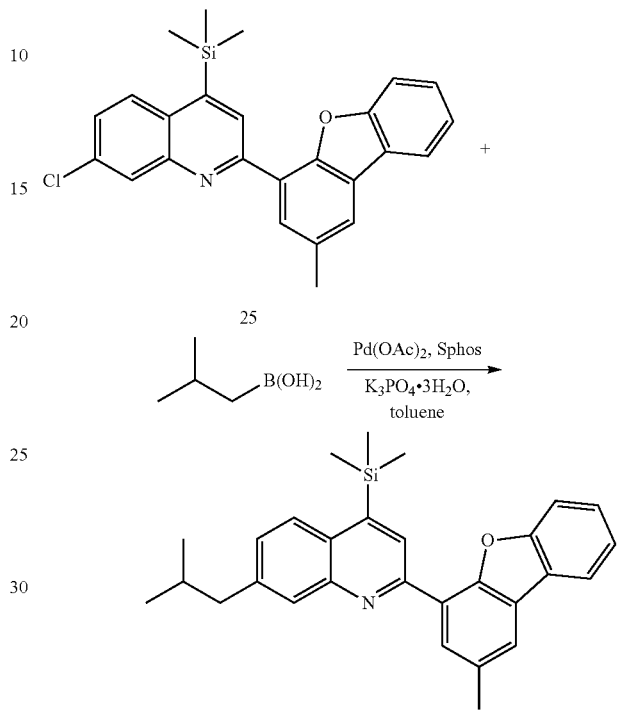

Intermediate 25 (1.8 g, 4.3 mmol), isobutylboronic acid (0.88 g, 8.65 mmol), palladium acetate (49 mg, 0.22 mmol), Sphos (181 mg, 0.43 mmol), potassium phosphate trihydrate (3.46 g, 13.0 mmol) and toluene (30 mL) were added to a 100 mL three-necked flask, and then the resulting reaction mixture was heated to reflux overnight under nitrogen protection. After the reaction mixture was cooled to room temperature, the reaction mixture was poured into a funnel filled with Celite and filtered. The filtrate was collected and subjected to rotary evaporation to dryness to obtain a crude product. The crude product was isolated through silica gel column chromatography (eluents: dichloromethane:petroleum ether=1:3, v/v) to obtain target product Intermediate 26 as a white solid (1.74 g, 91.8%).

Step 4: Synthesis of an Iridium Dimer

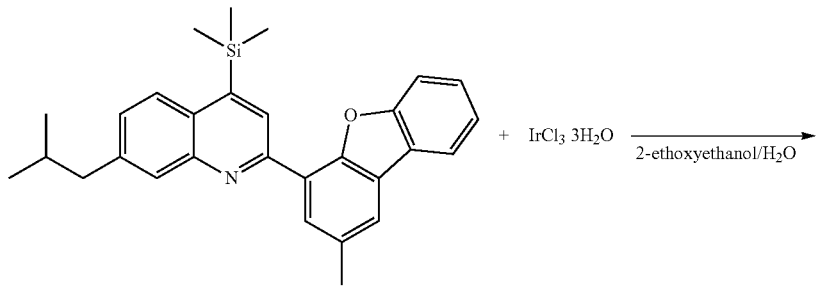

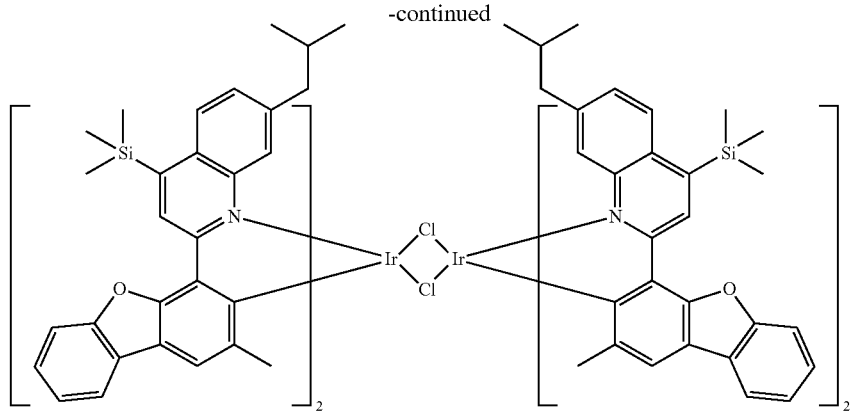

A mixture of Intermediate 26 (0.3 g, 0.69 mmol), iridium trichloride trihydrate (60 mg, 0.17 mmol), 2-ethoxyethanol (6 mL), and water (2 mL) was refluxed under a nitrogen atmosphere for 24 h. The system was cooled to room temperature and subjected to rotary evaporation to carefully remove water in the solution, so that a solution of an iridium dimer in ethoxyethanol was obtained, which was used in the next step without further purification.

Step 5: Synthesis of Compound 122

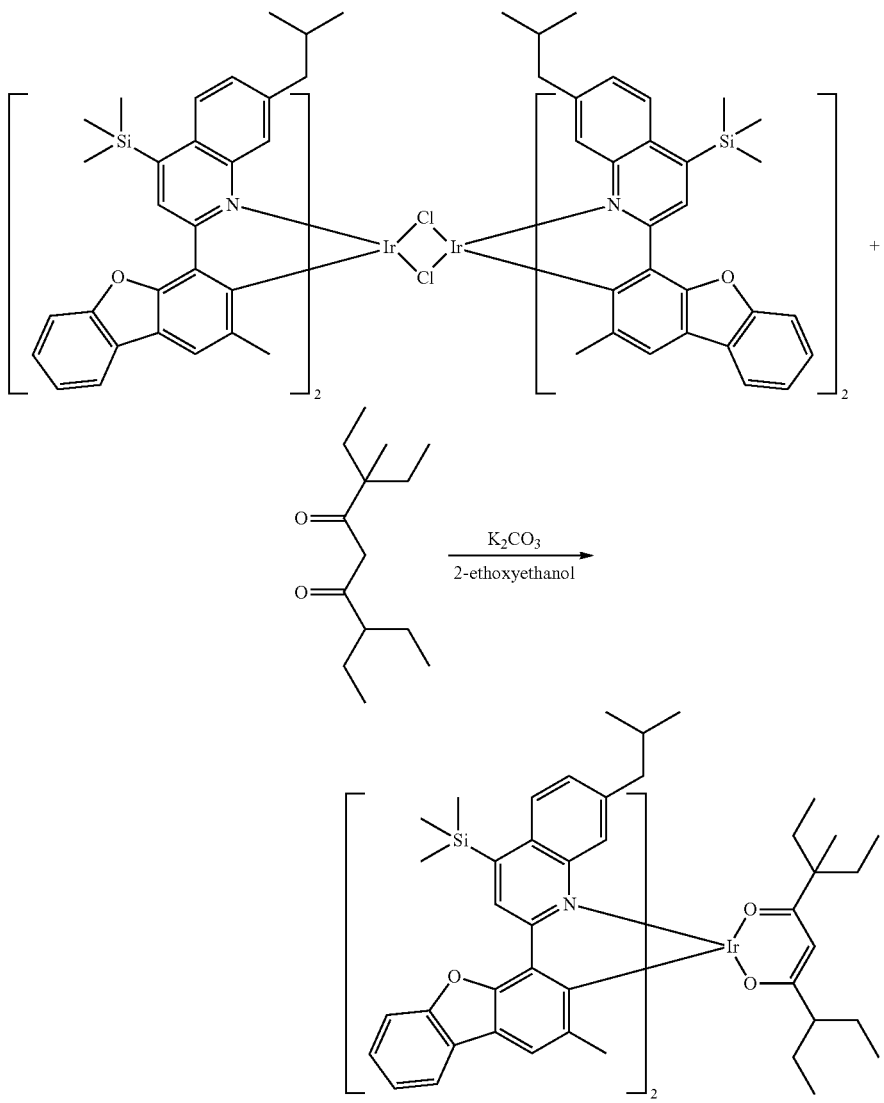

The solution of the iridium dimer in ethoxyethanol obtained in step 4, 3,7-diethyl-3-methylnonane-4,6-dione (77 mg, 0.34 mmol) and potassium carbonate (117 mg, 0.85 mmol) were added to a 50 mL round-bottom flask and reacted at room temperature for 24 h under nitrogen protection. Then, the system was poured into a funnel filled with Celite to be filtered and washed with ethanol. The obtained solids were added with dichloromethane and the filtrate was collected. Then ethanol was added and the resulting solution was concentrated not to dryness. The solution was filtered to obtain 80 mg of Compound 122 (with a yield of 36.5%). The product was further purified through column chromatography. The structure of the compound was confirmed through NMR and LC-MS as the target product with a molecular weight of 1290.6.

Synthesis Example 7: Synthesis of Compound 110

Step 1: Synthesis of an Iridium Dimer

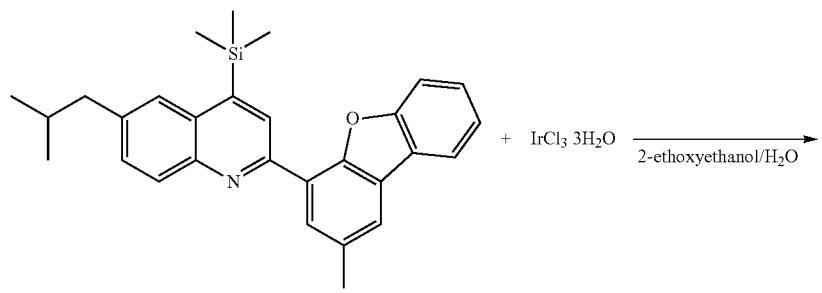

23

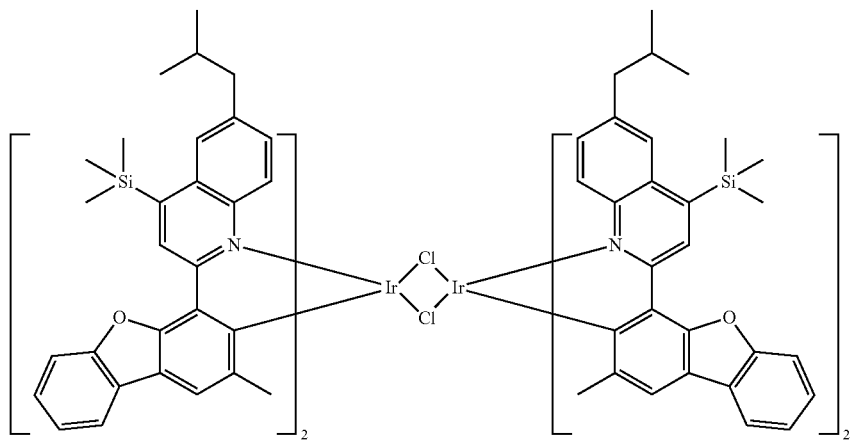

A mixture of Intermediate 23 (0.5 g, 1.14 mmol), iridium trichloride trihydrate (101 mg, 0.29 mmol), 2-ethoxyethanol (9 mL), and water (3 mL) was refluxed under a nitrogen atmosphere for 24 h. The system was cooled to room temperature and subjected to rotary evaporation to carefully remove water in the solution, so that a solution of an iridium dimer in ethoxyethanol was obtained, which was used in the next step without further purification.

Step 2: Synthesis of Compound 110

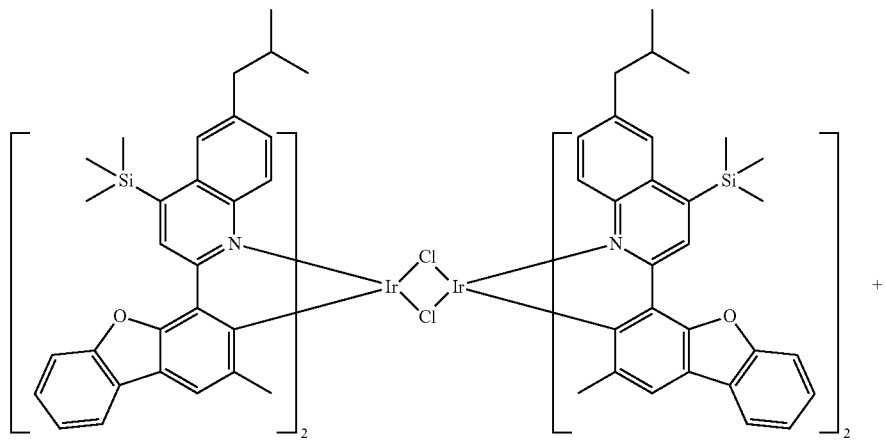

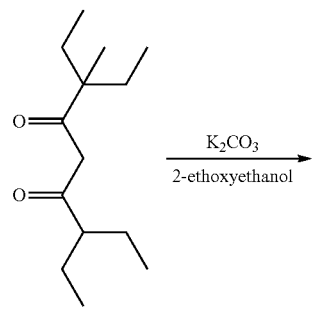

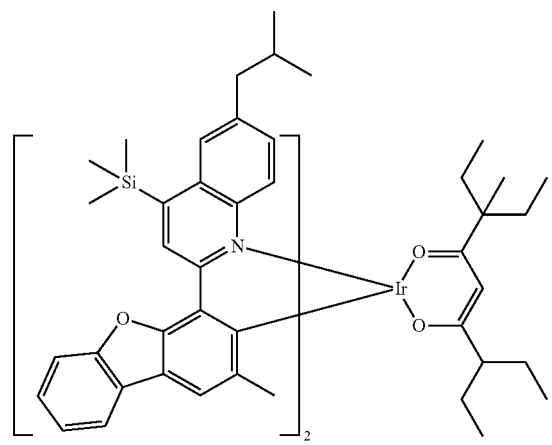

The solution of the iridium dimer in ethoxyethanol obtained in step 1, 3,7-diethyl-3-methylnonane-4,6-dione (108 mg, 0.44 mmol) and potassium carbonate (200 mg, 1.45 mmol) were added to a 100 mL round-bottom flask and reacted at room temperature for 24 h under nitrogen protection. Then, the system was poured into a funnel filled with Celite to be filtered and washed with ethanol. The obtained solids were added with dichloromethane and the filtrate was collected. Then ethanol was added and the resulting solution was concentrated not to dryness. The solution was filtered to obtain 0.15 g of Compound 110 (with a yield of 40.1%). The product was further purified through column chromatography. The structure of the compound was confirmed through NMR and LC-MS as the target product with a molecular weight of 1290.6.

Synthesis Example 8: Synthesis of Compound 307

Step 1: Synthesis of an Iridium Dimer

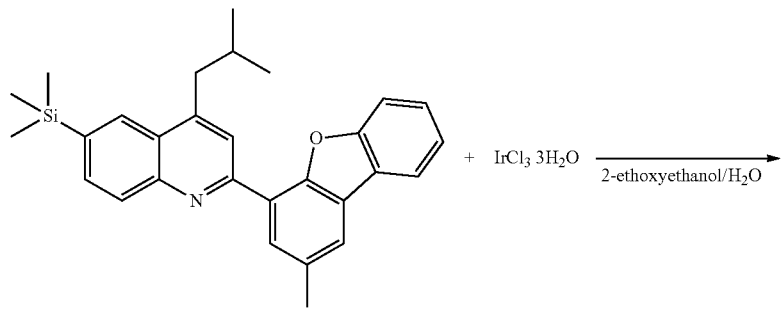

27

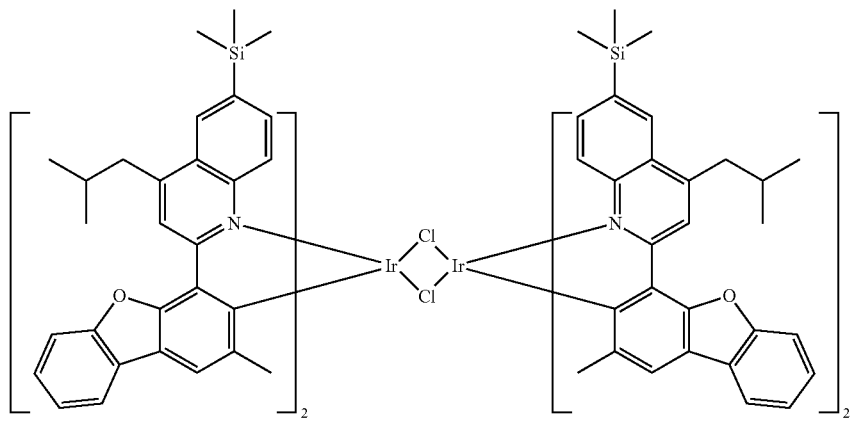

A mixture of Intermediate 27 (1.8 g, 4.11 mmol), iridium trichloride trihydrate (363 mg, 1.03 mmol), 2-ethoxyethanol (22.5 mL), and water (7.5 mL) was refluxed under a nitrogen atmosphere for 24 h. The system was cooled to room temperature and subjected to rotary evaporation to carefully remove water in the solution, so that a solution of an iridium dimer in ethoxyethanol was obtained, which was used in the next step without further purification.

Step 2: Synthesis of Compound 307

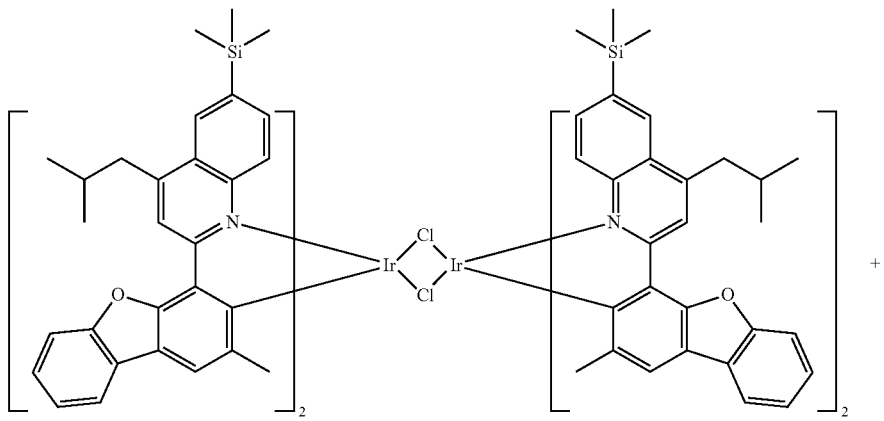

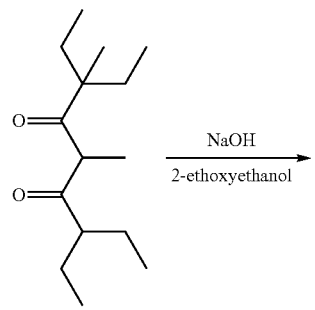

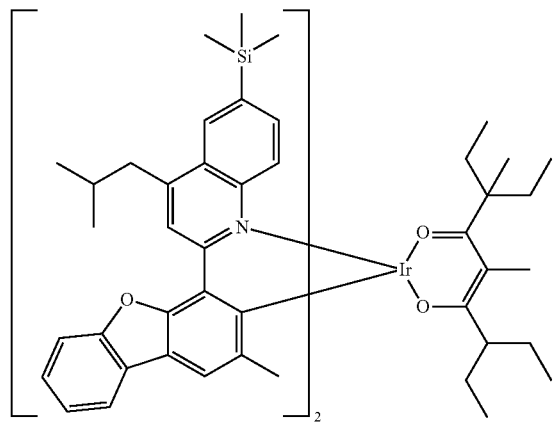

The solution of the iridium dimer in ethoxyethanol obtained in step 1, 3,7-diethyl-3,5-dimethylnonane-4,6-dione (208 mg, 0.87 mmol) and sodium hydroxide (46 mg, 1.16 mmol) were added to a 100 mL round-bottom flask and reacted at room temperature for 24 h under nitrogen protection. Then, the system was poured into a funnel filled with Celite to be filtered and washed with ethanol. The obtained solids were added with dichloromethane and the filtrate was collected. Then ethanol was added and the resulting solution was concentrated but not to dryness. The solution was filtered to obtain 0.44 g of Compound 307 (with a yield of 65.4%). The product was further purified through column chromatography. The structure of the compound was confirmed through NMR and LC-MS as the target product with a molecular weight of 1304.6.

Synthesis Example 9: Synthesis of Compound 311

Step 1: Synthesis of an Iridium Dimer

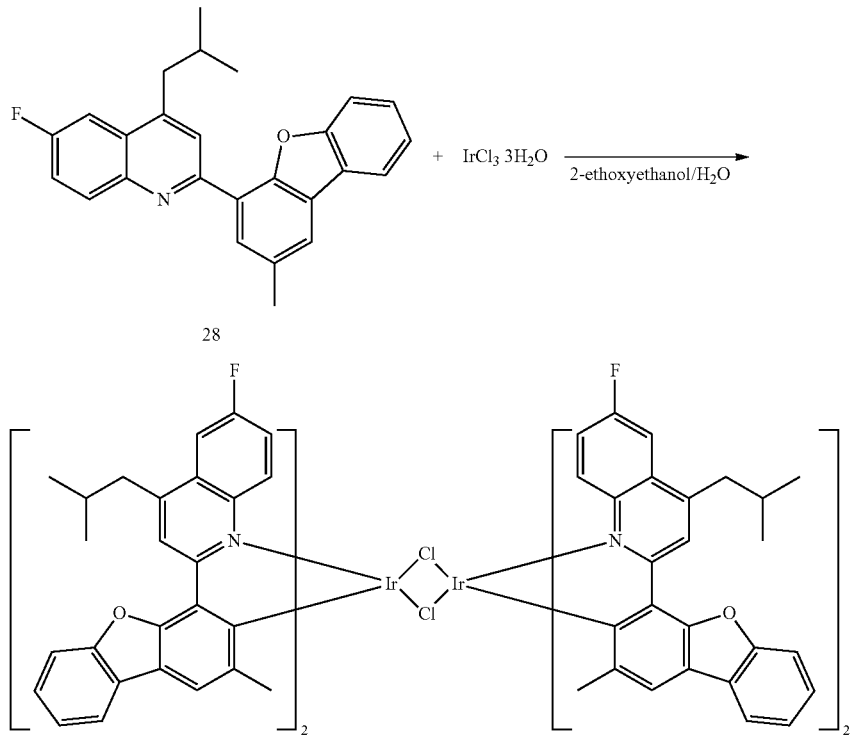

A mixture of Intermediate 28 (4.5 g, 11.7 mmol), iridium trichloride trihydrate (1.03 g, 2.93 mmol), 2-ethoxyethanol (60 mL), and water (20 mL) was refluxed under a nitrogen atmosphere for 24 h. The system was cooled to room temperature and subjected to rotary evaporation to carefully remove water in the solution, so that a solution of an iridium dimer in ethoxyethanol was obtained, which was used in the next step without further purification.

Step 2: Synthesis of Compound 311

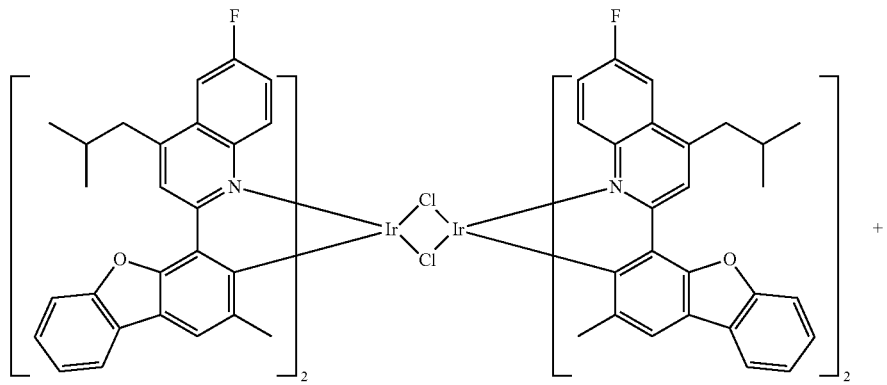

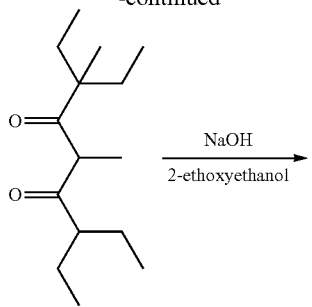

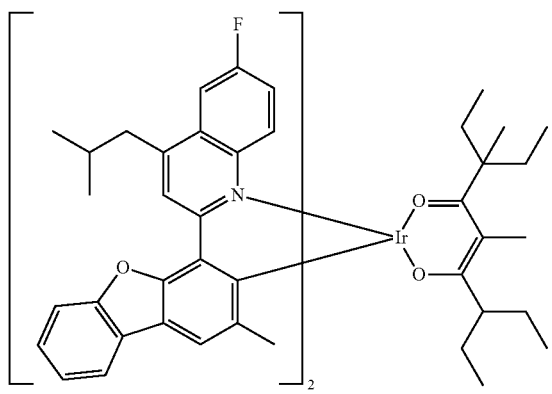

The solution of the iridium dimer in ethoxyethanol obtained in step 1, 3,7-diethyl-3,5-dimethylnonane-4,6-dione (703 mg, 2.93 mmol) and sodium hydroxide (234 mg, 5.86 mmol) were added to a 250 mL round-bottom flask and reacted at room temperature for 24 h under nitrogen protection. Then, the system was poured into a funnel filled with Celite to be filtered and washed with ethanol. The obtained solids were added with dichloromethane and the filtrate was collected. Then ethanol was added and the resulting solution was concentrated not to dryness. The solution was filtered to obtain 1.1 g of Compound 311 (with a yield of 62.8%). The product was further purified through column chromatography. The structure of the compound was confirmed through NMR and LC-MS as the target product with a molecular weight of 1196.5.

Synthesis Example 10: Synthesis of Compound 304

Step 1: Synthesis of an Iridium Dimer

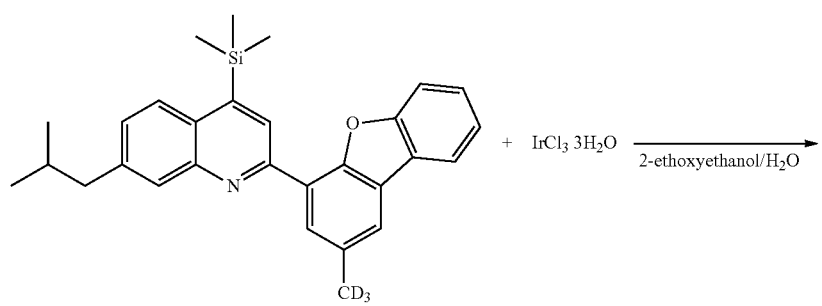

-continued

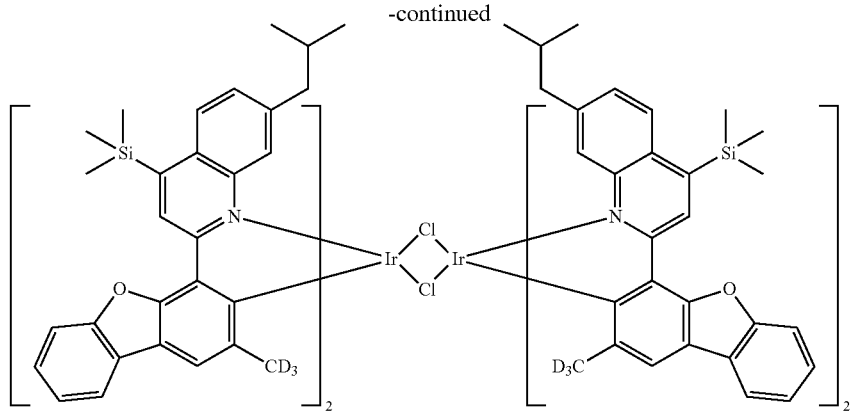

A mixture of Intermediate 29 (2.4 g, 5.52 mmol), iridium trichloride trihydrate (480 mg, 1.36 mmol), 2-ethoxyethanol (30 mL), and water (10 mL) was refluxed under a nitrogen atmosphere for 24 h. The system was cooled to room temperature and subjected to rotary evaporation to carefully remove water in the solution, so that a solution of an iridium dimer in ethoxyethanol was obtained, which was used in the next step without further purification.

Step 2: Synthesis of Compound 304

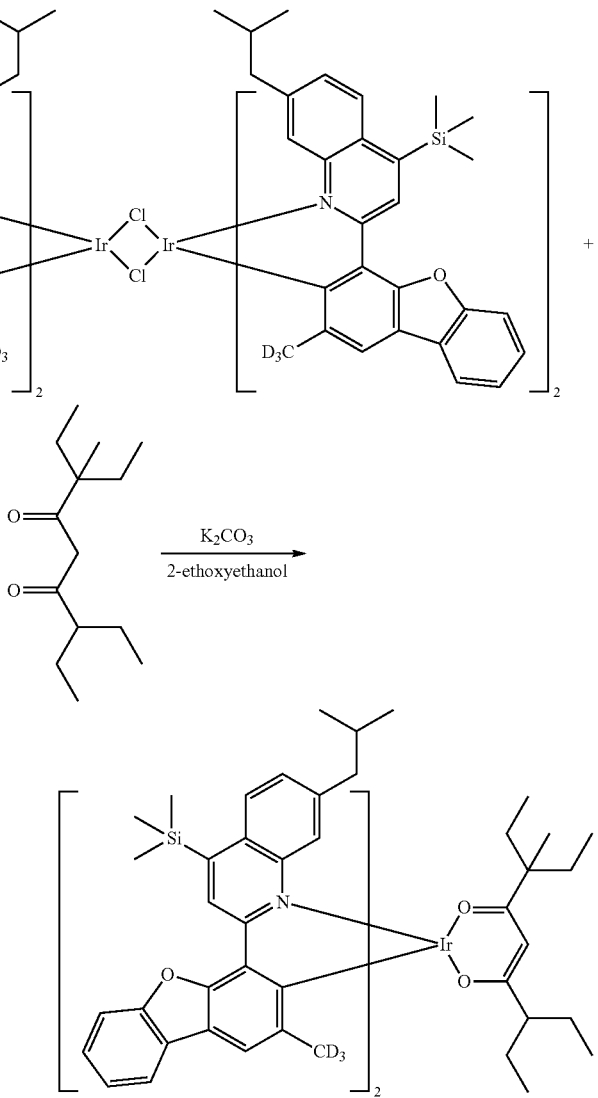

The solution of the iridium dimer in ethoxyethanol obtained in step 1, 3,7-diethyl-3-methylnonane-4,6-dione (462 mg, 2.04 mmol) and potassium carbonate (936 mg, 5.8 mmol) were added to a 100 mL round-bottom flask and reacted at room temperature for 24 h under nitrogen protection. Then, the system was poured into a funnel filled with Celite to be filtered and washed with ethanol. The obtained solids were added with dichloromethane and the filtrate was collected. Then ethanol was added and the resulting solution was concentrated not to dryness. The solution was filtered to obtain 640 mg of Compound 304 (with a yield of 72.6%). The product was further purified through column chromatography. The structure of the compound was confirmed through NMR and LC-MS as the target product with a molecular weight of 1296.6.

Synthesis Example 11: Synthesis of Compound 313

Step 1: Synthesis of an Iridium Dimer

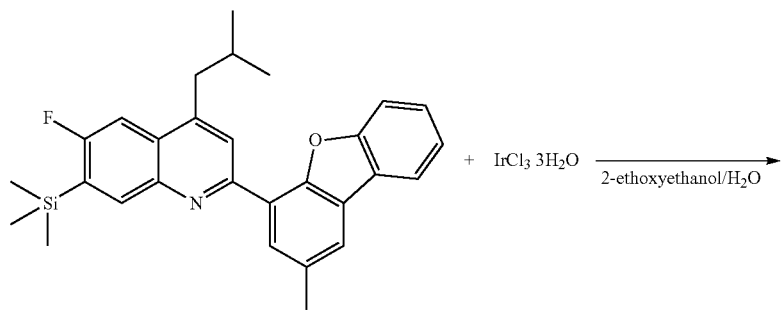

30

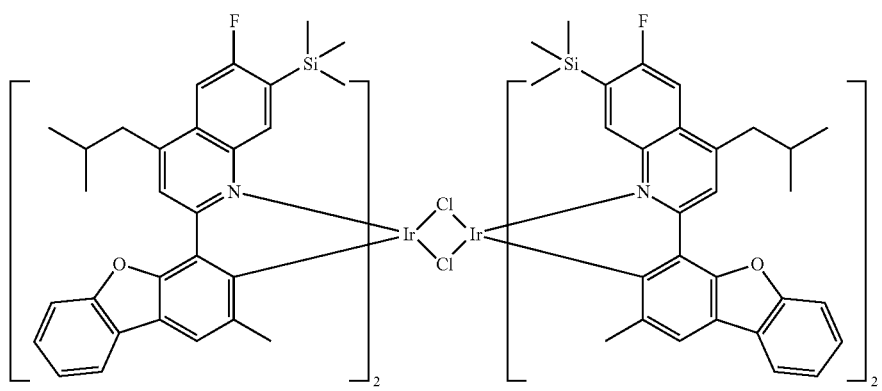

A mixture of Intermediate 30 (1 g, 2.19 mmol), iridium trichloride trihydrate (193 mg, 0.55 mmol), 2-ethoxyethanol (9 mL), and water (3 mL) was refluxed under a nitrogen atmosphere for 24 h. The system was cooled to room temperature and subjected to rotary evaporation to carefully remove water in the solution, so that a solution of an iridium dimer in ethoxyethanol was obtained, which was used in the next step without further purification.

Step 2: Synthesis of Compound 313

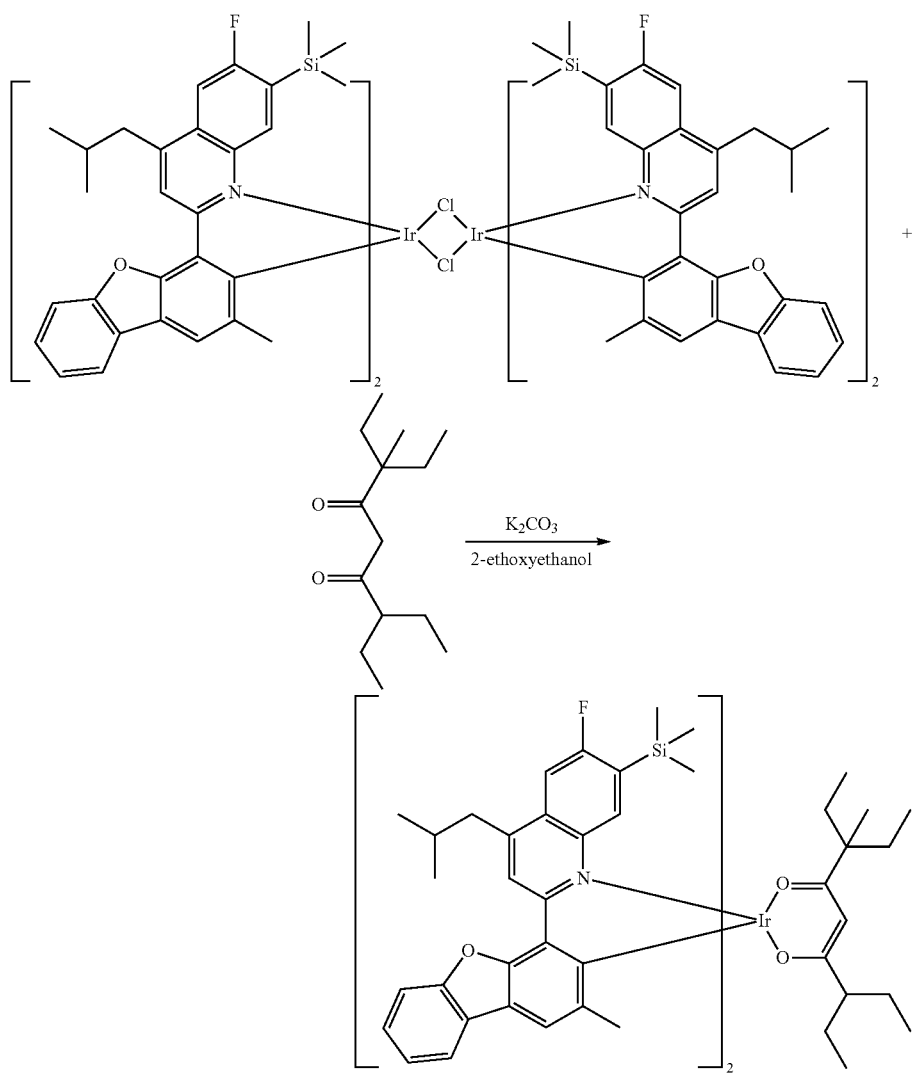

The solution of the iridium dimer in ethoxyethanol obtained in step 1, 3,7-diethyl-3-methylnonane-4,6-dione (373 mg, 1.65 mmol) and potassium carbonate (380 mg, 2.75 mmol) were added to a 100 mL round-bottom flask and reacted at room temperature for 24 h under nitrogen protection. Then, the system was poured into a funnel filled with Celite to be filtered and washed with ethanol. The obtained solids were added with dichloromethane and the filtrate was collected. Then ethanol was added and the resulting solution was concentrated not to dryness. The solution was filtered to obtain 0.21 g of Compound 313 (with a yield of 57.5%). The product was further purified through column chromatography. The structure of the compound was confirmed through NMR and LC-MS as the target product with a molecular weight of 1326.5.

Those skilled in the art will appreciate that the above preparation methods are merely exemplary. Those skilled in the art can obtain other compound structures of the present disclosure through the modifications of the preparation methods.

Spectroscopy Data

The photoluminescence (PL) spectroscopy data of the compounds of the present disclosure and a comparative compound was measured using a fluorescence spectrophotometer F98 produced by SHANGHAI LENGGUANG TECHNOLOGY CO., LTD. Samples in examples and a comparative example were prepared into solutions each with a concentration of $3\times10^{-5}$ mol/L by using HPLC-grade dichloromethane and then excited at room temperature (298 K) with light with a wavelength of 500 nm, and their emission spectrums were measured. Measurement results are shown in Table 1.

TABLE 1

PL spectroscopy data

| No. | Sample No. | Maximum Emission Wavelength $\lambda_{max}$ (nm) in PL |
|---|---|---|
| 1 | Comparative compound | 609 |
| 2 | Compound 77 | 626 |
| 3 | Compound 73 | 622 |
| 4 | Compound 128 | 615 |
| 5 | Compound 164 | 616 |
| 6 | Compound 74 | 620 |
| 7 | Compound 122 | 622 |
| 8 | Compound 110 | 622 |
| 9 | Compound 307 | 614 |
| 10 | Compound 311 | 614 |
| 11 | Compound 304 | 622 |
| 12 | Compound 313 | 612 |

Device Example 1

First, a glass substrate having an Indium Tin Oxide (ITO) anode with a thickness of 120 nm was cleaned and then treated with oxygen plasma and UV ozone. After the treatment, the substrate was dried in a glovebox to remove moisture. Next, the substrate was mounted on a substrate holder and placed in a vacuum chamber. Organic layers specified below were sequentially deposited through vacuum thermal evaporation on the ITO anode at a rate of 0.2 to 2 Angstroms per second at a vacuum degree of about $10^{-8}$ torr. Compound HI was used as a hole injection layer (HIL). Compound HT was used as a hole transporting layer (HTL). Compound EB was used as an electron blocking layer (EBL). Compound 77 of the present disclosure was doped in a host compound RH to be used as an emissive layer (EML). Compound HB was used as a hole blocking layer (HBL). On the HBL, Compound ET and 8-hydroxyquinolinolato-lithium (Liq) were co-deposited as an electron transporting layer (ETL). Finally, Liq with a thickness of 1 nm was deposited as an electron injection layer, and Al with a thickness of 120 nm was deposited as a cathode. The device was transferred back to the glovebox and encapsulated with a glass lid and a moisture getter to complete the device.

Device Example 2

The preparation method in Device Example 2 was the same as that in Device Example 1, except that Compound 77 of the present disclosure was replaced with Compound 128 of the present disclosure in the emissive layer (EML).

Device Example 3

The preparation method in Device Example 3 was the same as that in Device Example 1, except that Compound 77 of the present disclosure was replaced with Compound 164 of the present disclosure in the emissive layer (EML).

Device Example 4

The preparation method in Device Example 4 was the same as that in Device Example 1, except that Compound 77 of the present disclosure was replaced with Compound 73 of the present disclosure in the emissive layer (EML).

Device Example 5

The preparation method in Device Example 5 was the same as that in Device Example 1, except that Compound 77 of the present disclosure was replaced with Compound 74 of the present disclosure in the emissive layer (EML).

Device Example 6

The preparation method in Device Example 6 was the same as that in Device Example 1, except that Compound 77 of the present disclosure was replaced with Compound 122 of the present disclosure in the emissive layer (EML) and the weight ratio of Compound 122 to Compound RH was 2.5:97.5.

Device Example 7

The preparation method in Device Example 7 was the same as that in Device Example 1, except that Compound 77 of the present disclosure was replaced with Compound 307 of the present disclosure in the emissive layer (EML).

Device Example 8

The preparation method in Device Example 8 was the same as that in Device Example 6, except that Compound 122 of the present disclosure was replaced with Compound 304 of the present disclosure in the emissive layer (EML).

Device Example 9

The preparation method in Device Example 9 was the same as that in Device Example 1, except that Compound 77 of the present disclosure was replaced with Compound 311 of the present disclosure in the emissive layer (EML).

Device Comparative Example 1

The preparation method in Device Comparative Example 1 was the same as that in Device Example 1, except that Compound 77 of the present disclosure was replaced with the comparative compound in the emissive layer (EML).

The structures and thicknesses of layers of the devices are shown in the following table. The layers using more than one material were obtained by doping different compounds at weight ratio as recorded.

TABLE 2

| Partial device structures in device examples and the comparative example | | | | | | |
|---|---|---|---|---|---|---|
| Device No. | HIL | HTL | EBL | EML | HBL | ETL |
| Example 1 | Compound HI (100 Å) | Compound HT (400 Å) | Compound EB (50 Å) | Compound RH:Compound 77 (97:3) (400 Å) | Compound HB (50 Å) | Compound ET:Liq (40:60) (350 Å) |
| Example 2 | Compound HI (100 Å) | Compound HT (400 Å) | Compound EB (50 Å) | Compound RH:Compound 128 (97:3) (400 Å) | Compound HB (50 Å) | Compound ET:Liq (40:60) (350 Å) |

TABLE 2-continued

Partial device structures in device examples and the comparative example

| Device No. | HIL | HTL | EBL | EML | HBL | ETL |
|---|---|---|---|---|---|---|
| Example 3 | Compound HI (100 Å) | Compound HT (400 Å) | Compound EB (50 Å) | Compound RH:Compound 164 (97:3) (400 Å) | Compound HB (50 Å) | Compound ET:Liq (40 60) (350 Å) |
| Example 4 | Compound HI (100 Å) | Compound HT (400 Å) | Compound EB (50 Å) | Compound RH:Compound 73 (97:3) (400 Å) | Compound HB (50 Å) | Compound ET:Liq (40:60) (350 Å) |
| Example 5 | Compound HI (100 Å) | Compound HT (400 Å) | Compound EB (50 Å) | Compound RH:Compound 74 (97:3) (400 Å) | Compound HB (50 Å) | Compound ET:Liq (40:60) (350 Å) |
| Example 6 | Compound HI (100 Å) | Compound HT (400 Å) | Compound EB (50 Å) | Compound RH:Compound 122 (97.5:2.5) (400 Å) | Compound HB (50 Å) | Compound ET:Liq (40:60) (350 Å) |
| Example 7 | Compound HI (100 Å) | Compound HT (400 Å) | Compound EB (50 Å) | Compound RH:Compound 307 (97:3) (400 Å) | Compound HB (50 Å) | Compound ET:Liq (40:60) (350 Å) |
| Example 8 | Compound HI (100 Å) | Compound HT (400 Å) | Compound EB (50 Å) | Compound RH:Compound 304 (97.5:2.5) (400 Å) | Compound HB (50 Å) | Compound ET:Liq (40:60) (350 Å) |
| Example 9 | Compound HI (100 Å) | Compound HT (400 Å) | Compound EB (50 Å) | Compound RH:Compound 311 (97:3) (400 Å) | Compound HB (50 Å) | Compound ET:Liq (40:60) (350 Å) |
| Comparative Example 1 | Compound HI (100 Å) | Compound HT (400 Å) | Compound EB (50 Å) | Compound RH:comparative compound (97:3) (400 Å) | Compound HB (50 Å) | Compound ET:Liq (40:60) (350 Å) |

The structures of the materials used in the devices are shown as follows:

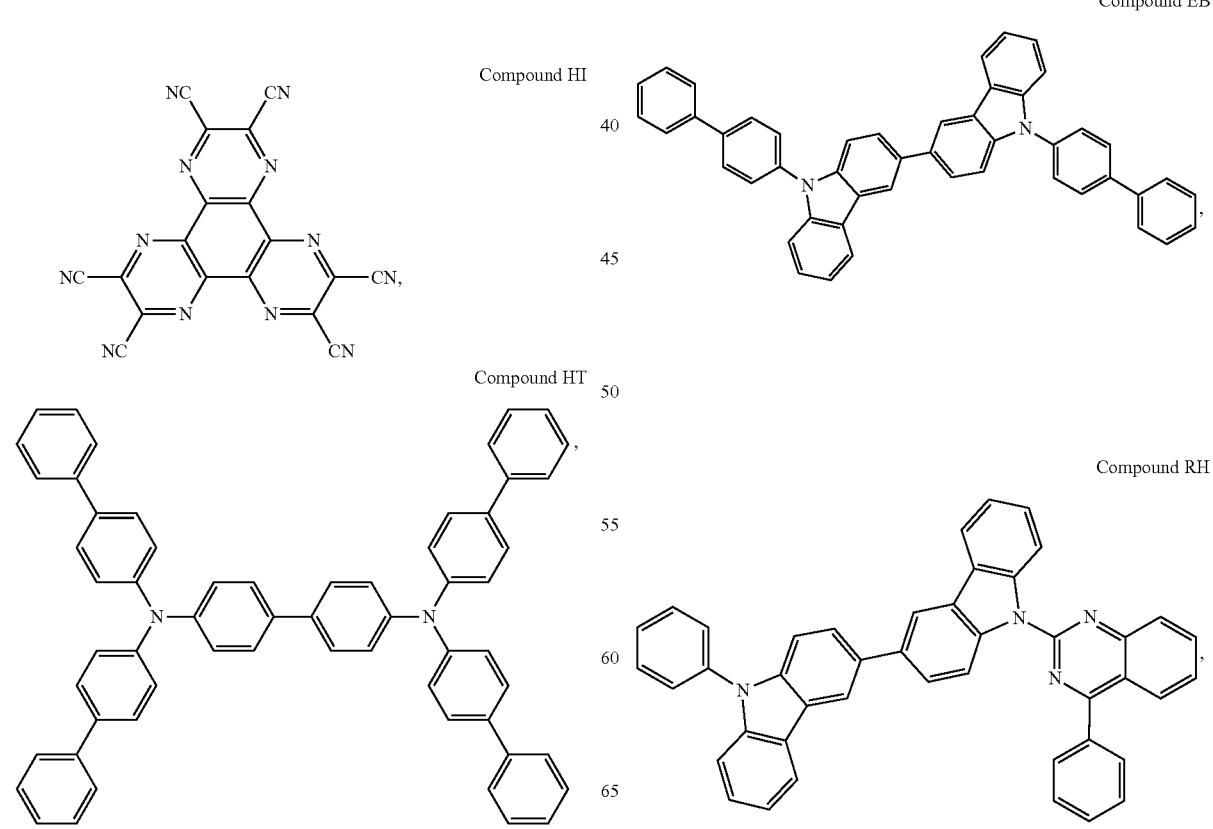

Compound HB
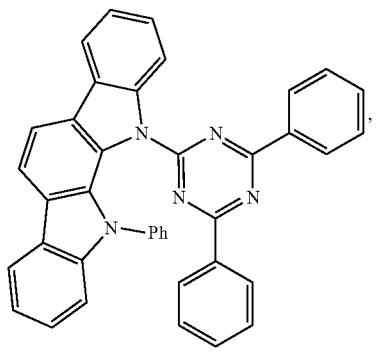
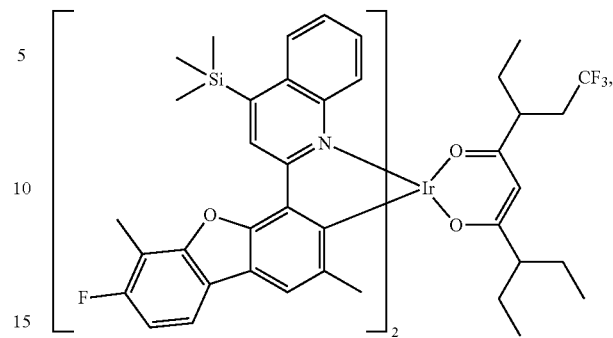
Compound 77
Compound ET
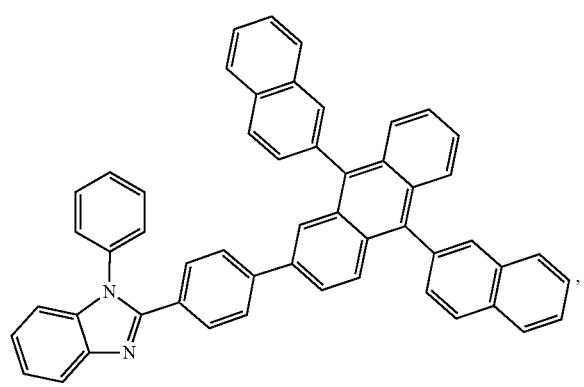
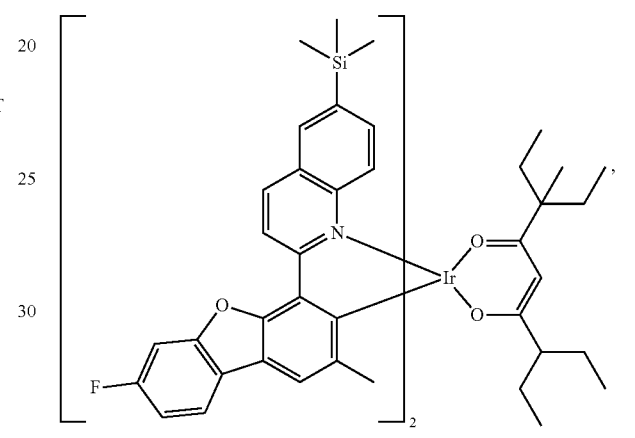
Compound 128
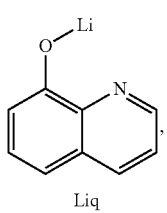
Liq
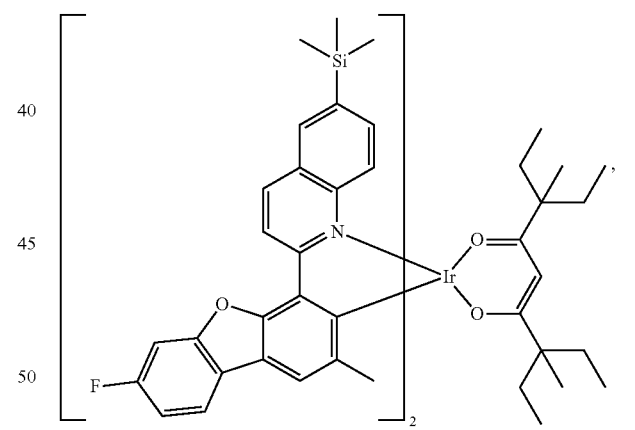
Compound 164
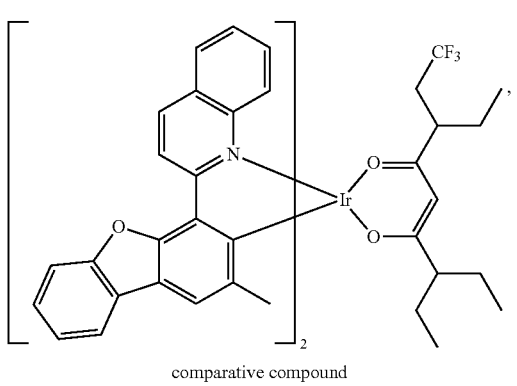
comparative compound
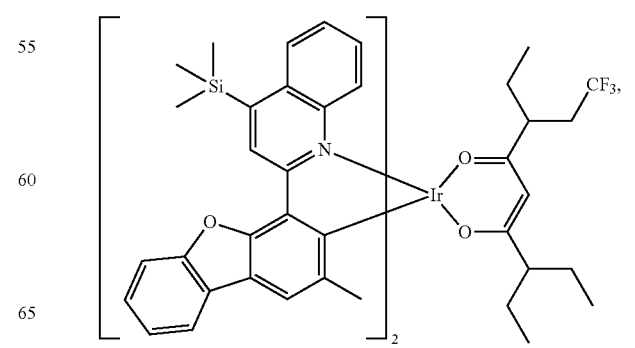
Compound 73

Compound 74

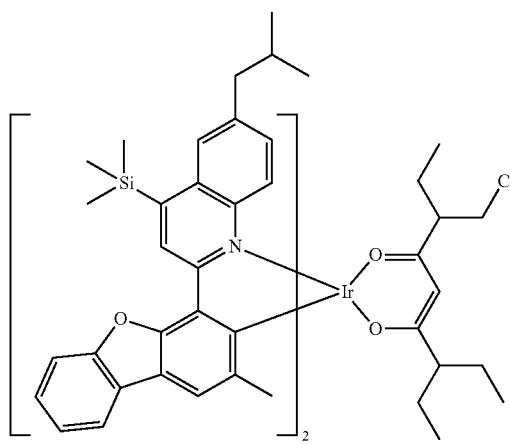

Compound 122

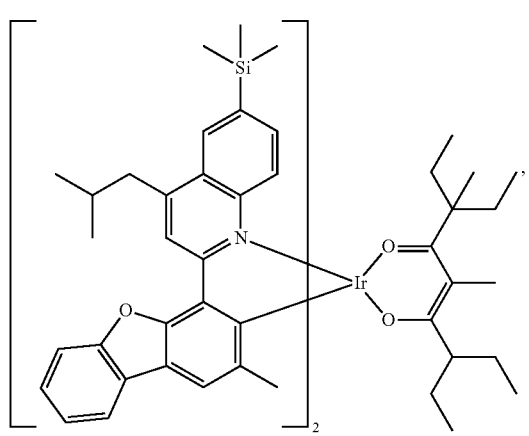

Compound 307

Compound 304

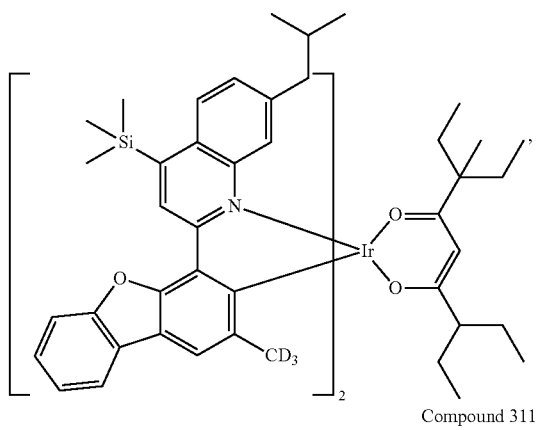

Compound 311

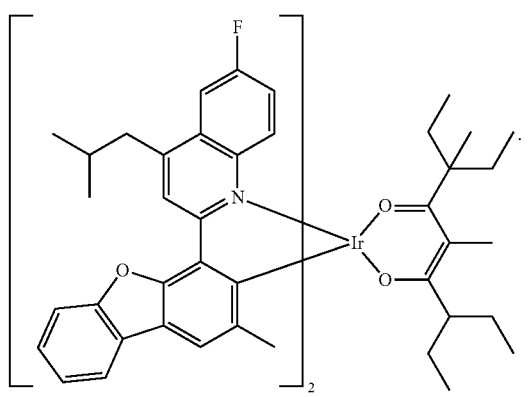

Current-voltage-luminance (IVL) characteristics of the devices were measured. Table 3 shows the data on the CIE, maximum emission wavelength ($\lambda_{max}$), voltage, full width at half maximum (FWHM) and external quantum efficiency (EQE) measured at a current density of 15 mA/cm².

TABLE 3

Device data

| Device No. | CIE (x, y) | Voltage (V) | $\lambda_{max}$ (nm) | FWHM (nm) | EQE (%) |
|---|---|---|---|---|---|
| Example 1 | (0.684, 0.313) | 4.00 | 634 | 53.8 | 21.51 |
| Example 2 | (0.668, 0.330) | 3.91 | 620 | 50.4 | 21.26 |
| Example 3 | (0.670, 0.328) | 3.98 | 622 | 50.7 | 21.84 |
| Example 4 | (0.678, 0.319) | 3.83 | 629 | 52.6 | 21.25 |
| Example 5 | (0.671, 0.326) | 3.84 | 623 | 49.6 | 21.25 |
| Example 6 | (0.679, 0.319) | 4.07 | 627 | 48.6 | 23.74 |
| Example 7 | (0.667, 0.332) | 3.89 | 619 | 48.2 | 25.19 |
| Example 8 | (0.679, 0.319) | 4.08 | 627 | 48.6 | 23.81 |
| Example 9 | (0.667, 0.331) | 4.04 | 623 | 49.9 | 24.28 |
| Comparative Example 1 | (0.655, 0.343) | 3.96 | 614 | 50.2 | 20.33 |

DISCUSSION

It can be seen from Table 1 that the introduction of a silicon substituent into the ligand $L_a$ of the present application effectively shifts the emission wavelength of a material from a light red region to a deep red region, which is further proved by CIE and $\lambda_{max}$ in Table 3. In addition, it can also be found from the data on the voltage, FWHM and EQE in Table 3 that the introduction of the silicon substituent can significantly increase external quantum efficiency while maintaining a relatively low voltage and a relatively narrow FWHM, which demonstrates that the silicon substituent has various functions in compounds of the present disclosure, such as changing an emission wavelength and improving light-emitting efficiency.

Among the above comparisons, Example 4 and Comparative Example 1 are the most direct comparison. The light-emitting material of Example 4 is Compound 73, and the light-emitting material of Comparative Example 1 is the comparative compound. The PL $\lambda_{max}$ of Compound 73 was 622 nm, and the PL $\lambda_{max}$ of the comparative compound was 609 nm. In the devices, the CIE x of Example 4 and Comparative Example 1 was 0.678 and 0.655, respectively, and the efficiency of Example 4 and Comparative Example 1 was 21.25% and 20.33%, respectively. The data clearly proves the advantages of a silyl substitution. In addition, the light-emitting materials used in Examples 1 to 8 include silicon substituents introduced at different positions. For example, the silyl substitution exists on a benzene ring of a quinoline ring in Examples 2, 3 and 7, and the silyl substitution exists on a pyridine ring of a quinoline ring in Examples 1, 4, 5, 6 and 8. The CIE x of Examples 2, 3 and 7 were 0.668, 0.670 and 0.667, respectively, while the CIE x of Examples 1, 4, 5, 6 and 8 were 0.684, 0.678, 0.671, 0.679 and 0.679, respectively, which proves that the silyl substitution on the benzene ring of the quinoline ring generates a smaller red shift than the silyl substitution on the pyridine ring of the quinoline ring. It proves that the CIE of the devices can be fine-tuned while deep red emission is achieved by adjusting the position of the silyl substitution on the quinoline ring. In addition, the EQE of Example 7 was as high as 25.19%, which proves that the silyl substitution on the benzene ring of the quinoline ring can provide high device efficiency.

The light-emitting material, Compound 311, of Example 9 has a fluorine substitution on the quinoline ring. The PL $\lambda_{max}$ of Example 9 was 614 nm, the CIE data of the device also proved the deep red emission, and the device efficiency reached 24.28%, which proves that the fluorine substitution also has a very good result.

In summary, the metal complexes disclosed by the present disclosure can effectively adjust the light-emitting color to deep red, can improve the external quantum efficiency of the devices while maintaining a relatively narrow FWHM, and can provide the better device performance.

It is to be understood that various embodiments described herein are merely exemplary and not intended to limit the scope of the present disclosure. Therefore, it is apparent to those skilled in the art that the present disclosure as claimed may include variations of specific embodiments and preferred embodiments described herein. Many of the materials and structures described herein may be replaced with other materials and structures without departing from the spirit of the present disclosure. It is to be understood that various theories as to why the present disclosure works are not intended to be limitative.

The invention claimed is:

1. A metal complex, wherein the metal complex has a maximum emission wavelength greater than or equal to 612 nm in a photoluminescence (PL) spectrum, wherein the metal complex has a structure of $M(L_a)_m(L_b)_n(L_c)_q$ and comprises a metal M selected from a metal with a relative atomic mass greater than 40, wherein $L_a$, $L_b$ and $L_c$ are a first ligand, a second ligand, and a third ligand of the metal complex, respectively;

m is selected from 1, 2 or 3;
n is selected from 0, 1 or 2;
q is selected from 0, 1 or 2;
m+n+q is equal to the oxidation state of the metal M;
when m is greater than 1, the multiple $L_a$ may be the same or different;
when n is 2, the two $L_b$ may be the same or different;
when q is 2, the two $L_c$ may be the same or different;
$L_a$, $L_b$ and $L_c$ can be optionally joined to form a multidentate ligand; and
ligand $L_a$ has a structure represented by Formula 1:

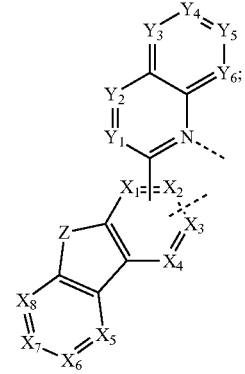

Formula 1 wherein,
Z is selected from O;
$X_1$ to $X_8$ are, at each occurrence identically or differently, selected from C or $CR_x$;
$Y_1$ to $Y_6$ are, at each occurrence identically or differently, selected from $CR_{y1}$, $CR_{y2}$ or N; at least one of $Y_1$ to $Y_6$ is selected from $CR_{y1}$, and the $R_{y1}$ is fluorine, or at least one of $Y_1$ to $Y_6$ is selected from $CR_{y2}$, and the $R_{y2}$ has a structure of $-L-SiR_{s1}R_{s2}R_{s3}$;
$R_x$, $R_{s1}$, $R_{s2}$ and $R_{s3}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof;
$R_{y1}$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof;

L is selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or a combination thereof;

adjacent substituents $R_x$, $R_{s1}$, $R_{s2}$, $R_{s3}$ can be optionally joined to form a ring $L_b$ and $L_c$ are, at each occurrence identically or differently, selected from the group consisting of the following structures:

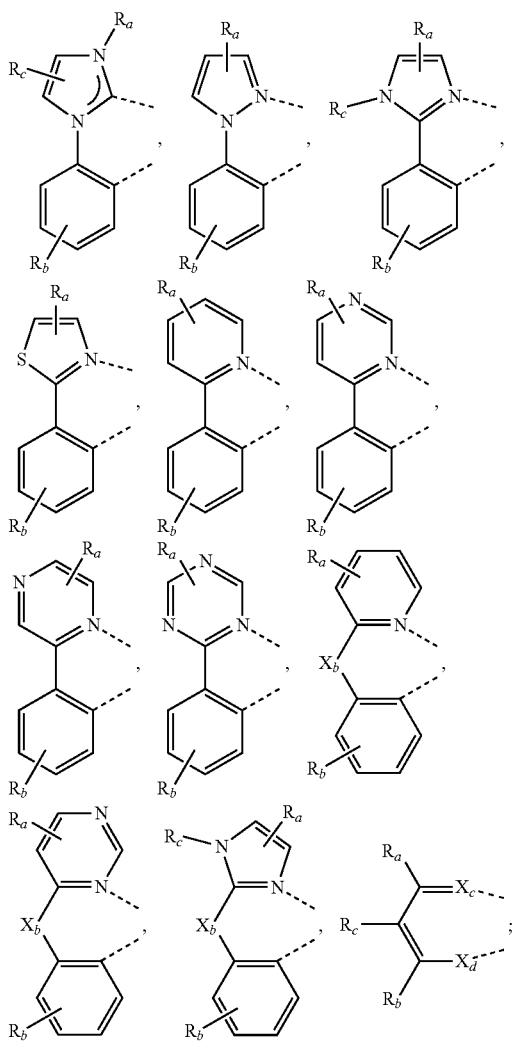

wherein $R_a$, $R_b$ and $R_c$ represent, at each occurrence identically or differently, mono-substitution, multiple substitutions or non-substitution;

$X_b$ is, at each occurrence identically or differently, selected from the group consisting of: O, S, Se, $NR_{N1}$ and $CR_{C1}R_{C2}$;

$X_c$ and $X_d$ are, at each occurrence identically or differently, selected from the group consisting of: O, S, Se and $NR_{N2}$;

$R_a$, $R_b$, $R_c$, $R_{N1}$, $R_{N2}$, $R^{C1}$ and $R_{C2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

wherein adjacent substituents $R_a$, $R_b$, $R_c$, $R_{N1}$, $R_{N2}$, $R_{C1}$, $R_{C2}$ can be optionally joined to form a ring.

2. The metal complex of claim 1, wherein the metal complex further comprises a ligand $L_b$ which has a structure represented by the following formula:

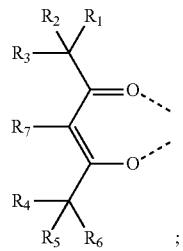

wherein $R_1$ to $R_7$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof.

3. The metal complex of claim 1, wherein
$Y_1$ to $Y_6$ are, at each occurrence identically or differently, selected from $CR_{y1}$, $CR_{y2}$ or N; and at least one of $Y_1$ to $Y_6$ is selected from $CR_{y2}$, wherein the $R_{y2}$ has a structure of -L-$SiR_{s1}R_{s2}R_{s3}$;
$R_{y1}$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof;
$R_{s1}$, $R_{s2}$ and $R_{s3}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof;
L is selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or a combination thereof;
adjacent substituents $R_{s1}$, $R_{s2}$, $R_{s3}$ can be optionally joined to form a ring.

4. The metal complex of claim 1, wherein
at least one of $X_1$ to $X_8$ and $Y_1$ to $Y_6$ is selected from $CR_x$ or $CR_{y1}$;
the $R_x$ is, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof;
the $R_{y1}$ is, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof.

5. A metal complex, having a structure of $M(L_a)_m(L_b)_n(L_c)_q$, wherein the metal complex comprises a metal M selected from a metal with a relative atomic mass greater than 40, $L_a$, $L_b$ and $L_c$ are the first ligand, the second ligand and the third ligand of the metal complex, respectively; m is selected from 1, 2 or 3, n is selected from 0, 1 or 2, q is selected from 0, 1 or 2, and m+n+q is equal to the oxidation state of the metal M; when m is greater than 1, the multiple $L_a$ may be the same or different; when n is 2, the two $L_b$ may be the same or different; when q is 2, the two $L_c$ may be the same or different; $L_a$, $L_b$ and $L_c$ can be optionally joined to form a multi-dentate ligand; and the ligand $L_a$ has a structure represented by Formula 1':

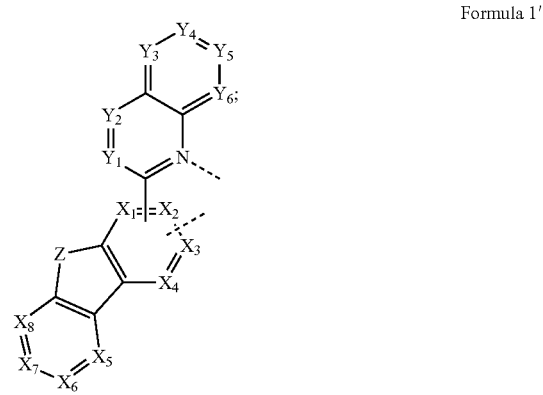

Formula 1' wherein,
- Z is selected from O, S or Se;
- $X_1$ to $X_8$ are, at each occurrence identically or differently, selected from C or $CR_x$;
- $Y_1$ to $Y_6$ are, at each occurrence identically or differently, selected from $CR_{y1}$, $CR_{y2}$ or N; wherein at least one of $Y_1$ to $Y_6$ is selected from $CR_{y2}$, and the $R_{y2}$ has a structure of -L-$SiR_{s1}R_{s2}R_{s3}$;
- $R_x$, $R_{s1}$, $R_{s2}$ and $R_{s3}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof;
- $R_{y1}$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof;
- L is selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or a combination thereof;
- adjacent substituents $R_x$, $R_{s1}$, $R_{s2}$, $R_{s3}$ can be optionally joined to form a ring;
- $L_b$ and $L_c$ are, at each occurrence identically or differently, selected from the group consisting of the following structures:

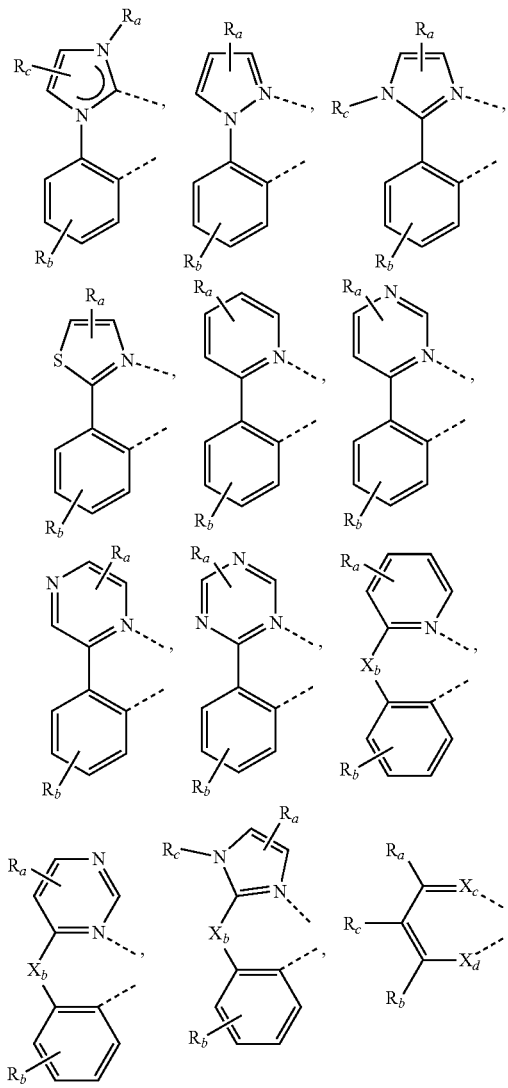

- wherein $R_a$, $R_b$ and $R_c$ represent, at each occurrence identically or differently, mono-substitution, multiple substitutions or non-substitution;
- $X_b$ is, at each occurrence identically or differently, selected from the group consisting of: O, S, Se, $NR_{N1}$ and $CR_{C1}R_{C2}$;
- $X_c$ and $X_d$ are, at each occurrence identically or differently, selected from the group consisting of: O, S, Se and $NR_{N2}$;
- $R_a$, $R_b$, $R_c$, $R_{N1}$, $R_{N2}$, $R_{C1}$ and $R_{C2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

wherein adjacent substituents $R_a$, $R_b$, $R_c$, $R_{N1}$, $R_{N2}$, $R_{C1}$, $R_{C2}$ can be optionally joined to form a ring.

6. The metal complex of claim 5, wherein two adjacent ones of $X_1$ to $X_4$ are C, one of the two C is linked to the metal by a carbon-metal bond, one of $X_1$ to $X_4$ at the ortho position of the carbon-metal bond is selected from $CR_x$, and the $R_x$ is selected from deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group or a combination thereof.

7. The metal complex of claim 5, wherein at least one of $X_1$ to $X_8$ and $Y_1$ to $Y_6$ is selected from $CR_x$ or $CR_{y1}$; and the $R_{y1}$ is, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof;

the $R_x$ is, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof.

8. The metal complex of claim 5, wherein the $L_a$ has a structure represented by Formula 2:

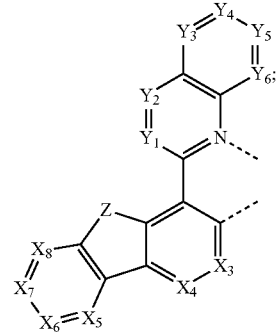

Formula 2 wherein,

Z is selected from O, S or Se;

$X_3$ to $X_8$ are, at each occurrence identically or differently, selected from $CR_x$;

$Y_1$ to $Y_6$ are, at each occurrence identically or differently, selected from $CR_{y1}$, $CR_{y2}$ or N; wherein at least one of $Y_1$ to $Y_6$ is selected from $CR_{y2}$, and the $R_{y2}$ has a structure of -L-$SiR_{s1}R_{s2}R_{s3}$;

$R_x$, $R_{s1}$, $R_{s2}$ and $R_{s3}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof;

$R_{y1}$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof;

L is selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or a combination thereof; and adjacent substituents $R_x$, $R_{s1}$, $R_{s2}$, $R_{s3}$ can be optionally joined to form a ring.

9. The metal complex of claim 5, wherein $Y_1$ and $Y_2$ are, at each occurrence identically or differently, selected from $CR_{y1}$ or N; $Y_3$ to $Y_6$ are, at each occurrence identically or differently, selected from $CR_{y1}$, $CR_{y2}$ or N, and at least one of $Y_3$ to $Y_6$ is selected from $CR_{y2}$, and the $R_{y2}$ has a structure of -L-SiR$_{s1}$R$_{s2}$R$_{s3}$;

$R_{y1}$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof;

$R_{s1}$, $R_{s2}$ and $R_{s3}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof;

L is selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or a combination thereof;

adjacent substituents $R_{s1}$, $R_{s2}$, $R_{s3}$ can be optionally joined to form a ring.

10. The metal complex of claim 5,
wherein the metal M is selected from Ir, Rh, Re, Os, Pt, Au or Cu.

11. The metal complex of claim 5, wherein the metal complex has a structure of $M(L_a)_m(L_b)_n(L_c)_q$; wherein the metal M is selected from Ir, Os, or Pt; $L_a$, $L_b$ and $L_c$ are the first ligand, the second ligand and the third ligand of the metal complex, respectively; m is selected from 1, 2 or 3, n is selected from 0, 1 or 2, q is selected from 0, 1 or 2, and m+n+q is equal to the oxidation state of the metal M; when m is greater than 1, the multiple $L_a$ may be the same or different; when n is 2, the two $L_b$ may be the same or different; when q is 2, the two $L_c$ may be the same or different; $L_a$, $L_b$ and $L_c$ can be optionally joined to form a multi-dentate ligand; and $L_b$ is, at each occurrence identically or differently, selected from the following structure:

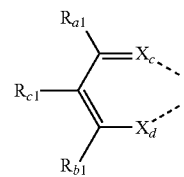

wherein $X_c$ and $X_d$ are, at each occurrence identically or differently, selected from the group consisting of: O, S, Se and $NR_{N2}$;

$R_{a1}$, $R_{b1}$, $R_{c1}$ and $R_{N2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof; wherein adjacent substitutes $R_{a1}$, $R_{b1}$, $R_{c1}$ can be optionally joined to form a ring;

$L_c$ is, at each occurrence identically or differently, selected from the group consisting of the following structures:

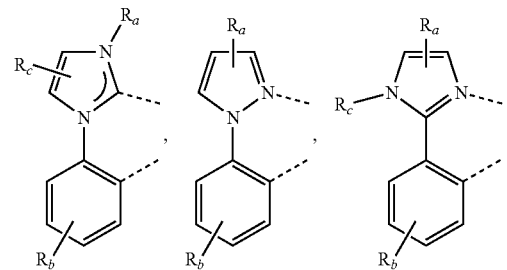

113

-continued

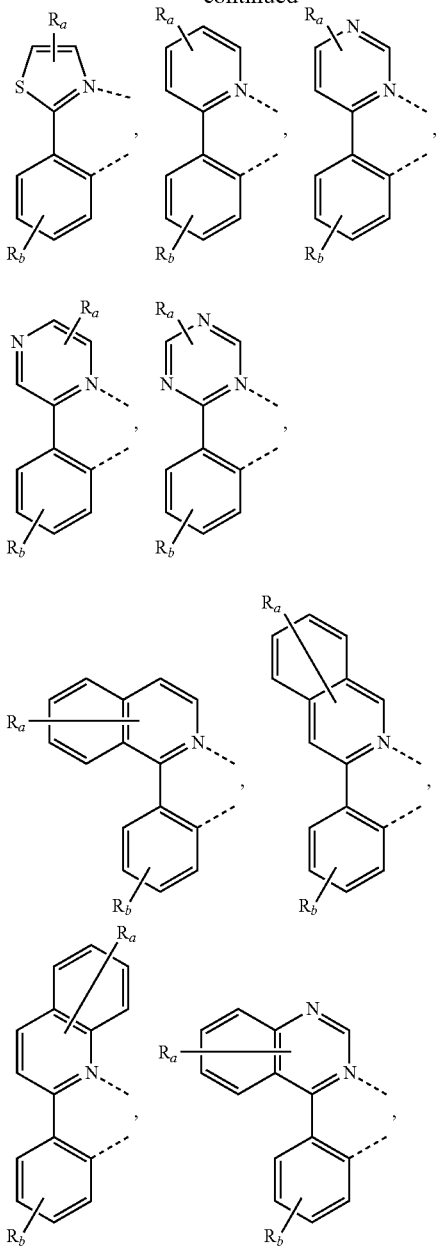

114

-continued

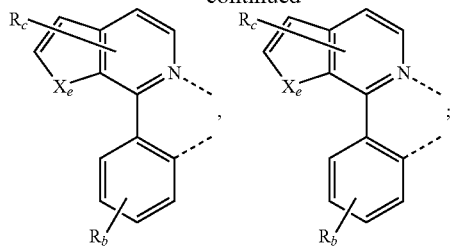

wherein $R_a$, $R_b$ and $R_c$ represent, at each occurrence identically or differently, mono-substitution, multiple substitutions or non-substitution;

$X_e$ is, at each occurrence identically or differently, selected from the group consisting of: O, S, Se and $NR_{N3}$;

$R_a$, $R_b$, $R_c$ and $R_{N3}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

wherein adjacent substituents $R_b$, $R_c$ can be optionally joined to form a ring.

12. The metal complex of claim 10, wherein the metal complex has a structure represented by Formula 3:

Formula 3

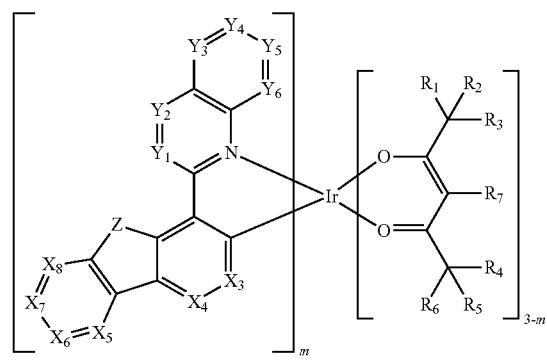

wherein,
m is 1 or 2;
Z is O;
$X_3$ to $X_8$ are, at each occurrence identically or differently, selected from $CR_x$;
$Y_1$ to $Y_6$ are, at each occurrence identically or differently, selected from $CR_{y1}$, $CR_{y2}$ or N; wherein at least one of $Y_1$ to $Y_6$ is selected from $CR_{y2}$, and the $R_{y2}$ has a structure of $-L-SiR_{s1}R_{s2}R_{s3}$;
$R_{y1}$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof;
$R_x$, $R_{s1}$, $R_{s2}$, $R_{s3}$, $R_1$, $R_2$, $R_3$, $R_4$, $R_5$, $R_6$ and $R_7$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof;
L is selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or a combination thereof;
adjacent substituents $R_x$, $R_{s1}$, $R_{s2}$, $R_{s3}$ can be optionally joined to form a ring;
adjacent substituents $R_1$, $R_2$, $R_3$, $R_4$, $R_5$, $R_6$, $R_7$ can be optionally joined to form a ring.

13. The metal complex of claim 5, wherein $Y_1$ to $Y_6$ are each independently selected from $CR_{y1}$ or $CR_{y2}$.

14. The metal complex of claim 5, wherein at least one of $Y_1$ to $Y_6$ is selected from N.

15. The metal complex of claim 5, wherein $X_3$ to $X_8$ are each independently selected from $CR_x$; and the $R_x$ is selected from hydrogen, deuterium, halogen, substituted or unsubstituted alkyl having 1 to 20 carbon atoms, substituted or unsubstituted cycloalkyl having 3 to 20 ring carbon atoms, substituted or unsubstituted alkylsilyl having 3 to 20 carbon atoms, substituted or unsubstituted arylsilyl having 6 to 20 carbon atoms or a combination thereof.

16. The metal complex of claim 5, wherein $X_3$ is selected from $CR_x$, and the $R_x$ is selected from hydrogen, deuterium, halogen, substituted or unsubstituted alkyl having 1 to 20 carbon atoms, substituted or unsubstituted cycloalkyl having 3 to 20 ring carbon atoms, substituted or unsubstituted alkylsilyl having 3 to 20 carbon atoms, substituted or unsubstituted arylsilyl having 6 to 20 carbon atoms or a combination thereof.

17. The metal complex of claim 5, wherein at least one of $Y_1$ to $Y_6$ is selected from $CR_{y2}$, and $R_{y2}$ has a structure of $-L-SiR_{s1}R_{s2}R_{s3}$, wherein L is selected from a single bond, and $R_{s1}$, $R_{s2}$ and $R_{s3}$ are each independently selected from the group consisting of: substituted or unsubstituted alkyl having 1 to 20 carbon atoms, substituted or unsubstituted cycloalkyl having 3 to 20 ring carbon atoms, substituted or unsubstituted aryl having 6 to 20 carbon atoms and combinations thereof.

18. The metal complex of claim 17, wherein at least one of $Y_1$ to $Y_6$ is selected from $CR_{y2}$, and $R_{y2}$ has a structure of $-L-SiR_{s1}R_{s2}R_{s3}$, wherein L is selected from a single bond, and $R_{s1}$, $R_{s2}$ and $R_{s3}$ are each independently selected from the group consisting of: methyl, ethyl, isopropyl, isobutyl, t-butyl, neopentyl, cyclopentyl, cyclopentylmethyl, cyclohexyl, norbornyl, adamantyl, trifluoromethyl, phenyl and combinations thereof.

19. The metal complex of claim 1, wherein $L_a$ is, at each occurrence identically or differently, selected from any one of the group consisting of $L_{a1}$ to $L_{a108}$, $L_{a133}$ to $L_{a231}$, $L_{a254}$ to $L_{a297}$, $L_{a320}$ to $L_{a411}$, $L_{a436}$ to $L_{a531}$, $L_{a556}$ to $L_{a603}$, $L_{a676}$ to $L_{a726}$, $L_{a728}$ to $L_{a775}$, $L_{a800}$ to $L_{a883}$, $L_{a908}$ to $L_{a955}$, $L_{a980}$ to $L_{a1027}$, $L_{a1052}$ to $L_{a1099}$, $L_{a1160}$ to $L_{a1212}$, $L_{a1214}$ to $L_{a1237}$, $L_{a1256}$ to $L_{a1303}$, $L_{a1340}$ to $L_{a1363}$, $L_{a1376}$ to $L_{a1387}$, $L_{a1394}$ to $L_{a1405}$, $L_{a1412}$ to $L_{a1423}$, $L_{a1430}$ to $L_{a1441}$, $L_{a1448}$ to $L_{a1459}$, $L_{a1466}$ to $L_{a1477}$, $L_{a1484}$ to $L_{a1489}$, $L_{a1496}$ to $L_{a1501}$, $L_{a1508}$ to $L_{a1521}$, $L_{a1523}$ to $L_{a1526}$ and $L_{a1528}$ to $L_{a1611}$, wherein specific structures of $L_{a1}$ to $L_{a108}$, $L_{a133}$ to $L_{a231}$, $L_{a254}$ to $L_{a297}$, $L_{a320}$ to $L_{a411}$, $L_{a436}$ to $L_{a531}$, $L_{a556}$ to $L_{a603}$, $L_{a676}$ to $L_{a726}$, $L_{a728}$ to $L_{a775}$, $L_{a800}$ to $L_{a883}$, $L_{a908}$ to $L_{a955}$, $L_{a980}$ to $L_{a1027}$, $L_{a1052}$ to $L_{a1099}$, $L_{a1160}$ to $L_{a1212}$, $L_{a1214}$ to $L_{a1237}$, $L_{a1256}$ to $L_{a1303}$, $L_{a1340}$ to $L_{a1363}$, $L_{a1376}$ to $L_{a1387}$, $L_{a1394}$ to $L_{a1405}$, $L_{a1412}$ to $L_{a1423}$, $L_{a1430}$ to $L_{a1441}$, $L_{a1448}$ to $L_{a1459}$, $L_{a1466}$ to $L_{a1477}$, $L_{a1484}$ to $L_{a1489}$, $L_{a1496}$ to $L_{a1501}$, $L_{a1508}$ to $L_{a1521}$, $L_{a1523}$ to $L_{a1526}$ and $L_{a1528}$ to $L_{a1611}$ are shown as follows:

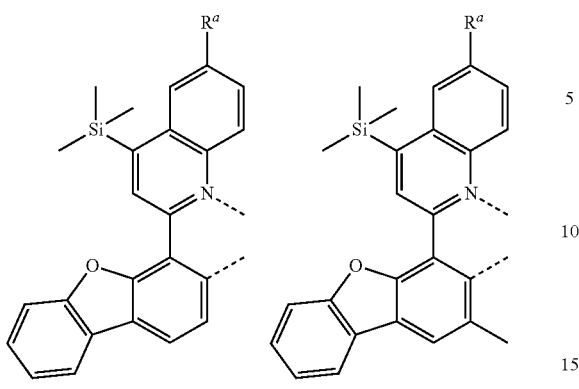

L<sub>a1</sub>: R<sup>a</sup> = H; L<sub>a2</sub>: R<sup>a</sup> = CH<sub>3</sub>;
L<sub>a3</sub>: R<sup>a</sup> = R<sup>a1</sup>; L<sub>a4</sub>: R<sup>a</sup> = R<sup>a2</sup>;
L<sub>a5</sub>: R<sup>a</sup> = R<sup>a3</sup>; L<sub>a6</sub>: R<sup>a</sup> = R<sup>a4</sup>;
L<sub>a7</sub>: R<sup>a</sup> = R<sup>a5</sup>; L<sub>a8</sub>: R<sup>a</sup> = R<sup>a6</sup>;
L<sub>a9</sub>: R<sup>a</sup> = R<sup>a7</sup>; L<sub>a10</sub>: R<sup>a</sup> = R<sup>a8</sup>;
L<sub>a11</sub>: R<sup>a</sup> = R<sup>a9</sup>; L<sub>a12</sub>: R<sup>a</sup> = F;

L<sub>a13</sub>: R<sup>a</sup> = H; L<sub>a14</sub>: R<sup>a</sup> = CH<sub>3</sub>;
L<sub>a15</sub>: R<sup>a</sup> = R<sup>a1</sup>; L<sub>a16</sub>: R<sup>a</sup> = R<sup>a2</sup>;
L<sub>a17</sub>: R<sup>a</sup> = R<sup>a3</sup>; L<sub>a18</sub>: R<sup>a</sup> = R<sup>a4</sup>;
L<sub>a19</sub>: R<sup>a</sup> = R<sup>a5</sup>; L<sub>a20</sub>: R<sup>a</sup> = R<sup>a6</sup>;
L<sub>a21</sub>: R<sup>a</sup> = R<sup>a7</sup>; L<sub>a22</sub>: R<sup>a</sup> = R<sup>a8</sup>;
L<sub>a23</sub>: R<sup>a</sup> = R<sup>a9</sup>; L<sub>a24</sub>: R<sup>a</sup> = F;

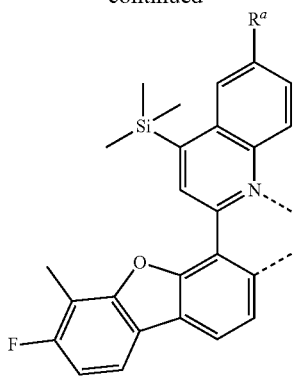

L<sub>a49</sub>: R<sup>a</sup> = H; L<sub>a50</sub>: R<sup>a</sup> = CH<sub>3</sub>;
L<sub>a51</sub>: R<sup>a</sup> = R<sup>a1</sup>; L<sub>a52</sub>: R<sup>a</sup> = R<sup>a2</sup>;
L<sub>a53</sub>: R<sup>a</sup> = R<sup>a3</sup>; L<sub>a54</sub>: R<sup>a</sup> = R<sup>a4</sup>;
L<sub>a55</sub>: R<sup>a</sup> = R<sup>a5</sup>; L<sub>a56</sub>: R<sup>a</sup> = R<sup>a6</sup>;
L<sub>a57</sub>: R<sup>a</sup> = R<sup>a7</sup>; L<sub>a58</sub>: R<sup>a</sup> = R<sup>a8</sup>;
L<sub>a59</sub>: R<sup>a</sup> = R<sup>a9</sup>; L<sub>a60</sub>: R<sup>a</sup> = F;

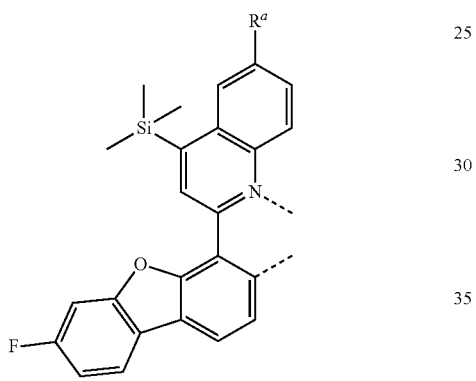

L<sub>a25</sub>: R<sup>a</sup> = H; L<sub>a26</sub>: R<sup>a</sup> = CH<sub>3</sub>;
L<sub>a27</sub>: R<sup>a</sup> = R<sup>a1</sup>; L<sub>a28</sub>: R<sup>a</sup> = R<sup>a2</sup>;
L<sub>a29</sub>: R<sup>a</sup> = R<sup>a3</sup>; L<sub>a30</sub>: R<sup>a</sup> = R<sup>a4</sup>;
L<sub>a31</sub>: R<sup>a</sup> = R<sup>a5</sup>; L<sub>a32</sub>: R<sup>a</sup> = R<sup>a6</sup>;
L<sub>a33</sub>: R<sup>a</sup> = R<sup>a7</sup>; L<sub>a34</sub>: R<sup>a</sup> = R<sup>a8</sup>;
L<sub>a35</sub>: R<sup>a</sup> = R<sup>a9</sup>; L<sub>a36</sub>: R<sup>a</sup> = F;

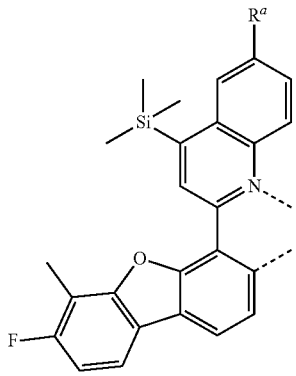

L<sub>a61</sub>: R<sup>a</sup> = H; L<sub>a62</sub>: R<sup>a</sup> = CH<sub>3</sub>;
L<sub>a63</sub>: R<sup>a</sup> = R<sup>a1</sup>; L<sub>a64</sub>: R<sup>a</sup> = R<sup>a2</sup>;
L<sub>a65</sub>: R<sup>a</sup> = R<sup>a3</sup>; L<sub>a66</sub>: R<sup>a</sup> = R<sup>a4</sup>;
L<sub>a67</sub>: R<sup>a</sup> = R<sup>a5</sup>; L<sub>a68</sub>: R<sup>a</sup> = R<sup>a6</sup>;
L<sub>a69</sub>: R<sup>a</sup> = R<sup>a7</sup>; L<sub>a70</sub>: R<sup>a</sup> = R<sup>a8</sup>;
L<sub>a71</sub>: R<sup>a</sup> = R<sup>a9</sup>; L<sub>a72</sub>: R<sup>a</sup> = F;

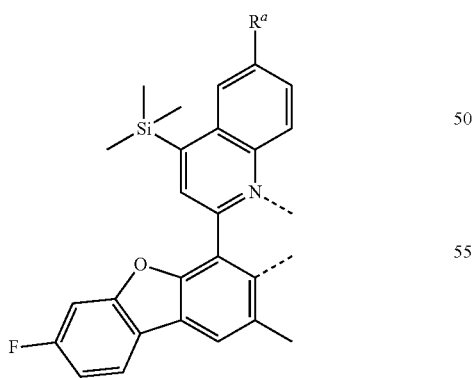

L<sub>a37</sub>: R<sup>a</sup> = H; L<sub>a38</sub>: R<sup>a</sup> = CH<sub>3</sub>;
L<sub>a39</sub>: R<sup>a</sup> = R<sup>a1</sup>; L<sub>a40</sub>: R<sup>a</sup> = R<sup>a2</sup>;
L<sub>a41</sub>: R<sup>a</sup> = R<sup>a3</sup>; L<sub>a42</sub>: R<sup>a</sup> = R<sup>a4</sup>;
L<sub>a43</sub>: R<sup>a</sup> = R<sup>a5</sup>; L<sub>a44</sub>: R<sup>a</sup> = R<sup>a6</sup>;
L<sub>a45</sub>: R<sup>a</sup> = R<sup>a7</sup>; L<sub>a46</sub>: R<sup>a</sup> = R<sup>a8</sup>;
L<sub>a47</sub>: R<sup>a</sup> = R<sup>a9</sup>; L<sub>a48</sub>: R<sup>a</sup> = F;

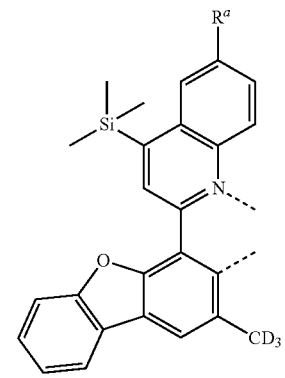

L<sub>a73</sub>: R<sup>a</sup> = H; L<sub>a74</sub>: R<sup>a</sup> = CH<sub>3</sub>;
L<sub>a75</sub>: R<sup>a</sup> = R<sup>a1</sup>; L<sub>a76</sub>: R<sup>a</sup> = R<sup>a2</sup>;
L<sub>a77</sub>: R<sup>a</sup> = R<sup>a3</sup>; L<sub>a78</sub>: R<sup>a</sup> = R<sup>a4</sup>;
L<sub>a79</sub>: R<sup>a</sup> = R<sup>a5</sup>; L<sub>a80</sub>: R<sup>a</sup> = R<sup>a6</sup>;
L<sub>a81</sub>: R<sup>a</sup> = R<sup>a7</sup>; L<sub>a82</sub>: R<sup>a</sup> = R<sup>a8</sup>;
L<sub>a83</sub>: R<sup>a</sup> = R<sup>a9</sup>; L<sub>a84</sub>: R<sup>a</sup> = F;

-continued

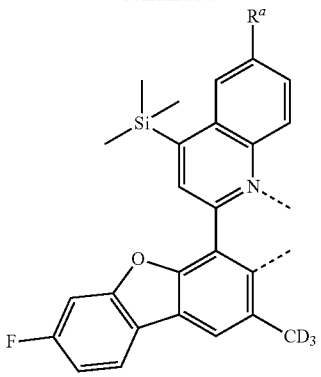

L$_{a85}$: R$^a$ = H; L$_{a86}$: R$^a$ = CH$_3$;
L$_{a87}$: R$^a$ = R$^{a1}$; L$_{a88}$: R$^a$ = R$^{a2}$;
L$_{a89}$: R$^a$ = R$^{a3}$; L$_{a90}$: R$^a$ = R$^{a4}$;
L$_{a91}$: R$^a$ = R$^{a5}$; L$_{a92}$: R$^a$ = R$^{a6}$;
L$_{a93}$: R$^a$ = R$^{a7}$; L$_{a94}$: R$^a$ = R$^{a8}$;
L$_{a95}$: R$^a$ = R$^{a9}$; L$_{a96}$: R$^a$ = F;

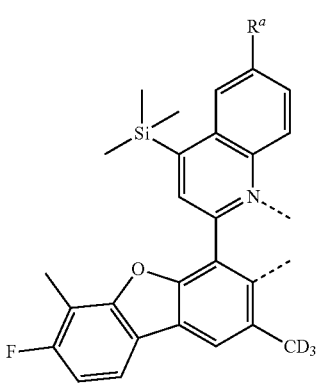

L$_{a97}$: R$^a$ = H; L$_{a98}$: R$^a$ = CH$_3$;
L$_{a99}$: R$^a$ = R$^{a1}$; L$_{a100}$: R$^a$ = R$^{a2}$;
L$_{a101}$: R$^a$ = R$^{a3}$; L$_{a102}$: R$^a$ = R$^{a4}$;
L$_{a103}$: R$^a$ = R$^{a5}$; L$_{a104}$: R$^a$ = R$^{a6}$;
L$_{a105}$: R$^a$ = R$^{a7}$; L$_{a106}$: R$^a$ = R$^{a8}$;
L$_{a107}$: R$^a$ = R$^{a9}$; L$_{a108}$: R$^a$ = F;

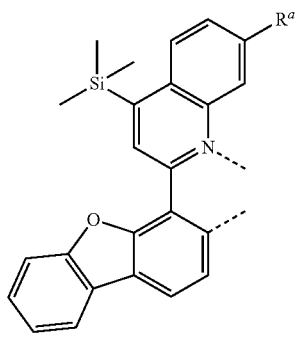

L$_{a133}$: R$^a$ = CH$_3$; L$_{a134}$: R$^a$ = R$^{a1}$;
L$_{a135}$: R$^a$ = R$^{a2}$; L$_{a136}$: R$^a$ = R$^{a3}$;
L$_{a137}$: R$^a$ = R$^{a4}$; L$_{a138}$: R$^a$ = R$^{a4}$;
L$_{a139}$: R$^a$ = R$^{a6}$; L$_{a140}$: R$^a$ = R$^{a6}$;
L$_{a141}$: R$^a$ = R$^{a8}$; L$_{a142}$: R$^a$ = R$^{a8}$;
L$_{a143}$: R$^a$ = F;

-continued

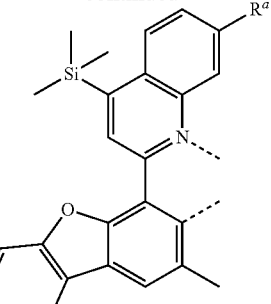

L$_{a144}$: R$^a$ = CH$_3$; L$_{a145}$: R$^a$ = R$^{a1}$;
L$_{a146}$: R$^a$ = R$^{a2}$; L$_{a147}$: R$^a$ = R$^{a3}$;
L$_{a148}$: R$^a$ = R$^{a4}$; L$_{a149}$: R$^a$ = R$^{a4}$;
L$_{a150}$: R$^a$ = R$^{a6}$; L$_{a151}$: R$^a$ = R$^{a6}$;
L$_{a152}$: R$^a$ = R$^{a8}$; L$_{a153}$: R$^a$ = R$^{a8}$;
L$_{a154}$: R$^a$ = F;

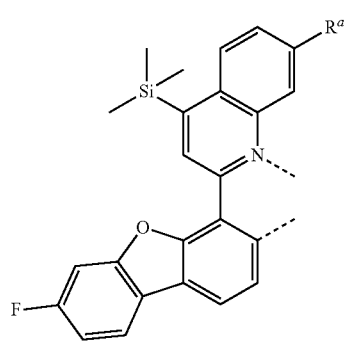

L$_{a155}$: R$^a$ = CH$_3$; L$_{a156}$: R$^a$ = R$^{a1}$;
L$_{a157}$: R$^a$ = R$^{a2}$; L$_{a158}$: R$^a$ = R$^{a3}$;
L$_{a159}$: R$^a$ = R$^{a4}$; L$_{a160}$: R$^a$ = R$^{a4}$;
L$_{a161}$: R$^a$ = R$^{a6}$; L$_{a162}$: R$^a$ = R$^{a6}$;
L$_{a163}$: R$^a$ = R$^{a8}$; L$_{a164}$: R$^a$ = R$^{a8}$;
L$_{a165}$: R$^a$ = F;

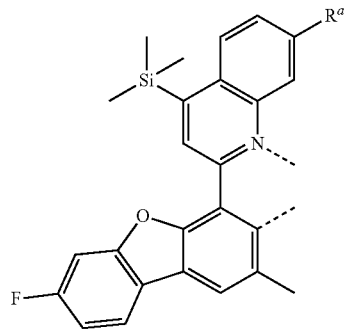

L$_{a166}$: R$^a$ = CH$_3$; L$_{a167}$: R$^a$ = R$^{a1}$;
L$_{a168}$: R$^a$ = R$^{a2}$; L$_{a169}$: R$^a$ = R$^{a3}$;
L$_{a170}$: R$^a$ = R$^{a4}$; L$_{a171}$: R$^a$ = R$^{a5}$;
L$_{a172}$: R$^a$ = R$^{a6}$; L$_{a173}$: R$^a$ = R$^{a7}$;
L$_{a174}$: R$^a$ = R$^{a8}$; L$_{a175}$: R$^a$ = R$^{a9}$;
L$_{a176}$: R$^a$ = F;

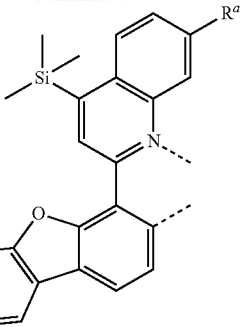

L_{a177}: R^a = CH_3; L_{a178}: R^a = R^{a1};
L_{a179}: R^a = R^{a2}; L_{a180}: R^a = R^{a3};
L_{a181}: R^a = R^{a4}; L_{a182}: R^a = R^{a5};
L_{a183}: R^a = R^{a6}; L_{a184}: R^a = R^{a7};
L_{a185}: R^a = R^{a8}; L_{a186}: R^a = R^{a9};
L_{a187}: R^a = F;

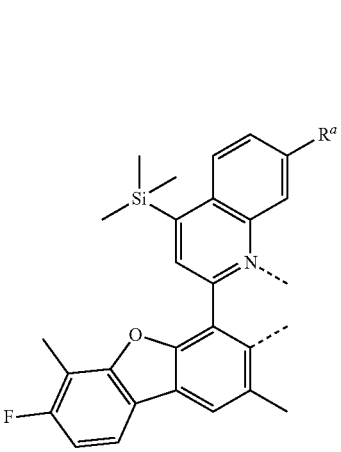

L_{a188}: R^a = CH_3; L_{a189}: R^a = R^{a1};
L_{a190}: R^a = R^{a2}; L_{a191}: R^a = R^{a3};
L_{a192}: R^a = R^{a4}; L_{a193}: R^a = R^{a5};
L_{a194}: R^a = R^{a6}; L_{a195}: R^a = R^{a7};
L_{a196}: R^a = R^{a8}; L_{a197}: R^a = R^{a9};
L_{a198}: R^a = F;

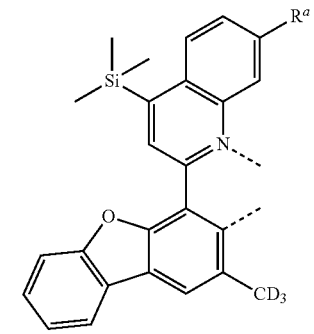

L_{a199}: R^a = CH_3; L_{a200}: R^a = R^{a1};
L_{a201}: R^a = R^{a2}; L_{a202}: R^a = R^{a3};
L_{a203}: R^a = R^{a4}; L_{a204}: R^a = R^{a5};
L_{a205}: R^a = R^{a6}; L_{a206}: R^a = R^{a7};
L_{a207}: R^a = R^{a8}; L_{a208}: R^a = R^{a9};
L_{a209}: R^a = F;

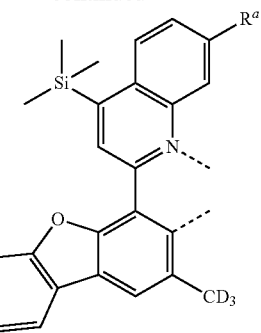

L_{a210}: R^a = CH_3; L_{a211}: R^a = R^{a1};
L_{a212}: R^a = R^{a2}; L_{a213}: R^a = R^{a3};
L_{a214}: R^a = R^{a4}; L_{a215}: R^a = R^{a5};
L_{a216}: R^a = R^{a6}; L_{a217}: R^a = R^{a7};
L_{a218}: R^a = R^{a8}; L_{a219}: R^a = R^{a9};
L_{a220}: R^a = F;

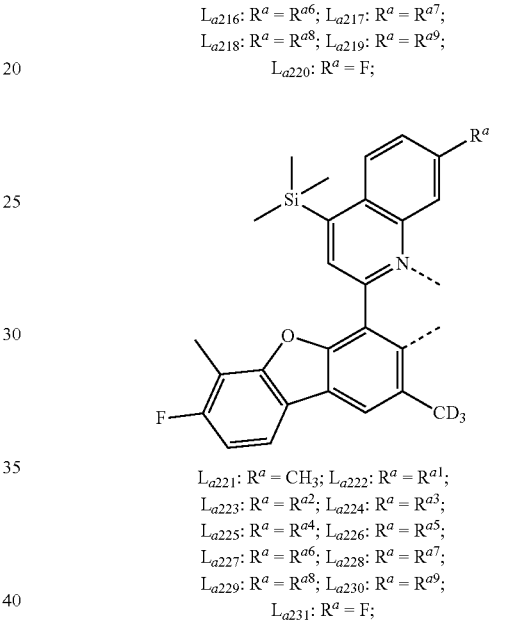

L_{a221}: R^a = CH_3; L_{a222}: R^a = R^{a1};
L_{a223}: R^a = R^{a2}; L_{a224}: R^a = R^{a3};
L_{a225}: R^a = R^{a4}; L_{a226}: R^a = R^{a5};
L_{a227}: R^a = R^{a6}; L_{a228}: R^a = R^{a7};
L_{a229}: R^a = R^{a8}; L_{a230}: R^a = R^{a9};
L_{a231}: R^a = F;

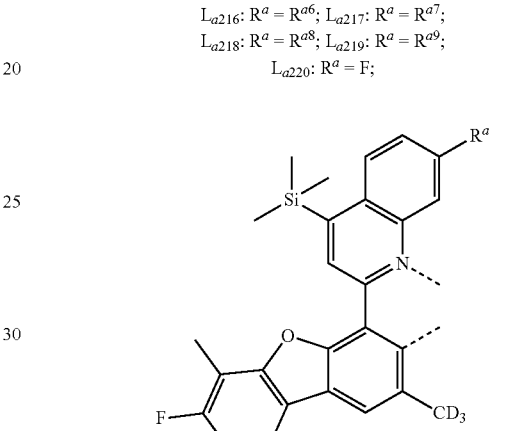

L_{a254}: R^a = CH_3; L_{a255}: R^a = R^{a1};
L_{a256}: R^a = R^{a2}; L_{a257}: R^a = R^{a3};
L_{a258}: R^a = R^{a4}; L_{a259}: R^a = R^{a5};
L_{a260}: R^a = R^{a6}; L_{a261}: R^a = R^{a7};
L_{a262}: R^a = R^{a8}; L_{a263}: R^a = R^{a9};
L_{a264}: R^a = F;

L_{a265}: R^a = CH_3; L_{a266}: R^a = R^{a1};
L_{a267}: R^a = R^{a2}; L_{a268}: R^a = R^{a3};
L_{a269}: R^a = R^{a4}; L_{a270}: R^a = R^{a5};
L_{a271}: R^a = R^{a6}; L_{a272}: R^a = R^{a7};
L_{a273}: R^a = R^{a8}; L_{a274}: R^a = R^{a9};
L_{a275}: R^a = F;

123
-continued

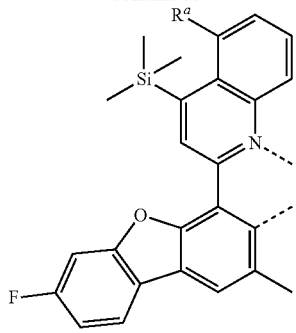

L$_{a276}$: R$^a$ = CH$_3$; L$_{a277}$: R$^a$ = R$^{a1}$;
L$_{a278}$: R$^a$ = R$^{a2}$; L$_{a279}$: R$^a$ = R$^{a3}$;
L$_{a280}$: R$^a$ = R$^{a4}$; L$_{a281}$: R$^a$ = R$^{a5}$;
L$_{a282}$: R$^a$ = R$^{a6}$; L$_{a283}$: R$^a$ = R$^{a7}$;
L$_{a284}$: R$^a$ = R$^{a8}$; L$_{a285}$: R$^a$ = R$^{a9}$;
L$_{a286}$: R$^a$ = F;

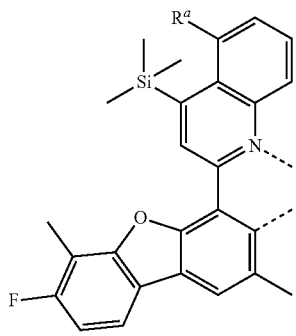

L$_{a287}$: R$^a$ = CH$_3$; L$_{a288}$: R$^a$ = R$^{a1}$;
L$_{a289}$: R$^a$ = R$^{a2}$; L$_{a290}$: R$^a$ = R$^{a3}$;
L$_{a291}$: R$^a$ = R$^{a4}$; L$_{a292}$: R$^a$ = R$^{a5}$;
L$_{a293}$: R$^a$ = R$^{a6}$; L$_{a294}$: R$^a$ = R$^{a7}$;
L$_{a295}$: R$^a$ = R$^{a8}$; L$_{a296}$: R$^a$ = R$^{a9}$;
L$_{a297}$: R$^a$ = F;

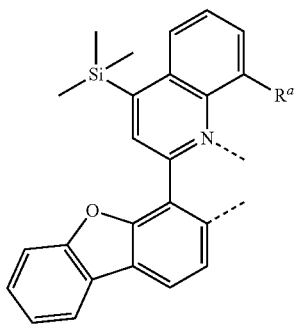

L$_{a320}$: R$^a$ = CH$_3$; L$_{a321}$: R$^a$ = R$^{a1}$;
L$_{a322}$: R$^a$ = R$^{a2}$; L$_{a323}$: R$^a$ = R$^{a3}$;
L$_{a324}$: R$^a$ = R$^{a4}$; L$_{a325}$: R$^a$ = R$^{a5}$;
L$_{a326}$: R$^a$ = R$^{a6}$; L$_{a327}$: R$^a$ = R$^{a7}$;
L$_{a328}$: R$^a$ = R$^{a8}$; L$_{a329}$: R$^a$ = R$^{a9}$;
L$_{a330}$: R$^a$ = F;

124
-continued

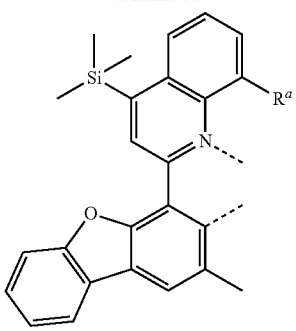

L$_{a331}$: R$^a$ = CH$_3$; L$_{a332}$: R$^a$ = R$^{a1}$;
L$_{a333}$: R$^a$ = R$^{a2}$; L$_{a334}$: R$^a$ = R$^{a3}$;
L$_{a335}$: R$^a$ = R$^{a4}$; L$_{a336}$: R$^a$ = R$^{a5}$;
L$_{a337}$: R$^a$ = R$^{a6}$; L$_{a338}$: R$^a$ = R$^{a7}$;
L$_{a339}$: R$^a$ = R$^{a8}$; L$_{a340}$: R$^a$ = R$^{a9}$;
L$_{a341}$: R$^a$ = F;

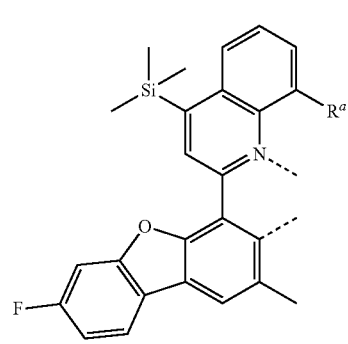

L$_{a342}$: R$^a$ = CH$_3$; L$_{a343}$: R$^a$ = R$^{a1}$;
L$_{a344}$: R$^a$ = R$^{a2}$; L$_{a345}$: R$^a$ = R$^{a3}$;
L$_{a346}$: R$^a$ = R$^{a4}$; L$_{a347}$: R$^a$ = R$^{a5}$;
L$_{a348}$: R$^a$ = R$^{a6}$; L$_{a349}$: R$^a$ = R$^{a7}$;
L$_{a350}$: R$^a$ = R$^{a8}$; L$_{a351}$: R$^a$ = R$^{a9}$;
L$_{a352}$: R$^a$ = F;

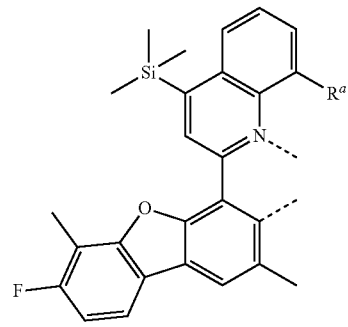

L$_{a353}$: R$^a$ = CH$_3$; L$_{a354}$: R$^a$ = R$^{a1}$;
L$_{a355}$: R$^a$ = R$^{a2}$; L$_{a356}$: R$^a$ = R$^{a3}$;
L$_{a357}$: R$^a$ = R$^{a4}$; L$_{a358}$: R$^a$ = R$^{a5}$;
L$_{a359}$: R$^a$ = R$^{a6}$; L$_{a360}$: R$^a$ = R$^{a7}$;
L$_{a361}$: R$^a$ = R$^{a8}$; L$_{a362}$: R$^a$ = R$^{a9}$;
L$_{a363}$: R$^a$ = F;

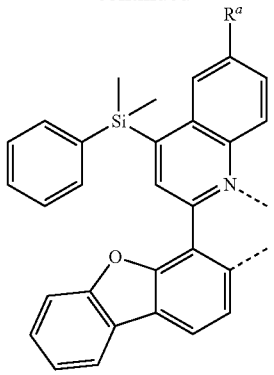

L$_{a364}$: R$^a$ = H; L$_{a365}$: R$^a$ = CH$_3$;
L$_{a366}$: R$^a$ = R$^{a1}$; L$_{a367}$: R$^a$ = R$^{a2}$;
L$_{a368}$: R$^a$ = R$^{a3}$; L$_{a369}$: R$^a$ = R$^{a4}$;
L$_{a370}$: R$^a$ = R$^{a5}$; L$_{a371}$: R$^a$ = R$^{a6}$;
L$_{a372}$: R$^a$ = R$^{a7}$; L$_{a373}$: R$^a$ = R$^{a8}$;
L$_{a374}$: R$^a$ = R$^{a9}$; L$_{a375}$: R$^a$ = F;

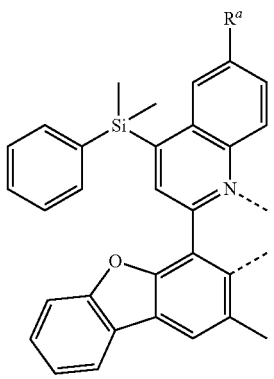

L$_{a376}$: R$^a$ = H; L$_{a377}$: R$^a$ = CH$_3$;
L$_{a378}$: R$^a$ = R$^{a1}$; L$_{a379}$: R$^a$ = R$^{a2}$;
L$_{a380}$: R$^a$ = R$^{a3}$; L$_{a381}$: R$^a$ = R$^{a4}$;
L$_{a382}$: R$^a$ = R$^{a5}$; L$_{a383}$: R$^a$ = R$^{a6}$;
L$_{a384}$: R$^a$ = R$^{a7}$; L$_{a385}$: R$^a$ = R$^{a8}$;
L$_{a386}$: R$^a$ = R$^{a9}$; L$_{a387}$: R$^a$ = F;

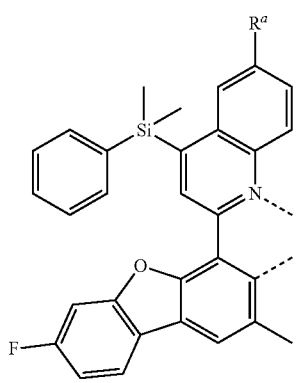

L$_{a388}$: R$^a$ = H; L$_{a389}$: R$^a$ = CH$_3$;
L$_{a390}$: R$^a$ = R$^{a1}$; L$_{a391}$: R$^a$ = R$^{a2}$;
L$_{a392}$: R$^a$ = R$^{a3}$; L$_{a393}$: R$^a$ = R$^{a4}$;
L$_{a394}$: R$^a$ = R$^{a5}$; L$_{a395}$: R$^a$ = R$^{a6}$;
L$_{a396}$: R$^a$ = R$^{a7}$; L$_{a397}$: R$^a$ = R$^{a8}$;
L$_{a398}$: R$^a$ = R$^{a9}$; L$_{a399}$: R$^a$ = F;

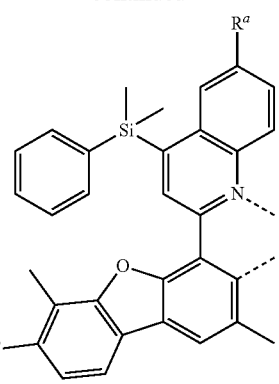

L$_{a400}$: R$^a$ = H; L$_{a401}$: R$^a$ = CH$_3$;
L$_{a402}$: R$^a$ = R$^{a1}$; L$_{a403}$: R$^a$ = R$^{a2}$;
L$_{a404}$: R$^a$ = R$^{a3}$; L$_{a405}$: R$^a$ = R$^{a4}$;
L$_{a406}$: R$^a$ = R$^{a5}$; L$_{a407}$: R$^a$ = R$^{a6}$;
L$_{a408}$: R$^a$ = R$^{a7}$; L$_{a409}$: R$^a$ = R$^{a8}$;
L$_{a410}$: R$^a$ = R$^{a9}$; L$_{a411}$: R$^a$ = F;

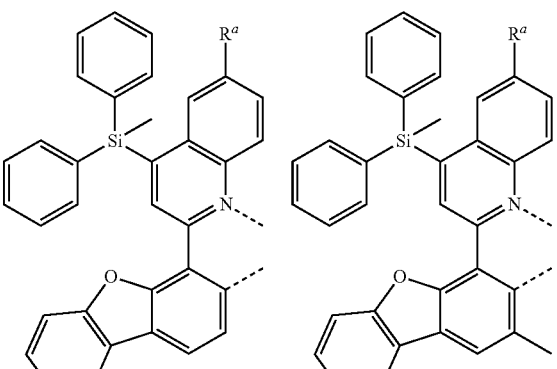

L$_{a436}$: R$^a$ = H; L$_{a437}$: R$^a$ = CH$_3$;
L$_{a438}$: R$^a$ = R$^{a1}$; L$_{a439}$: R$^a$ = R$^{a2}$;
L$_{a440}$: R$^a$ = R$^{a3}$; L$_{a441}$: R$^a$ = R$^{a4}$;
L$_{a442}$: R$^a$ = R$^{a5}$; L$_{a443}$: R$^a$ = R$^{a6}$;
L$_{a444}$: R$^a$ = R$^{a7}$; L$_{a445}$: R$^a$ = R$^{a8}$;
L$_{a446}$: R$^a$ = R$^{a9}$; L$_{a447}$: R$^a$ = F;

L$_{a448}$: R$^a$ = H; L$_{a449}$: R$^a$ = CH$_3$;
L$_{a450}$: R$^a$ = R$^{a1}$; L$_{a451}$: R$^a$ = R$^{a2}$;
L$_{a452}$: R$^a$ = R$^{a3}$; L$_{a453}$: R$^a$ = R$^{a4}$;
L$_{a454}$: R$^a$ = R$^{a5}$; L$_{a455}$: R$^a$ = R$^{a6}$;
L$_{a456}$: R$^a$ = R$^{a7}$; L$_{a457}$: R$^a$ = R$^{a8}$;
L$_{a458}$: R$^a$ = R$^{a9}$; L$_{a459}$: R$^a$ = F;

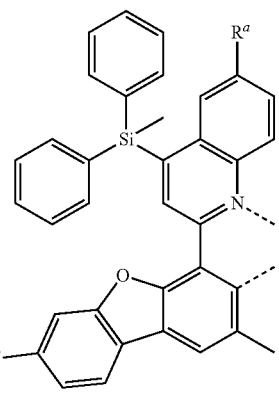

L$_{a460}$: R$^a$ = H; L$_{a461}$: R$^a$ = CH$_3$;
L$_{a462}$: R$^a$ = R$^{a1}$; L$_{a463}$: R$^a$ = R$^{a2}$;
L$_{a464}$: R$^a$ = R$^{a3}$; L$_{a465}$: R$^a$ = R$^{a4}$;
L$_{a466}$: R$^a$ = R$^{a5}$; L$_{a467}$: R$^a$ = R$^{a6}$;
L$_{a468}$: R$^a$ = R$^{a7}$; L$_{a469}$: R$^a$ = R$^{a8}$;
L$_{a470}$: R$^a$ = R$^{a9}$; L$_{a471}$: R$^a$ = F;

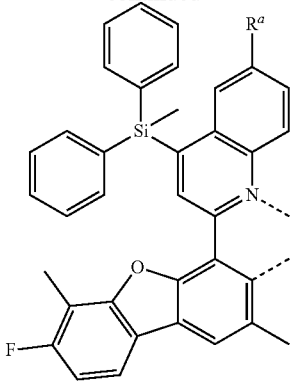

L$_{a472}$: R$^a$ = H; L$_{a473}$: R$^a$ = CH$_3$;
L$_{a474}$: R$^a$ = R$^{a1}$; L$_{a475}$: R$^a$ = R$^{a2}$;
L$_{a476}$: R$^a$ = R$^{a3}$; L$_{a477}$: R$^a$ = R$^{a4}$;
L$_{a478}$: R$^a$ = R$^{a5}$; L$_{a479}$: R$^a$ = R$^{a6}$;
L$_{a480}$: R$^a$ = R$^{a7}$; L$_{a481}$: R$^a$ = R$^{a8}$;
L$_{a482}$: R$^a$ = R$^{a9}$; L$_{a483}$: R$^a$ = F;

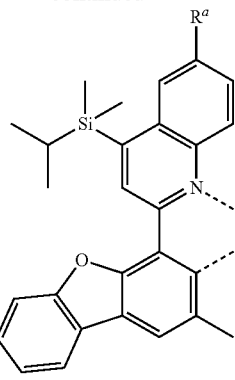

L$_{a508}$: R$^a$ = H; L$_{a509}$: R$^a$ = CH$_3$;
L$_{a510}$: R$^a$ = R$^{a1}$; L$_{a511}$: R$^a$ = R$^{a2}$;
L$_{a512}$: R$^a$ = R$^{a3}$; L$_{a513}$: R$^a$ = R$^{a4}$;
L$_{a514}$: R$^a$ = R$^{a5}$; L$_{a515}$: R$^a$ = R$^{a6}$;
L$_{a516}$: R$^a$ = R$^{a7}$; L$_{a517}$: R$^a$ = R$^{a8}$;
L$_{a518}$: R$^a$ = R$^{a9}$; L$_{a519}$: R$^a$ = F;

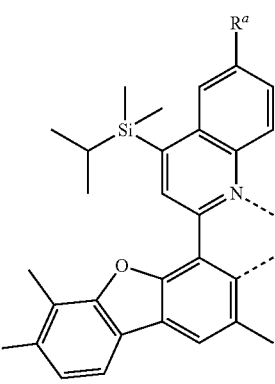

L$_{a520}$: R$^a$ = H; L$_{a521}$: R$^a$ = CH$_3$;
L$_{a522}$: R$^a$ = R$^{a1}$; L$_{a523}$: R$^a$ = R$^{a2}$;
L$_{a524}$: R$^a$ = R$^{a3}$; L$_{a525}$: R$^a$ = R$^{a4}$;
L$_{a526}$: R$^a$ = R$^{a5}$; L$_{a527}$: R$^a$ = R$^{a6}$;
L$_{a528}$: R$^a$ = R$^{a7}$; L$_{a529}$: R$^a$ = R$^{a8}$;
L$_{a530}$: R$^a$ = R$^{a9}$; L$_{a531}$: R$^a$ = F;

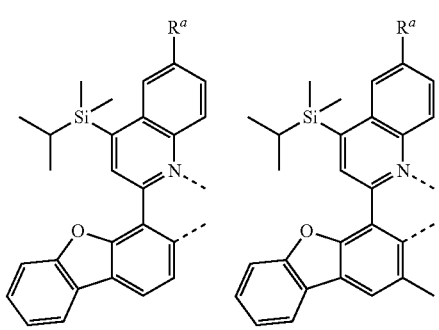

L$_{a484}$: R$^a$ = H; L$_{a485}$: R$^a$ = CH$_3$;
L$_{a486}$: R$^a$ = R$^{a1}$; L$_{a487}$: R$^a$ = R$^{a2}$;
L$_{a488}$: R$^a$ = R$^{a3}$; L$_{a489}$: R$^a$ = R$^{a4}$;
L$_{a490}$: R$^a$ = R$^{a5}$; L$_{a491}$: R$^a$ = R$^{a6}$;
L$_{a492}$: R$^a$ = R$^{a7}$; L$_{a493}$: R$^a$ = R$^{a8}$;
L$_{a494}$: R$^a$ = R$^{a9}$; L$_{a495}$: R$^a$ = F;

L$_{a496}$: R$^a$ = H; L$_{a497}$: R$^a$ = CH$_3$;
L$_{a498}$: R$^a$ = R$^{a1}$; L$_{a499}$: R$^a$ = R$^{a2}$;
L$_{a500}$: R$^a$ = R$^{a3}$; L$_{a501}$: R$^a$ = R$^{a4}$;
L$_{a502}$: R$^a$ = R$^{a5}$; L$_{a503}$: R$^a$ = R$^{a6}$;
L$_{a504}$: R$^a$ = R$^{a7}$; L$_{a505}$: R$^a$ = R$^{a8}$;
L$_{a506}$: R$^a$ = R$^{a9}$; L$_{a507}$: R$^a$ = F;

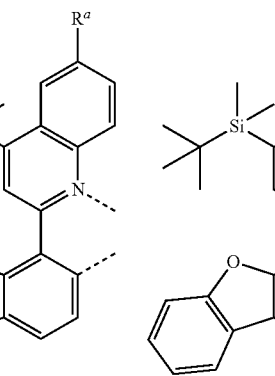

L$_{a556}$: R$^a$ = H; L$_{a557}$: R$^a$ = CH$_3$;
L$_{a558}$: R$^a$ = R$^{a1}$; L$_{a559}$: R$^a$ = R$^{a2}$;
L$_{a560}$: R$^a$ = R$^{a3}$; L$_{a561}$: R$^a$ = R$^{a4}$;
L$_{a562}$: R$^a$ = R$^{a5}$; L$_{a563}$: R$^a$ = R$^{a6}$;
L$_{a564}$: R$^a$ = R$^{a7}$; L$_{a565}$: R$^a$ = R$^{a8}$;
L$_{a566}$: R$^a$ = R$^{a9}$; L$_{a567}$: R$^a$ = F;

L$_{a568}$: R$^a$ = H; L$_{a569}$: R$^a$ = CH$_3$;
L$_{a570}$: R$^a$ = R$^{a1}$; L$_{a571}$: R$^a$ = R$^{a2}$;
L$_{a572}$: R$^a$ = R$^{a3}$; L$_{a573}$: R$^a$ = R$^{a4}$;
L$_{a574}$: R$^a$ = R$^{a5}$; L$_{a575}$: R$^a$ = R$^{a6}$;
L$_{a576}$: R$^a$ = R$^{a7}$; L$_{a577}$: R$^a$ = R$^{a8}$;
L$_{a578}$: R$^a$ = R$^{a9}$; L$_{a579}$: R$^a$ = F;

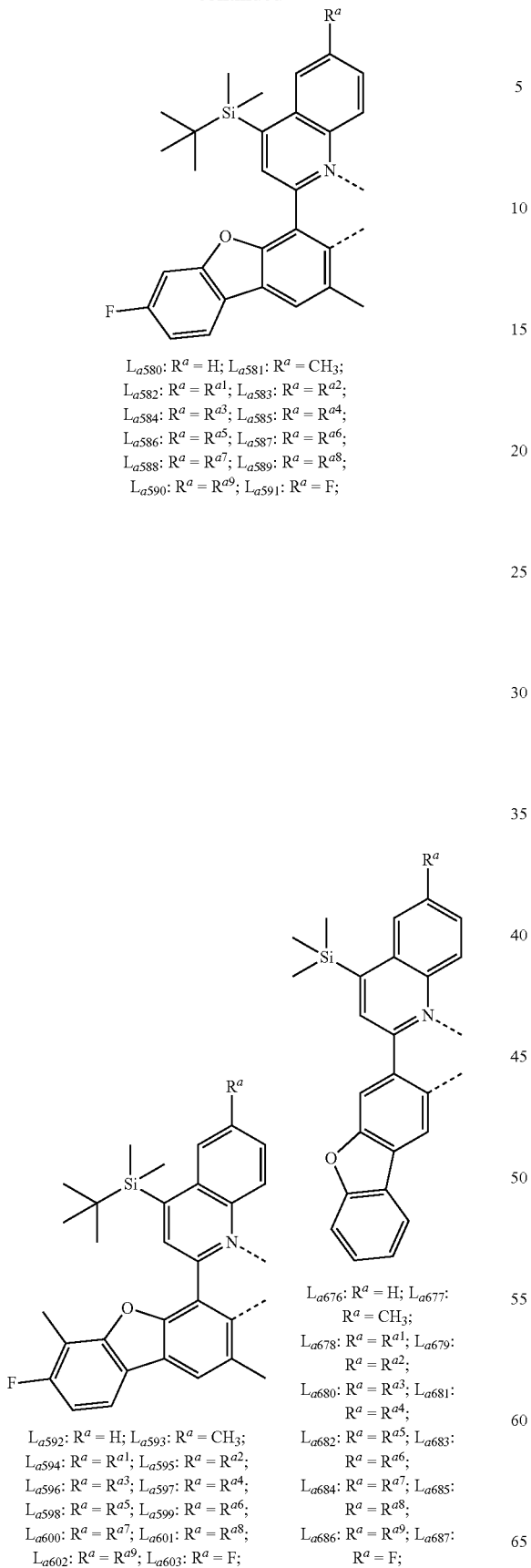

L$_{a}$580: R$^a$ = H; L$_{a}$581: R$^a$ = CH$_3$;
L$_{a}$582: R$^a$ = R$^{a1}$; L$_{a}$583: R$^a$ = R$^{a2}$;
L$_{a}$584: R$^a$ = R$^{a3}$; L$_{a}$585: R$^a$ = R$^{a4}$;
L$_{a}$586: R$^a$ = R$^{a5}$; L$_{a}$587: R$^a$ = R$^{a6}$;
L$_{a}$588: R$^a$ = R$^{a7}$; L$_{a}$589: R$^a$ = R$^{a8}$;
L$_{a}$590: R$^a$ = R$^{a9}$; L$_{a}$591: R$^a$ = F;

L$_{a}$676: R$^a$ = H; L$_{a}$677: R$^a$ = CH$_3$;
L$_{a}$678: R$^a$ = R$^{a1}$; L$_{a}$679: R$^a$ = R$^{a2}$;
L$_{a}$680: R$^a$ = R$^{a3}$; L$_{a}$681: R$^a$ = R$^{a4}$;
L$_{a}$682: R$^a$ = R$^{a5}$; L$_{a}$683: R$^a$ = R$^{a6}$;
L$_{a}$684: R$^a$ = R$^{a7}$; L$_{a}$685: R$^a$ = R$^{a8}$;
L$_{a}$686: R$^a$ = R$^{a9}$; L$_{a}$687: R$^a$ = F;

L$_{a}$592: R$^a$ = H; L$_{a}$593: R$^a$ = CH$_3$;
L$_{a}$594: R$^a$ = R$^{a1}$; L$_{a}$595: R$^a$ = R$^{a2}$;
L$_{a}$596: R$^a$ = R$^{a3}$; L$_{a}$597: R$^a$ = R$^{a4}$;
L$_{a}$598: R$^a$ = R$^{a5}$; L$_{a}$599: R$^a$ = R$^{a6}$;
L$_{a}$600: R$^a$ = R$^{a7}$; L$_{a}$601: R$^a$ = R$^{a8}$;
L$_{a}$602: R$^a$ = R$^{a9}$; L$_{a}$603: R$^a$ = F;

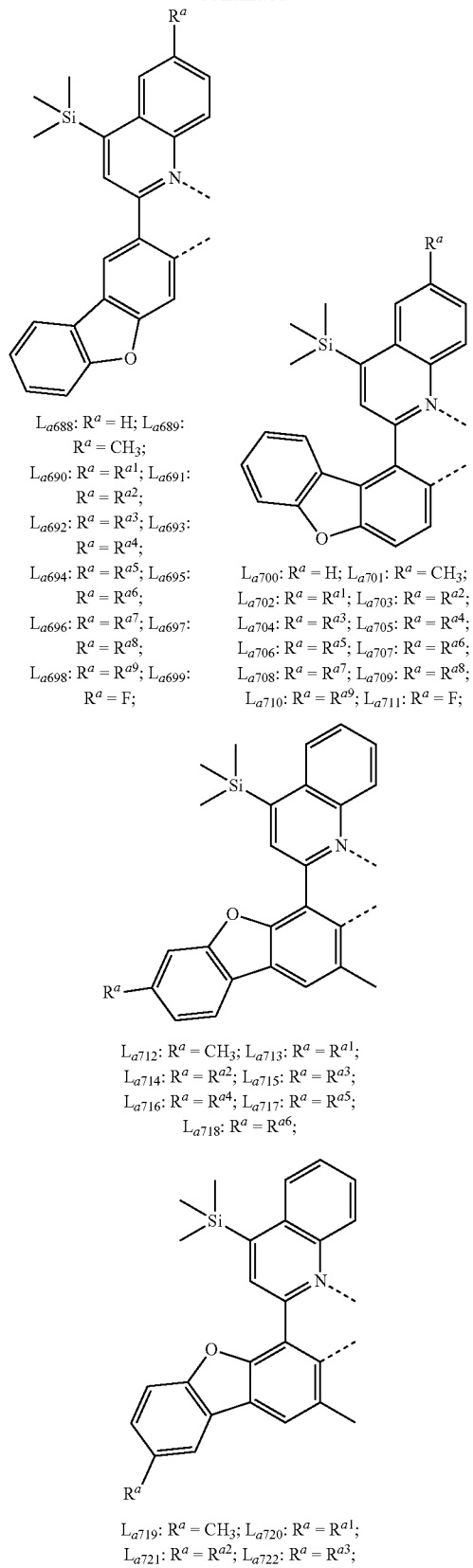

L$_{a}$688: R$^a$ = H; L$_{a}$689: R$^a$ = CH$_3$;
L$_{a}$690: R$^a$ = R$^{a1}$; L$_{a}$691: R$^a$ = R$^{a2}$;
L$_{a}$692: R$^a$ = R$^{a3}$; L$_{a}$693: R$^a$ = R$^{a4}$;
L$_{a}$694: R$^a$ = R$^{a5}$; L$_{a}$695: R$^a$ = R$^{a6}$;
L$_{a}$696: R$^a$ = R$^{a7}$; L$_{a}$697: R$^a$ = R$^{a8}$;
L$_{a}$698: R$^a$ = R$^{a9}$; L$_{a}$699: R$^a$ = F;

L$_{a}$700: R$^a$ = H; L$_{a}$701: R$^a$ = CH$_3$;
L$_{a}$702: R$^a$ = R$^{a1}$; L$_{a}$703: R$^a$ = R$^{a2}$;
L$_{a}$704: R$^a$ = R$^{a3}$; L$_{a}$705: R$^a$ = R$^{a4}$;
L$_{a}$706: R$^a$ = R$^{a5}$; L$_{a}$707: R$^a$ = R$^{a6}$;
L$_{a}$708: R$^a$ = R$^{a7}$; L$_{a}$709: R$^a$ = R$^{a8}$;
L$_{a}$710: R$^a$ = R$^{a9}$; L$_{a}$711: R$^a$ = F;

L$_{a}$712: R$^a$ = CH$_3$; L$_{a}$713: R$^a$ = R$^{a1}$;
L$_{a}$714: R$^a$ = R$^{a2}$; L$_{a}$715: R$^a$ = R$^{a3}$;
L$_{a}$716: R$^a$ = R$^{a4}$; L$_{a}$717: R$^a$ = R$^{a5}$;
L$_{a}$718: R$^a$ = R$^{a6}$;

L$_{a}$719: R$^a$ = CH$_3$; L$_{a}$720: R$^a$ = R$^{a1}$;
L$_{a}$721: R$^a$ = R$^{a2}$; L$_{a}$722: R$^a$ = R$^{a3}$;
L$_{a}$723: R$^a$ = R$^{a4}$; L$_{a}$724: R$^a$ = R$^{a5}$;
L$_{a}$725: R$^a$ = R$^{a6}$; L$_{a}$726: R$^a$ = F;

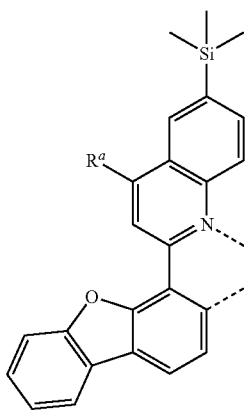

L_{a728}: R^a = H; L_{a729}: R^a = CH_3;
L_{a730}: R^a = R^{a1}; L_{a731}: R^a = R^{a2};
L_{a732}: R^a = R^{a3}; L_{a733}: R^a = R^{a4};
L_{a734}: R^a = R^{a5}; L_{a735}: R^a = R^{a6};
L_{a736}: R^a = R^{a7}; L_{a737}: R^a = R^{a8};
L_{a738}: R^a = R^{a9}; L_{a739}: R^a = F;

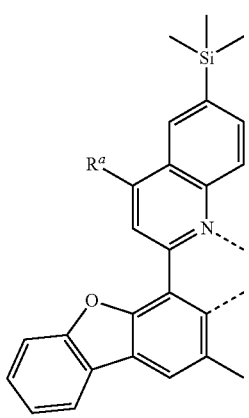

L_{a740}: R^a = H; L_{a741}: R^a = CH_3;
L_{a742}: R^a = R^{a1}; L_{a743}: R^a = R^{a2};
L_{a744}: R^a = R^{a3}; L_{a745}: R^a = R^{a4};
L_{a746}: R^a = R^{a5}; L_{a747}: R^a = R^{a6};
L_{a748}: R^a = R^{a7}; L_{a749}: R^a = R^{a8};
L_{a750}: R^a = R^{a9}; L_{a751}: R^a = F;

-continued

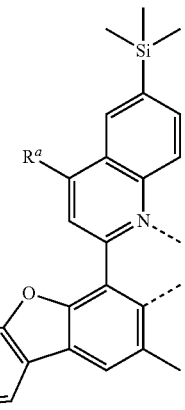

L_{a752}: R^a = H; L_{a753}: R^a = CH_3;
L_{a754}: R^a = R^{a1}; L_{a755}: R^a = R^{a2};
L_{a756}: R^a = R^{a3}; L_{a757}: R^a = R^{a4};
L_{a758}: R^a = R^{a5} L_{a759}: R^a = R^{a6};
L_{a760}: R^a = R^{a7}; L_{a761}: R^a = R^{a8};
L_{a762}: R^a = R^{a9}; L_{a763}: R^a = F;

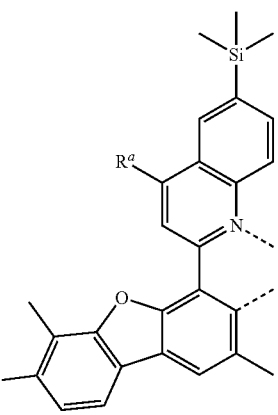

L_{a764}: R^a = H; L_{a765}: R^a = CH_3;
L_{a766}: R^a = R^{a1}; L_{a767}: R^a = R^{a2};
L_{a768}: R^a = R^{a3}; L_{a769}: R^a = R^{a4};
L_{a770}: R^a = R^{a5}; L_{a771}: R^a = R^{a6};
L_{a772}: R^a = R^{a7}; L_{a773}: R^a = R^{a8};
L_{a774}: R^a = R^{a9}; L_{a775}: R^a = F;

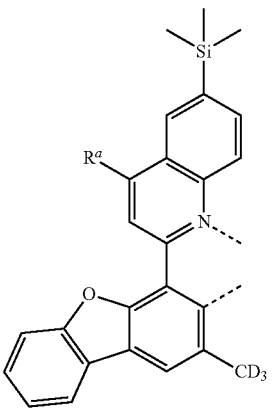

L$_{a800}$: R$^a$ = H; L$_{a801}$: R$^a$ = CH$_3$;
L$_{a802}$: R$^a$ = R$^{a1}$; L$_{a803}$: R$^a$ = R$^{a2}$;
L$_{a804}$: R$^a$ = R$^{a3}$; L$_{a805}$: R$^a$ = R$^{a4}$;
L$_{a806}$: R$^a$ = R$^{a5}$; L$_{a807}$: R$^a$ = R$^{a6}$;
L$_{a808}$: R$^a$ = R$^{a7}$; L$_{a809}$: R$^a$ = R$^{a8}$;
L$_{a810}$: R$^a$ = R$^{a9}$; L$_{a811}$: R$^a$ = F;

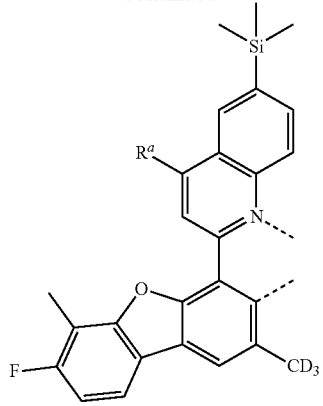

L$_{a824}$: R$^a$ = H; L$_{a825}$: R$^a$ = CH$_3$;
L$_{a826}$: R$^a$ = R$^{a1}$; L$_{a827}$: R$^a$ = R$^{a2}$;
L$_{a828}$: R$^a$ = R$^{a3}$; L$_{a829}$: R$^a$ = R$^{a4}$;
L$_{a830}$: R$^a$ = R$^{a5}$; L$_{a831}$: R$^a$ = R$^{a6}$;
L$_{a832}$: R$^a$ = R$^{a7}$; L$_{a833}$: R$^a$ = R$^{a8}$;
L$_{a834}$: R$^a$ = R$^{a9}$; L$_{a835}$: R$^a$ = F;

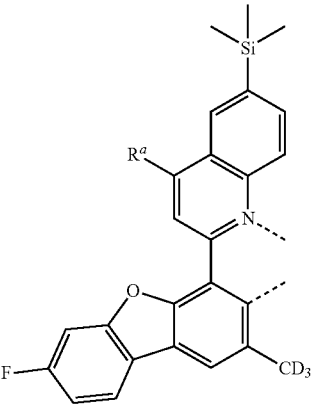

L$_{a812}$: R$^a$ = H; L$_{a813}$: R$^a$ = CH$_3$;
L$_{a814}$: R$^a$ = R$^{a1}$; L$_{a815}$: R$^a$ = R$^{a2}$;
L$_{a816}$: R$^a$ = R$^{a3}$; L$_{a817}$: R$^a$ = R$^{a4}$;
L$_{a818}$: R$^a$ = R$^{a5}$; L$_{a819}$: R$^a$ = R$^{a6}$;
L$_{a820}$: R$^a$ = R$^{a7}$; L$_{a821}$: R$^a$ = R$^{a8}$;
L$_{a822}$: R$^a$ = R$^{a9}$; L$_{a823}$: R$^a$ = F;

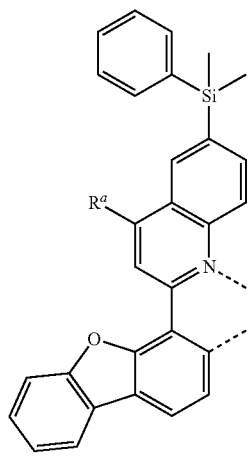

L$_{a836}$: R$^a$ = H; L$_{a837}$: R$^a$ = CH$_3$;
L$_{a838}$: R$^a$ = R$^{a1}$; L$_{a839}$: R$^a$ = R$^{a2}$;
L$_{a840}$: R$^a$ = R$^{a3}$; L$_{a841}$: R$^a$ = R$^{a4}$;
L$_{a842}$: R$^a$ = R$^{a5}$; L$_{a843}$: R$^a$ = R$^{a6}$;
L$_{a844}$: R$^a$ = R$^{a7}$; L$_{a845}$: R$^a$ = R$^{a8}$;
L$_{a846}$: R$^a$ = R$^{a9}$; L$_{a847}$: R$^a$ = F;

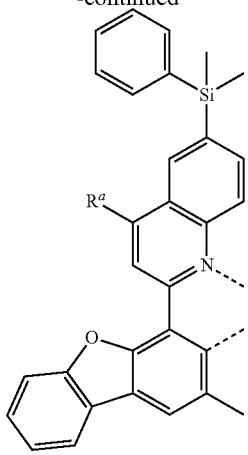

L$_{a848}$: R$^a$ = H; L$_{a849}$: R$^a$ = CH$_3$;
L$_{a850}$: R$^a$ = R$^{a1}$; L$_{a851}$: R$^a$ = R$^{a2}$;
L$_{a852}$: R$^a$ = R$^{a3}$; L$_{a853}$: R$^a$ = R$^{a4}$;
L$_{a854}$: R$^a$ = R$^{a5}$; L$_{a855}$: R$^a$ = R$^{a6}$;
L$_{a856}$: R$^a$ = R$^{a7}$; L$_{a857}$: R$^a$ = R$^{a8}$;
L$_{a858}$: R$^a$ = R$^{a9}$; L$_{a859}$: R$^a$ = F;

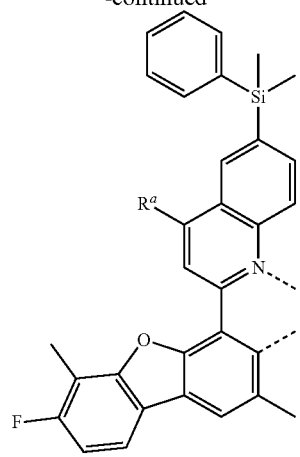

L$_{a872}$: R$^a$ = H; L$_{a873}$: R$^a$ = CH$_3$;
L$_{a874}$: R$^a$ = R$^{a1}$; L$_{a875}$: R$^a$ = R$^{a2}$;
L$_{a876}$: R$^a$ = R$^{a3}$; L$_{a877}$: R$^a$ = R$^{a4}$;
L$_{a878}$: R$^a$ = R$^{a5}$; L$_{a879}$: R$^a$ = R$^{a6}$;
L$_{a880}$: R$^a$ = R$^{a7}$; L$_{a881}$: R$^a$ = R$^{a8}$;
L$_{a882}$: R$^a$ = R$^{a9}$; L$_{a883}$: R$^a$ = F;

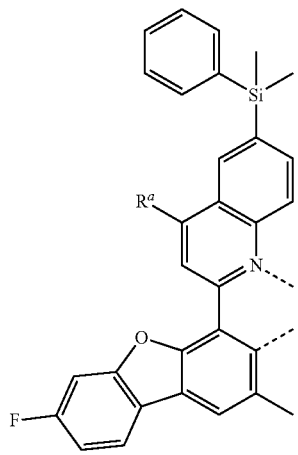

L$_{a860}$: R$^a$ = H; L$_{a861}$: R$^a$ = CH$_3$;
L$_{a862}$: R$^a$ = R$^{a1}$; L$_{a863}$: R$^a$ = R$^{a2}$;
L$_{a864}$: R$^a$ = R$^{a3}$; L$_{a865}$: R$^a$ = R$^{a4}$;
L$_{a866}$: R$^a$ = R$^{a5}$; L$_{a867}$: R$^a$ = R$^{a6}$;
L$_{a868}$: R$^a$ = R$^{a7}$; L$_{a869}$: R$^a$ = R$^{a8}$;
L$_{a870}$: R$^a$ = R$^{a9}$; L$_{a871}$: R$^a$ = F;

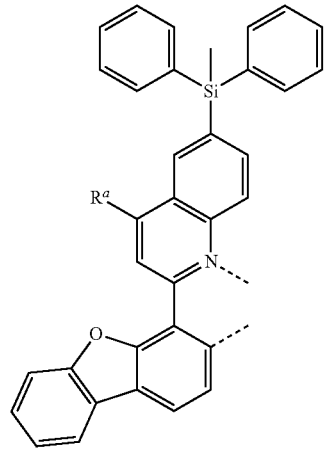

L$_{a908}$: R$^a$ = H; L$_{a909}$: R$^a$ = CH$_3$;
L$_{a910}$: R$^a$ = R$^{a1}$; L$_{a911}$: R$^a$ = R$^{a2}$;
L$_{a912}$: R$^a$ = R$^{a3}$; L$_{a913}$: R$^a$ = R$^{a4}$;
L$_{a914}$: R$^a$ = R$^{a5}$; L$_{a915}$: R$^a$ = R$^{a6}$;
L$_{a916}$: R$^a$ = R$^{a7}$; L$_{a917}$: R$^a$ = R$^{a8}$;
L$_{a918}$: R$^a$ = R$^{a9}$; L$_{a919}$: R$^a$ = F;

-continued

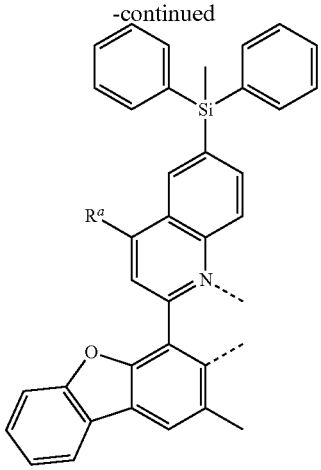

L$_{a920}$: R$^a$ = H; L$_{a921}$: R$^a$ = CH$_3$;
L$_{a922}$: R$^a$ = R$^{a1}$; L$_{a923}$: R$^a$ = R$^{a2}$;
L$_{a924}$: R$^a$ = R$^{a3}$; L$_{a925}$: R$^a$ = R$^{a4}$;
L$_{a926}$: R$^a$ = R$^{a5}$; L$_{a927}$: R$^a$ = R$^{a6}$;
L$_{a928}$: R$^a$ = R$^{a7}$; L$_{a929}$: R$^a$ = R$^{a8}$;
L$_{a930}$: R$^a$ = R$^{a9}$; L$_{a931}$: R$^a$ = F;

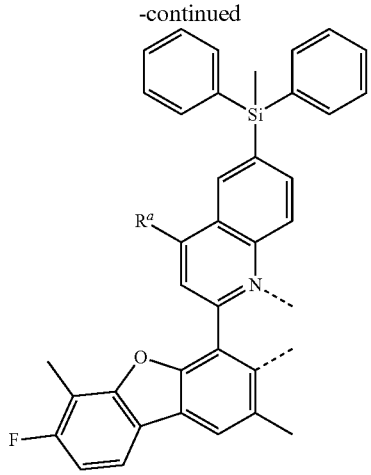

L$_{a944}$: R$^a$ = H; L$_{a945}$: R$^a$ = CH$_3$;
L$_{a946}$: R$^a$ = R$^{a1}$; L$_{a947}$: R$^a$ = R$^{a2}$;
L$_{a948}$: R$^a$ = R$^{a3}$; L$_{a949}$: R$^a$ = R$^{a4}$;
L$_{a950}$: R$^a$ = R$^{a5}$; L$_{a951}$: R$^a$ = R$^{a6}$;
L$_{a952}$: R$^a$ = R$^{a7}$; L$_{a953}$: R$^a$ = R$^{a8}$;
L$_{a954}$: R$^a$ = R$^{a9}$; L$_{a955}$: R$^a$ = F;

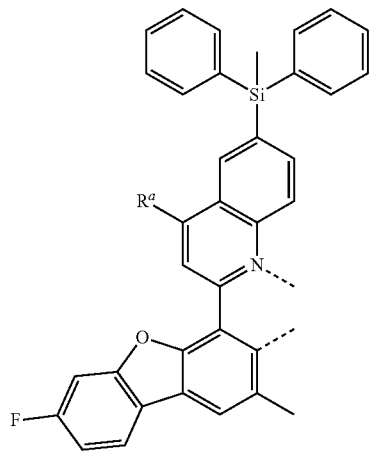

L$_{a932}$: R$^a$ = H; L$_{a933}$: R$^a$ = CH$_3$;
L$_{a934}$: R$^a$ = R$^{a1}$; L$_{a935}$: R$^a$ = R$^{a2}$;
L$_{a936}$: R$^a$ = R$^{a3}$; L$_{a937}$: R$^a$ = R$^{a4}$;
L$_{a938}$: R$^a$ = R$^{a5}$; L$_{a939}$: R$^a$ = R$^{a6}$;
L$_{a940}$: R$^a$ = R$^{a7}$; L$_{a941}$: R$^a$ = R$^{a8}$;
L$_{a942}$: R$^a$ = R$^{a9}$; L$_{a943}$: R$^a$ = F;

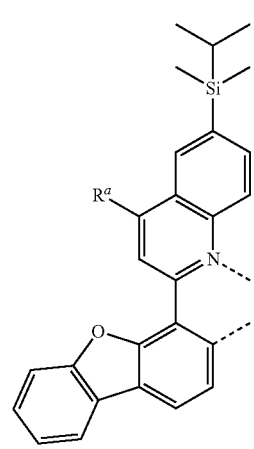

L$_{a980}$: R$^a$ = H; L$_{a981}$: R$^a$ = CH$_3$;
L$_{a982}$: R$^a$ = R$^{a1}$; L$_{a983}$: R$^a$ = R$^{a2}$;
L$_{a984}$: R$^a$ = R$^{a3}$; L$_{a985}$: R$^a$ = R$^{a4}$;
L$_{a986}$: R$^a$ = R$^{a5}$; L$_{a987}$: R$^a$ = R$^{a6}$;
L$_{a988}$: R$^a$ = R$^{a7}$; L$_{a989}$: R$^a$ = R$^{a8}$;
L$_{a990}$: R$^a$ = R$^{a9}$; L$_{a991}$: R$^a$ = F;

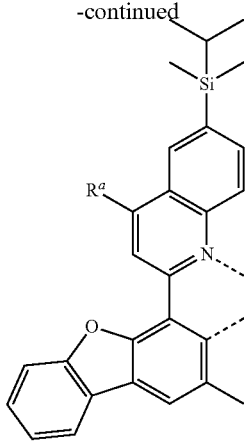

L$_{a992}$: R$^a$ = H; L$_{a993}$: R$^a$ = CH$_3$;
L$_{a994}$: R$^a$ = R$^{a1}$; L$_{a995}$: R$^a$ = R$^{a2}$;
L$_{a996}$: R$^a$ = R$^{a3}$; L$_{a997}$: R$^a$ = R$^{a4}$;
L$_{a998}$: R$^a$ = R$^{a5}$; L$_{a999}$: R$^a$ = R$^{a6}$;
L$_{a1000}$: R$^a$ = R$^{a7}$; L$_{a1001}$: R$^a$ = R$^{a8}$;
L$_{a1002}$: R$^a$ = R$^{a9}$; L$_{a1003}$: R$^a$ = F;

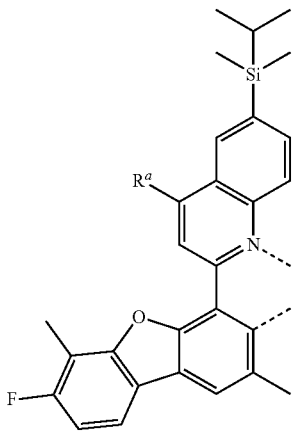

L$_{a1016}$: R$^a$ = H; L$_{a1017}$: R$^a$ = CH$_3$;
L$_{a1018}$: R$^a$ = R$^{a1}$; L$_{a1019}$: R$^a$ = R$^{a2}$;
L$_{a1020}$: R$^a$ = R$^{a3}$; L$_{a1021}$: R$^a$ = R$^{a4}$;
L$_{a1022}$: R$^a$ = R$^{a5}$; L$_{a1023}$: R$^a$ = R$^{a6}$;
L$_{a1024}$: R$^a$ = R$^{a7}$; L$_{a1025}$: R$^a$ = R$^{a8}$;
L$_{a1026}$: R$^a$ = R$^{a9}$; L$_{a1027}$: R$^a$ = F;

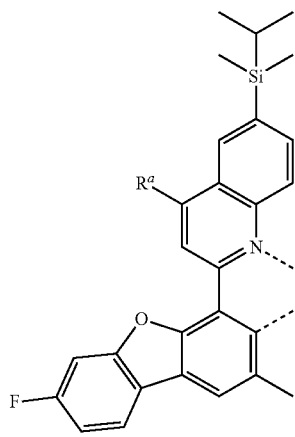

L$_{a1004}$: R$^a$ = H; L$_{a1005}$: R$^a$ = CH$_3$;
L$_{a1006}$: R$^a$ = R$^{a1}$; L$_{a1007}$: R$^a$ = R$^{a2}$;
L$_{a1008}$: R$^a$ = R$^{a3}$; L$_{a1009}$: R$^a$ = R$^{a4}$;
L$_{a1010}$: R$^a$ = R$^{a5}$; L$_{a1011}$: R$^a$ = R$^{a6}$;
L$_{a1012}$: R$^a$ = R$^{a7}$; L$_{a1013}$: R$^a$ = R$^{a8}$;
L$_{a1014}$: R$^a$ = R$^{a9}$; L$_{a1015}$: R$^a$ = F;

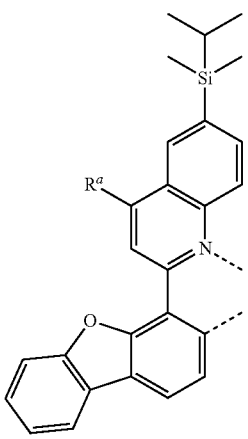

L$_{a1052}$: R$^a$ = H; L$_{a1053}$: R$^a$ = CH$_3$;
L$_{a1054}$: R$^a$ = R$^{a1}$; L$_{a1055}$: R$^a$ = R$^{a2}$;
L$_{a1056}$: R$^a$ = R$^{a3}$; L$_{a1057}$: R$^a$ = R$^{a4}$;
L$_{a1058}$: R$^a$ = R$^{a5}$; L$_{a1059}$: R$^a$ = R$^{a6}$;
L$_{a1060}$: R$^a$ = R$^{a7}$; L$_{a1061}$: R$^a$ = R$^{a8}$;
L$_{a1062}$: R$^a$ = R$^{a9}$; L$_{a1063}$: R$^a$ = F;

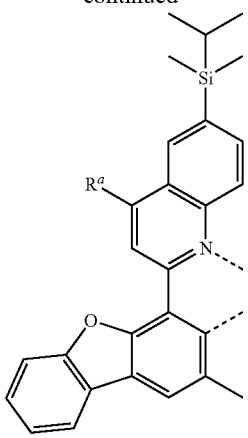

L$_{a1064}$: R$^a$ = H; L$_{a1065}$: R$^a$ = CH$_3$;
L$_{a1066}$: R$^a$ = R$^{a1}$; L$_{a1067}$: R$^a$ = R$^{a2}$;
L$_{a1068}$: R$^a$ = R$^{a3}$; L$_{a1069}$: R$^a$ = R$^{a4}$;
L$_{a1070}$: R$^a$ = R$^{a5}$; L$_{a1071}$: R$^a$ = R$^{a6}$;
L$_{a1072}$: R$^a$ = R$^{a7}$; L$_{a1073}$: R$^a$ = R$^{a8}$;
L$_{a1074}$: R$^a$ = R$^{a9}$; L$_{a1075}$: R$^a$ = F;

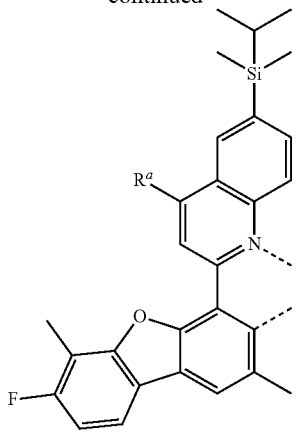

L$_{a1088}$: R$^a$ = H; L$_{a1089}$: R$^a$ = CH$_3$;
L$_{a1090}$: R$^a$ = R$^{a1}$; L$_{a1091}$: R$^a$ = R$^{a2}$;
L$_{a1092}$: R$^a$ = R$^{a3}$; L$_{a1093}$: R$^a$ = R$^{a4}$;
L$_{a1094}$: R$^a$ = R$^{a5}$; L$_{a1095}$: R$^a$ = R$^{a6}$;
L$_{a1096}$: R$^a$ = R$^{a7}$; L$_{a1097}$: R$^a$ = R$^{a8}$;
L$_{a1098}$: R$^a$ = R$^{a9}$; L$_{a1099}$: R$^a$ = F;

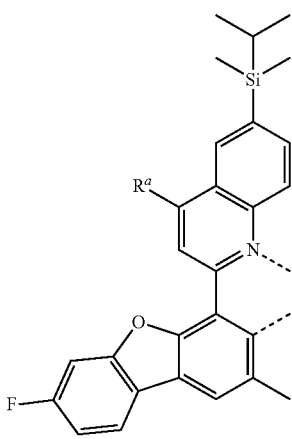

L$_{a1076}$: R$^a$ = H; L$_{a1077}$: R$^a$ = CH$_3$;
L$_{a1078}$: R$^a$ = R$^{a1}$; L$_{a1079}$: R$^a$ = R$^{a2}$;
L$_{a1080}$: R$^a$ = R$^{a3}$; L$_{a1081}$: R$^a$ = R$^{a4}$;
L$_{a1082}$: R$^a$ = R$^{a5}$; L$_{a1083}$: R$^a$ = R$^{a6}$;
L$_{a1084}$: R$^a$ = R$^{a7}$; L$_{a1085}$: R$^a$ = R$^{a8}$;
L$_{a1086}$: R$^a$ = R$^{a9}$; L$_{a1087}$: R$^a$ = F;

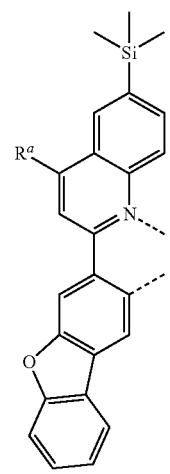

L$_{a1160}$: R$^a$ = H; L$_{a1161}$: R$^a$ = CH$_3$;
L$_{a1162}$: R$^a$ = R$^{a1}$; L$_{a1163}$: R$^a$ = R$^{a2}$;
L$_{a1164}$: R$^a$ = R$^{a3}$; L$_{a1165}$: R$^a$ = R$^{a4}$;
L$_{a1166}$: R$^a$ = R$^{a5}$; L$_{a1167}$: R$^a$ = R$^{a6}$;
L$_{a1168}$: R$^a$ = R$^{a7}$; L$_{a1169}$: R$^a$ = R$^{a8}$;
L$_{a1170}$: R$^a$ = R$^{a9}$; L$_{a1171}$: R$^a$ = F;

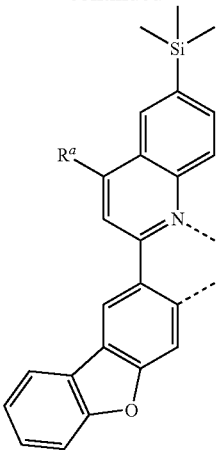

L$_{a1172}$: R$^a$ = H; L$_{a1173}$: R$^a$ = CH$_3$;
L$_{a1174}$: R$^a$ = R$^{a1}$; L$_{a1175}$: R$^a$ = R$^{a2}$;
L$_{a1176}$: R$^a$ = R$^{a3}$; L$_{a1177}$: R$^a$ = R$^{a4}$;
L$_{a1178}$: R$^a$ = R$^{a5}$; L$_{a1179}$: R$^a$ = R$^{a6}$;
L$_{a1180}$: R$^a$ = R$^{a7}$; L$_{a1181}$: R$^a$ = R$^{a8}$;
L$_{a1182}$: R$^a$ = R$^{a9}$; L$_{a1183}$: R$^a$ = F;

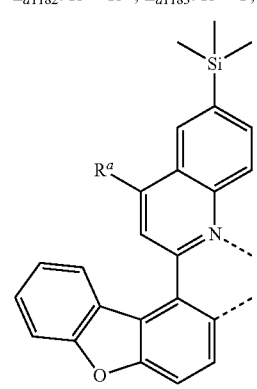

L$_{a1184}$: R$^a$ = H; L$_{a1185}$: R$^a$ = CH$_3$;
L$_{a1186}$: R$^a$ = R$^{a1}$; L$_{a1187}$: R$^a$ = R$^{a2}$;
L$_{a1188}$: R$^a$ = R$^{a3}$; L$_{a1189}$: R$^a$ = R$^{a4}$;
L$_{a1190}$: R$^a$ = R$^{a5}$; L$_{a1191}$: R$^a$ = R$^{a6}$;
L$_{a1192}$: R$^a$ = R$^{a7}$; L$_{a1193}$: R$^a$ = R$^{a8}$;
L$_{a1194}$: R$^a$ = R$^{a9}$; L$_{a1195}$: R$^a$ = F;

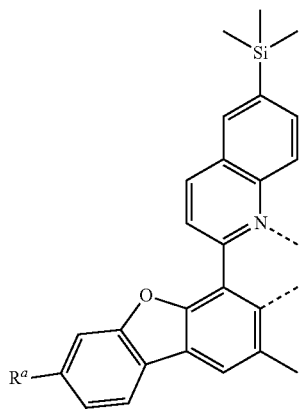

L$_{a1196}$: R$^a$ = CH$_3$; L$_{a1197}$: R$^a$ = R$^{a1}$;
L$_{a1198}$: R$^a$ = R$^{a2}$; L$_{a1199}$: R$^a$ = R$^{a3}$;
L$_{a1200}$: R$^a$ = R$^{a4}$; L$_{a1201}$: R$^a$ = R$^{a5}$;
L$_{a1202}$: R$^a$ = R$^{a4}$; L$_{a1203}$: R$^a$ = R$^{a5}$;

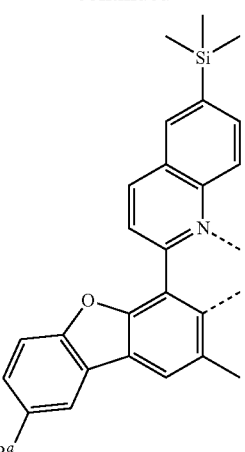

L$_{a1204}$: R$^a$ = CH$_3$; L$_{a1205}$: R$^a$ = R$^{a1}$;
L$_{a1206}$: R$^a$ = R$^{a2}$; L$_{a1207}$: R$^a$ = R$^{a3}$;
L$_{a1208}$: R$^a$ = R$^{a4}$; L$_{a1209}$: R$^a$ = R$^{a5}$;
L$_{a1210}$: R$^a$ = R$^{a6}$; L$_{a1211}$: R$^a$ = R$^{a7}$;
L$_{a1212}$: R$^a$ = F;

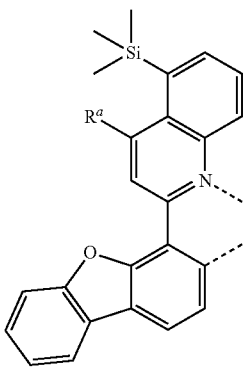

L$_{a1214}$: R$^a$ = H; L$_{a1215}$: R$^a$ = R$^{a1}$;
L$_{a1216}$: R$^a$ = R$^{a2}$; L$_{a1217}$: R$^a$ = R$^{a4}$;
L$_{a1218}$: R$^a$ = R$^{a5}$; L$_{a1219}$: R$^a$ = R$^{a7}$;

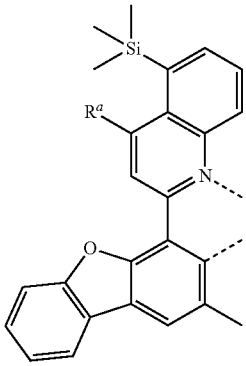

L$_{a1220}$: R$^a$ = H; L$_{a1221}$: R$^a$ = R$^{a1}$;
L$_{a1222}$: R$^a$ = R$^{a2}$; L$_{a1223}$: R$^a$ = R$^{a4}$;
L$_{a1224}$: R$^a$ = R$^{a5}$; L$_{a1225}$: R$^a$ = R$^{a7}$;

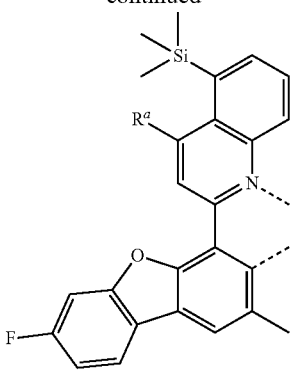

L$_{a1226}$: R$^a$ = H; L$_{a1227}$: R$^a$ = R$^{a1}$;
L$_{a1228}$: R$^a$ = R$^{a2}$; L$_{a1229}$: R$^a$ = R$^{a4}$;
L$_{a1230}$: R$^a$ = R$^{a5}$; L$_{a1231}$: R$^a$ = R$^{a7}$;

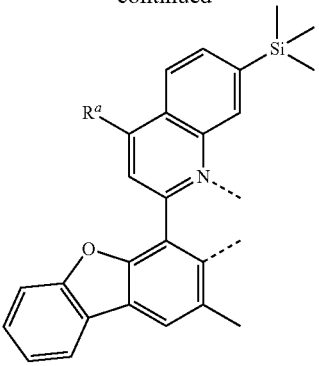

L$_{a1268}$: R$^a$ = H; L$_{a1269}$: R$^a$ = CH$_3$;
L$_{a1270}$: R$^a$ = R$^{a1}$; L$_{a1271}$: R$^a$ = R$^{a2}$;
L$_{a1272}$: R$^a$ = R$^{a3}$; L$_{a1273}$: R$^a$ = R$^{a4}$;
L$_{a1274}$: R$^a$ = R$^{a5}$; L$_{a1275}$: R$^a$ = R$^{a6}$;
L$_{a1276}$: R$^a$ = R$^{a7}$; L$_{a1277}$: R$^a$ = R$^{a8}$;
L$_{a1278}$: R$^a$ = R$^{a9}$; L$_{a1279}$: R$^a$ = F;

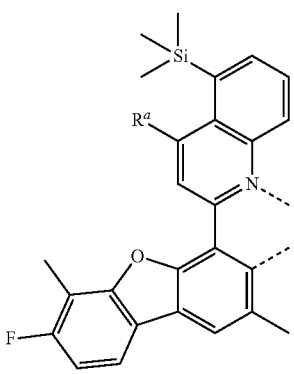

L$_{a1232}$: R$^a$ = H; L$_{a1233}$: R$^a$ = R$^{a1}$;
L$_{a1234}$: R$^a$ = R$^{a2}$; L$_{a1235}$: R$^a$ = R$^{a4}$;
L$_{a1236}$: R$^a$ = R$^{a5}$; L$_{a1237}$: R$^a$ = R$^{a7}$;

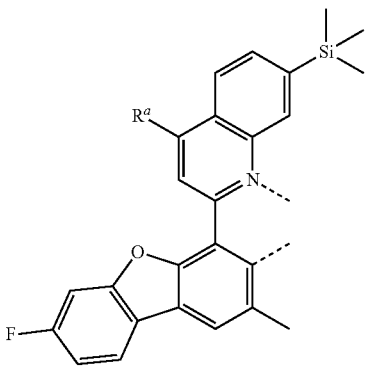

L$_{a1280}$: R$^a$ = H; L$_{a1281}$: R$^a$ = CH$_3$;
L$_{a1282}$: R$^a$ = R$^{a1}$; L$_{a1283}$: R$^a$ = R$^{a2}$;
L$_{a1284}$: R$^a$ = R$^{a3}$; L$_{a1285}$: R$^a$ = R$^{a4}$;
L$_{a1286}$: R$^a$ = R$^{a5}$; L$_{a1287}$: R$^a$ = R$^{a6}$;
L$_{a1288}$: R$^a$ = R$^{a7}$; L$_{a1289}$: R$^a$ = R$^{a8}$;
L$_{a1290}$: R$^a$ = R$^{a9}$; L$_{a1291}$: R$^a$ = F;

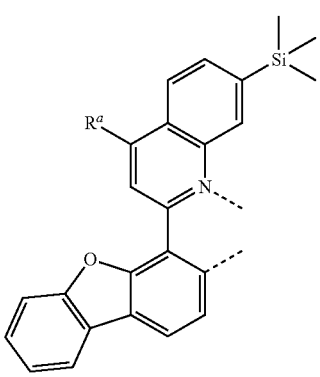

L$_{a1256}$: R$^a$ = H; L$_{a1257}$: R$^a$ = CH$_3$;
L$_{a1258}$: R$^a$ = R$^{a1}$; L$_{a1259}$: R$^a$ = R$^{a2}$;
L$_{a1260}$: R$^a$ = R$^{a3}$; L$_{a1261}$: R$^a$ = R$^{a4}$;
L$_{a1262}$: R$^a$ = R$^{a5}$; L$_{a1263}$: R$^a$ = R$^{a6}$;
L$_{a1264}$: R$^a$ = R$^{a7}$; L$_{a1265}$: R$^a$ = R$^{a8}$;
L$_{a1266}$: R$^a$ = R$^{a9}$; L$_{a1267}$: R$^a$ = F;

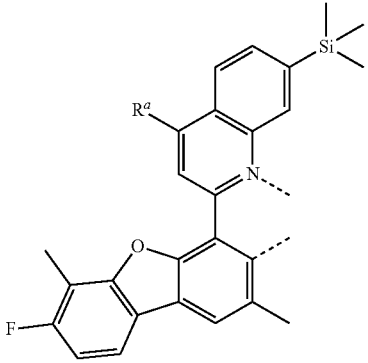

L$_{a1292}$: R$^a$ = H; L$_{a1293}$: R$^a$ = CH$_3$;
L$_{a1294}$: R$^a$ = R$^{a1}$; L$_{a1295}$: R$^a$ = R$^{a2}$;
L$_{a1296}$: R$^a$ = R$^{a3}$; L$_{a1297}$: R$^a$ = R$^{a4}$;
L$_{a1298}$: R$^a$ = R$^{a5}$; L$_{a1299}$: R$^a$ = R$^{a6}$;
L$_{a1300}$: R$^a$ = R$^{a7}$; L$_{a1301}$: R$^a$ = R$^{a8}$;
L$_{a1302}$: R$^a$ = R$^{a9}$; L$_{a1303}$: R$^a$ = F;

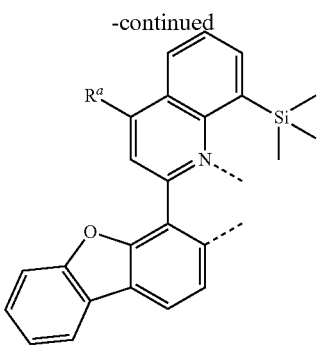

L_{a1340}: R^a = H; L_{a1341}: R^a = R^{a1};
L_{a1342}: R^a = R^{a2}; L_{a1343}: R^a = R^{a4};
L_{a1344}: R^a = R^{a5}; L_{a1345}: R^a = R^{a7};

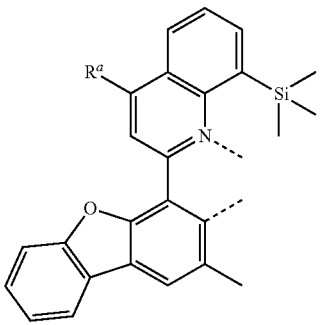

L_{a1346}: R^a = H; L_{a1347}: R^a = R^{a1};
L_{a1348}: R^a = R^{a2}; L_{a1349}: R^a = R^{a4};
L_{a1350}: R^a = R^{a5}; L_{a1351}: R^a = R^{a7};

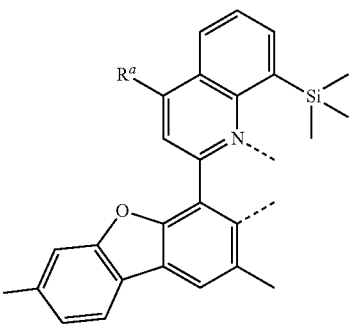

L_{a1352}: R^a = H; L_{a1353}: R^a = R^{a1};
L_{a1354}: R^a = R^{a2}; L_{a1355}: R^a = R^{a4};
L_{a1356}: R^a = R^{a5}; L_{a1357}: R^a = R^{a7};

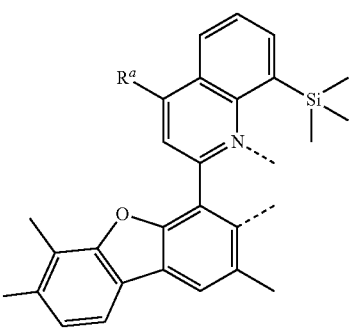

L_{a1358}: R^a = H; L_{a1359}: R^a = R^{a1};
L_{a1360}: R^a = R^{a2}; L_{a1361}: R^a = R^{a4};
L_{a1362}: R^a = R^{a5}; L_{a1363}: R^a = R^{a7};

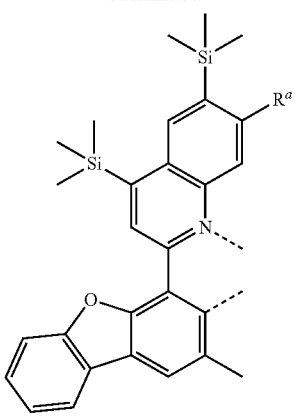

L_{a1376}: R^a = H; L_{a1377}: R^a = R^{a1};
L_{a1378}: R^a = R^{a2}; L_{a1379}: R^a = R^{a4};
L_{a1380}: R^a = R^{a5}; L_{a1381}: R^a = R^{a7};

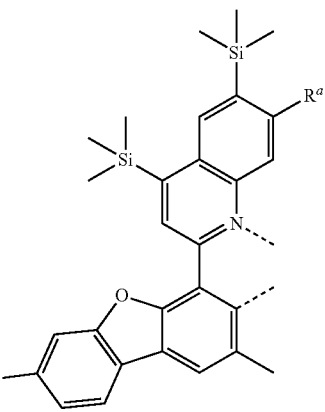

L_{a1382}: R^a = H; L_{a1383}: R^a = R^{a1};
L_{a1384}: R^a = R^{a2}; L_{a1385}: R^a = R^{a4};
L_{a1386}: R^a = R^{a5}; L_{a1387}: R^a = R^{a7};

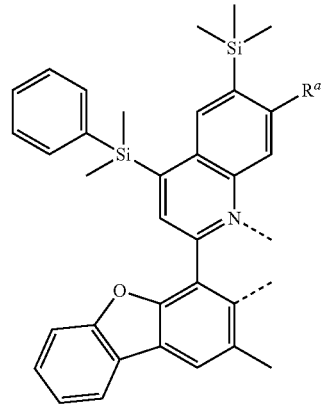

L_{a1394}: R^a = H; L_{a1395}: R^a = R^{a1};
L_{a1396}: R^a = R^{a2}; L_{a1397}: R^a = R^{a4};
L_{a1398}: R^a = R^{a5}; L_{a1399}: R^a = R^{a7};

-continued

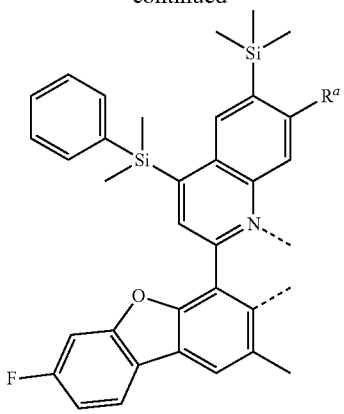

L$_{a1400}$: R$^a$ = H; L$_{a1401}$: R$^a$ = R$^{a1}$;
L$_{a1402}$: R$^a$ = R$^{a2}$; L$_{a1403}$: R$^a$ = R$^{a4}$;
L$_{a1404}$: R$^a$ = R$^{a5}$; L$_{a1405}$: R$^a$ = R$^{a7}$;

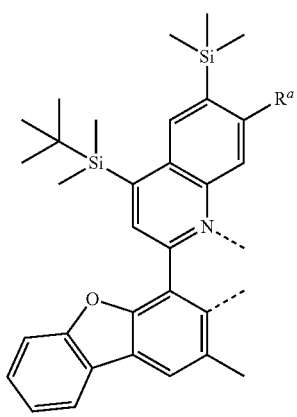

L$_{a1412}$: R$^a$ = H; L$_{a1413}$: R$^a$ = R$^{a1}$;
L$_{a1414}$: R$^a$ = R$^{a2}$; L$_{a1415}$: R$^a$ = R$^{a4}$;
L$_{a1416}$: R$^a$ = R$^{a5}$; L$_{a1417}$: R$^a$ = R$^{a7}$;

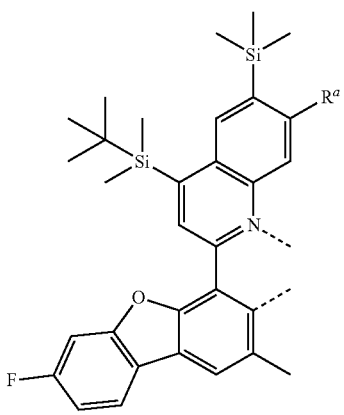

L$_{a1418}$: R$^a$ = H; L$_{a1419}$: R$^a$ = R$^{a1}$;
L$_{a1420}$: R$^a$ = R$^{a2}$; L$_{a1421}$: R$^a$ = R$^{a4}$;
L$_{a1422}$: R$^a$ = R$^{a5}$; L$_{a1423}$: R$^a$ = R$^{a7}$;

-continued

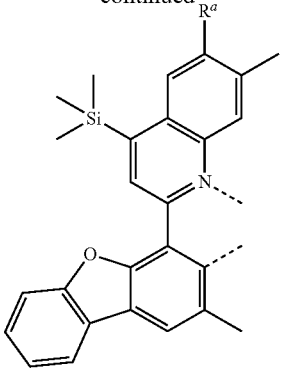

L$_{a1430}$: R$^a$ = H; L$_{a1431}$: R$^a$ = R$^{a1}$;
L$_{a1432}$: R$^a$ = R$^{a2}$; L$_{a1433}$: R$^a$ = R$^{a4}$;
L$_{a1434}$: R$^a$ = R$^{a5}$; L$_{a1435}$: R$^a$ = R$^{a7}$;

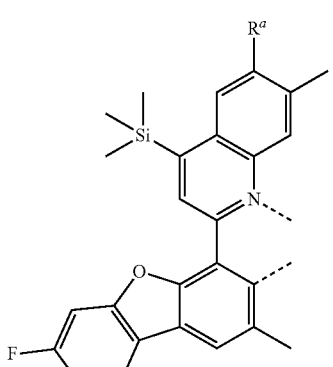

L$_{a1436}$: R$^a$ = H; L$_{a1437}$: R$^a$ = R$^{a1}$;
L$_{a1438}$: R$^a$ = R$^{a2}$; L$_{a1439}$: R$^a$ = R$^{a4}$;
L$_{a1440}$: R$^a$ = R$^{a5}$; L$_{a1441}$: R$^a$ = R$^{a7}$;

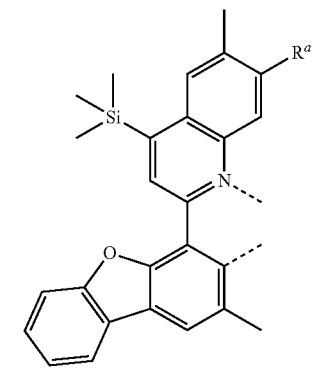

L$_{a1448}$: R$^a$ = H; L$_{a1449}$: R$^a$ = R$^{a1}$;
L$_{a1450}$: R$^a$ = R$^{a2}$; L$_{a1451}$: R$^a$ = R$^{a4}$;
L$_{a1452}$: R$^a$ = R$^{a5}$; L$_{a1453}$: R$^a$ = R$^{a7}$;

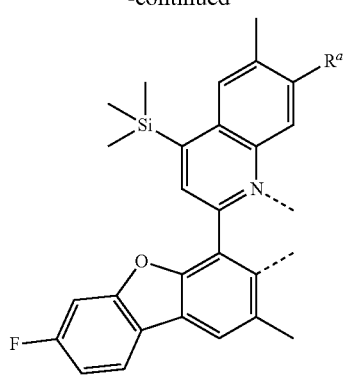

L$_{a1454}$: R$^a$ = H; L$_{a1455}$: R$^a$ = R$^{a1}$;
L$_{a1456}$: R$^a$ = R$^{a2}$; L$_{a1457}$: R$^a$ = R$^{a4}$;
L$_{a1458}$: R$^a$ = R$^{a5}$; L$_{a1459}$: R$^a$ = R$^{a7}$;

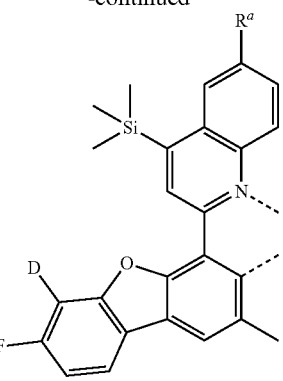

L$_{a1484}$: R$^a$ = H; L$_{a1485}$: R$^a$ = R$^{a1}$;
L$_{a1486}$: R$^a$ = R$^{a2}$; L$_{a1487}$: R$^a$ = R$^{a4}$;
L$_{a1488}$: R$^a$ = R$^{a5}$; L$_{a1489}$: R$^a$ = R$^{a7}$;

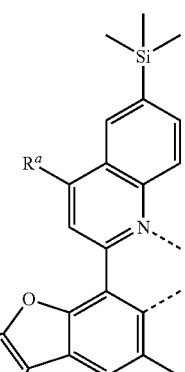

L$_{a1466}$: R$^a$ = H; L$_{a1467}$: R$^a$ = R$^{a1}$;
L$_{a1468}$: R$^a$ = R$^{a2}$; L$_{a1469}$: R$^a$ = R$^{a4}$;
L$_{a1470}$: R$^a$ = R$^{a5}$; L$_{a1471}$: R$^a$ = R$^{a7}$;

L$_{a1496}$: R$^a$ = H; L$_{a1497}$: R$^a$ = R$^{a1}$;
L$_{a1498}$: R$^a$ = R$^{a2}$; L$_{a1499}$: R$^a$ = R$^{a4}$;
L$_{a1500}$: R$^a$ = R$^{a5}$; L$_{a1501}$: R$^a$ = R$^{a7}$;

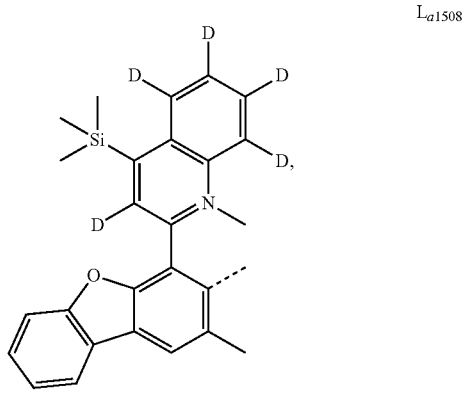

L$_{a1472}$: R$^a$ = H; L$_{a1473}$: R$^a$ = R$^{a1}$;
L$_{a1474}$: R$^a$ = R$^{a2}$; L$_{a1475}$: R$^a$ = R$^{a4}$;
L$_{a1476}$: R$^a$ = R$^{a5}$; L$_{a1477}$: R$^a$ = R$^{a7}$;

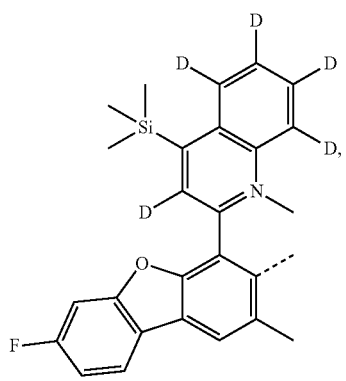 L_{a1509}
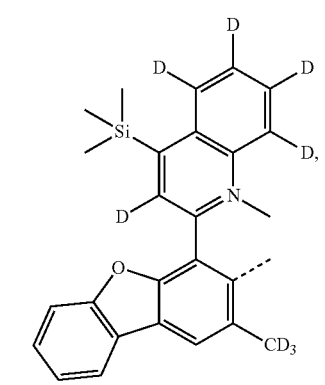 L_{a1510}
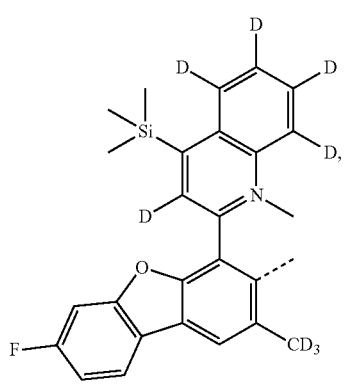 L_{a1511}
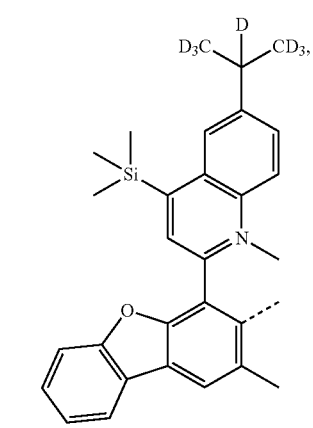 L_{a1512}
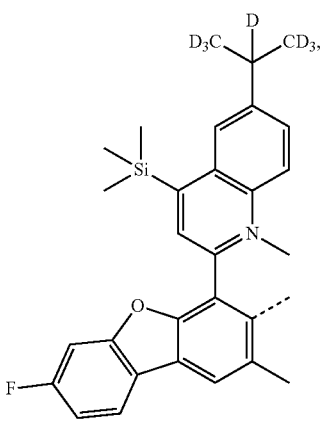 L_{a1513}
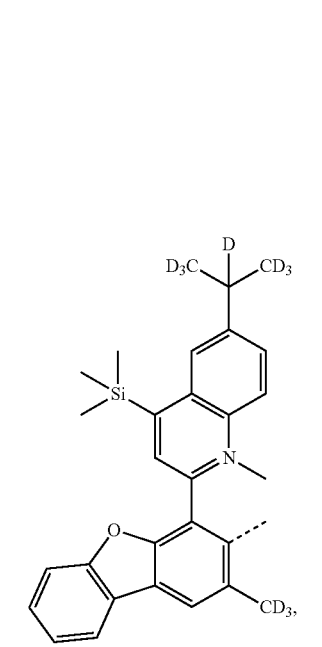 L_{a1514}
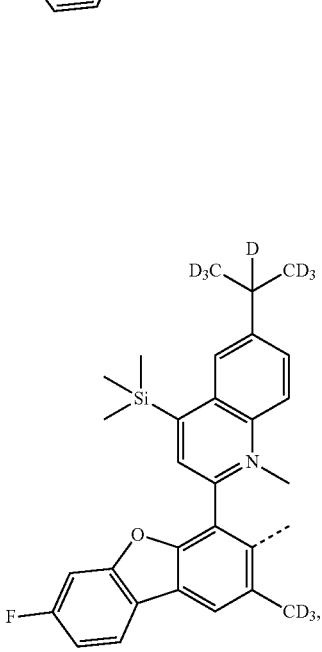 L_{a1515}

L*a*1516
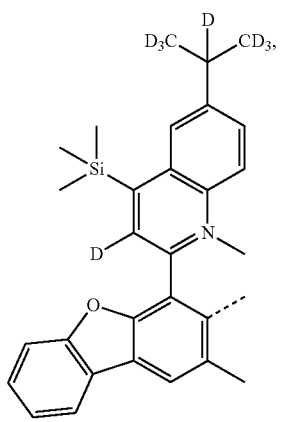
L*a*1517
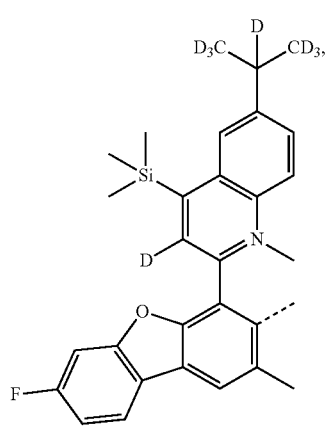
L*a*1518
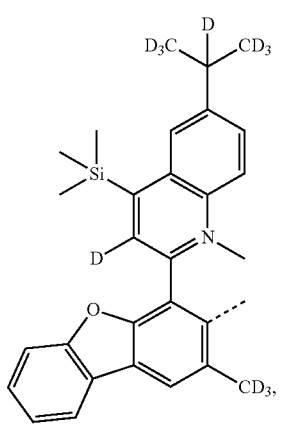
L*a*1519
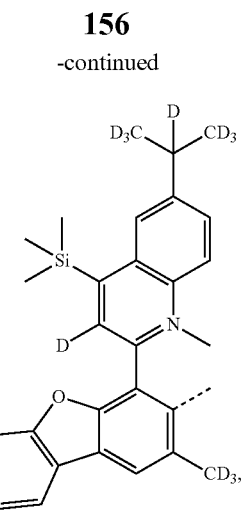
L*a*1520
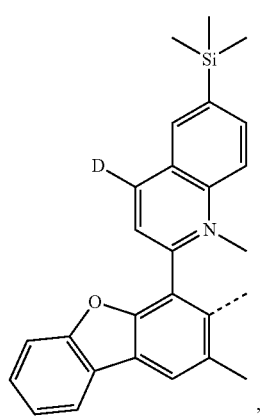
L*a*1521
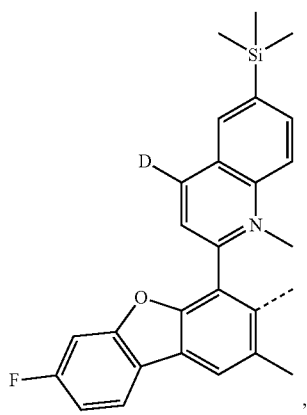

157 158
-continued -continued
L<sub>a1523</sub>
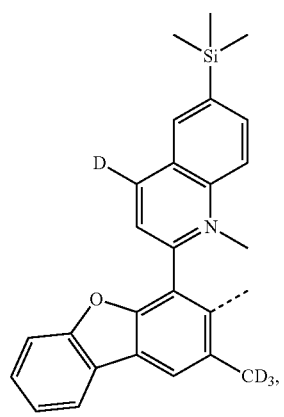
L<sub>a1526</sub>
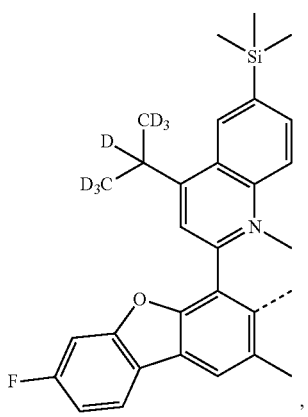
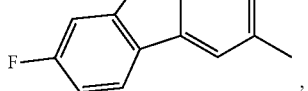
L<sub>a1524</sub>
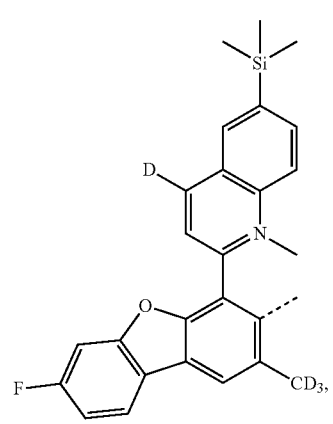
L<sub>a1528</sub>
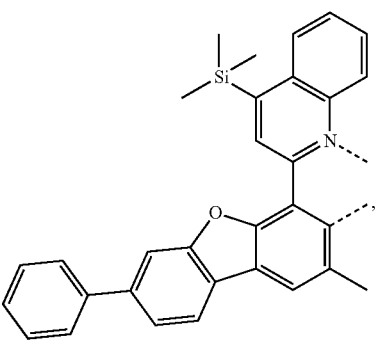
L<sub>a1529</sub>
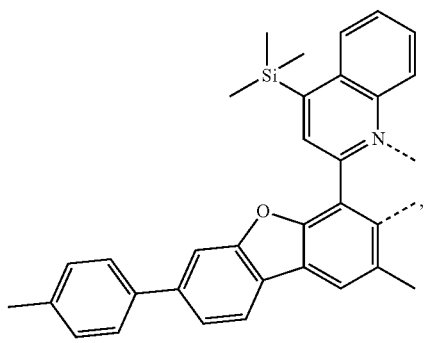
L<sub>a1525</sub>
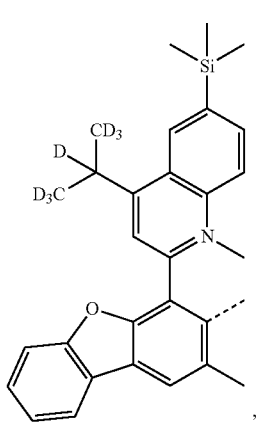
L<sub>a1530</sub>
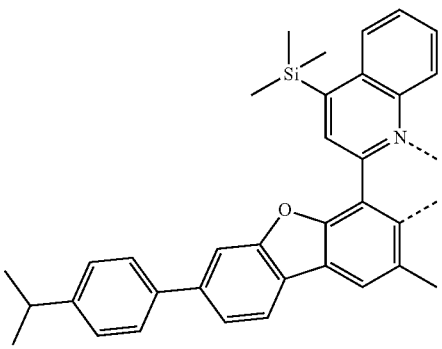

-continued
L<sub>a1531</sub>
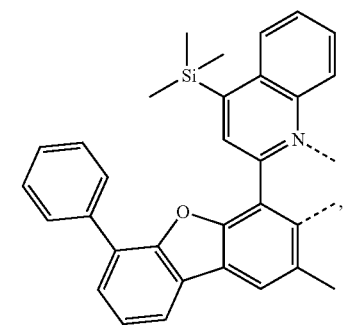
L<sub>a1532</sub>
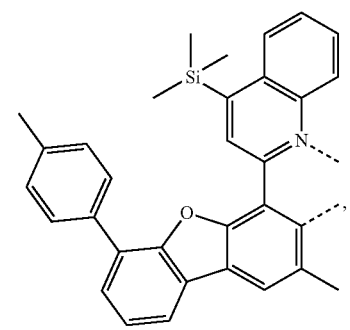
L<sub>a1533</sub>
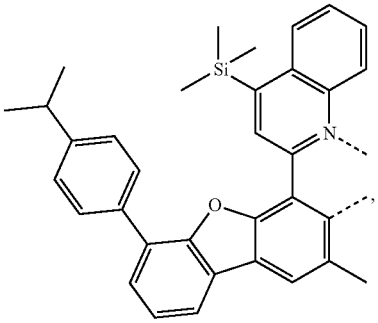
L<sub>a1534</sub>
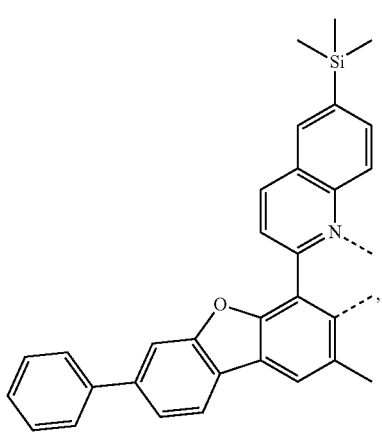
-continued
L<sub>a1535</sub>
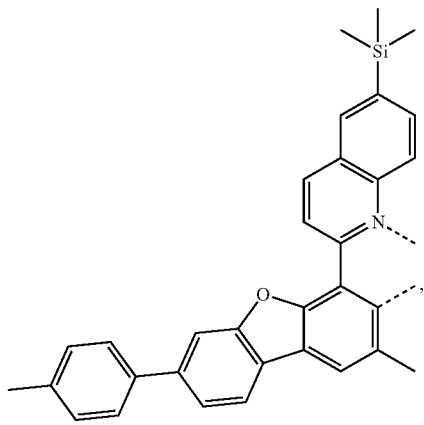
L<sub>a1536</sub>
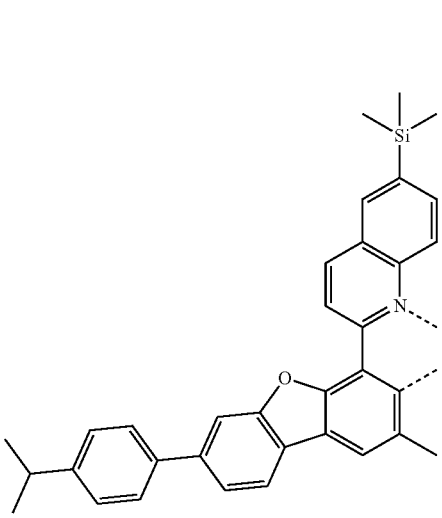
L<sub>a1537</sub>
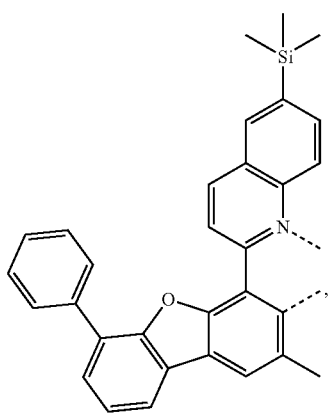

-continued
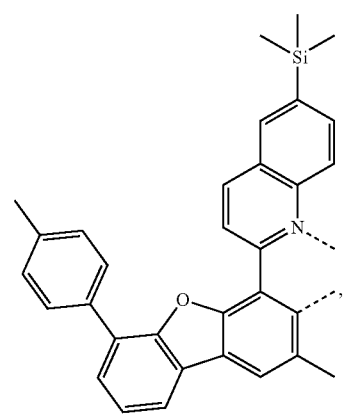
L_{a1538}
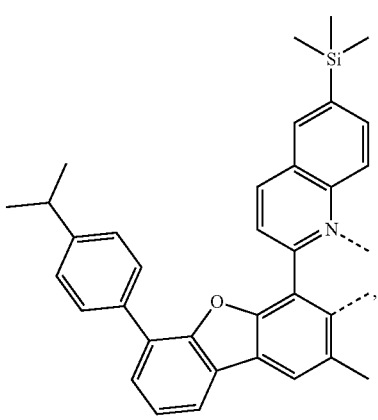
L_{a1539}
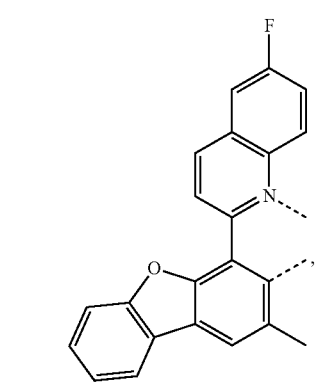
L_{a1540}
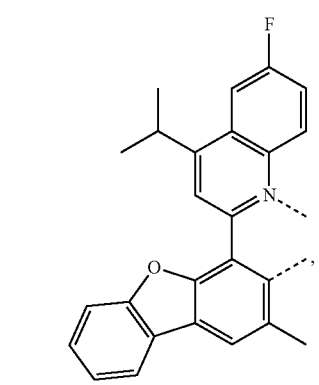
L_{a1541}
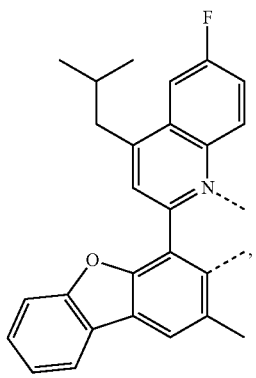
L_{a1542}
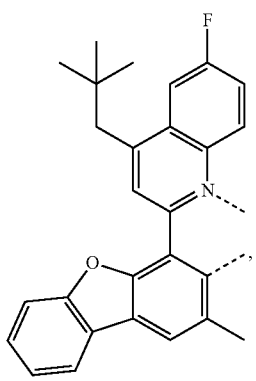
L_{a1543}
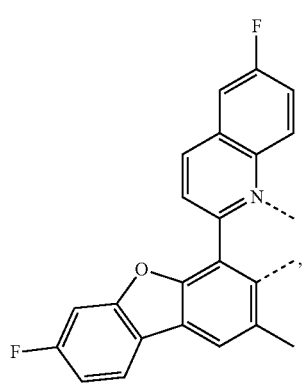
L_{a1544}
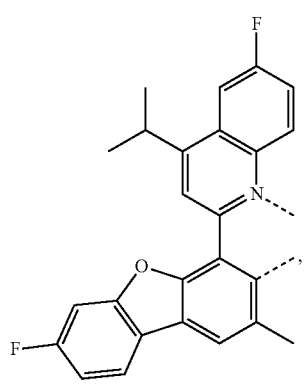
L_{a1545}

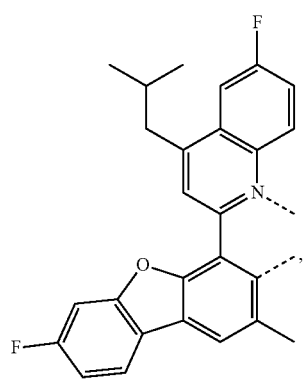
$L_{a1546}$
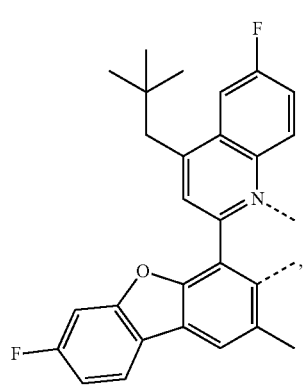
$L_{a1547}$
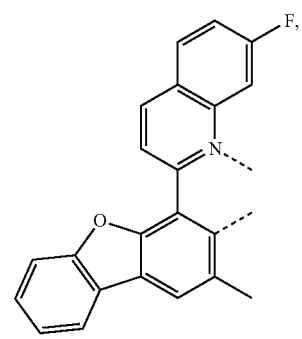
$L_{a1548}$
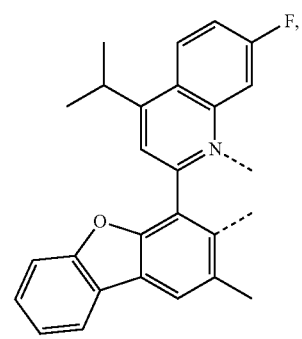
$L_{a1549}$
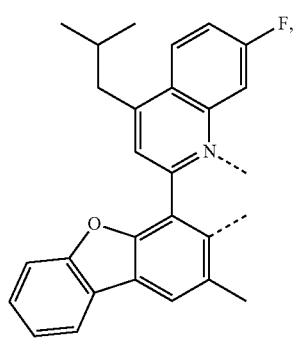
$L_{a1550}$
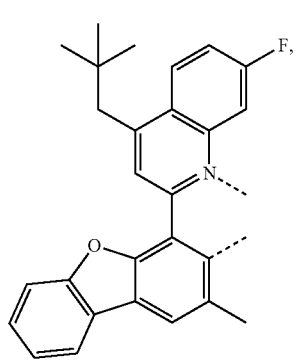
$L_{a1551}$
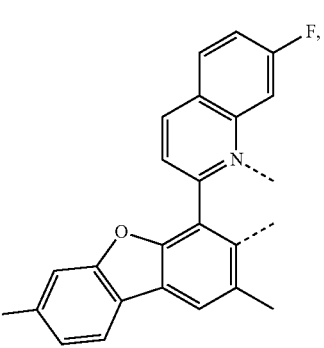
$L_{a1552}$
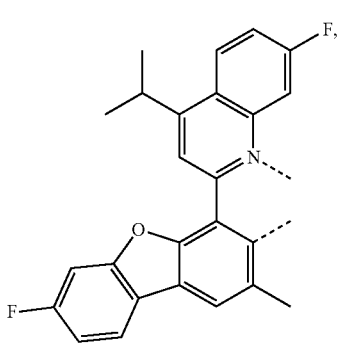
$L_{a1553}$

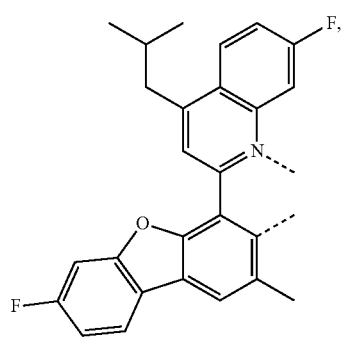 L<sub>a1554</sub>
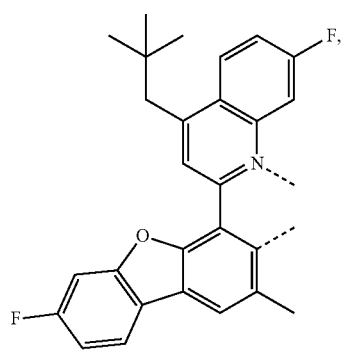 L<sub>a1555</sub>
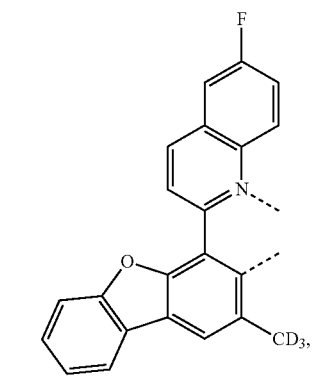 L<sub>a1556</sub>
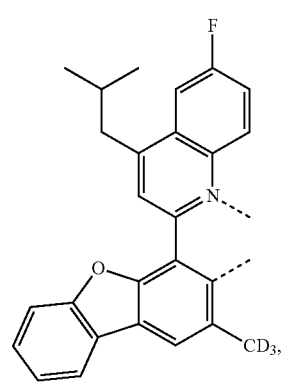 L<sub>a1557</sub>
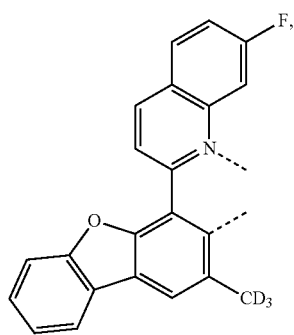 L$_{a1558}$
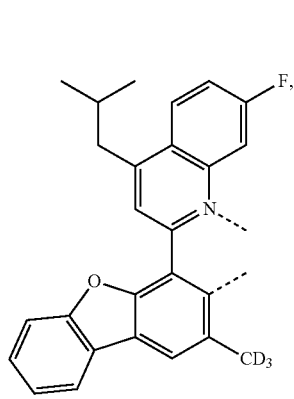 L$_{a1559}$
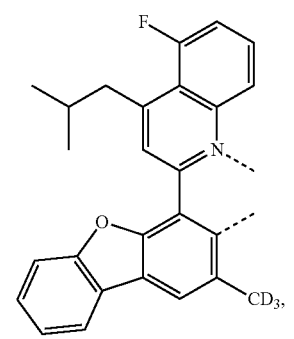 L$_{a1560}$
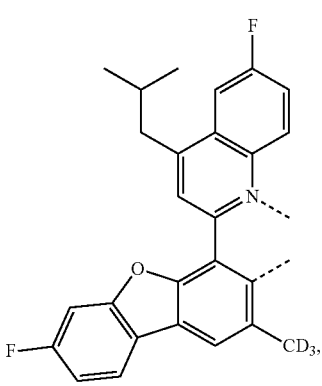 L$_{a1561}$ -continued
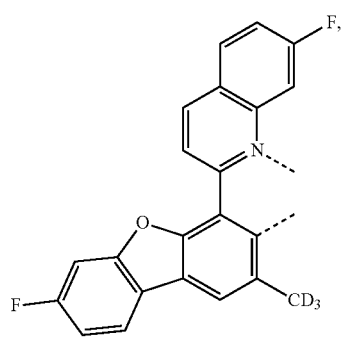 L<sub>a1562</sub>
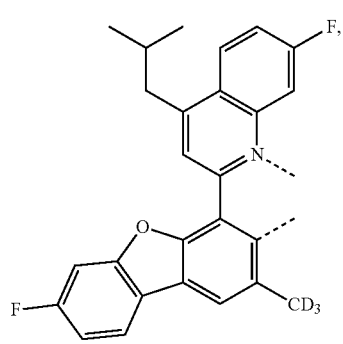 L<sub>a1563</sub>
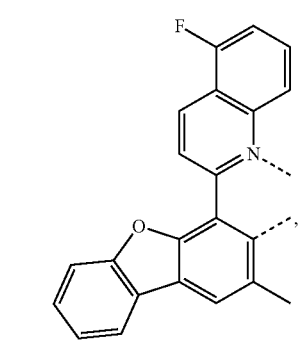 L<sub>a1564</sub>
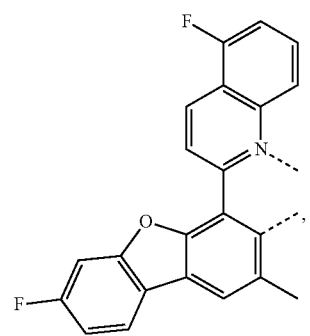 L<sub>a1565</sub>
-continued
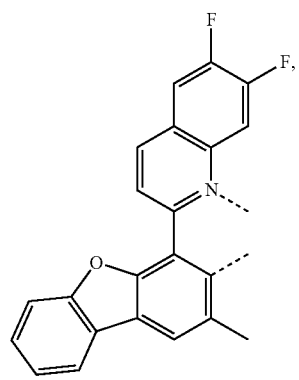 L<sub>a1566</sub>
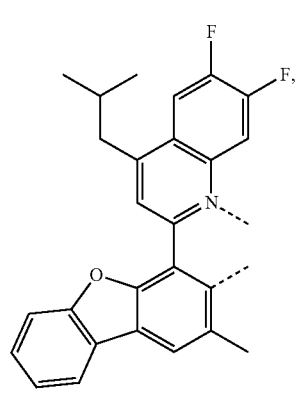 L<sub>a1567</sub>
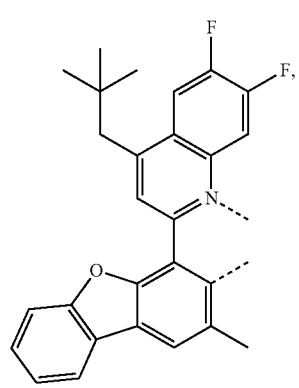 L<sub>a1568</sub>
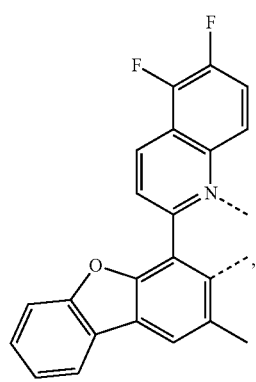 L<sub>a1569</sub>

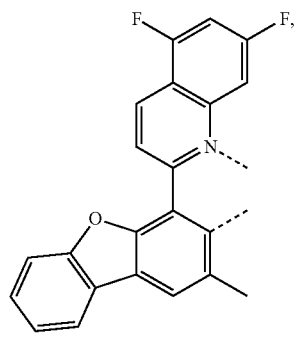
L<sub>a1570</sub>
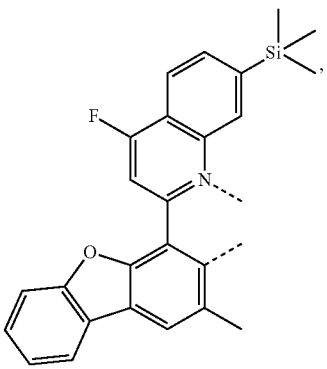
L<sub>a1574</sub>
L<sub>a1571</sub>
L<sub>a1575</sub>
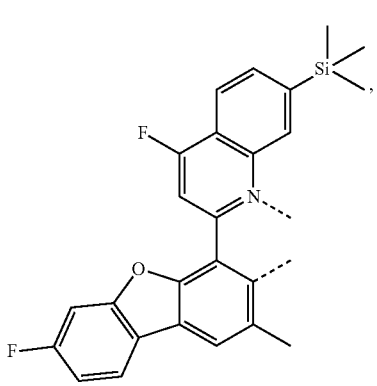
L<sub>a1572</sub>
L<sub>a1576</sub>
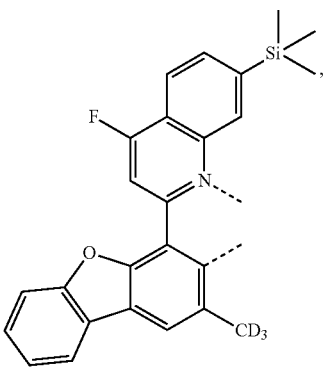
L<sub>a1573</sub>
L<sub>a1577</sub>
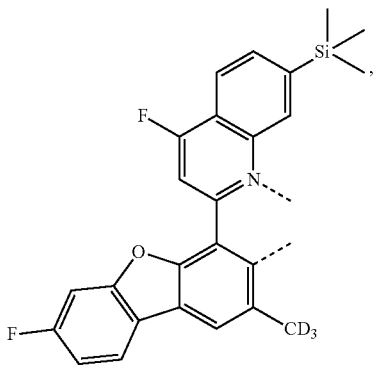

-continued
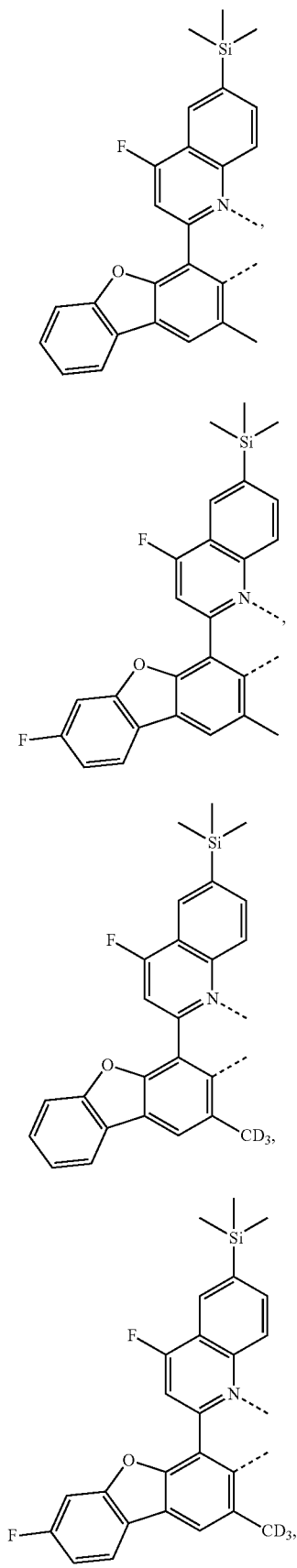
L_{a1578}
L_{a1579}
L_{a1580}
L_{a1581}
-continued
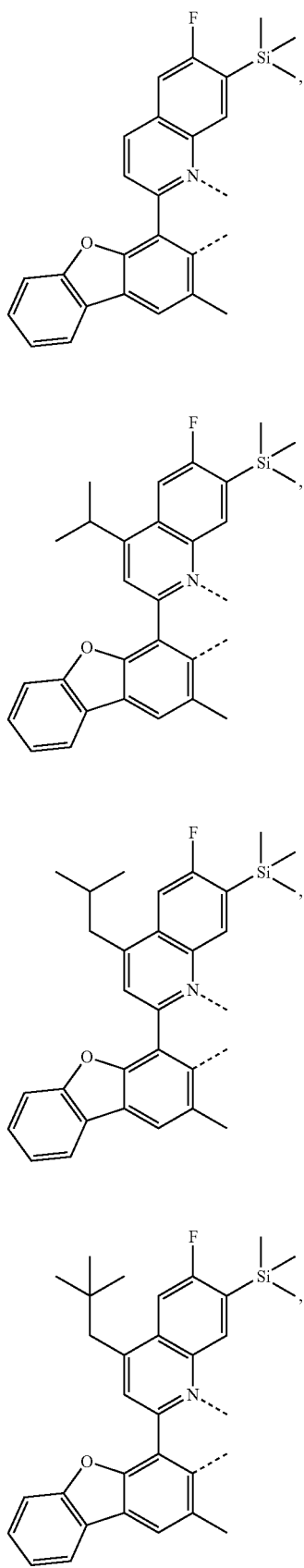
L_{a1582}
L_{a1583}
L_{a1584}
L_{a1585}

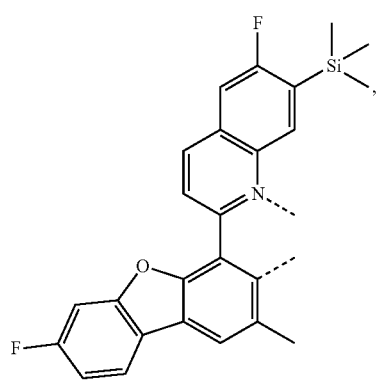 L<sub>a1586</sub>
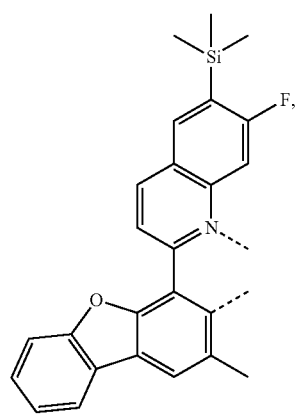 L<sub>a1590</sub>
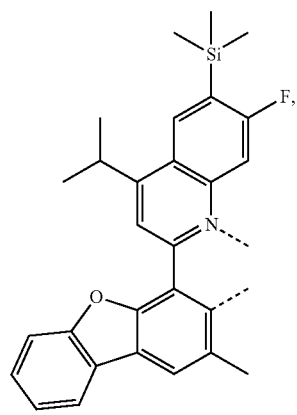 L<sub>a1591</sub>
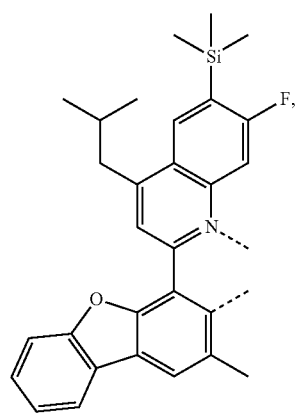 L<sub>a1592</sub>
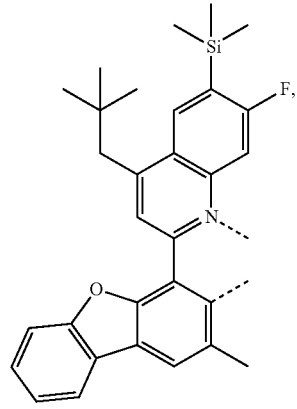 L<sub>a1593</sub>

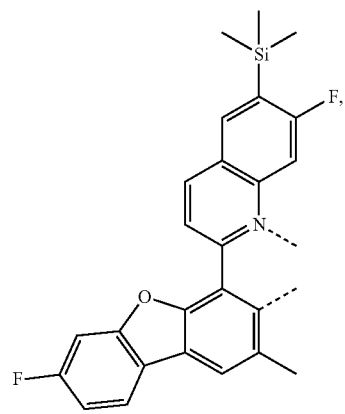 L<sub>a1594</sub>
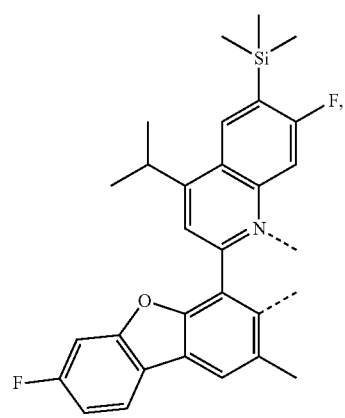 L<sub>a1595</sub>
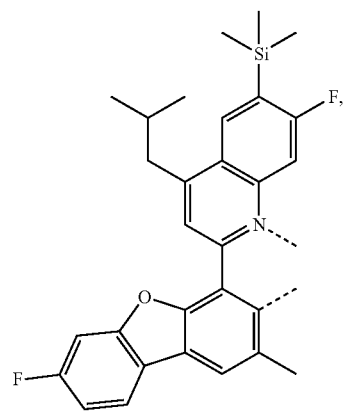 L<sub>a1596</sub>
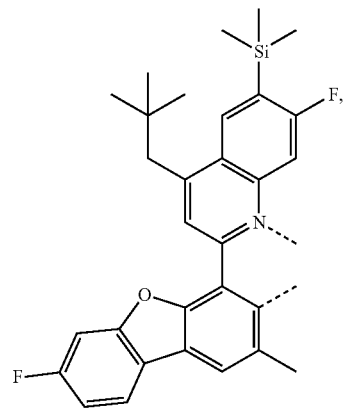 L<sub>a1597</sub>
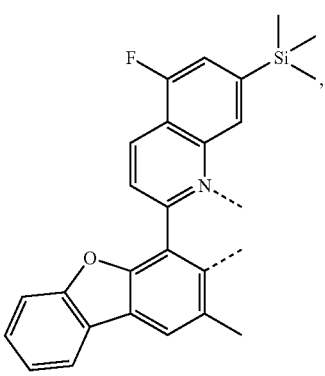 L<sub>a1598</sub>
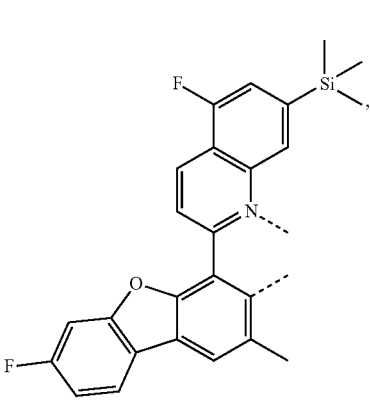 L<sub>a1599</sub>
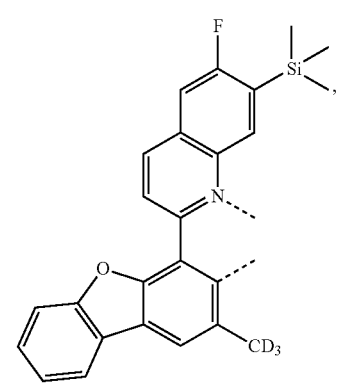 L<sub>a1600</sub>
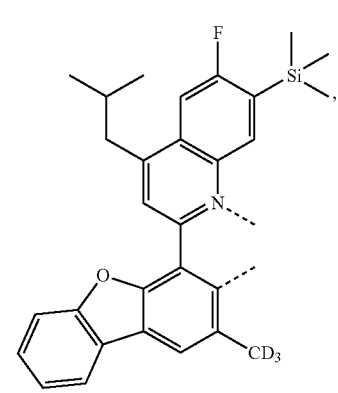 L<sub>a1601</sub>

L_{a1602}
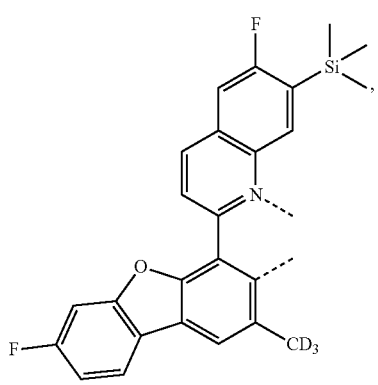
L_{a1603}
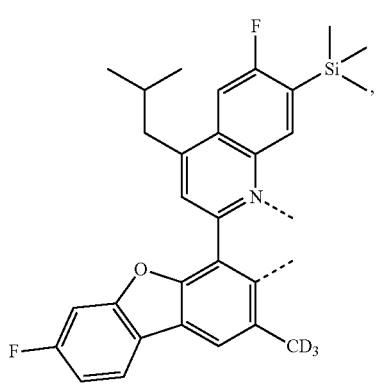
L_{a1604}
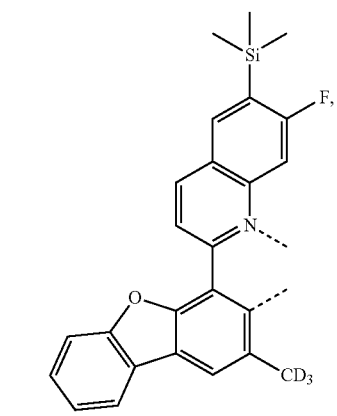
L_{a1605}
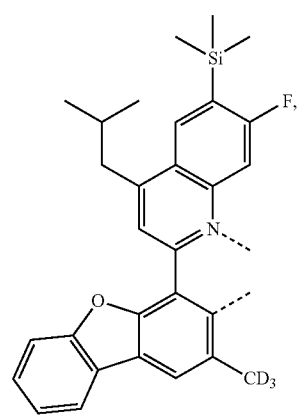
L_{a1606}
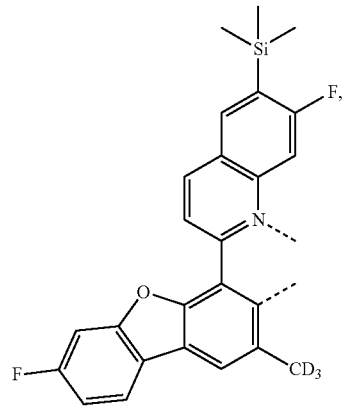
L_{a1607}
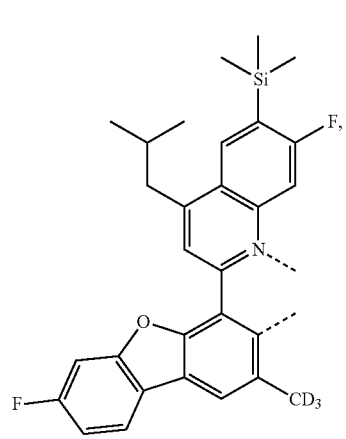
L_{a1608}
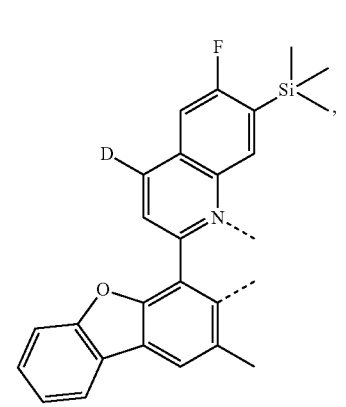
L_{a1609}
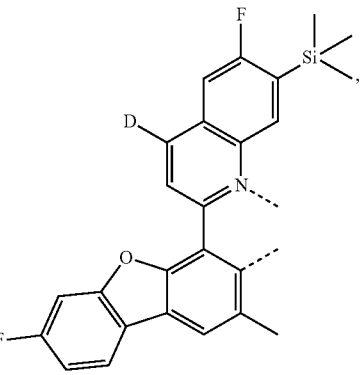

-continued

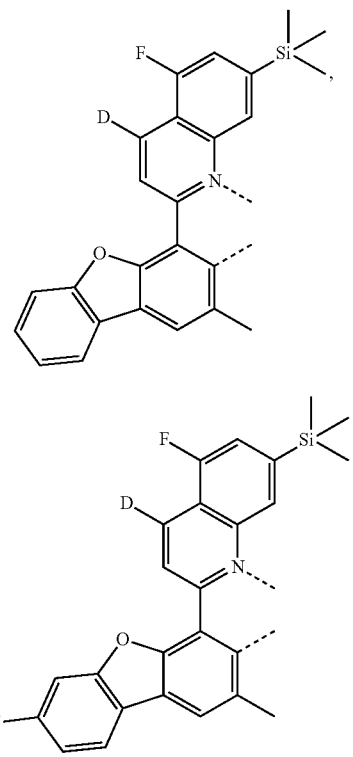

wherein in structures of $L_{a1}$ to $L_{a108}$, $L_{a133}$ to $L_{a231}$, $L_{a254}$ to $L_{a297}$, $L_{a320}$ to $L_{a411}$, $L_{a436}$ to $L_{a531}$, $L_{a556}$ to $L_{a603}$, $L_{a676}$ to $L_{a726}$, $L_{a728}$ to $L_{a775}$, $L_{a800}$ to $L_{a883}$, $L_{a908}$ to $L_{a955}$, $L_{a980}$ to $L_{a1027}$, $L_{a1052}$ to $L_{a1099}$, $L_{a1160}$ to $L_{a1212}$, $L_{a1214}$ to $L_{a1237}$, $L_{a1256}$ to $L_{a1303}$, $L_{a1340}$ to $L_{a1363}$, $L_{a1376}$ to $L_{a1387}$, $L_{a1394}$ to $L_{a1405}$, $L_{a1412}$ to $L_{a1423}$, $L_{a1430}$ to $L_{a1441}$, $L_{a1448}$ to $L_{a1459}$, $L_{a1466}$ to $L_{a1477}$, $L_{a1484}$ to $L_{a1489}$, $L_{a1496}$ to $L_{a1501}$, $R^{a1}$ to $R^{a9}$ are the following groups, respectively:

 $R^{a1}$

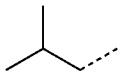 $R^{a2}$

 $R^{a3}$

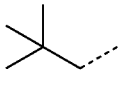 $R^{a4}$

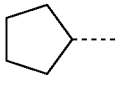 $R^{a5}$

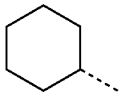 $R^{a6}$

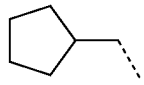 $R^{a7}$

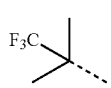 $R^{a8}$

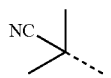 $R^{a8}$

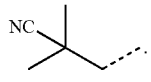 $R^{a9}$

20. The metal complex of claim 10, wherein $L_b$ is, at each occurrence identically or differently, selected from the following structure:

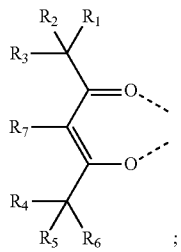

wherein $R_1$ to $R_7$ are each independently selected from the group consisting of: hydrogen, deuterium, halogen, substituted or unsubstituted alkyl having 1 to 20 carbon atoms, substituted or unsubstituted cycloalkyl having 3 to 20 ring carbon atoms, a cyano group and combinations thereof; and adjacent substituents $R_1$, $R_2$, $R_3$, $R_4$, $R_5$, $R_6$, $R_7$ can be optionally joined to form a ring.

21. The metal complex of claim 19, wherein $L_b$ is, at each occurrence identically or differently, selected from any one of the group consisting of the following structures:

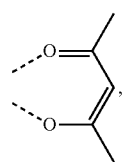 $L_{b1}$

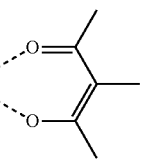 $L_{b2}$

L_{b3}
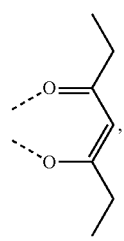
L_{b4}
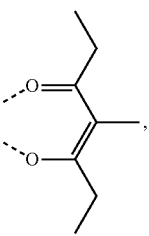
L_{b5}
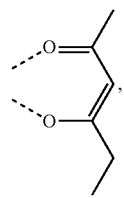
L_{b6}
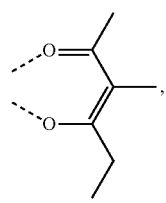
L_{b7}
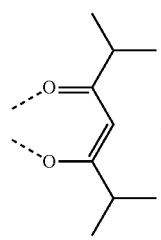
L_{b8}
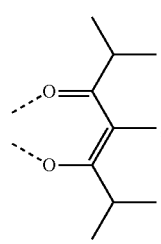
L_{b9}
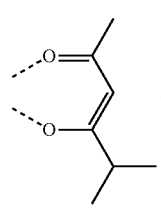
L_{b10}
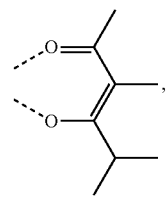
L_{b11}
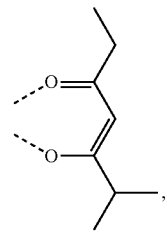
L_{b12}
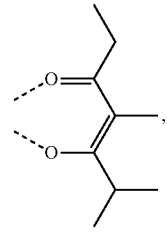
L_{b13}
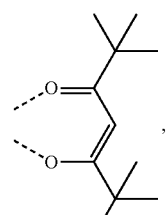
L_{b14}
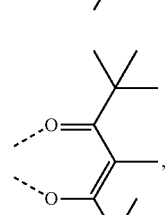
L_{b15}
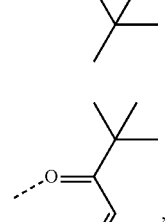
L_{b16}
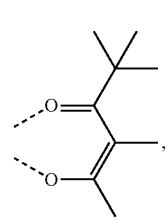

-continued
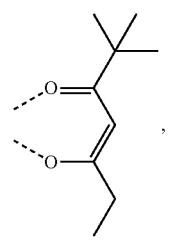
L<sub>b17</sub>,
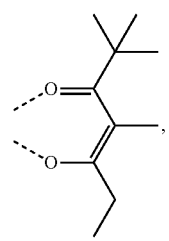
L<sub>b18</sub>,
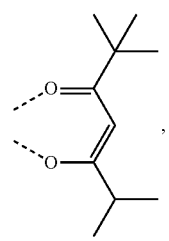
L<sub>b19</sub>,
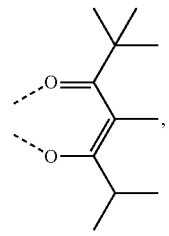
L<sub>b20</sub>,
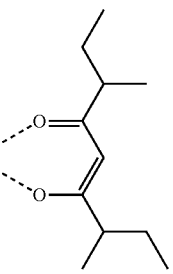
L<sub>b21</sub>,
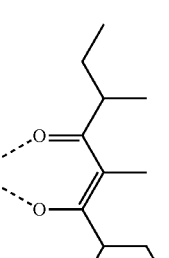
L<sub>b22</sub>,
-continued
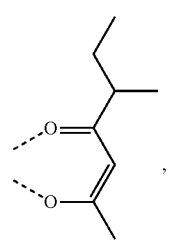
L<sub>b23</sub>,
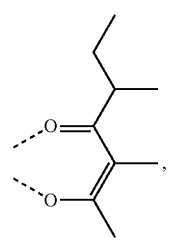
L<sub>b24</sub>,
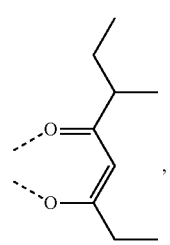
L<sub>b25</sub>,
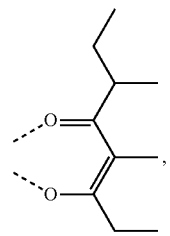
L<sub>b26</sub>,
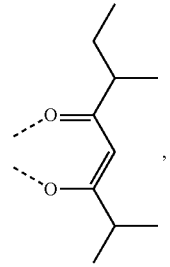
L<sub>b27</sub>,
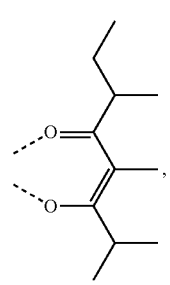
L<sub>b28</sub>

L_{b29}
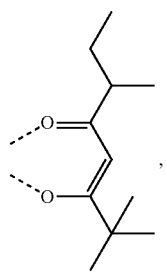
L_{b30}
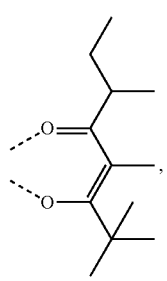
L_{b31}
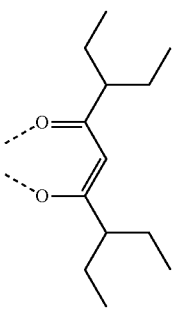
L_{b32}
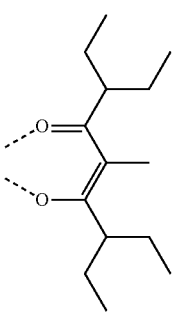
L_{b33}
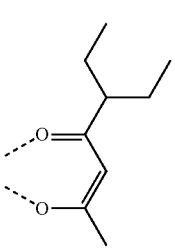
L_{b34}
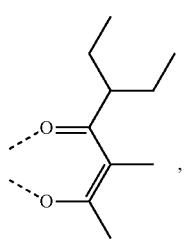
L_{b35}
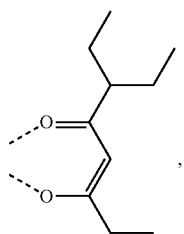
L_{b36}
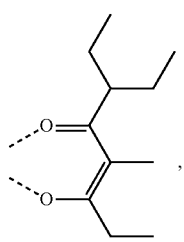
L_{b37}
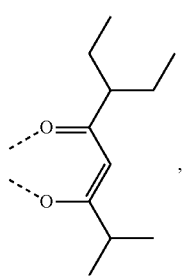
L_{b38}
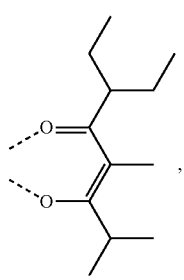
L_{b39}
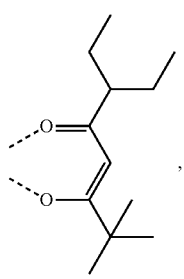

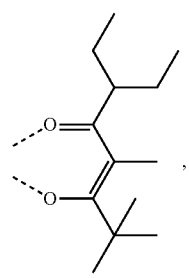
$L_{b40}$
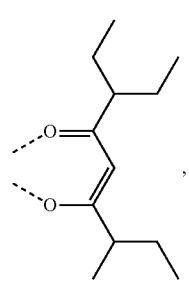
$L_{b41}$
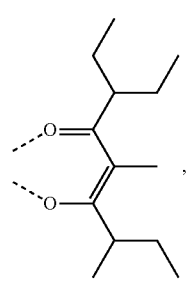
$L_{b42}$
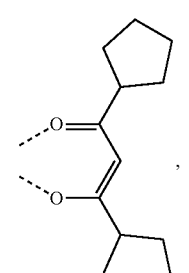
$L_{b43}$
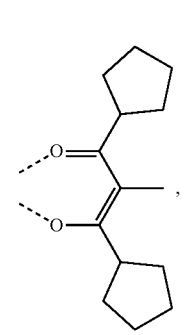
$L_{b44}$
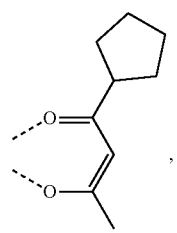
$L_{b45}$
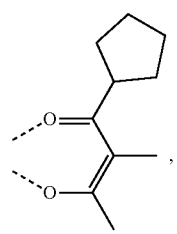
$L_{b46}$
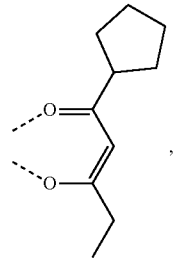
$L_{b47}$
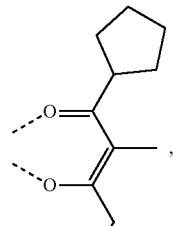
$L_{b48}$
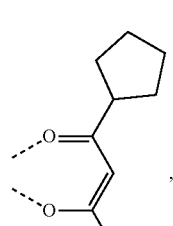
$L_{b49}$
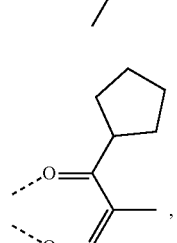
$L_{b50}$

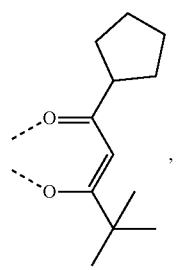 L_{b51}
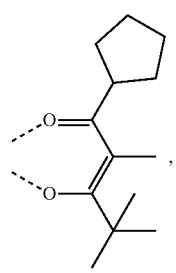 L_{b52}
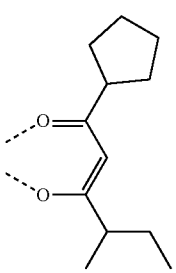 L_{b53}
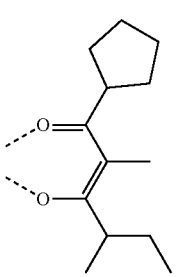 L_{b54}
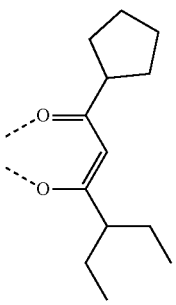 L_{b55}
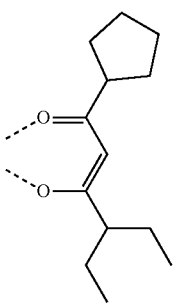 L_{b56}
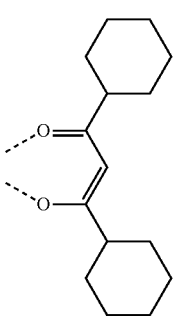 L_{b57}
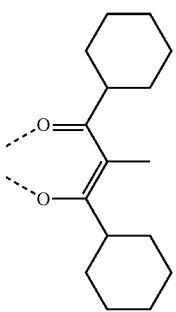 L_{b58}
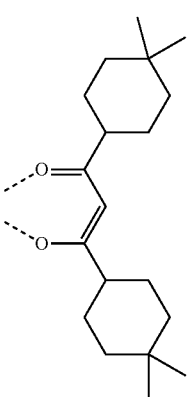 L_{b59}

-continued
L_{b60} 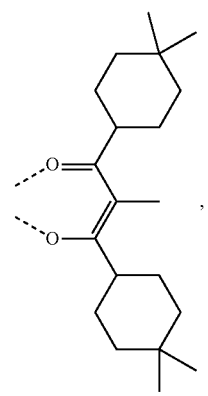
L_{b61} 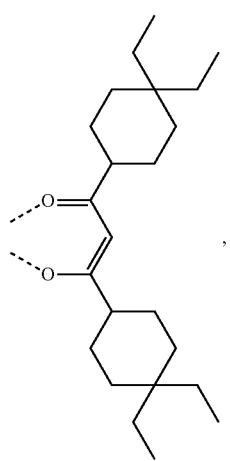
L_{b62} 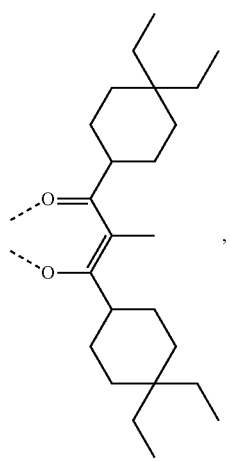
L_{b63} 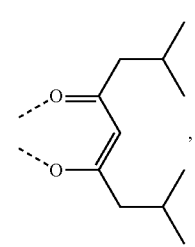
L_{b64} 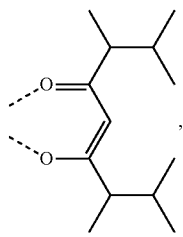
L_{b65} 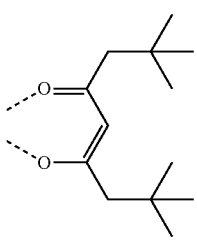
L_{b66} 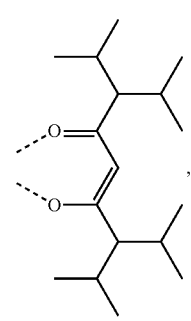
L_{b67} 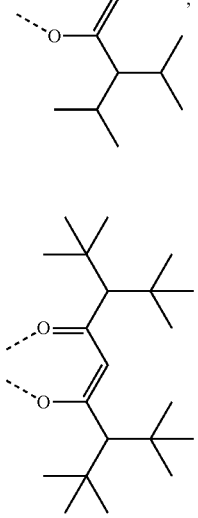
L_{b68} 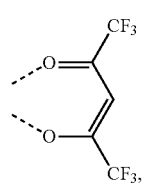
L_{b69} 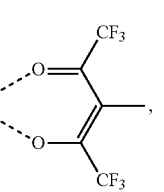

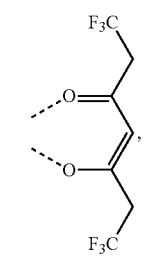 L_{b70}
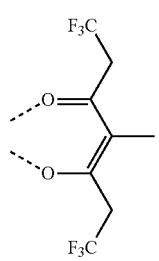 L_{b71}
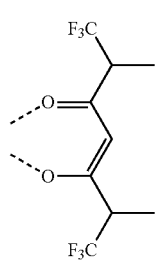 L_{b72}
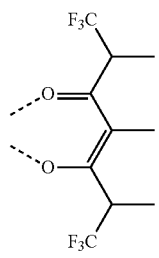 L_{b73}
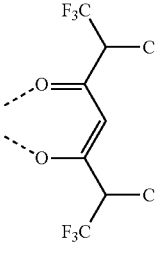 L_{b74}
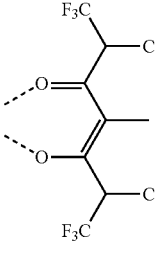 L_{b75}
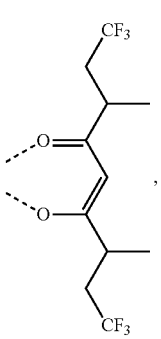 L_{b76}
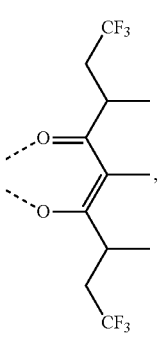 L_{b77}
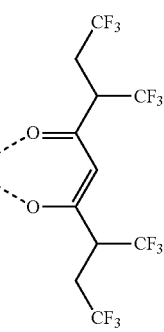 L_{b78}
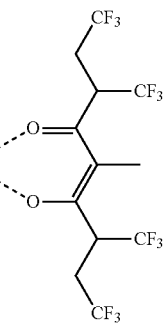 L_{b79}

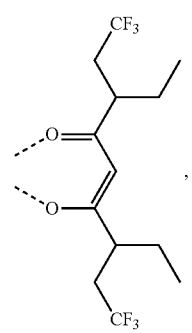
$L_{b80}$
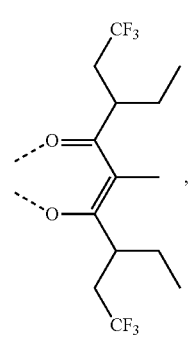
$L_{b81}$
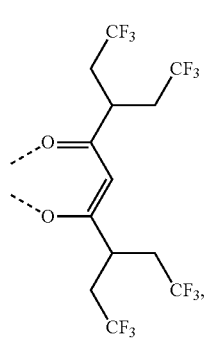
$L_{b82}$
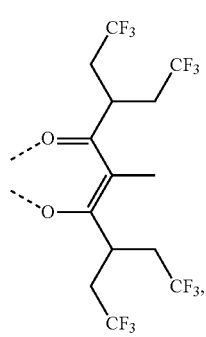
$L_{b83}$
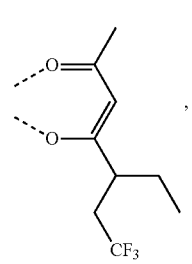
$L_{b84}$
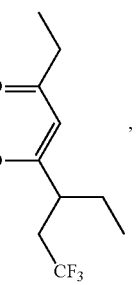
$L_{b85}$
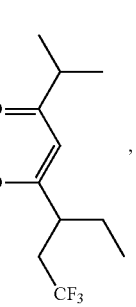
$L_{b86}$
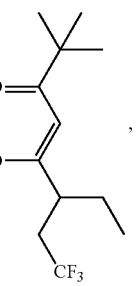
$L_{b87}$
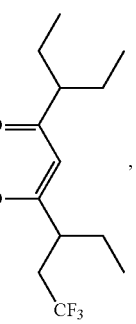
$L_{b88}$
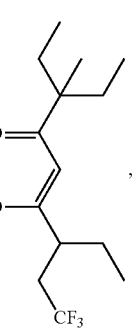
$L_{b89}$ -continued
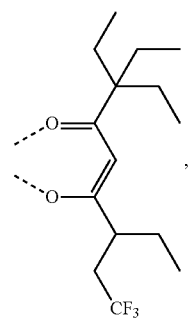
L<sub>b90</sub>
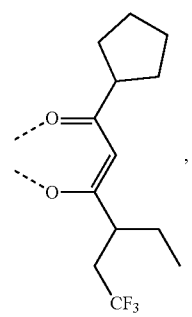
L<sub>b91</sub>
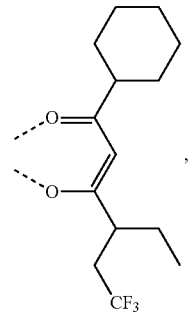
L<sub>b92</sub>
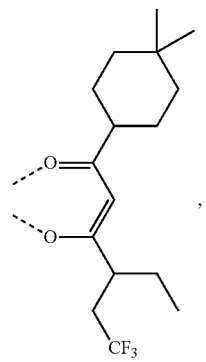
L<sub>b93</sub>
-continued
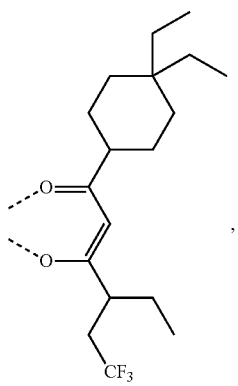
L<sub>b94</sub>
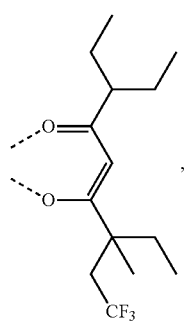
L<sub>b95</sub>
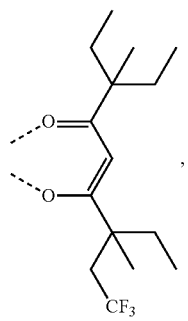
L<sub>b96</sub>
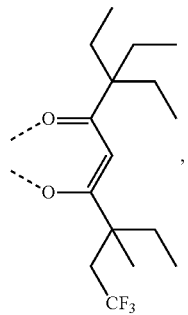
L<sub>b97</sub>

-continued
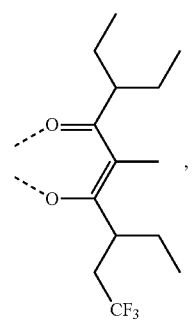
L$_{b98}$
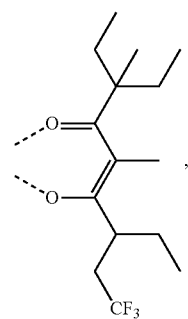
L$_{b99}$
L$_{b100}$
L$_{b101}$
L$_{b102}$
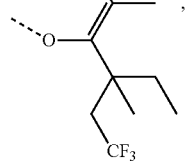
-continued
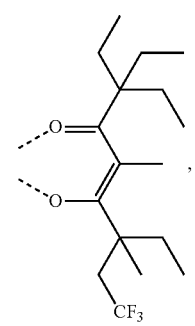
L$_{b103}$
L$_{b104}$
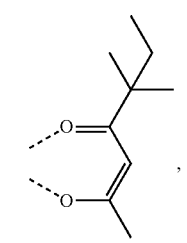
L$_{b105}$
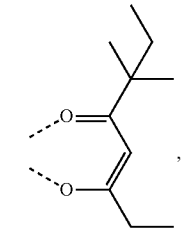
L$_{b106}$
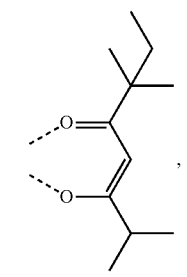
L$_{b107}$
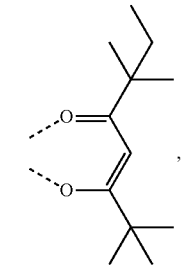

-continued
L_{b108}
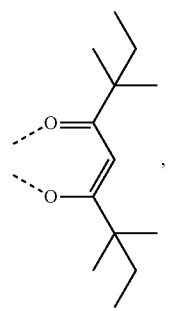,
L_{b109}
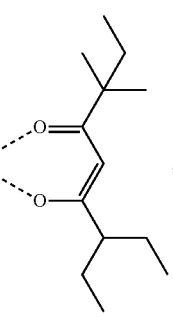,
L_{b110}
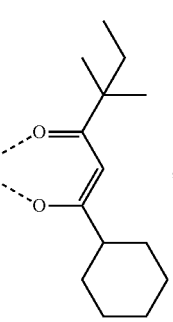,
L_{b111}
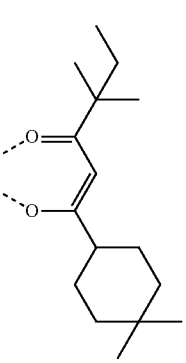,
L_{b112}
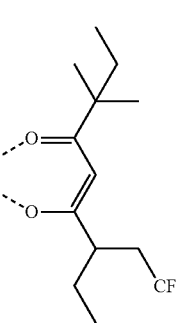,
-continued
L_{b113}
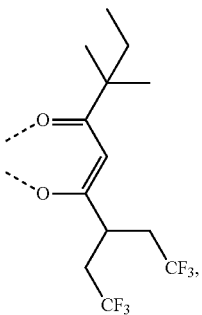,
L_{b114}
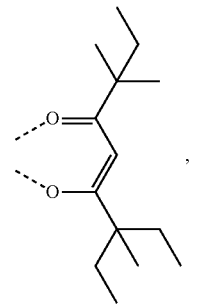,
L_{b115}
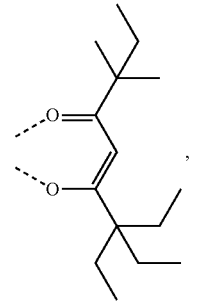,
L_{b116}
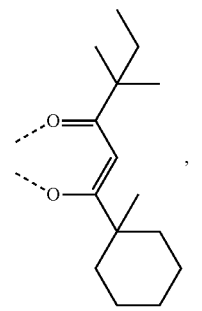,
L_{b117}
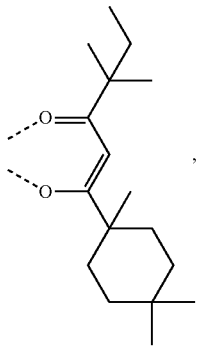,

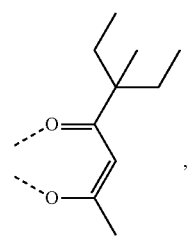 L_{b118}
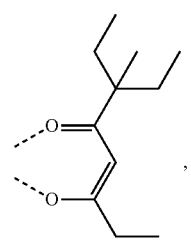 L_{b119}
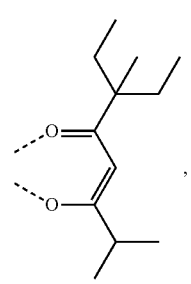 L_{b120}
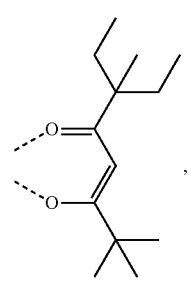 L_{b121}
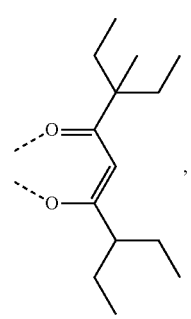 L_{b122}
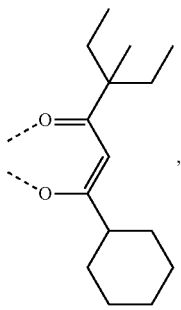 L_{b123}
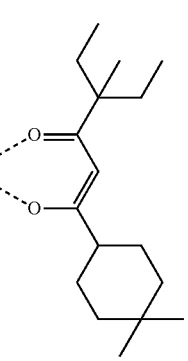 L_{b124}
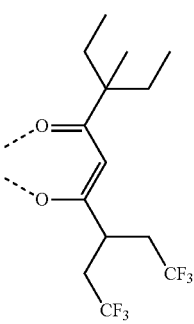 L_{b125}
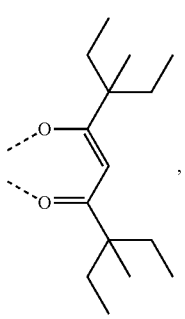 L_{b126}
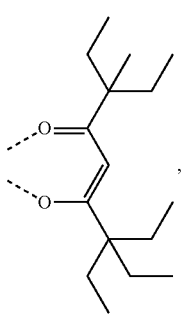 L_{b127}

L_b128 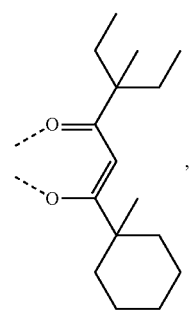
L_b129 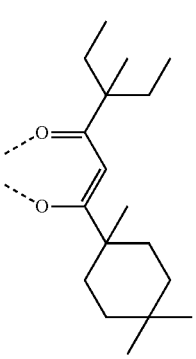
L_b130 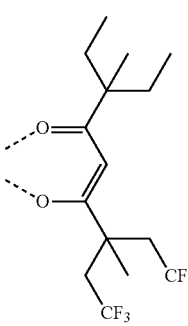
L_b131 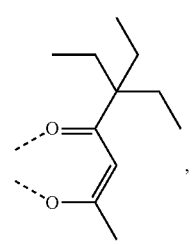
L_b132 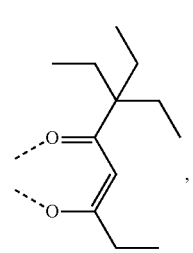
L_b133 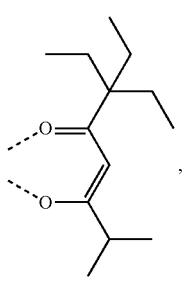
L_b134 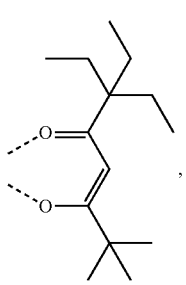
L_b135 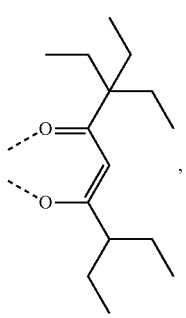
L_b136 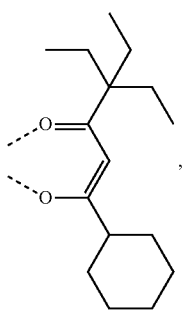
L_b137 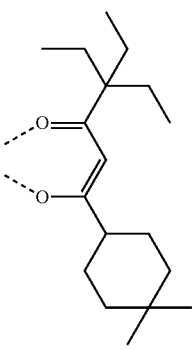

| | |
|---|---|
| $L_{b138}$ 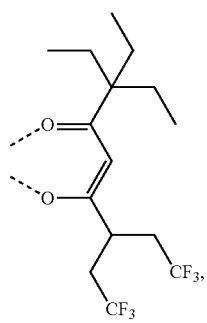 | $L_{b143}$ 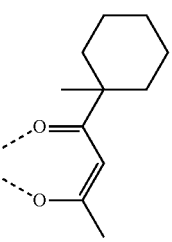 |
| $L_{b139}$ 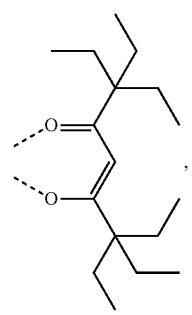 | $L_{b144}$ 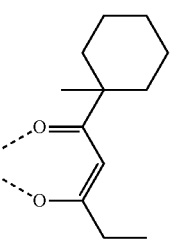 |
| $L_{b140}$ 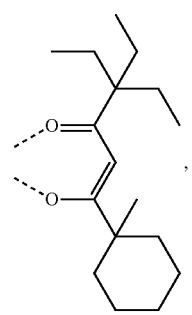 | $L_{b145}$ 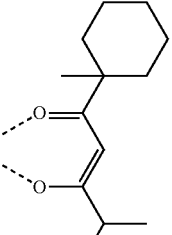 |
| $L_{b141}$ 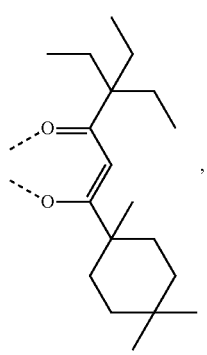 | $L_{b146}$ 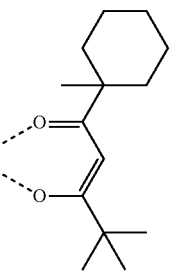 |
| $L_{b142}$ 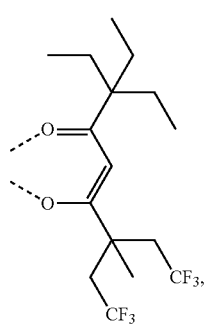 | $L_{b147}$ 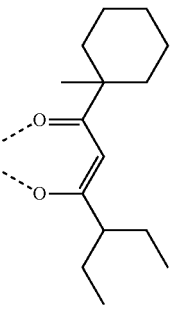 |

L_{b148}
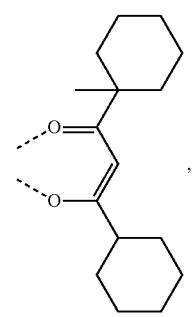
L_{b149}
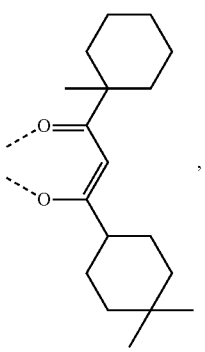
L_{b150}
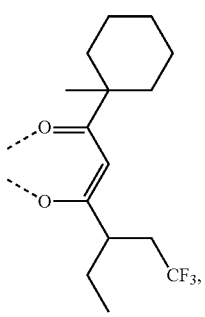
L_{b151}
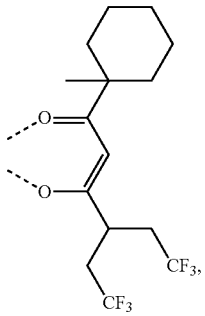
L_{b152}
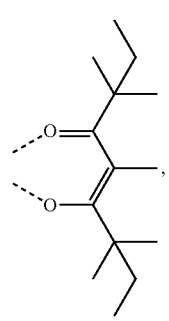
L_{b153}
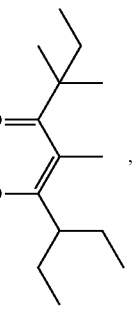
L_{b154}
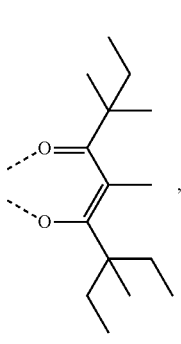
L_{b155}
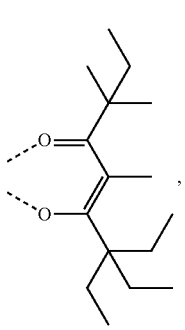
L_{b156}
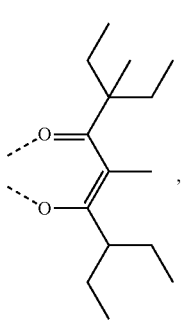
L_{b157}
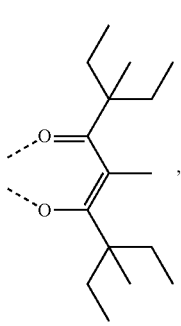

-continued
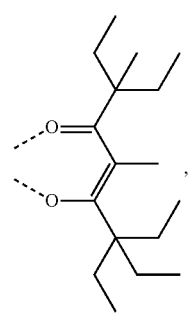  L_{b158}
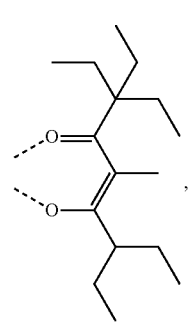  L_{b159}
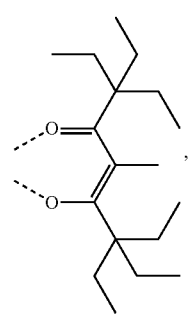  L_{b160}
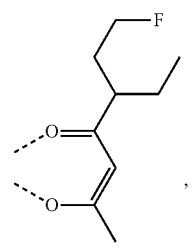  L_{b161}
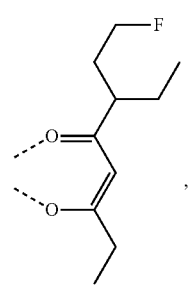  L_{b162}
-continued
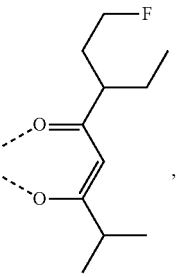  L_{b163}
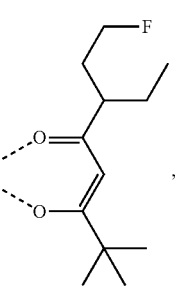  L_{b164}
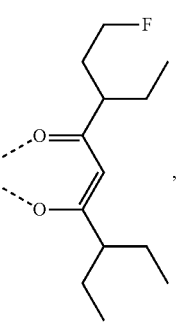  L_{b165}
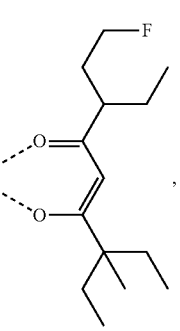  L_{b166}
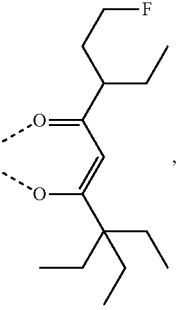  L_{b167}

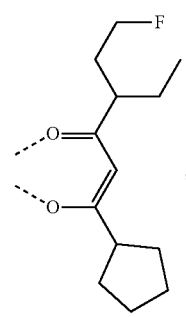
$L_{b168}$
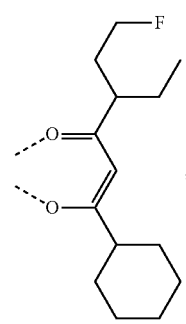
$L_{b169}$
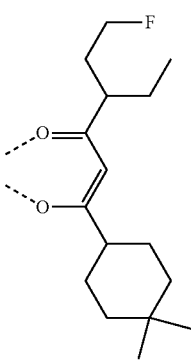
$L_{b170}$
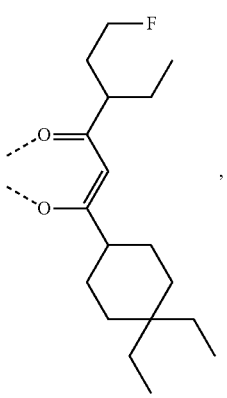
$L_{b171}$
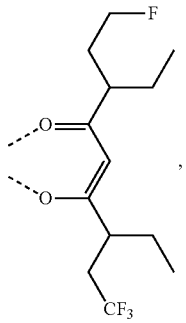
$L_{b172}$
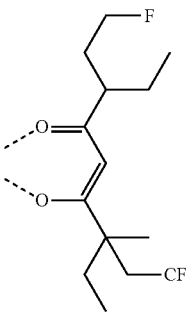
$L_{b173}$
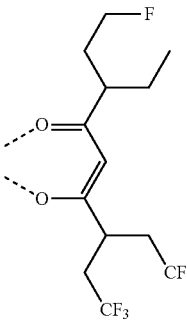
$L_{b174}$
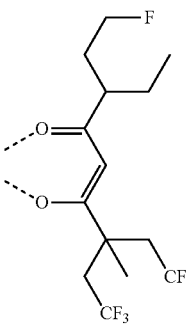
$L_{b175}$
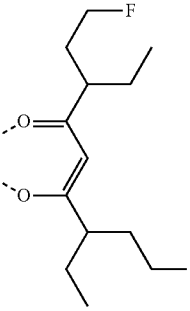
$L_{b176}$ L_{b177}
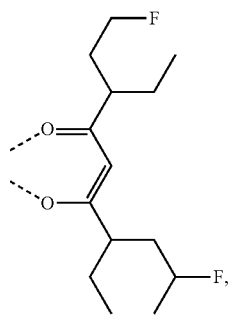
L_{b178}
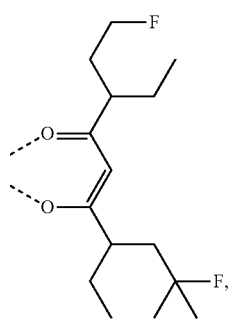
L_{b179}
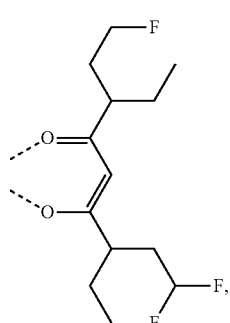
L_{b180}
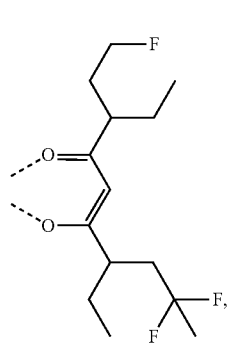
L_{b181}
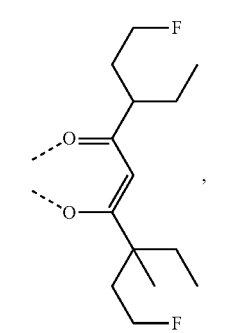
L_{b182}
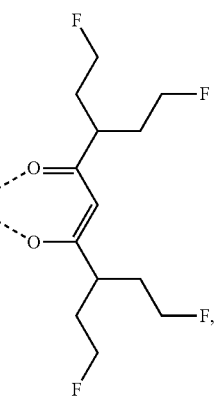
L_{b183}
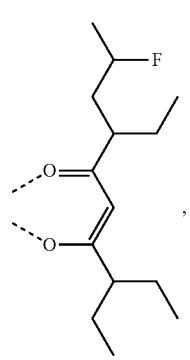
L_{b184}
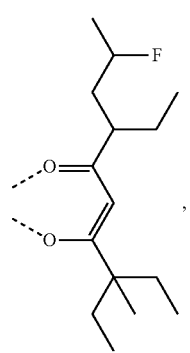
L_{b185}
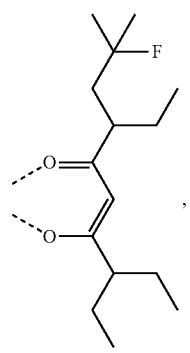

L<sub>b186</sub>
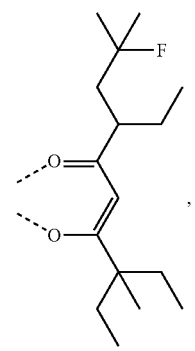
,
L<sub>b187</sub>
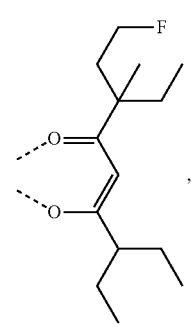
,
L<sub>b188</sub>
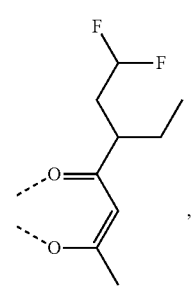
,
L<sub>b189</sub>
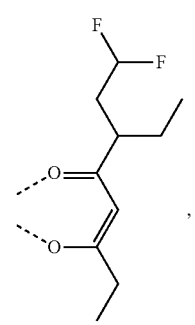
,
L<sub>b190</sub>
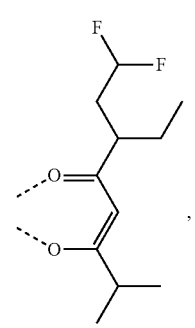
,
L<sub>b191</sub>
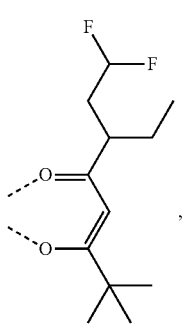
,
L<sub>b192</sub>
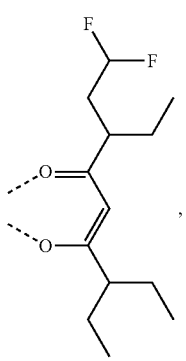
,
L<sub>b193</sub>
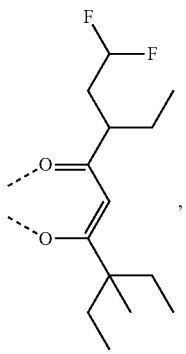
,
L<sub>b94</sub>
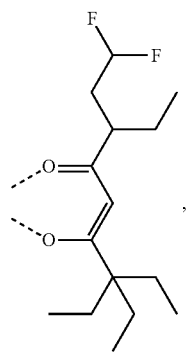
,

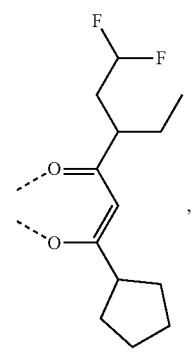 L<sub>b195</sub>
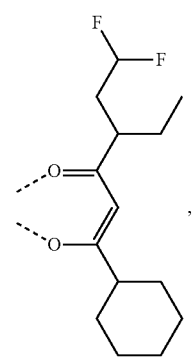 L<sub>b196</sub>
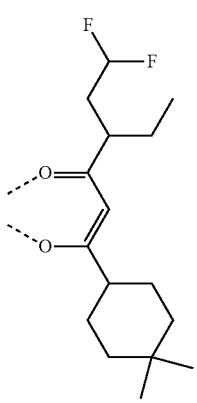 L<sub>b197</sub>
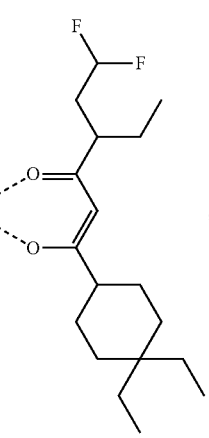 L<sub>b198</sub>
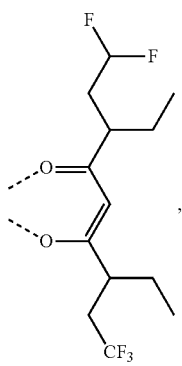 L<sub>b199</sub>
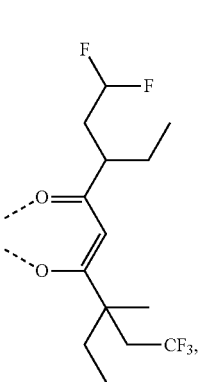 L<sub>b200</sub>
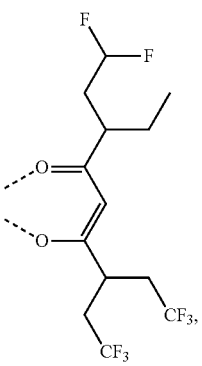 L<sub>b201</sub>
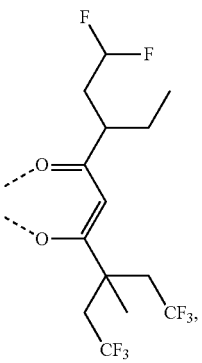 L<sub>b202</sub>

-continued
L$_{b203}$
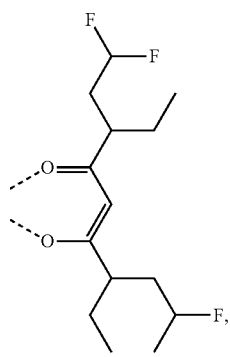
L$_{b204}$
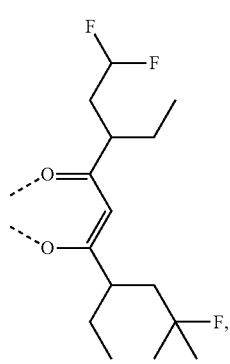
L$_{b205}$
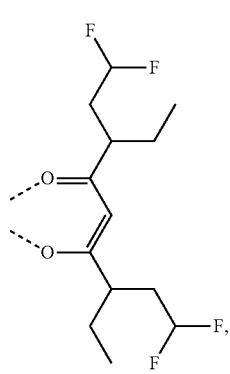
L$_{b206}$
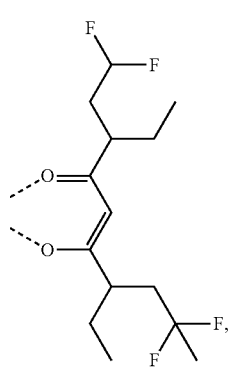
-continued
L$_{b207}$
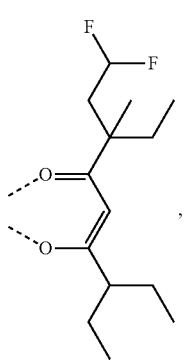
L$_{b208}$
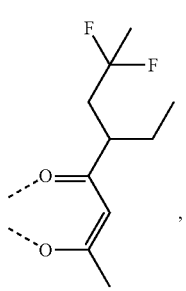
L$_{b209}$
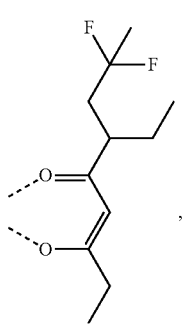
L$_{b210}$
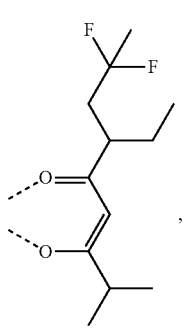
L$_{b211}$
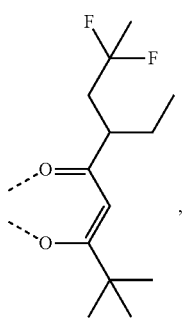

L_{b212}
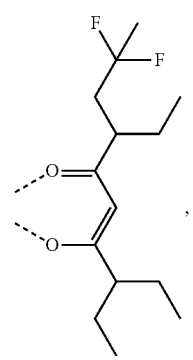
L_{b213}
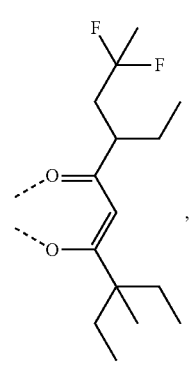
L_{b214}
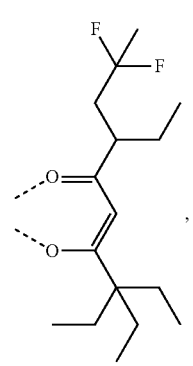
L_{b215}
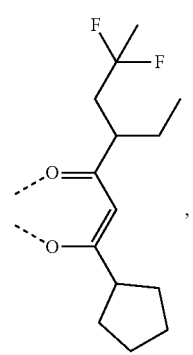
L_{b216}
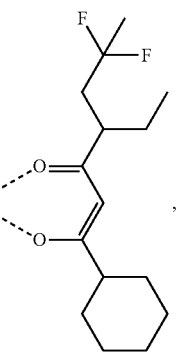
L_{b217}
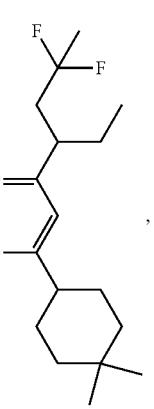
L_{b218}
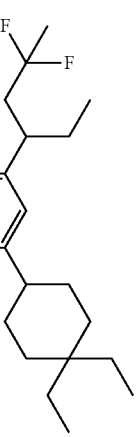
L_{b219}
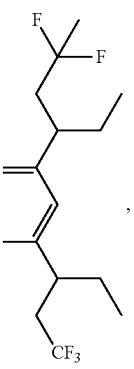

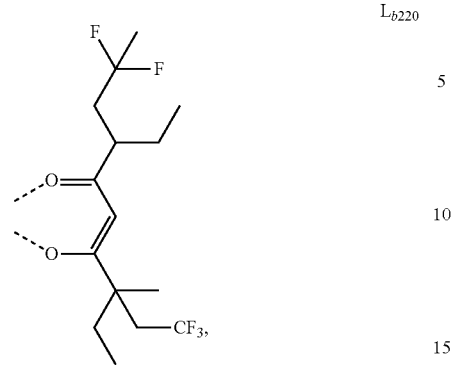 L_{b220}
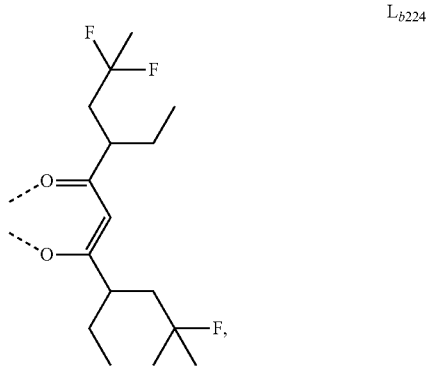 L_{b224}
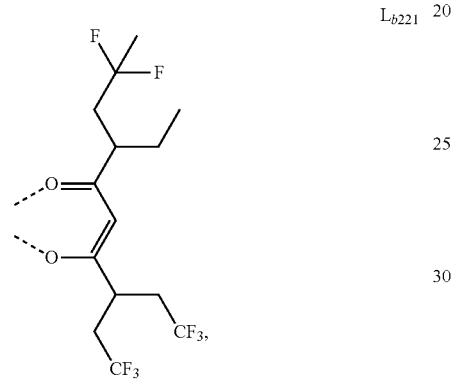 L_{b221}
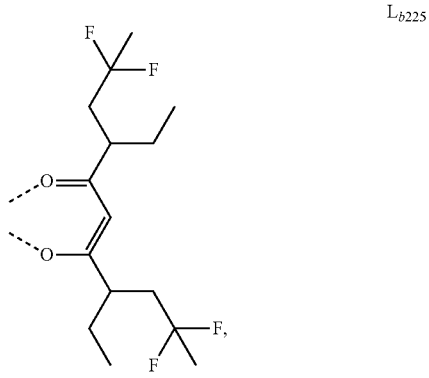 L_{b225}
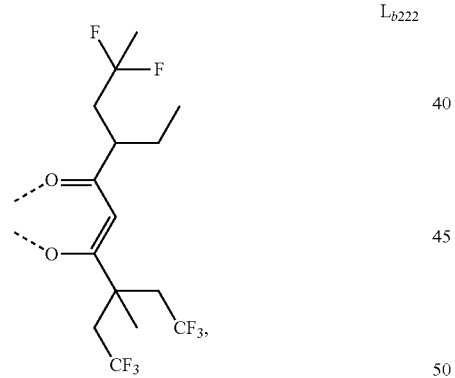 L_{b222}
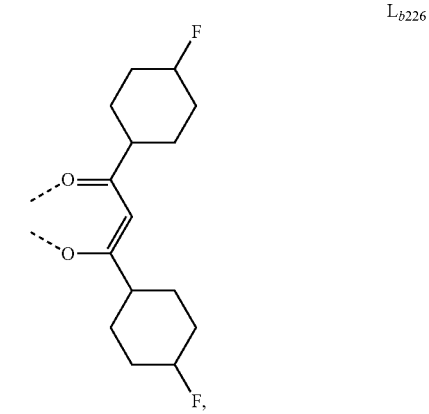 L_{b226}
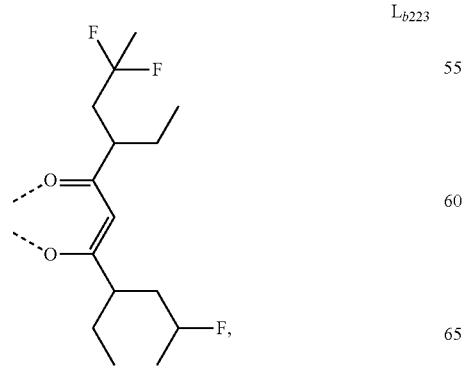 L_{b223}
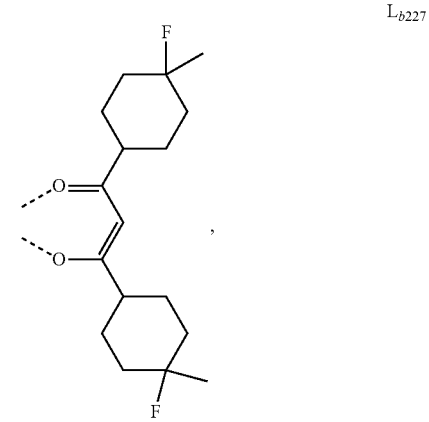 L_{b227}

227
-continued
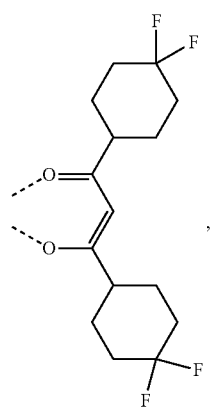, L_{b228}
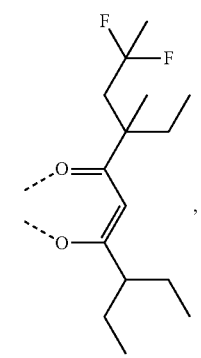, L_{b229}
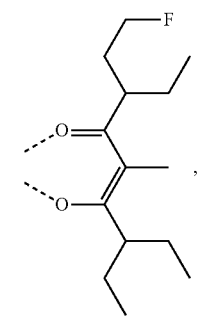, L_{b230}
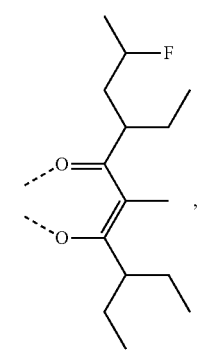, L_{b231}
228
-continued
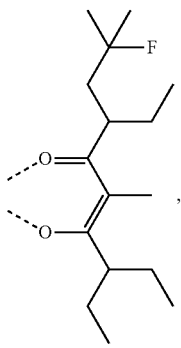, L_{b232}
L_{b233}
L_{b234}
L_{b235}
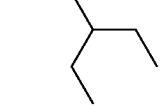
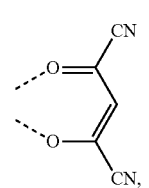, L_{b236}

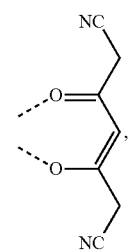
, L$_{b237}$
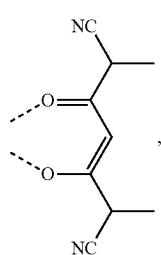
, L$_{b238}$
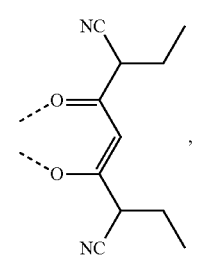
, L$_{b239}$
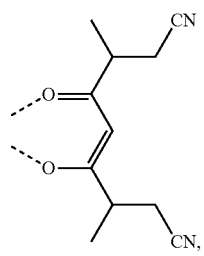
, L$_{b240}$
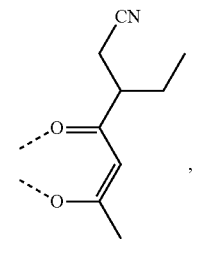
, L$_{b241}$
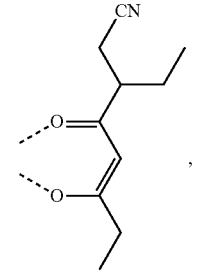
, L$_{b242}$
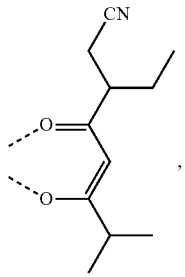
, L$_{b243}$
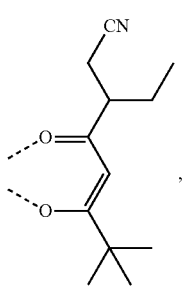
, L$_{b244}$
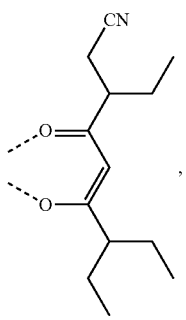
, L$_{b245}$
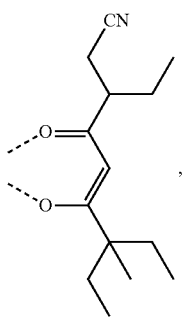
, L$_{b246}$
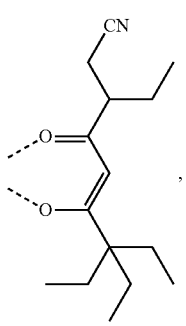
, L$_{b247}$ 231
-continued
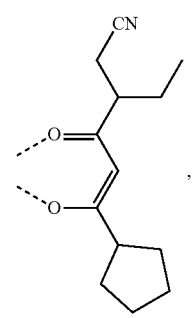,
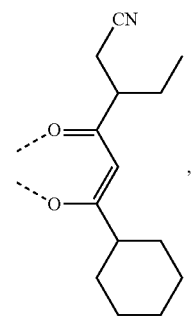,
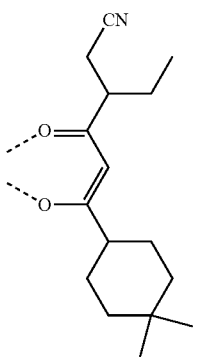,
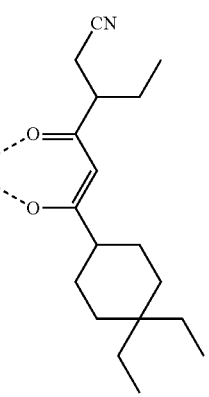,
232
L$_{b248}$
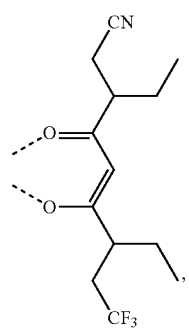,
L$_{b249}$
L$_{b250}$
L$_{b251}$
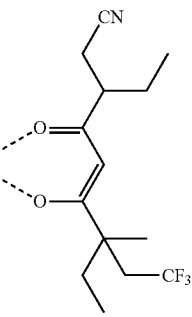,
L$_{b252}$
L$_{b253}$
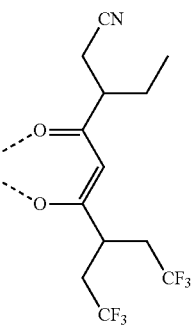,
L$_{b254}$
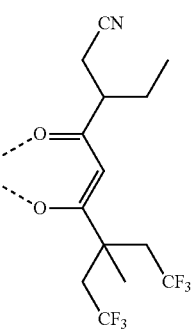,
L$_{b255}$
L$_{b256}$
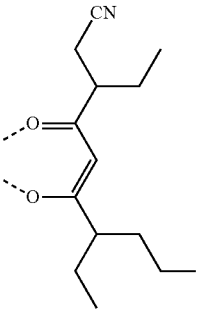, 233
-continued
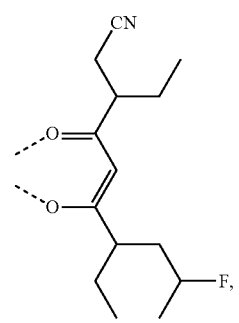 L_{b257}
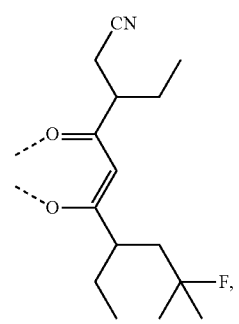 L_{b258}
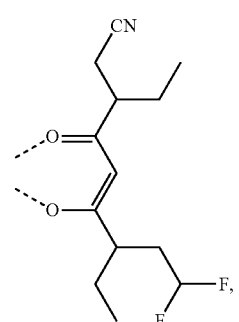 L_{b259}
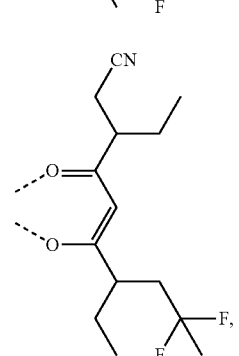 L_{b260}
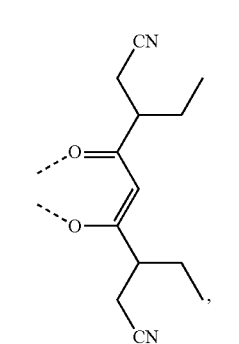 L_{b261}
234
-continued
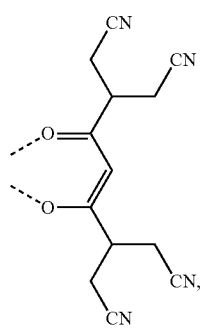 L_{b262}
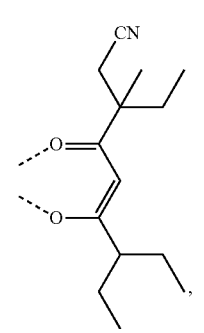 L_{b263}
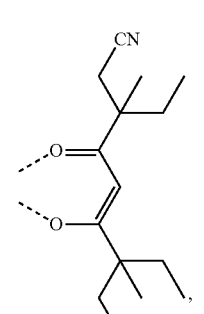 L_{b264}
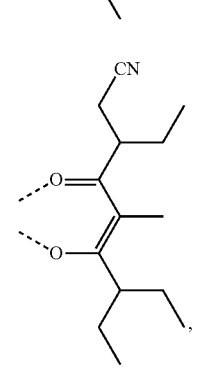 L_{b265}
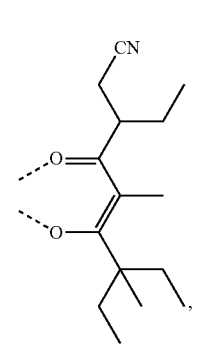 L_{b266}

L_{b267}
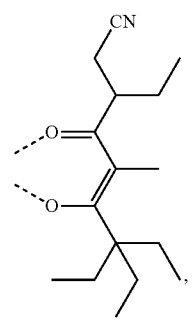
L_{b268}
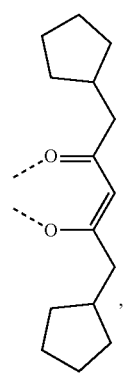
L_{b269}
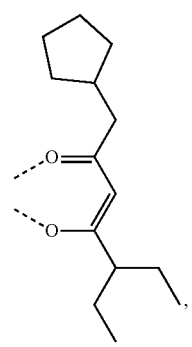
L_{b270}
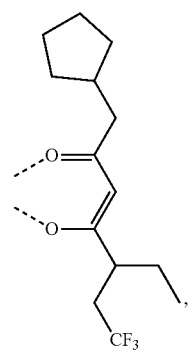
L_{b271}
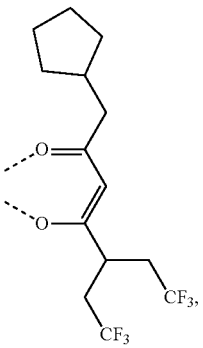
L_{b272}
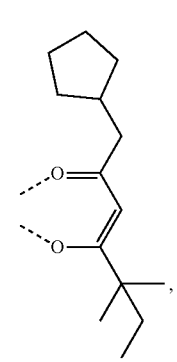
L_{b273}
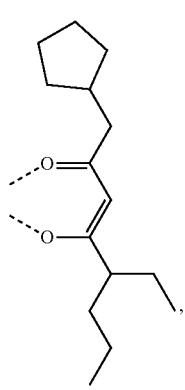
L_{b274}
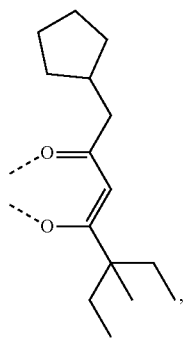

| | |
|---|---|
| 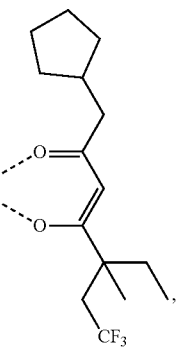 | $L_{b275}$ |
| 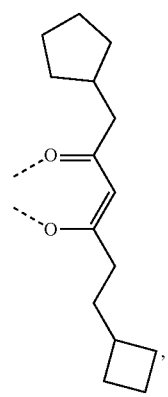 | $L_{b276}$ |
| 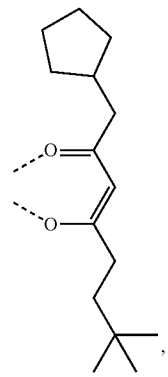 | $L_{b277}$ |
| 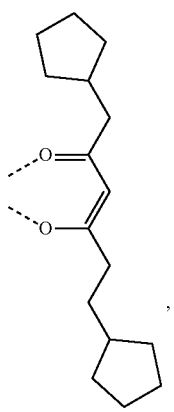 | $L_{b278}$ |
| 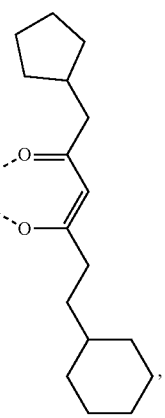 | $L_{b279}$ |
| 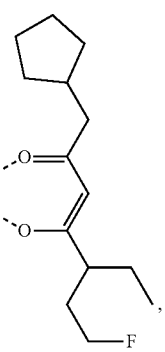 | $L_{b280}$ |
| 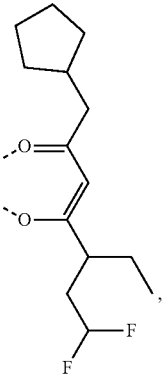 | $L_{b281}$ |
| 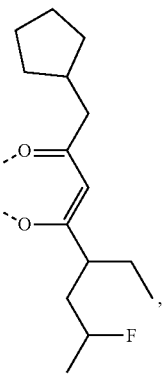 | $L_{b282}$ |

L_{b283}
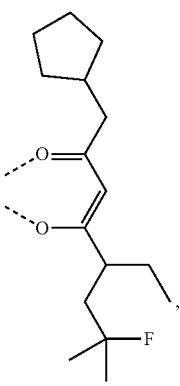
L_{b284}
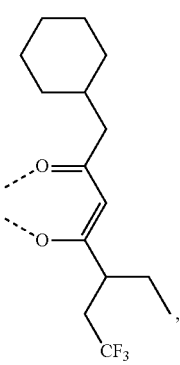
L_{b285}
L_{b286}
L_{b287}
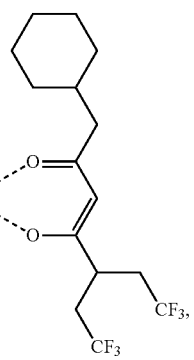
L_{b288}
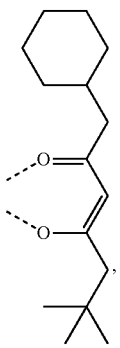
L_{b289}
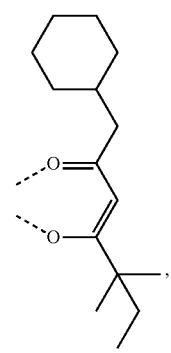
L_{b290}
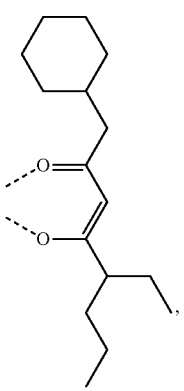

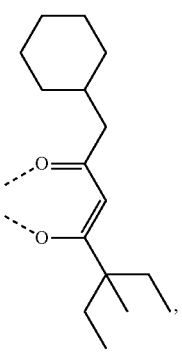 L_{b291}
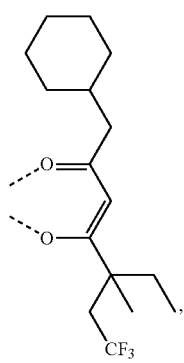 L_{b292}
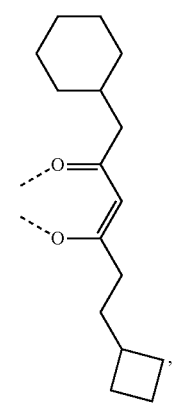 L_{b293}
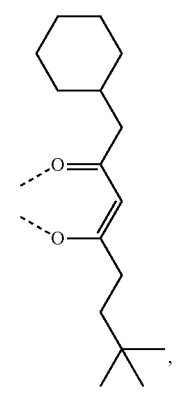 L_{b294}
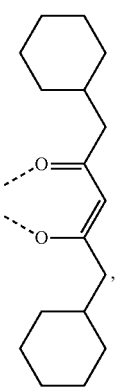 L_{b295}
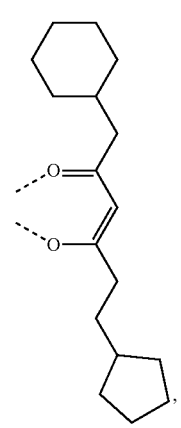 L_{b296}
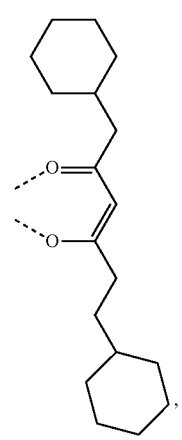 L_{b297}
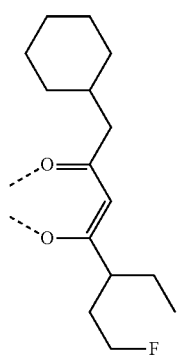 L_{b298}

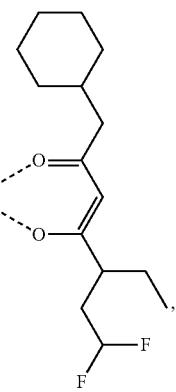
L_{b299}
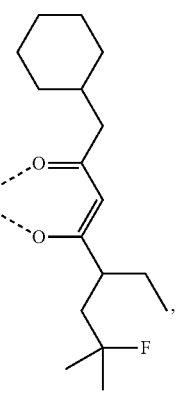
L_{b300}
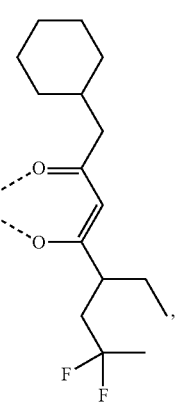
L_{b301}
L_{b302}
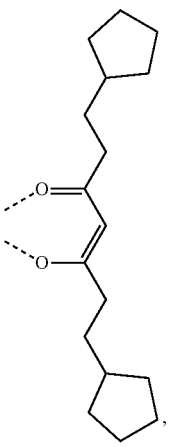
L_{b303}
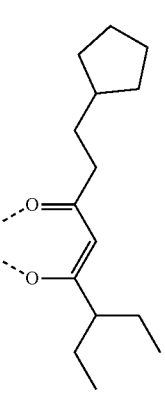
L_{b304}
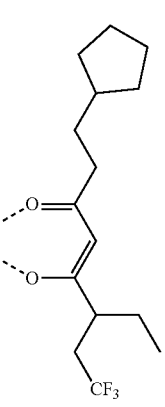
L_{b305}

-continued
L<sub>b306</sub>
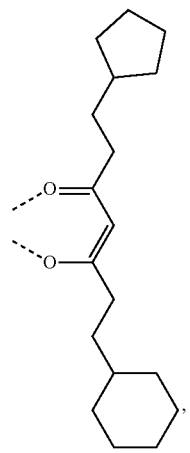
L<sub>b307</sub>
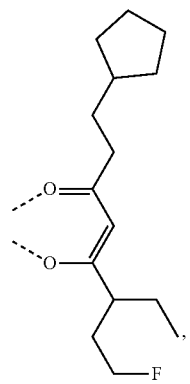
L<sub>b308</sub>
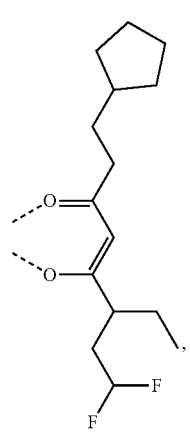
-continued
L<sub>b309</sub>
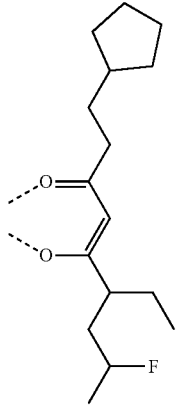
L<sub>b310</sub>
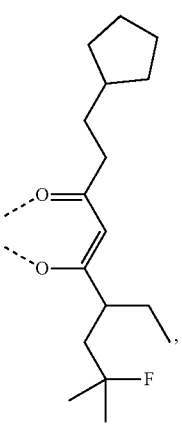
L<sub>b311</sub>
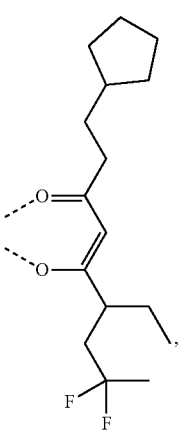

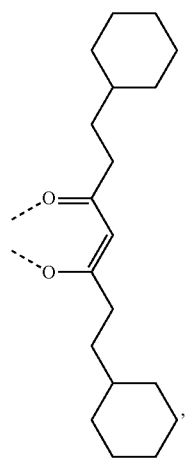
$L_{b312}$
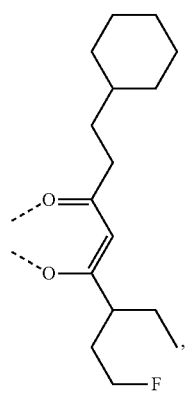
$L_{b313}$
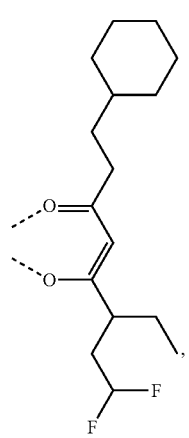
$L_{b314}$
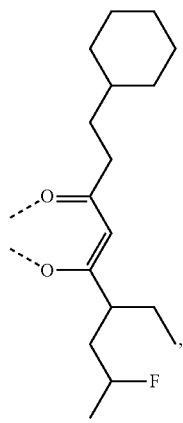
$L_{b315}$
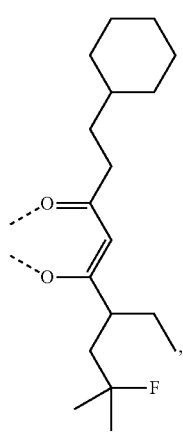
$L_{b316}$
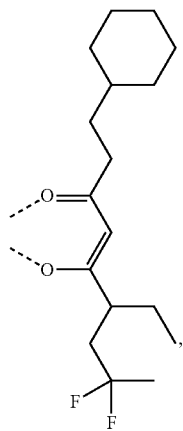
$L_{b317}$ L{b318} 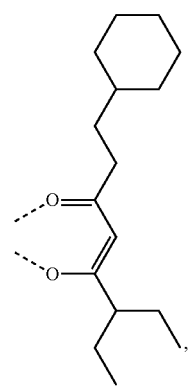
L{b319} 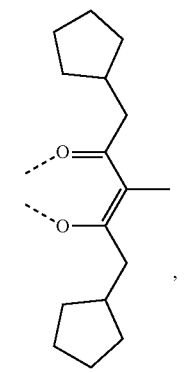
L{b320} 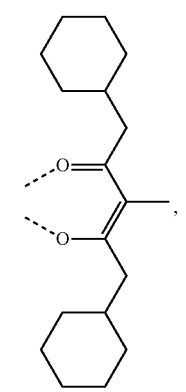
L{b321} 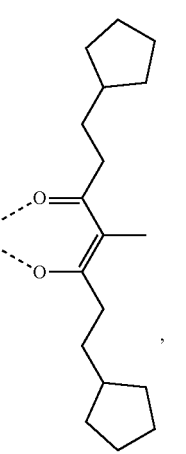
L{b322} 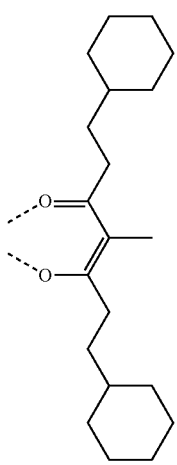
22. The metal complex of claim 21, wherein $L_c$ is, at each occurrence identically or differently, selected from any one of the group consisting of the following structures:
L{c1} 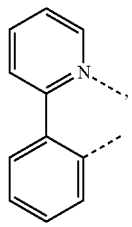
L{c2} 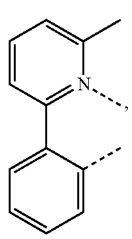
L{c3} 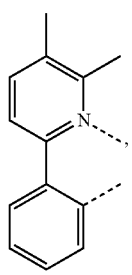
L{c4} 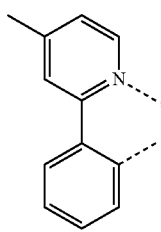

L_{c5}
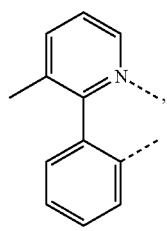
L_{c6}
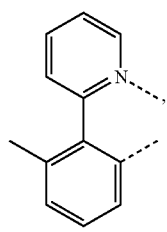
L_{c7}
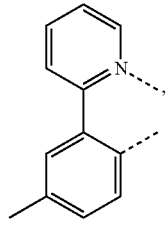
L_{c8}
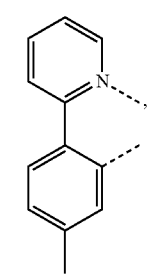
L_{c9}
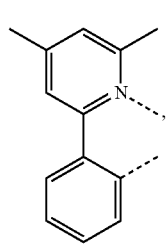
L_{c10}
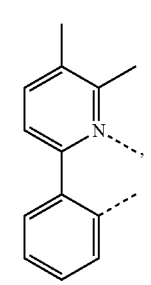
L_{c11}
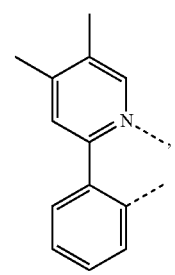
L_{c12}
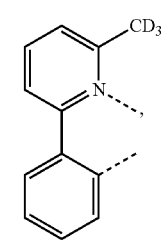
L_{c13}
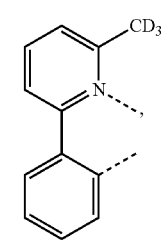
L_{c14}
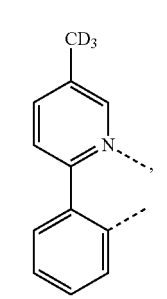
L_{c15}
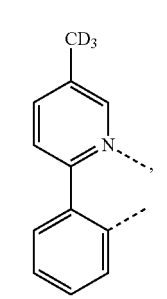

-continued
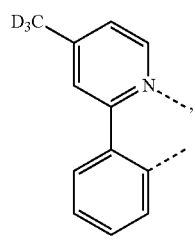 L<sub>c16</sub>
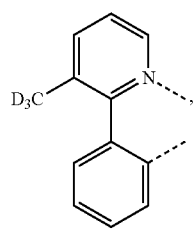 L<sub>c17</sub>
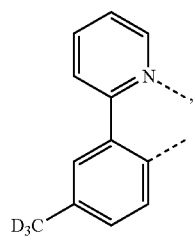 L<sub>c19</sub>
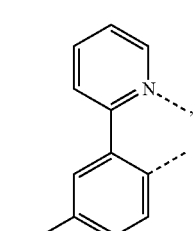 L<sub>c19</sub>
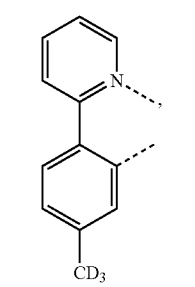 L<sub>c20</sub>
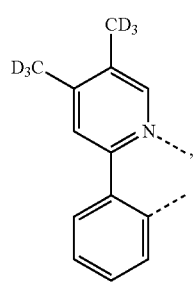 L<sub>c21</sub>
-continued
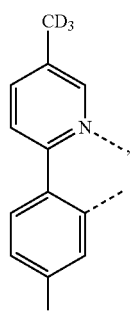 L<sub>c22</sub>
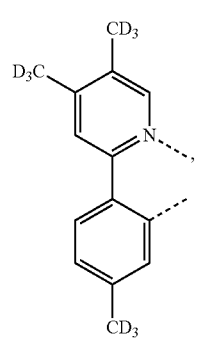 L<sub>c23</sub>
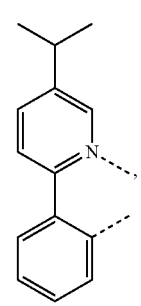 L<sub>c24</sub>
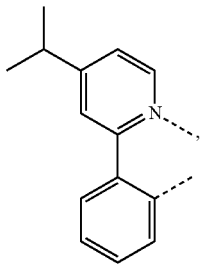 L<sub>c25</sub>
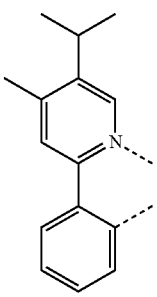 L<sub>c26</sub>

-continued
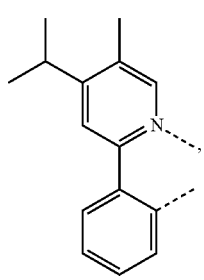 L<sub>c27</sub>
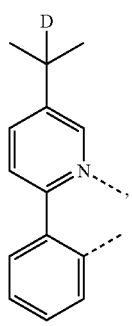 L<sub>c28</sub>
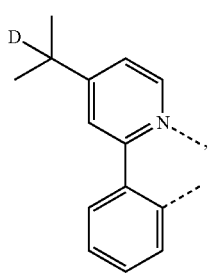 L<sub>c29</sub>
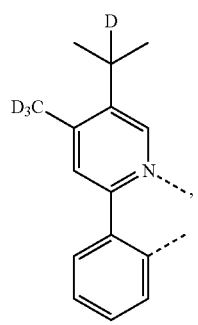 L<sub>c30</sub>
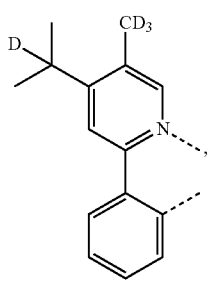 L<sub>c31</sub>
-continued
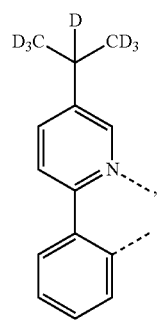 L<sub>c32</sub>
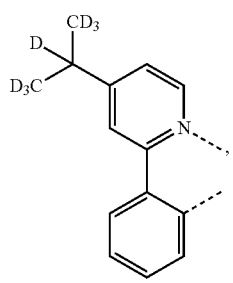 L<sub>c33</sub>
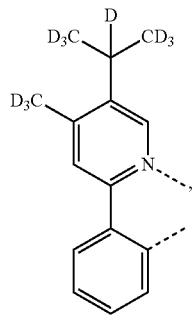 L<sub>c34</sub>
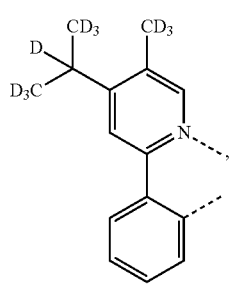 L<sub>c35</sub>
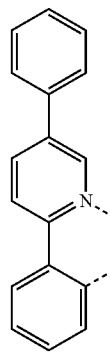 L<sub>c36</sub>

257
-continued
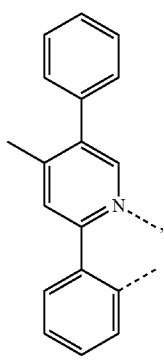
$L_{c37}$
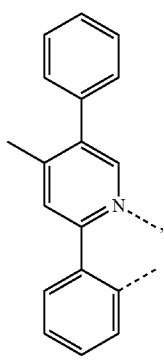
$L_{c38}$
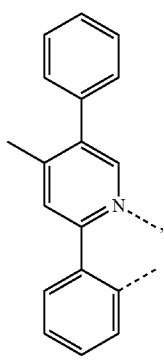
$L_{c39}$
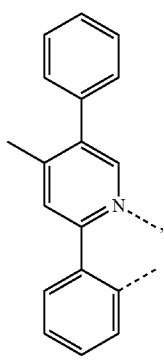
$L_{c40}$
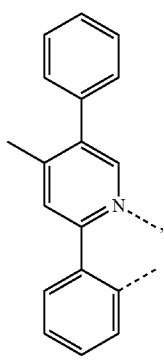
$L_{c41}$
258
-continued
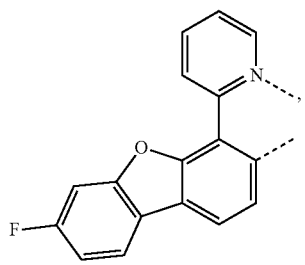
$L_{c42}$
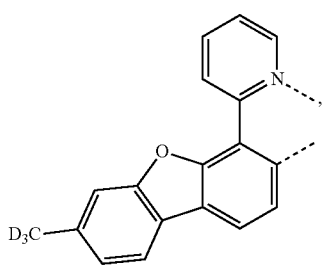
$L_{c43}$
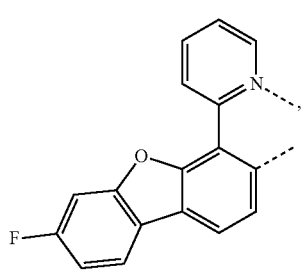
$L_{c44}$
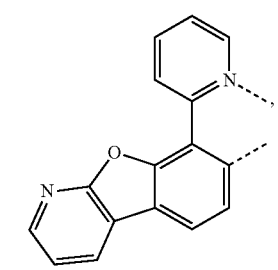
$L_{c45}$
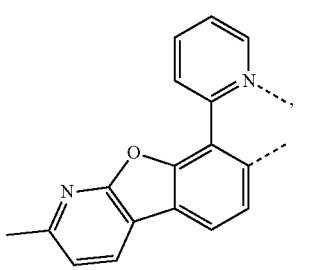
$L_{c46}$
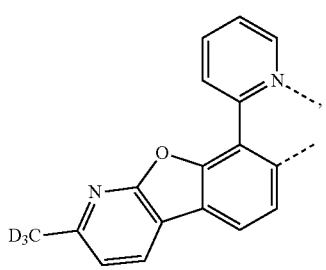
$L_{c47}$ -continued
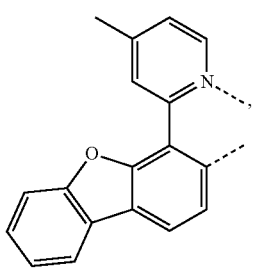 L<sub>c48</sub>
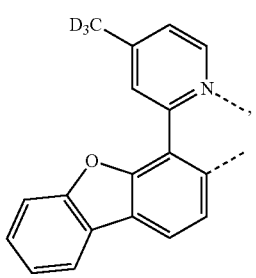 L<sub>c49</sub>
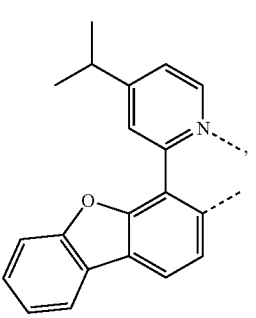 L<sub>c50</sub>
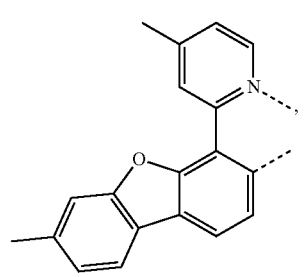 L<sub>c51</sub>
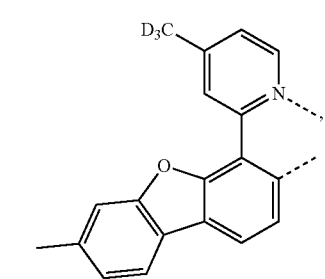 L<sub>c52</sub>
-continued
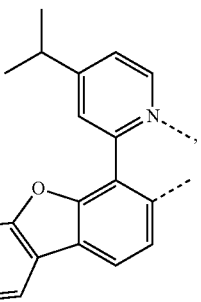 L<sub>c53</sub>
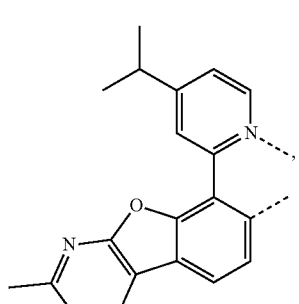 L<sub>c54</sub>
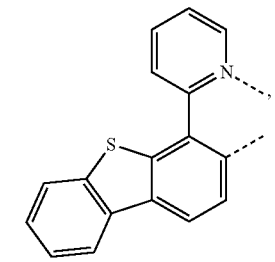 L<sub>c55</sub>
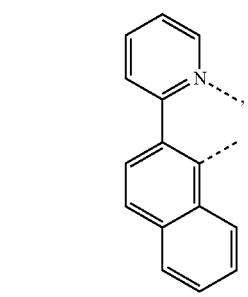 L<sub>c56</sub>
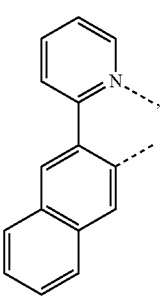 L<sub>c57</sub>

-continued
L<sub>c58</sub>
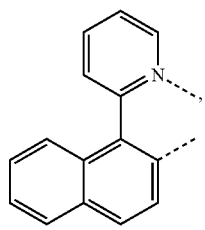
L<sub>c59</sub>
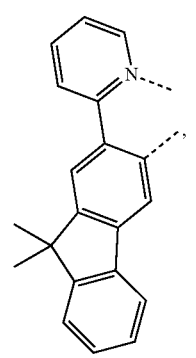
L<sub>c60</sub>
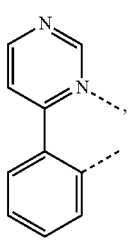
L<sub>c61</sub>
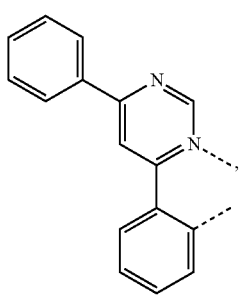
L<sub>c62</sub>
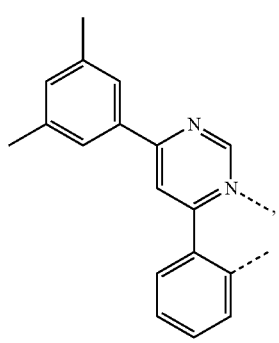
-continued
L<sub>c63</sub>
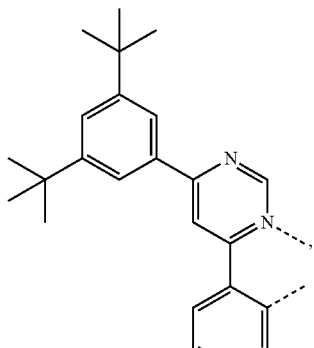
L<sub>c64</sub>
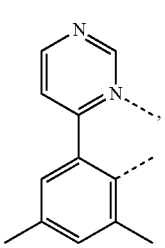
L<sub>c65</sub>
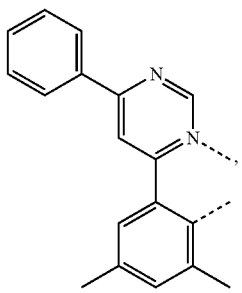
L<sub>c66</sub>
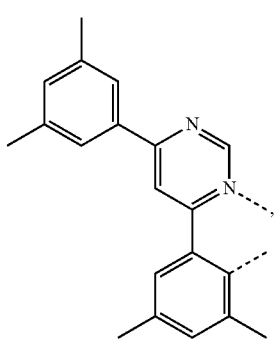
L<sub>c67</sub>
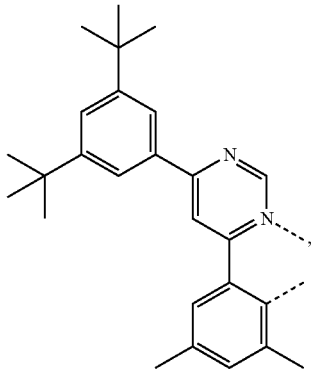

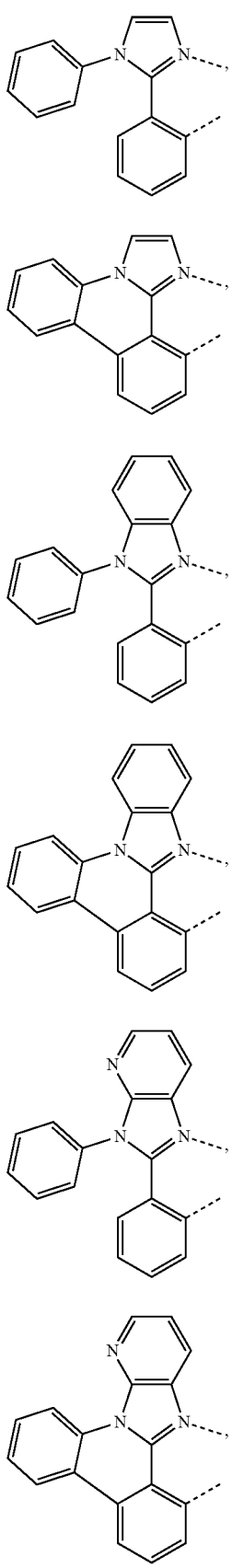
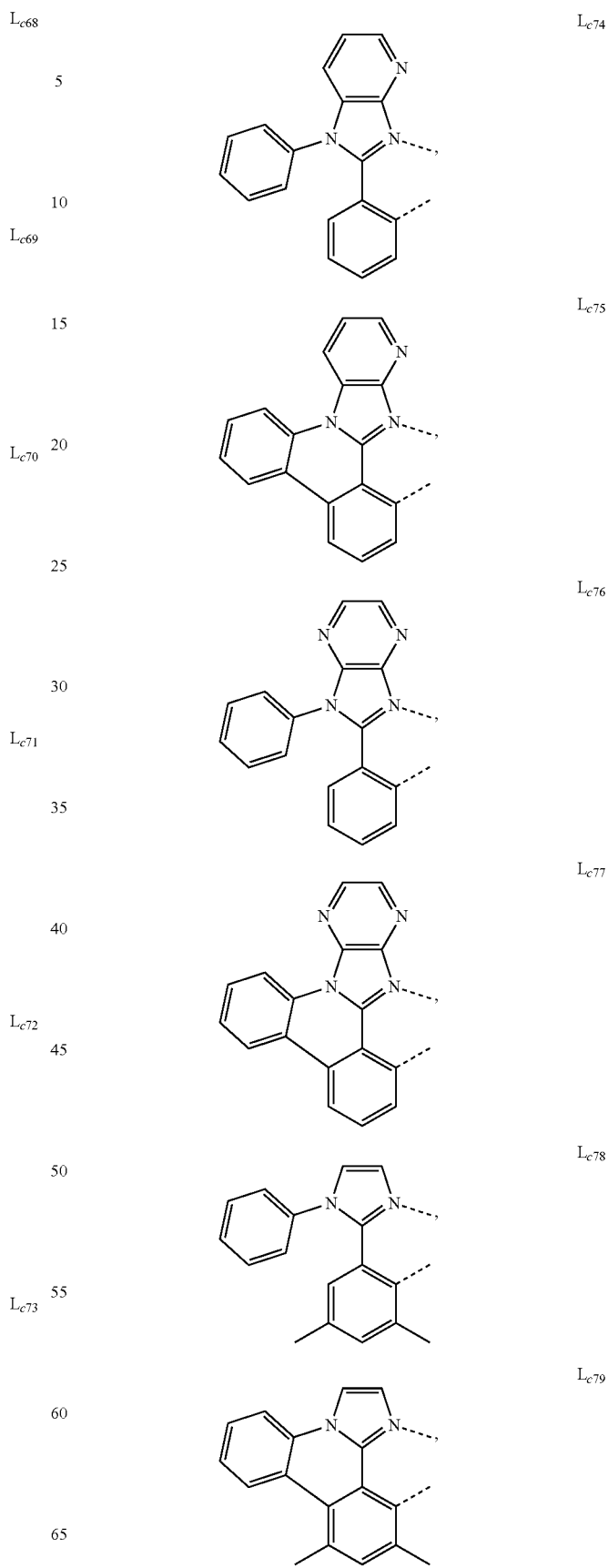

| | |
|---|---|
| L$_{c80}$ 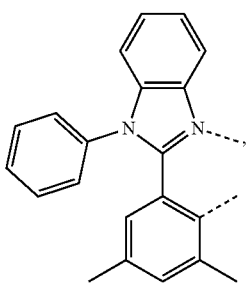 | L$_{c85}$ 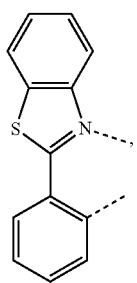 |
| L$_{c81}$ 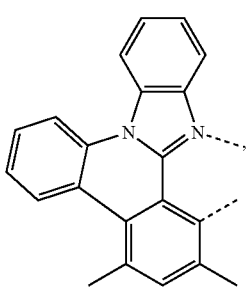 | L$_{c86}$ 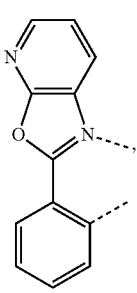 |
| L$_{c82}$ 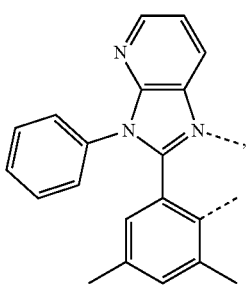 | L$_{c87}$ 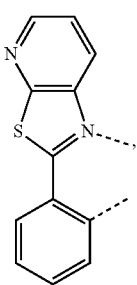 |
| L$_{c83}$ 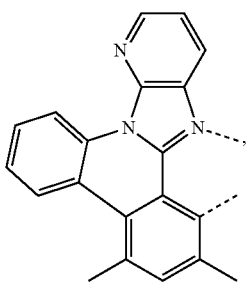 | L$_{c88}$ 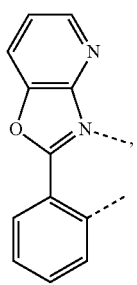 |
| L$_{c84}$ 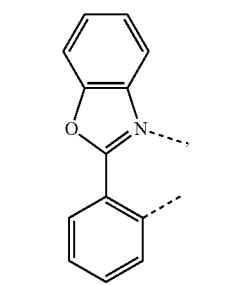 | L$_{c89}$ 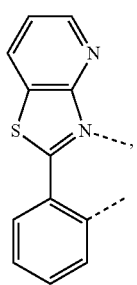 |

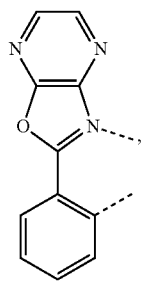 L<sub>c90</sub>
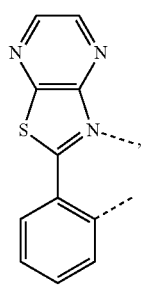 L<sub>c91</sub>
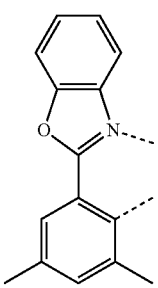 L<sub>c92</sub>
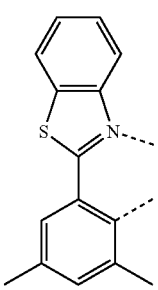 L<sub>c93</sub>
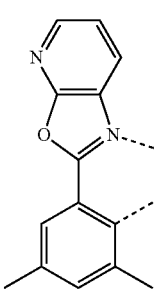 L<sub>c94</sub>
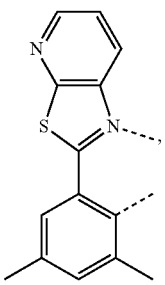 L<sub>c95</sub>
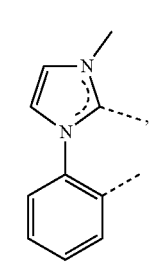 L<sub>c96</sub>
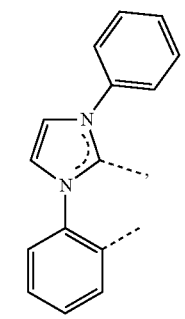 L<sub>c97</sub>
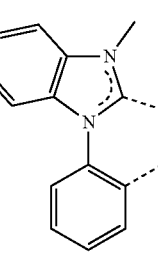 L<sub>c98</sub>
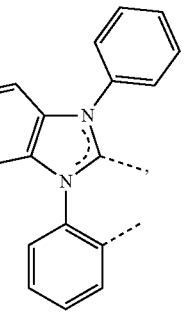 L<sub>c99</sub>

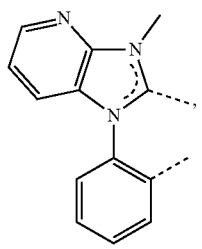
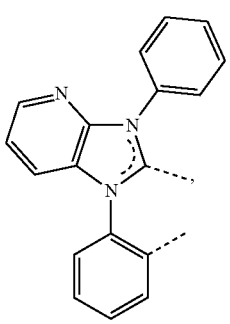
L<sub>c101</sub>
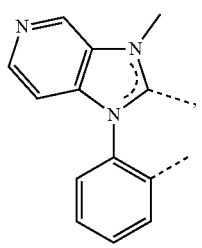
L<sub>c102</sub>
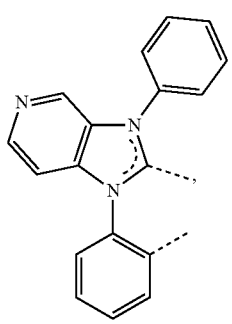
L<sub>c103</sub>
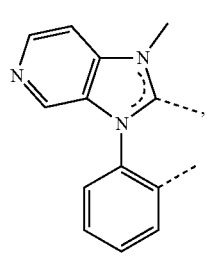
L<sub>c104</sub>
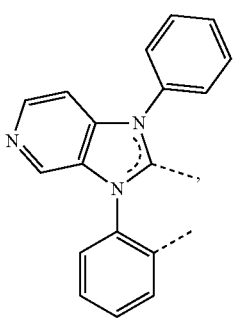
L<sub>c100</sub>
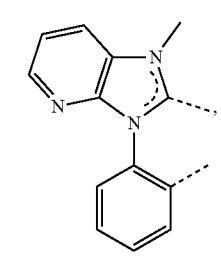
L<sub>c105</sub>
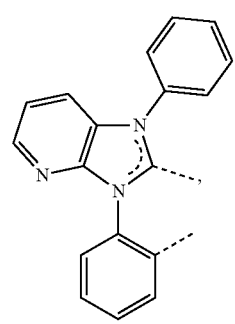
L<sub>c106</sub>
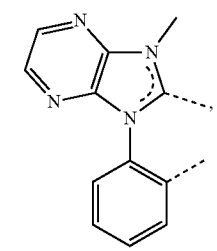
L<sub>c107</sub>
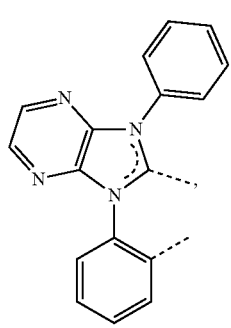
L<sub>c108</sub>
L<sub>c109</sub>

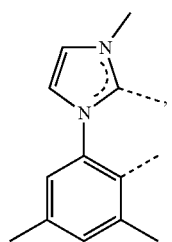
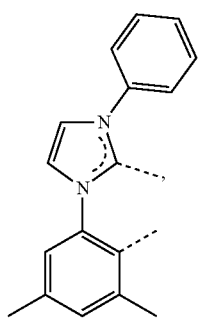
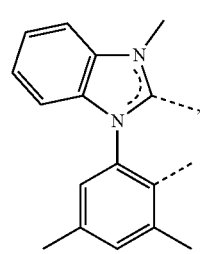
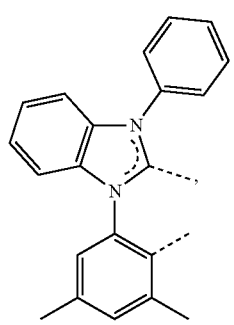
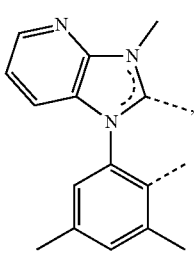
$L_{c110}$
$L_{c111}$
$L_{c112}$
$L_{c113}$
$L_{c114}$
$L_{c115}$
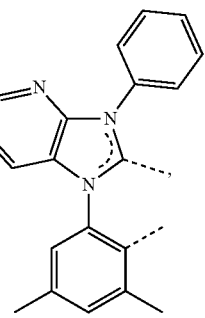
$L_{c116}$
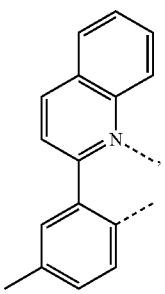
$L_{c117}$
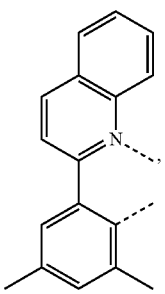
$L_{c118}$
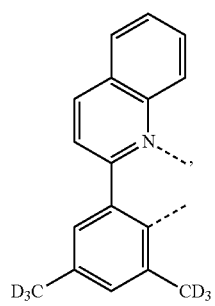
$L_{c119}$ -continued
L$_{c120}$ 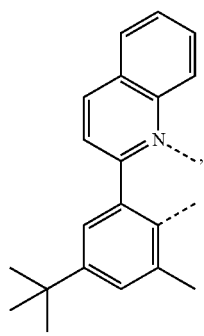
L$_{c121}$ 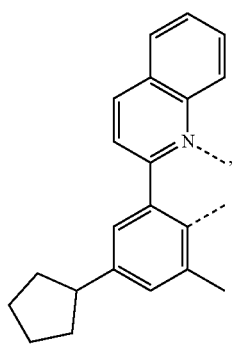
L$_{c122}$ 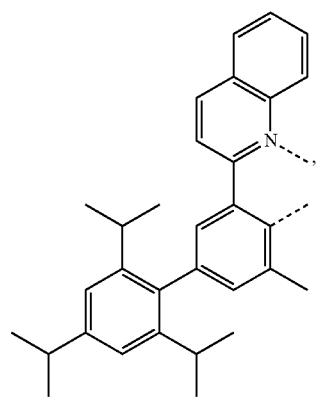
L$_{c123}$ 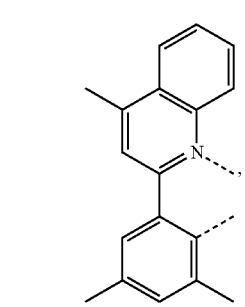
L$_{c124}$ 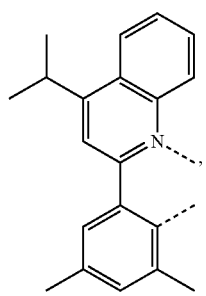
L$_{c125}$ 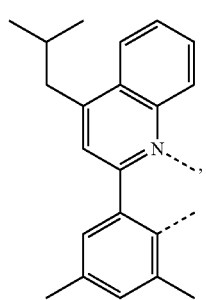
L$_{c126}$ 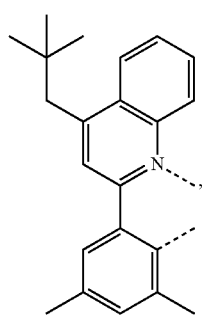
L$_{c127}$ 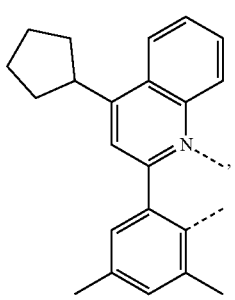
L$_{c128}$ 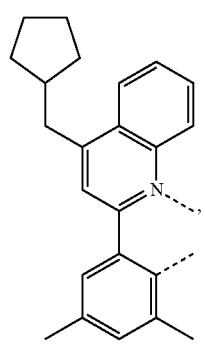

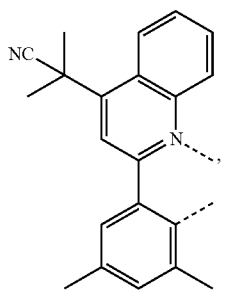
$L_{c129}$
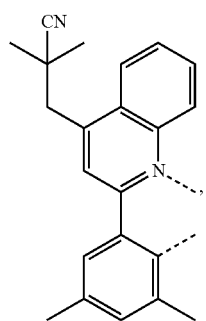
$L_{c130}$
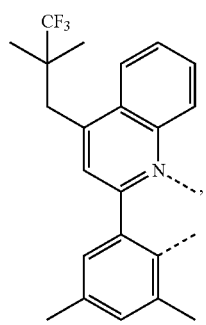
$L_{c131}$
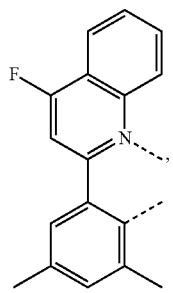
$L_{c132}$
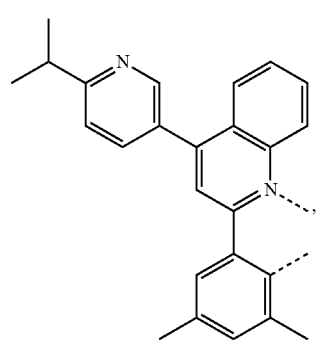
$L_{c133}$
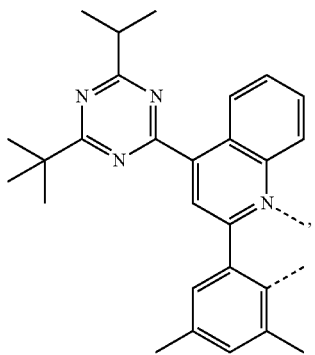
$L_{c134}$
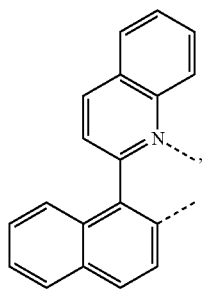
$L_{c135}$
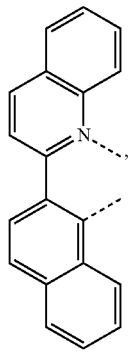
$L_{c136}$
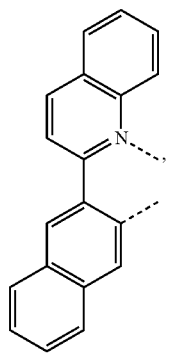
$L_{c137}$ L$_{c138}$ 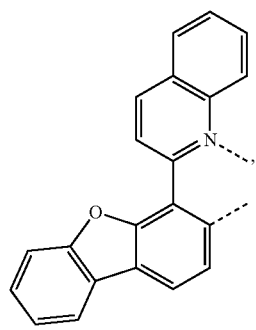
L$_{c139}$ 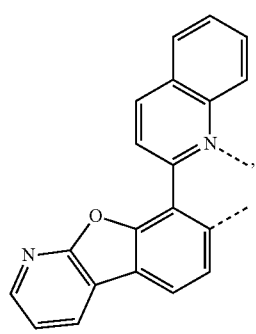
L$_{c140}$ 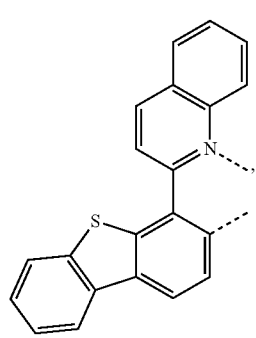
L$_{c141}$ 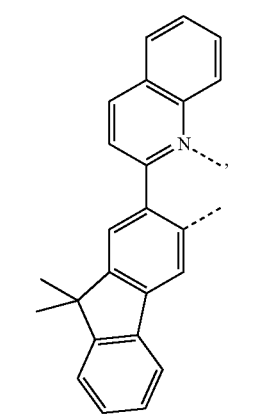
L$_{c142}$ 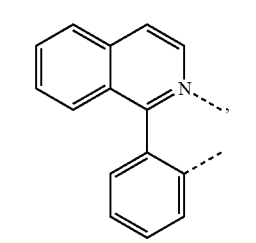
L$_{c143}$ 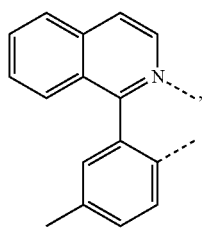
L$_{c144}$ 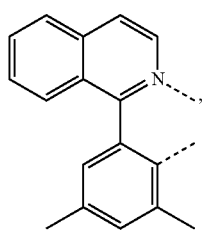
L$_{c145}$ 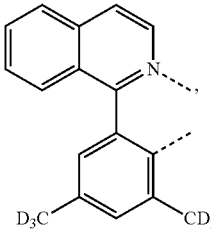
L$_{c146}$ 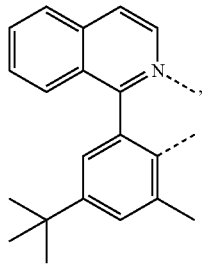
L$_{c147}$ 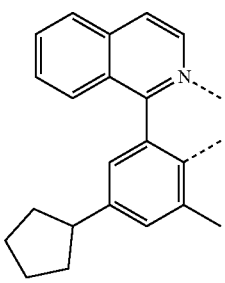
L$_{c148}$ 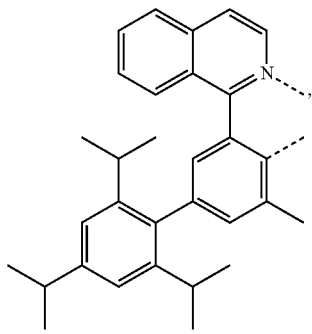

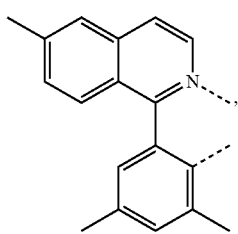 L_{c149}
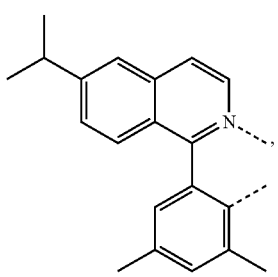 L_{c150}
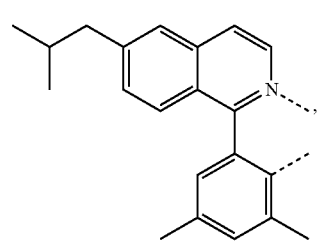 L_{c151}
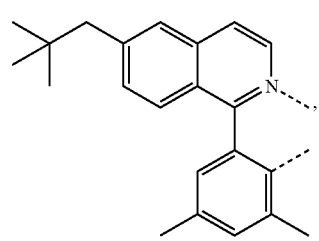 L_{c152}
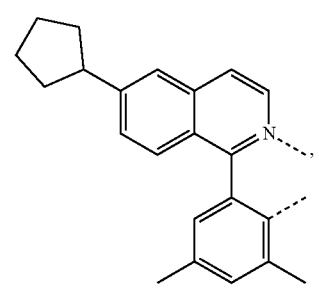 L_{c153}
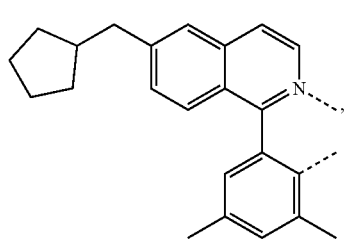 L_{c154}
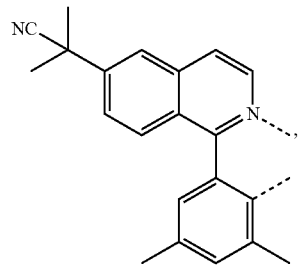 L_{c155}
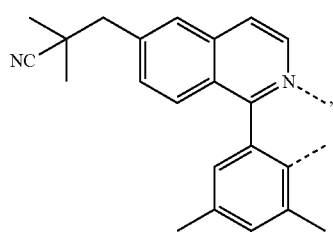 L_{c156}
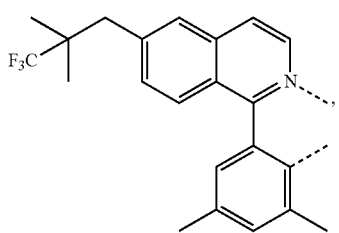 L_{c157}
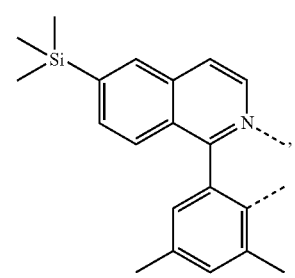 L_{c158}
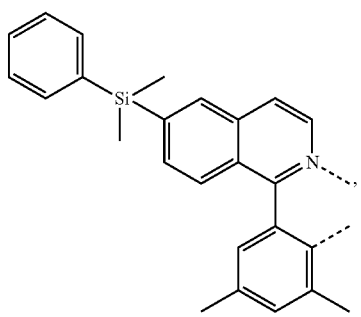 L_{c159}
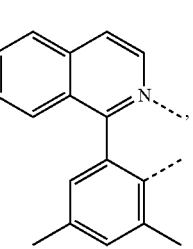 L_{c160}

L_{c161}
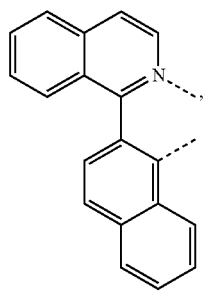
L_{c162}
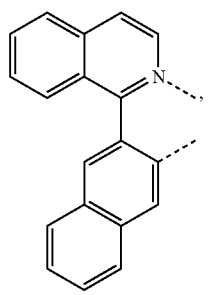
L_{c163}
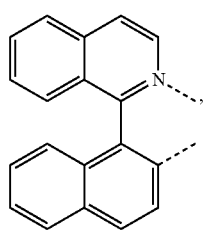
L_{c164}
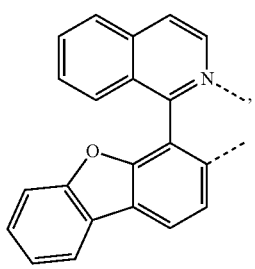
L_{c165}
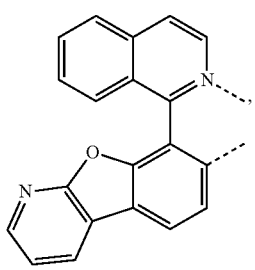
L_{c166}
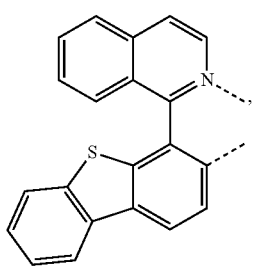
L_{c167}
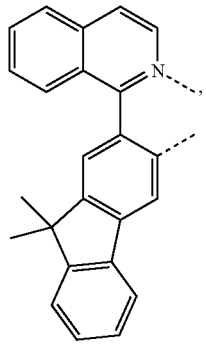
L_{c168}
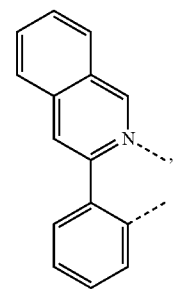
L_{c169}
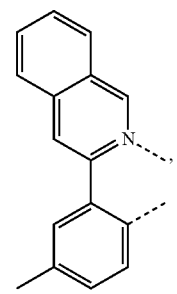
L_{c170}
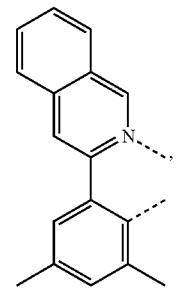
L_{c171}
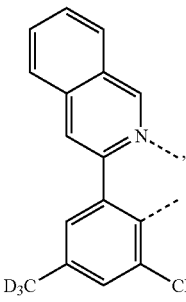

-continued
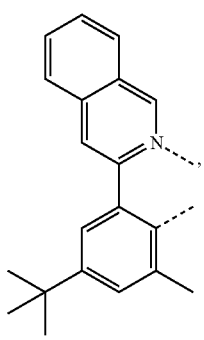 L<sub>c172</sub>
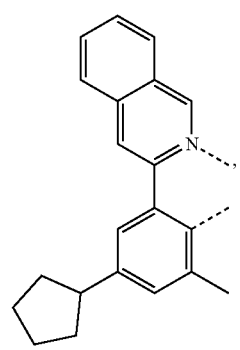 L<sub>c173</sub>
L<sub>c174</sub>
L<sub>c175</sub>
-continued
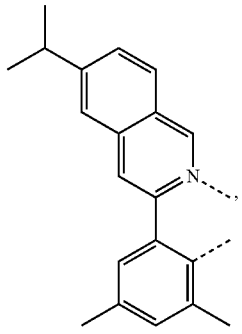 L<sub>c176</sub>
L<sub>c177</sub>
L<sub>c178</sub>
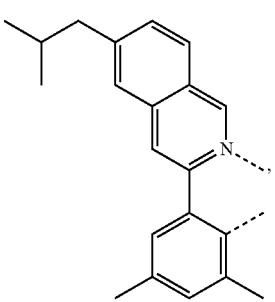
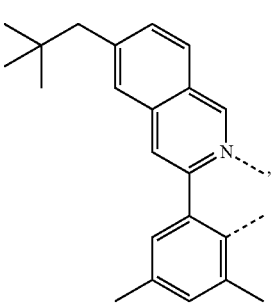 L<sub>c179</sub>
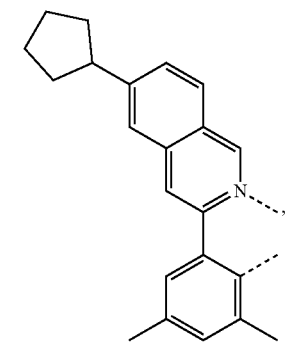 L<sub>c180</sub>
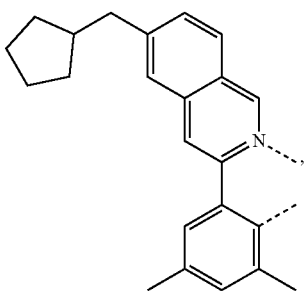

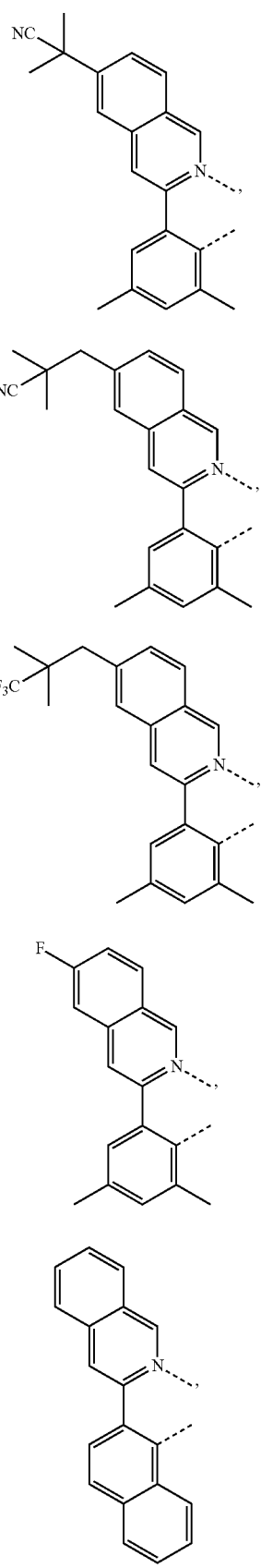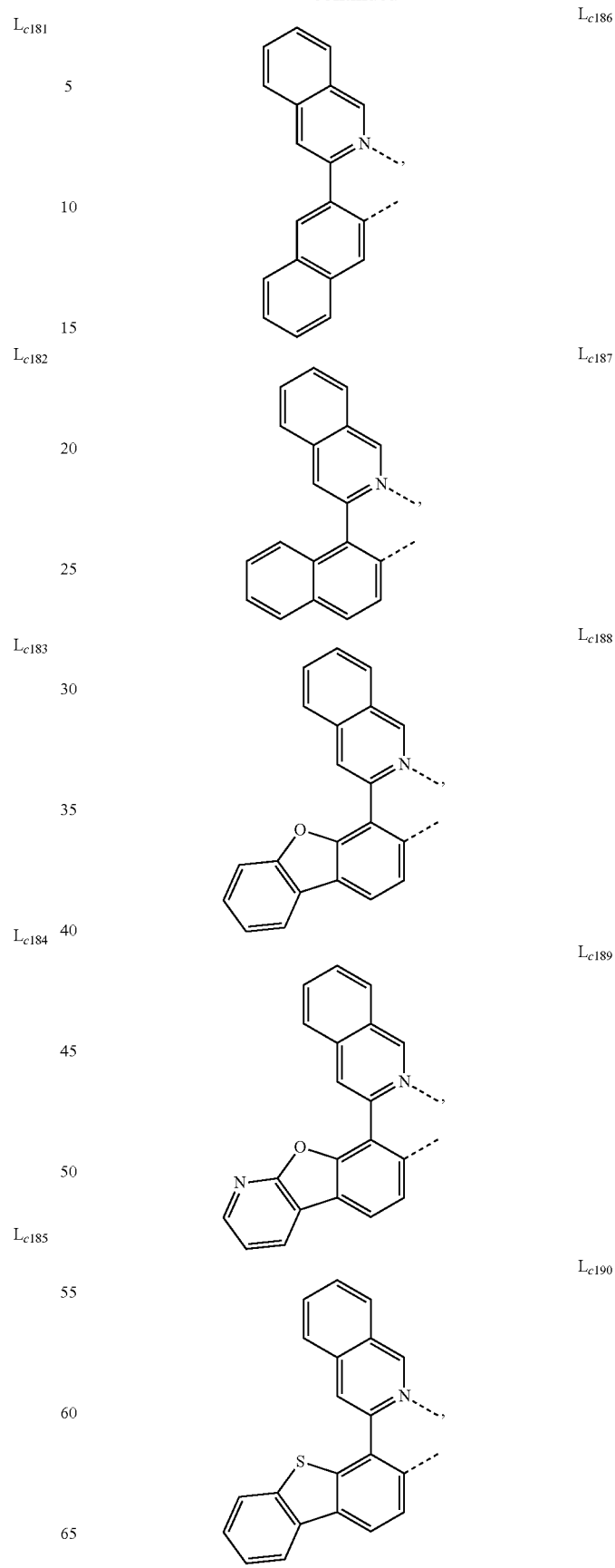

L_{c191} 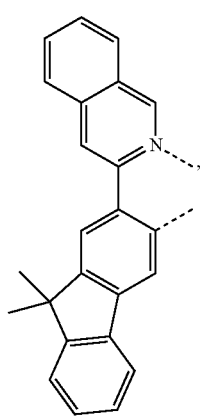
L_{c192} 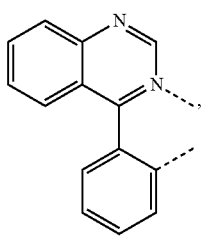
L_{c193} 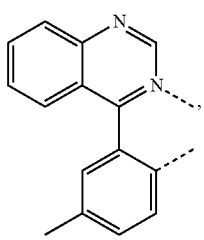
L_{c194} 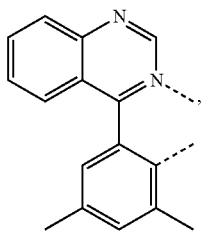
L_{c195} 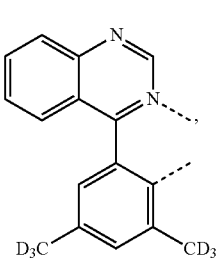
L_{c196} 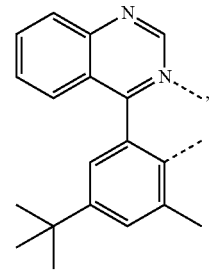
L_{c197} 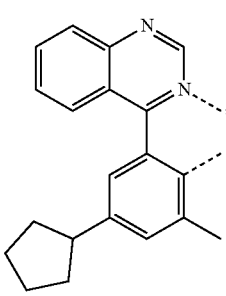
L_{c198} 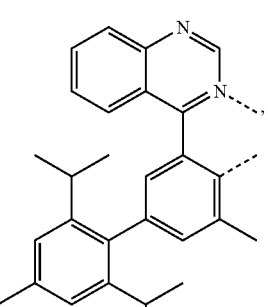
L_{c199} 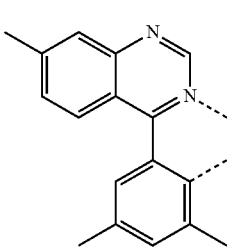
L_{c200} 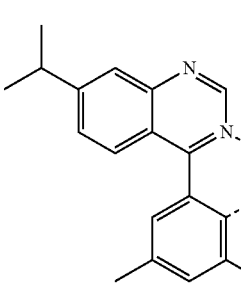

289
-continued
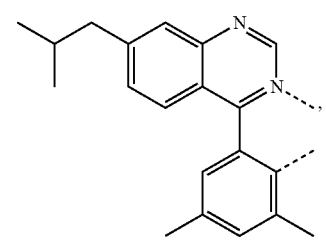  L<sub>c201</sub>
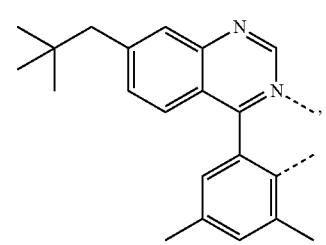  L<sub>c202</sub>
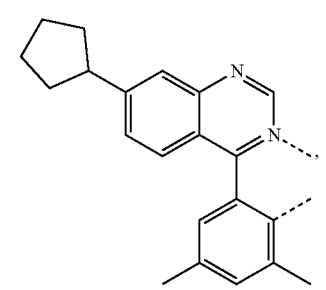  L<sub>c203</sub>
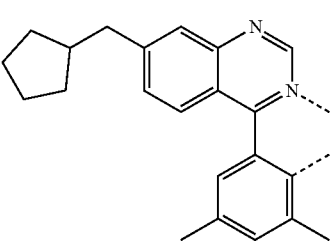  L<sub>c204</sub>
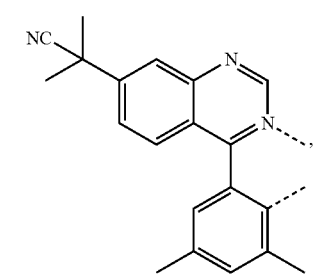  L<sub>c205</sub>
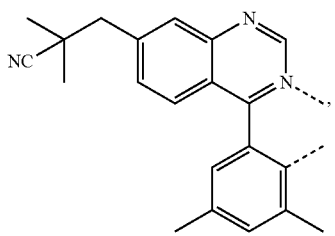  L<sub>c206</sub>
290
-continued
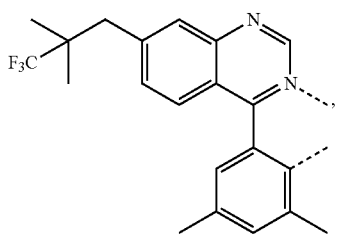  L<sub>c207</sub>
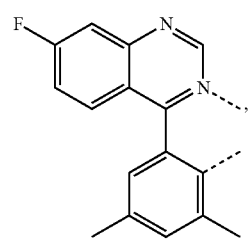  L<sub>c208</sub>
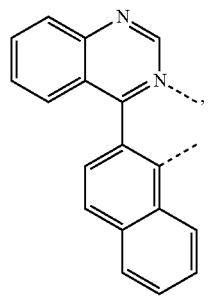  L<sub>c209</sub>
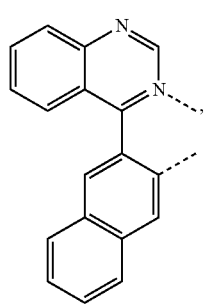  L<sub>c210</sub>
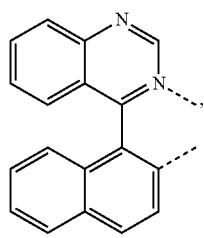  L<sub>c211</sub>
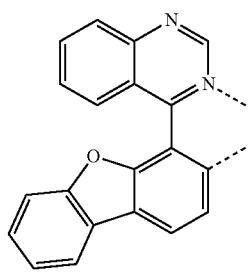  L<sub>c212</sub>

L<sub>c213</sub> 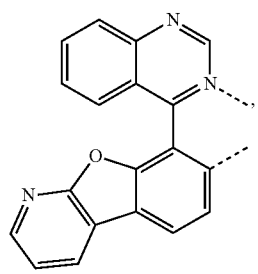
L<sub>c214</sub> 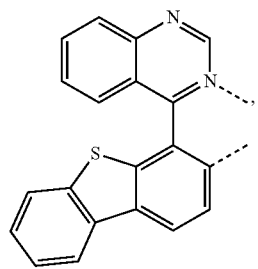
L<sub>c215</sub> 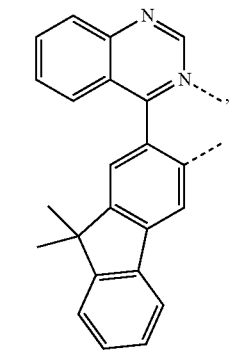
L<sub>c216</sub> 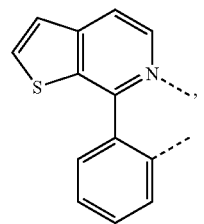
L<sub>c217</sub> 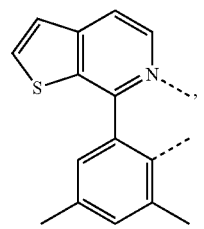
L<sub>c218</sub> 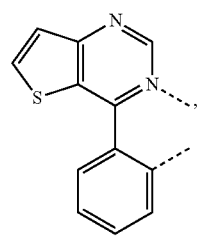
L<sub>c219</sub> 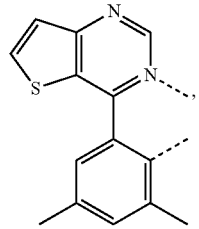
L<sub>c220</sub> 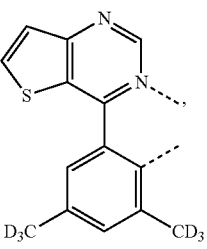
L<sub>c221</sub> 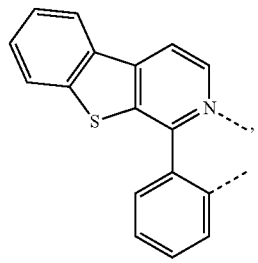
L<sub>c222</sub> 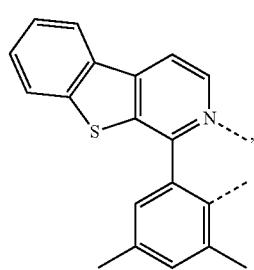
L<sub>c223</sub> 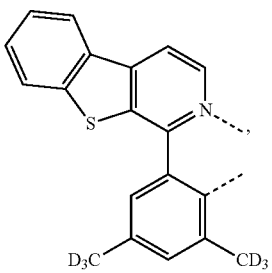
L<sub>c224</sub> 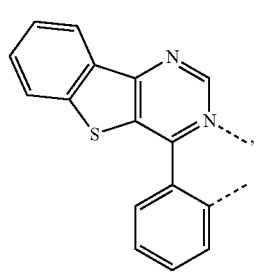

L<sub>c225</sub>
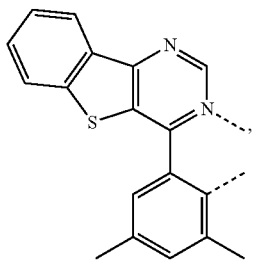

L<sub>c226</sub>
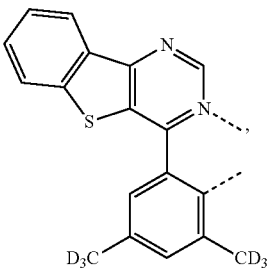

L<sub>c227</sub>
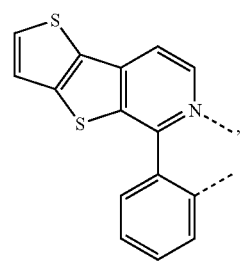

L<sub>c228</sub>
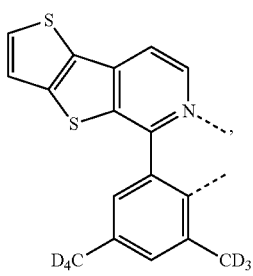

L<sub>c229</sub>
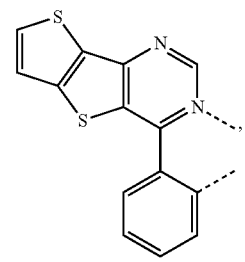

L<sub>c230</sub>
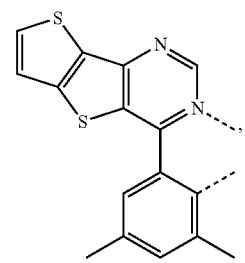

L<sub>c231</sub>
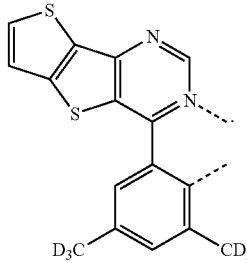

23. The metal complex of claim 22, wherein the metal complex has a structure of $Ir(L_a)_2(L_b)$ or $Ir(L_a)_2(L_c)$ or $Ir(L_a)(L_c)_2$;

wherein, when the metal complex has a structure of $Ir(L_a)_2(L_b)$, $L_a$ is, at each occurrence identically or differently, selected from any one or any two of the group consisting of $L_{a1}$ to $L_{a108}$, $L_{a133}$ to $L_{a231}$, $L_{a254}$ to $L_{a297}$, $L_{a320}$ to $L_{a411}$, $L_{a436}$ to $L_{a531}$, $L_{a556}$ to $L_{a603}$, $L_{a676}$ to $L_{a726}$, $L_{a728}$ to $L_{a775}$, $L_{a800}$ to $L_{a883}$, $L_{a908}$ to $L_{a955}$, $L_{a980}$ to $L_{a1027}$, $L_{a1052}$ to $L_{a1099}$, $L_{a1160}$ to $L_{a1212}$, $L_{a1214}$ to $L_{a1237}$, $L_{a1256}$ to $L_{a1303}$, $L_{a1340}$ to $L_{a1363}$, $L_{a1376}$ to $L_{a1387}$, $L_{a1394}$ to $L_{a1405}$, $L_{a1412}$ to $L_{a1423}$, $L_{a1430}$ to $L_{a1441}$, $L_{a1448}$ to $L_{a1459}$, $L_{a1466}$ to $L_{a1477}$, $L_{a1484}$ to $L_{a1489}$, $L_{a1496}$ to $L_{a1501}$, $L_{a1508}$ to $L_{a1521}$, $L_{a1523}$ to $L_{a1526}$ and $L_{a1528}$ to $L_{a1611}$, and $L_b$ is selected from any one of the group consisting of $L_{b1}$ to $L_{b322}$; when the metal complex has a structure of $Ir(L_a)_2(L_c)$, $L_a$ is, at each occurrence identically or differently, selected from any one or any two of the group consisting of $L_{a1}$ to $L_{a108}$, $L_{a133}$ to $L_{a231}$, $L_{a254}$ to $L_{a297}$, $L_{a320}$ to $L_{a411}$, $L_{a436}$ to $L_{a531}$, $L_{a556}$ to $L_{a603}$, $L_{a676}$ to $L_{a726}$, $L_{a728}$ to $L_{a775}$, $L_{a800}$ to $L_{a883}$, $L_{a908}$ to $L_{a955}$, $L_{a980}$ to $L_{a1027}$, $L_{a1052}$ to $L_{a1099}$, $L_{a1160}$ to $L_{a1212}$, $L_{a1214}$ to $L_{a1237}$, $L_{a1256}$ to $L_{a1303}$, $L_{a1340}$ to $L_{a1363}$, $L_{a1376}$ to $L_{a1387}$, $L_{a1394}$ to $L_{a1405}$, $L_{a1412}$ to $L_{a1423}$, $L_{a1430}$ to $L_{a1441}$, $L_{a1448}$ to $L_{a1459}$, $L_{a1466}$ to $L_{a1477}$, $L_{a1484}$ to $L_{a1489}$, $L_{a1496}$ to $L_{a1501}$, $L_{a1508}$ to $L_{a1521}$, $L_{a1523}$ to $L_{a1526}$ and $L_{a1528}$ to $L_{a1611}$, and Le is selected from any one of the group consisting of Lcl to $L_c231$; and when the metal complex has a structure of $Ir(L_a)(L_c)_2$, $L_a$ is selected from any one of the group consisting of $L_{a1}$ to $L_{a108}$, $L_{a133}$ to $L_{a231}$, $L_{a254}$ to $L_{a297}$, $L_{a320}$ to $L_{a411}$, $L_{a436}$ to $L_{a531}$, $L_{a556}$ to $L_{a603}$, $L_{a676}$ to $L_{a726}$, $L_{a728}$ to $L_{a775}$, $L_{a800}$ to $L_{a883}$, $L_{a908}$ to $L_{a955}$, $L_{a980}$ to $L_{a1027}$, $L_{a1052}$ to $L_{a1099}$, $L_{a1160}$ to $L_{a1212}$, $L_{a1214}$ to $L_{a1237}$, $L_{a1256}$ to $L_{a1303}$, $L_{a1340}$ to $L_{a1363}$, $L_{a1376}$ to $L_{a1387}$, $L_{a1394}$ to $L_{a1405}$, $L_{a1412}$ to $L_{a1423}$, $L_{a1430}$ to $L_{a1441}$, $L_{a1448}$ to $L_{a1459}$, $L_{a1466}$ to $L_{a1477}$, $L_{a1484}$ to $L_{a1489}$, $L_{a1496}$ to $L_{a1501}$, $L_{a1508}$ to $L_{a1521}$, $L_{a1523}$ to $L_{a1526}$ and $L_{a1528}$ to $L_{a1611}$, and $L_c$ is, at each occurrence identically or differently, selected from any one or any two of the group consisting of $L_{c1}$ to $L_{c231}$.

24. An electroluminescent device, comprising:
an anode,
a cathode, and
an organic layer disposed between the anode and the cathode, wherein the organic layer comprises the metal complex of claim 5.

25. The device of claim 24, wherein the organic layer is a light-emitting layer, and the metal complex is a light-emitting material.

26. A compound formulation, comprising the metal complex of claim 5.

27. The metal complex of claim 2, wherein at least one or two of $R_1$ to $R_3$ are selected from substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or a combination thereof; and/or at least one of $R_4$ to $R_6$ is substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or a combination thereof.

28. The metal complex of claim 7, wherein at least two or three of $X_1$ to $X_8$ and $Y_1$ to $Y_6$ are selected from $CR_x$ or $CR_{y1}$; and the $R_{y1}$ is, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof;

the $R_x$ is, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, an isocyano group, a hydroxyl group, a sulfanyl group, a sulfinyl group, a sulfonyl group, a phosphino group and combinations thereof.

29. The metal complex of claim 9, wherein $R_{s1}$, $R_{s2}$ and $R_{s3}$ are, at each occurrence identically or differently, selected from the group consisting of: substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms and combinations thereof.

30. The metal complex of claim 17, wherein $Y_2$ and/or $Y_4$ are selected from $CR_{y2}$; and at least one or two or three of $R_{s1}$, $R_{s2}$ and $R_{s3}$ are each independently selected from substituted or unsubstituted alkyl having 1 to 20 carbon atoms, substituted or unsubstituted cycloalkyl having 3 to 20 ring carbon atoms or a combination thereof.

31. The metal complex of claim 22, wherein the metal complex is selected from the group of the compounds listed in the following tables;

wherein the compounds listed in the following table have the structure of $Ir(L_a)_2(L_b)$, wherein the two $L_a$ are the same and $L_a$ and $L_b$ are respectively selected from structures listed in the following table:

| Compound No. | $L_a$ | $L_b$ | Compound No. | $L_a$ | $L_b$ |
|---|---|---|---|---|---|
| 1 | $L_{a13}$ | $L_{b31}$ | 2 | $L_{a16}$ | $L_{b31}$ |
| 3 | $L_{a37}$ | $L_{b31}$ | 4 | $L_{a40}$ | $L_{b31}$ |
| 5 | $L_{a61}$ | $L_{b31}$ | 6 | $L_{a64}$ | $L_{b31}$ |
| 7 | $L_{a73}$ | $L_{b31}$ | 8 | $L_{a85}$ | $L_{b31}$ |
| 9 | $L_{a97}$ | $L_{b31}$ | | | |
| | | | 14 | $L_{a146}$ | $L_{b31}$ |
| 15 | $L_{a168}$ | $L_{b31}$ | 16 | $L_{a190}$ | $L_{b31}$ |
| 19 | $L_{a740}$ | $L_{b31}$ | 20 | $L_{a752}$ | $L_{b31}$ |
| 21 | $L_{a764}$ | $L_{b31}$ | | | |
| | | | 24 | $L_{a1268}$ | $L_{b31}$ |
| 25 | $L_{a1280}$ | $L_{b31}$ | | | |
| 27 | $L_{a1376}$ | $L_{b31}$ | 28 | $L_{a1382}$ | $L_{b31}$ |
| | | | 30 | $L_{a1438}$ | $L_{b31}$ |
| 31 | $L_{a1450}$ | $L_{b31}$ | 32 | $L_{a1484}$ | $L_{b31}$ |
| | | | 34 | $L_{a1520}$ | $L_{b31}$ |
| 35 | $L_{a1521}$ | $L_{b31}$ | | | |
| 37 | $L_{a13}$ | $L_{b57}$ | 38 | $L_{a16}$ | $L_{b57}$ |
| 39 | $L_{a37}$ | $L_{b57}$ | 40 | $L_{a40}$ | $L_{b57}$ |
| 41 | $L_{a61}$ | $L_{b57}$ | 42 | $L_{a64}$ | $L_{b57}$ |
| 43 | $L_{a73}$ | $L_{b57}$ | 44 | $L_{a85}$ | $L_{b57}$ |
| 45 | $L_{a97}$ | $L_{b57}$ | | | |
| | | | 50 | $L_{a146}$ | $L_{b57}$ |
| 51 | $L_{a168}$ | $L_{b57}$ | 52 | $L_{a190}$ | $L_{b57}$ |
| 55 | $L_{a740}$ | $L_{b57}$ | 56 | $L_{a752}$ | $L_{b57}$ |
| 57 | $L_{a764}$ | $L_{b57}$ | | | |
| | | | 60 | $L_{a1268}$ | $L_{b57}$ |
| 61 | $L_{a1280}$ | $L_{b57}$ | | | |
| 63 | $L_{a1376}$ | $L_{b57}$ | 64 | $L_{a1382}$ | $L_{b57}$ |
| | | | 66 | $L_{a1438}$ | $L_{b57}$ |
| 67 | $L_{a1450}$ | $L_{b57}$ | 68 | $L_{a1484}$ | $L_{b57}$ |
| | | | 70 | $L_{a1520}$ | $L_{b57}$ |
| 71 | $L_{a1521}$ | $L_{b57}$ | | | |
| 73 | $L_{a13}$ | $L_{b88}$ | 74 | $L_{a16}$ | $L_{b88}$ |
| 75 | $L_{a37}$ | $L_{b88}$ | 76 | $L_{a40}$ | $L_{b88}$ |
| 77 | $L_{a61}$ | $L_{b88}$ | 78 | $L_{a64}$ | $L_{b88}$ |
| 79 | $L_{a73}$ | $L_{b88}$ | 80 | $L_{a85}$ | $L_{b88}$ |
| 81 | $L_{a97}$ | $L_{b88}$ | | | |
| | | | 86 | $L_{a146}$ | $L_{b88}$ |
| 87 | $L_{a168}$ | $L_{b88}$ | 88 | $L_{a190}$ | $L_{b88}$ |
| 91 | $L_{a740}$ | $L_{b88}$ | 92 | $L_{a752}$ | $L_{b88}$ |
| 93 | $L_{a764}$ | $L_{b88}$ | | | |
| | | | 96 | $L_{a1268}$ | $L_{b88}$ |
| 97 | $L_{a1280}$ | $L_{b88}$ | | | |
| 99 | $L_{a1376}$ | $L_{b88}$ | 100 | $L_{a1382}$ | $L_{b88}$ |
| | | | 102 | $L_{a1438}$ | $L_{b88}$ |
| 103 | $L_{a1450}$ | $L_{b88}$ | 104 | $L_{a1484}$ | $L_{b88}$ |
| | | | 106 | $L_{a1520}$ | $L_{b88}$ |
| 107 | $L_{a1521}$ | $L_{b88}$ | | | |
| 109 | $L_{a13}$ | $L_{b122}$ | 110 | $L_{a16}$ | $L_{b122}$ |
| 111 | $L_{a37}$ | $L_{b122}$ | 112 | $L_{a40}$ | $L_{b122}$ |
| 113 | $L_{a61}$ | $L_{b122}$ | 114 | $L_{a64}$ | $L_{b122}$ |
| 115 | $L_{a73}$ | $L_{b122}$ | 116 | $L_{a85}$ | $L_{b122}$ |
| 117 | $L_{a97}$ | $L_{b122}$ | | | |
| | | | 122 | $L_{a146}$ | $L_{b122}$ |
| 123 | $L_{a168}$ | $L_{b122}$ | 124 | $L_{a190}$ | $L_{b122}$ |
| 127 | $L_{a740}$ | $L_{b122}$ | 128 | $L_{a752}$ | $L_{b122}$ |
| 129 | $L_{a764}$ | $L_{b122}$ | | | |
| | | | 132 | $L_{a1268}$ | $L_{b122}$ |
| 133 | $L_{a1280}$ | $L_{b122}$ | | | |
| 135 | $L_{a1376}$ | $L_{b122}$ | 136 | $L_{a1382}$ | $L_{b122}$ |
| | | | 138 | $L_{a1438}$ | $L_{b122}$ |
| 139 | $L_{a1450}$ | $L_{b122}$ | 140 | $L_{a1484}$ | $L_{b122}$ |
| | | | 142 | $L_{a1520}$ | $L_{b122}$ |
| 143 | $L_{a1521}$ | $L_{b122}$ | | | |
| 145 | $L_{a13}$ | $L_{b126}$ | 146 | $L_{a16}$ | $L_{b126}$ |

| Compound No. | $L_a$ | $L_b$ | Compound No. | $L_a$ | $L_b$ |
|---|---|---|---|---|---|
| 147 | $L_{a37}$ | $L_{b126}$ | 148 | $L_{a40}$ | $L_{b126}$ |
| 149 | $L_{a61}$ | $L_{b126}$ | 150 | $L_{a64}$ | $L_{b126}$ |
| 151 | $L_{a73}$ | $L_{b126}$ | 152 | $L_{a85}$ | $L_{b126}$ |
| 153 | $L_{a97}$ | $L_{b126}$ | | | |
| | | | 158 | $L_{a146}$ | $L_{b126}$ |
| 159 | $L_{a168}$ | $L_{b126}$ | 160 | $L_{a190}$ | $L_{b126}$ |
| 163 | $L_{a740}$ | $L_{b126}$ | 164 | $L_{a752}$ | $L_{b126}$ |
| 165 | $L_{a764}$ | $L_{b126}$ | | | |
| | | | 168 | $L_{a1268}$ | $L_{b126}$ |
| 169 | $L_{a1280}$ | $L_{b126}$ | | | |
| 171 | $L_{a1376}$ | $L_{b126}$ | 172 | $L_{a1382}$ | $L_{b126}$ |
| | | | 174 | $L_{a1438}$ | $L_{b126}$ |
| 175 | $L_{a1450}$ | $L_{b126}$ | 176 | $L_{a1484}$ | $L_{b126}$ |
| | | | 178 | $L_{a1520}$ | $L_{b126}$ |
| 179 | $L_{a1521}$ | $L_{b126}$ | | | |
| 181 | $L_{a13}$ | $L_{b212}$ | 182 | $L_{a16}$ | $L_{b212}$ |
| 183 | $L_{a37}$ | $L_{b212}$ | 184 | $L_{a40}$ | $L_{b212}$ |
| 185 | $L_{a61}$ | $L_{b212}$ | 186 | $L_{a64}$ | $L_{b212}$ |
| 187 | $L_{a73}$ | $L_{b212}$ | 188 | $L_{a85}$ | $L_{b212}$ |
| 189 | $L_{a97}$ | $L_{b212}$ | | | |
| | | | 194 | $L_{a146}$ | $L_{b212}$ |
| 195 | $L_{a168}$ | $L_{b212}$ | 196 | $L_{a190}$ | $L_{b212}$ |
| 199 | $L_{a740}$ | $L_{b212}$ | 200 | $L_{a752}$ | $L_{b212}$ |
| 201 | $L_{a764}$ | $L_{b212}$ | | | |
| | | | 204 | $L_{a1268}$ | $L_{b212}$ |
| 205 | $L_{a1280}$ | $L_{b212}$ | | | |
| 207 | $L_{a1376}$ | $L_{b212}$ | 208 | $L_{a1382}$ | $L_{b212}$ |
| | | | 210 | $L_{a1438}$ | $L_{b212}$ |
| 211 | $L_{a1450}$ | $L_{b212}$ | 212 | $L_{a1484}$ | $L_{b212}$ |
| | | | 214 | $L_{a1520}$ | $L_{b212}$ |
| 215 | $L_{a1521}$ | $L_{b212}$ | | | |
| 301 | $L_{a201}$ | $L_{b31}$ | 302 | $L_{a201}$ | $L_{b57}$ |
| 303 | $L_{a201}$ | $L_{b88}$ | 304 | $L_{a201}$ | $L_{b122}$ |
| 305 | $L_{a201}$ | $L_{b126}$ | 306 | $L_{a201}$ | $L_{b212}$ |
| 307 | $L_{a743}$ | $L_{b156}$ | 308 | $L_{a755}$ | $L_{b156}$ |
| 309 | $L_{a1271}$ | $L_{b156}$ | 310 | $L_{a1283}$ | $L_{b156}$ |
| 311 | $L_{a1542}$ | $L_{b156}$ | 312 | $L_{a1584}$ | $L_{b156}$ |
| 313 | $L_{a1584}$ | $L_{b122}$ | 314 | $L_{a1584}$ | $L_{b126}$ |
| 315 | $L_{a1592}$ | $L_{b122}$ | 316 | $L_{a1592}$ | $L_{b126}$ |

| Compound No. | $L_a$ | $L_a$ | $L_b$ | Compound No. | $L_a$ | $L_a$ | $L_b$ |
|---|---|---|---|---|---|---|---|
| 223 | $L_{a13}$ | $L_{a1534}$ | $L_{b31}$ | | | | |
| 225 | $L_{a16}$ | $L_{a64}$ | $L_{b31}$ | | | | |
| 227 | $L_{a16}$ | $L_{a146}$ | $L_{b31}$ | | | | |
| 229 | $L_{a146}$ | $L_{a190}$ | $L_{b31}$ | | | | |
| 231 | $L_{a13}$ | $L_{a16}$ | $L_{b57}$ | 232 | $L_{a13}$ | $L_{a37}$ | $L_{b57}$ |
| | | | | 234 | $L_{a13}$ | $L_{a146}$ | $L_{b57}$ |
| 235 | $L_{a13}$ | $L_{a740}$ | $L_{b57}$ | 326 | $L_{a13}$ | $L_{a752}$ | $L_{b57}$ |
| 237 | $L_{a13}$ | $L_{a1534}$ | $L_{b57}$ | | | | |
| 239 | $L_{a16}$ | $L_{a64}$ | $L_{b57}$ | | | | |
| 241 | $L_{a16}$ | $L_{a146}$ | $L_{b57}$ | | | | |
| 243 | $L_{a146}$ | $L_{a190}$ | $L_{b57}$ | | | | |
| 245 | $L_{a13}$ | $L_{a16}$ | $L_{b88}$ | 246 | $L_{a13}$ | $L_{a37}$ | $L_{b88}$ |
| | | | | 248 | $L_{a13}$ | $L_{a146}$ | $L_{b88}$ |
| 249 | $L_{a13}$ | $L_{a740}$ | $L_{b88}$ | 250 | $L_{a13}$ | $L_{a752}$ | $L_{b88}$ |
| 251 | $L_{a13}$ | $L_{a1534}$ | $L_{b88}$ | | | | |
| 253 | $L_{a16}$ | $L_{a64}$ | $L_{b88}$ | | | | |
| 255 | $L_{a16}$ | $L_{a146}$ | $L_{b88}$ | | | | |
| 257 | $L_{a146}$ | $L_{a190}$ | $L_{b88}$ | | | | |
| 259 | $L_{a13}$ | $L_{a16}$ | $L_{b122}$ | 260 | $L_{a13}$ | $L_{a37}$ | $L_{b122}$ |
| | | | | 262 | $L_{a13}$ | $L_{a146}$ | $L_{b122}$ |
| 263 | $L_{a13}$ | $L_{a740}$ | $L_{b122}$ | 264 | $L_{a13}$ | $L_{a752}$ | $L_{b122}$ |
| 265 | $L_{a13}$ | $L_{a1534}$ | $L_{b122}$ | | | | |
| 267 | $L_{a16}$ | $L_{a64}$ | $L_{b122}$ | | | | |
| 269 | $L_{a16}$ | $L_{a146}$ | $L_{b122}$ | | | | |
| 271 | $L_{a146}$ | $L_{a190}$ | $L_{b122}$ | | | | |
| 273 | $L_{a13}$ | $L_{a16}$ | $L_{b126}$ | 274 | $L_{a13}$ | $L_{a37}$ | $L_{b126}$ |
| | | | | 276 | $L_{a13}$ | $L_{a146}$ | $L_{b126}$ |
| 277 | $L_{a13}$ | $L_{a740}$ | $L_{b126}$ | 278 | $L_{a13}$ | $L_{a752}$ | $L_{b126}$ |
| 279 | $L_{a13}$ | $L_{a1534}$ | $L_{b126}$ | | | | |
| 281 | $L_{a16}$ | $L_{a64}$ | $L_{b126}$ | | | | |
| 283 | $L_{a16}$ | $L_{a146}$ | $L_{b126}$ | | | | |
| 285 | $L_{a146}$ | $L_{a190}$ | $L_{b126}$ | | | | |
| 287 | $L_{a13}$ | $L_{a16}$ | $L_{b212}$ | 288 | $L_{a13}$ | $L_{a37}$ | $L_{b212}$ |
| | | | | 290 | $L_{a13}$ | $L_{a146}$ | $L_{b212}$ |
| 291 | $L_{a13}$ | $L_{a740}$ | $L_{b212}$ | 292 | $L_{a1}3$ | $L_{a752}$ | $L_{b212}$ |
| 293 | $L_{a13}$ | $L_{a1534}$ | $L_{b212}$ | | | | |
| 295 | $L_{a16}$ | $L_{a64}$ | $L_{b212}$ | | | | |
| 297 | $L_{a16}$ | $L_{a146}$ | $L_{b212}$ | | | | |
| 299 | $L_{a146}$ | $L_{a190}$ | $L_{b212}$. | | | | | wherein the compounds listed in the following table have the structure of $Ir(L_a)_2(L_b)$, wherein the two $L_a$ are different and $L_a$ and $L_b$ are respectively selected from structures listed in the following table:

| Compound No. | $L_a$ | $L_a$ | $L_b$ | Compound No. | $L_a$ | $L_a$ | $L_b$ |
|---|---|---|---|---|---|---|---|
| 217 | $L_{a13}$ | $L_{a16}$ | $L_{b31}$ | 218 | $L_{a13}$ | $L_{a37}$ | $L_{b31}$ |
| | | | | 220 | $L_{a13}$ | $L_{a146}$ | $L_{b31}$ |
| 221 | $L_{a13}$ | $L_{a740}$ | $L_{b31}$ | 222 | $L_{a13}$ | $L_{a752}$ | $L_{b31}$ |

32. The device of claim 25, wherein the light-emitting layer further comprises at least one host material; the at least one host material comprises at least one chemical group selected from the group consisting of: benzene, pyridine, pyrimidine, triazine, carbazole, azacarbazole, indolocarbazole, dibenzothiophene, aza-dibenzothiophene, dibenzofuran, azadibenzofuran, dibenzoselenophene, triphenylene, azatriphenylene, fluorene, silafluorene, naphthalene, quinoline, isoquinoline, quinazoline, quinoxaline, phenanthrene, azaphenanthrene and combinations thereof.

\* \* \* \* \*